US011812660B2

(12) United States Patent
Ran et al.

(10) Patent No.: US 11,812,660 B2
(45) Date of Patent: Nov. 7, 2023

(54) ORGANIC COMPOUND, ELECTROLUMINESCENT MATERIAL AND APPLICATION THEREOF

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Quan Ran, Shanghai (CN); Wei Gao, Shanghai (CN); Lei Zhang, Shanghai (CN); Wenpeng Dai, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(*) Notice: Subject to any disclaimer, the term of this patent is extended or adjusted under 35 U.S.C. 154(b) by 506 days.

(21) Appl. No.: 17/123,980

(22) Filed: Dec. 16, 2020

(65) Prior Publication Data

US 2022/0123226 A1 Apr. 21, 2022

(30) Foreign Application Priority Data

Oct. 21, 2020 (CN) ........................ 202011134843.2

(51) Int. Cl.
*H01L 51/00* (2006.01)
*H10K 85/60* (2023.01)
(Continued)

(52) U.S. Cl.
CPC ..... *H10K 85/6572* (2023.02); *C07F 9/65685* (2013.01); *C09K 11/06* (2013.01);
(Continued)

(58) Field of Classification Search
None
See application file for complete search history.

(56) References Cited

U.S. PATENT DOCUMENTS

2014/0316134 A1* 10/2014 Stoessel .............. C07D 221/20 546/18
2018/0083198 A1* 3/2018 Cha ........................ C09K 11/06
2019/0375773 A1 12/2019 Jun et al.

FOREIGN PATENT DOCUMENTS

CN 103304540 A 9/2013
CN 106187861 A 12/2016
(Continued)

*Primary Examiner* — Robert S Loewe
(74) *Attorney, Agent, or Firm* — Anova Law Group, PLLC

(57) ABSTRACT

An organic compound, an electroluminescent material and its application are provided in the present disclosure. The organic compound includes a structure:

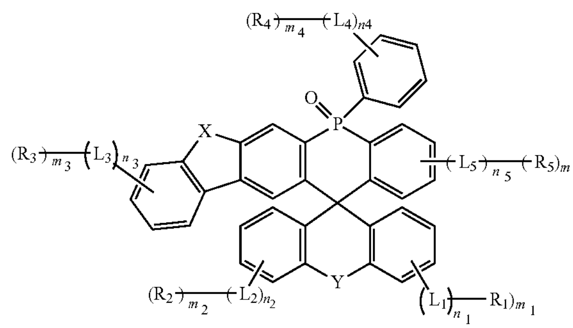

X is selected from O, S, N—$R_{N1}$, and $CR_{C1}R_{C2}$; Y is selected from O, S, N—$R_{N2}$, $CR_{C3}R_{C4}$, O═S═O, $SiR_{S1}R_{S2}$, O═P—$Ar_1$, and S═P—$Ar_2$, $R_{N1}$, $R_{N2}$, $R_{C1}$, $R_{C2}$,
(Continued)

$R_{C3}$, $R_{C4}$, $R_{S1}$, and $R_{S2}$ are each independently selected from C1~C20 linear or branched alkyl, C6~C40 aryl, and C3~C40 heteroaryl; $Ar_1$ and $Ar_2$ are each independently selected from C6~C40 aryl and C3~C40 heteroaryl; $L_1$, $L_2$, $L_3$, $L_4$, and $L_5$ are each independently selected from a single bond, C6~C40 arylene, and C3~C40 heteroarylene; $R_1$, $R_2$, $R_3$, $R_4$, and $R_5$ are each independently selected from deuterium, C1~C20 linear or branched alkyl, C1~C20 alkoxy, C1~C20 alkylthio, C3~C20 cycloalkyl, C6~C40 aryl, C3~C40 heteroaryl, and C6~C40 arylamino; and $n_1$, $n_2$, $n_3$, $n_4$, $n_5$, $m_1$, $m_2$, $m_3$, $m_4$, and $m_5$ are integers each independently selected from 0-2.

19 Claims, 1 Drawing Sheet

(51) Int. Cl.
*C07F 9/6568* (2006.01)
*C09K 11/06* (2006.01)
*H10K 50/11* (2023.01)
*H10K 50/16* (2023.01)
*H10K 50/18* (2023.01)
*H10K 101/10* (2023.01)

(52) U.S. Cl.
CPC ......... *H10K 85/636* (2023.02); *H10K 85/657* (2023.02); *H10K 85/6574* (2023.02); *H10K 85/6576* (2023.02); *C09K 2211/1018* (2013.01); *H10K 50/11* (2023.02); *H10K 50/16* (2023.02); *H10K 50/18* (2023.02); *H10K 2101/10* (2023.02)

(56) References Cited

FOREIGN PATENT DOCUMENTS

| | | | | | |
|---|---|---|---|---|---|
| CN | 106831861 | A | | 6/2017 | |
| CN | 107311978 | A | | 11/2017 | |
| CN | 110437208 | A | | 11/2019 | |
| CN | 110845537 | A | | 2/2020 | |
| JP | 2015505819 | A | | 2/2015 | |
| JP | 6081473 | B2 | | 2/2017 | |
| KR | 20110111093 | A | * | 10/2011 | ............. C09K 11/06 |
| KR | 20110113469 | A | * | 10/2011 | ............. C09K 11/06 |

* cited by examiner

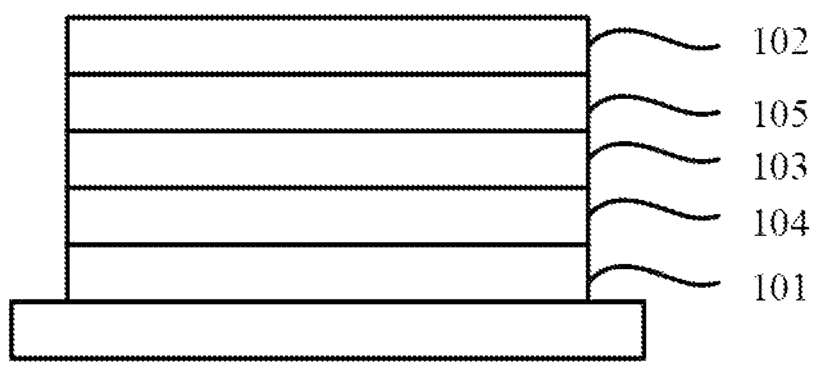
102
105
103
104
101

ORGANIC COMPOUND, ELECTROLUMINESCENT MATERIAL AND APPLICATION THEREOF

CROSS-REFERENCE TO RELATED APPLICATION

This application claims the priority of Chinese Patent Application No. 202011134843.2, filed on Oct. 21, 2020, the content of which is incorporated herein by reference in its entirety.

TECHNICAL FIELD

The present disclosure generally relates to the field of organic electroluminescent material technology and, more particularly, relates to an organic compound, an electroluminescent material and an application of the electroluminescent material.

BACKGROUND

Organic electroluminescence (EL) is an emerging technology with broad applications in the field of optoelectronics. Since the rise of organic electroluminescent materials and devices (e.g., organic light-emitting diode (OLED)) in 1987, organic electroluminescent materials and devices have attracted great attention from the scientific and industrial fields and are regarded as the most competitive technology in the new generation of display fields. OLED devices, which have the advantages of ultra-thin, self-illumination, wide viewing-angle, fast response, high luminous efficiency, desirable temperature adaptability, simple production process, low driving voltage and low energy consumption, have been widely used in industries, such as flat panel displays, flexible displays, solid-state lighting, automotive displays, and the like.

In the development of OLED devices, the material selection is crucial, and the chemical structures and properties of the materials directly affect the final performance of the devices. The luminescent materials in OLED devices can be classified into two types, including electroluminescence and electrophosphorescence, according to the light emission mechanism. Electroluminescence is the radiation decay transition of singlet excitons, while electrophosphorescence is the light emitted by the radiation of triplet excitons decayed to the ground state. According to the theory of spin quantum statistics, the formation probability ratio of singlet excitons and triplet excitons is 1:3. Therefore, for electroluminescent materials, the internal quantum efficiency does not exceed 25%, and the external quantum efficiency is generally less than 5%, but for electrophosphorescence materials, the internal quantum efficiency theoretically can reach 100%, and the external quantum efficiency can reach 20%. In 1998, Ma et al. of Jilin University and Forrest et al. of Princeton University respectively reported the use of osmium complexes and platinum complexes as dyes to be doped into the emission layer, and successfully obtained and explained the phosphorescence phenomenon for the first time and pioneered the application of the prepared phosphorescent materials to electroluminescent devices.

Phosphorescent heavy metal materials have a long lifetime, which can reach the micrometer level; and under high current density, it may cause triplet-triplet annihilation and concentration quenching, resulting in degradation of device performance. Therefore, phosphorescent heavy metal materials are usually doped into suitable host materials to form a host-guest doped system, which optimizes energy transfer and maximizes luminous efficiency and lifetime. Currently, the commercialization of heavy metal doped materials has well developed, and alternative doped materials are difficult to be developed, such that researchers focus on the development of phosphorescent host materials.

Currently, many researchers are dedicated to the research of phosphorescent host materials. For example, CN103304540A discloses a phosphorescent host material, its preparation method, and an organic electroluminescent device. The molecular structure of the phosphorescent host material is a pyridine bonded with pyridine and fluorene containing a carbazole group which may replace di-fluorenes. Fluorene and pyridine have high thermal stability, the carbazole group has hole transport properties, and the pyridyl group has electron transport properties, such that the phosphorescent host material has relatively high thermal stability and desirable carrier transport performance. CN110437208A discloses a 1,3-dicarbazole benzene phosphorescent host material, its synthesis method and application. Such phosphorescent host material contains a fixed structural unit of N, N'-dicarbazolyl-1,3-benzene, which has a relatively high glass transition temperature and desirable electron hole transport ability and can be used as a blue phosphorescent bipolar host material. CN107311978A discloses a phosphorescent host material, its preparation method, and an organic light emitting device fabricated using such host material. The phosphorescent host material is a fluorene compound containing a pyridyl group and a carbazole group, which may have the characteristics of wide energy gap, high glass transition temperature, and low concentration quenching effect. However, phosphorescent host materials, including the above-mentioned materials, still have various shortcomings in terms of luminescence performance, use stability and processing performance, which may not meet its application requirements as luminescent materials in display devices. The phosphorescent host materials still have significant improvement potential in terms of overall performance improvement and balance.

Therefore, there is a need to develop new types of phosphorescent host materials with desirable performance to meet the use requirements in high-performance OLED devices.

SUMMARY

One aspect of the present disclosure provides an organic compound. The organic compound includes a structure shown in formula I:

formula I

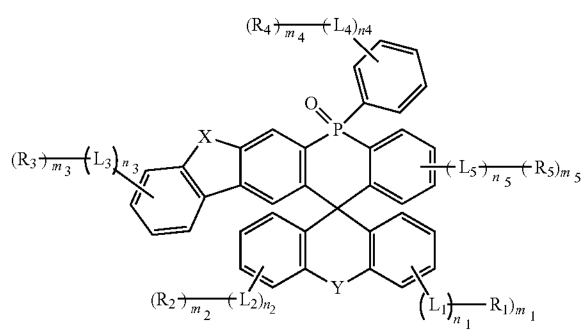

where, X is selected from O, S, N—$R_{N1}$, and $CR_{C1}R_{C2}$; Y is selected from O, S, N—$R_{N2}$, $CR_{C3}R_{C4}$, O═S═O, $SiR_{S1}R_{S2}$, O═P—$Ar_1$, and S═P—$Ar_2$; $R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl; $Ar_1$ and $Ar_2$ are each independently selected from any one of substituted or unsubstituted C6~C40 aryl and substituted or unsubstituted C3~C40 heteroaryl; $L_1$, $L_2$, $L_3$, $L_4$, and $L_5$ are each independently selected from any one of a single bond, substituted or unsubstituted C6~C40 arylene, and substituted or unsubstituted C3~C40 heteroarylene; $R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

Another aspect of the present disclosure provides an electroluminescent material including an organic compound. The organic compound includes a structure shown in formula I:

formula I

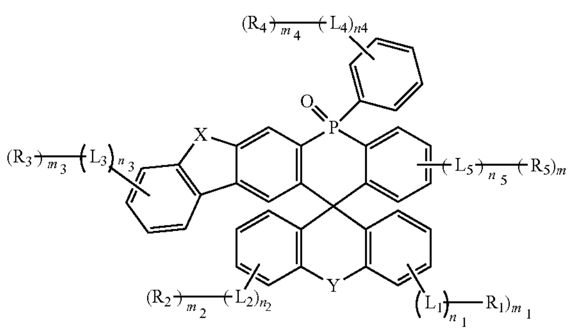

where, X is selected from O, S, N—$R_{N1}$, and $CR_{C1}R_{C2}$; Y is selected from O, S, N—$R_{N2}$, $CR_{C3}R_{C4}$, O═S═O, $SiR_{S1}R_{S2}$, O═P—$Ar_1$, and S═P—$Ar_2$, $R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl; $Ar_1$ and $Ar_2$ are each independently selected from any one of substituted or unsubstituted C6~C40 aryl and substituted or unsubstituted C3~C40 heteroaryl; $L_1$, $L_2$, $L_3$, $L_4$, and $L_5$ are each independently selected from any one of a single bond, substituted or unsubstituted C6~C40 arylene, and substituted or unsubstituted C3~C40 heteroarylene; $R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

Another aspect of the present disclosure provides a display panel including an organic light-emitting diode (OLED) device. The OLED device includes an anode, a cathode, and an organic thin-film layer between the anode and the cathode. The material of the organic thin-film layer includes an electroluminescent material including an organic compound. The organic compound includes a structure shown in formula I:

formula I

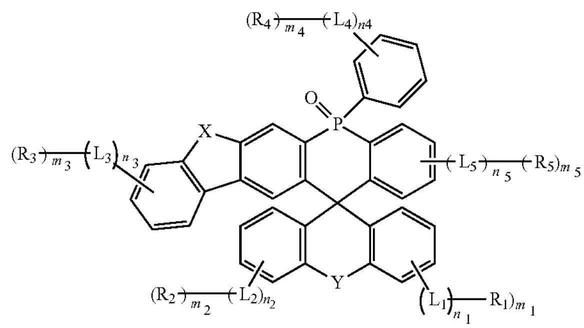

where, X is selected from O, S, N—$R_{N1}$, and $CR_{C1}R_{C2}$; Y is selected from O, S, N—$R_{N2}$, $CR_{C3}R_{C4}$, O═S═O, $SiR_{S1}R_{S2}$, O═P—$Ar_1$, and S═P—$Ar_2$; $R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl; $Ar_1$ and $Ar_2$ are each independently selected from any one of substituted or unsubstituted C6~C40 aryl and substituted or unsubstituted C3~C40 heteroaryl; $L_1$, $L_2$, $L_3$, $L_4$, and $L_5$ are each independently selected from any one of a single bond, substituted or unsubstituted C6~C40 arylene, and substituted or unsubstituted C3~C40 heteroarylene; $R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

Another aspect of the present disclosure provides an electronic device including the display panel as described above.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

FIG. 1 illustrates a structural schematic of an organic light-emitting diode (OLED) device according to various embodiments of the present disclosure.

DETAILED DESCRIPTION

The technical solutions of the present disclosure are further explained through implementation manners below. It should be understood by those skilled in the art that the embodiments are merely to help understand the present disclosure and should not be regarded as limitations to the present disclosure.

Various embodiments of the present disclosure are described in detail with reference to the drawings. It should be noted that the relative arrangement of components and steps, numerical expressions, and numerical values set forth in the embodiments may not limit the scope of the present disclosure unless specifically stated otherwise.

Techniques, methods and equipment known to those skilled in the art may not be discussed in detail, but where appropriate, the techniques, methods and equipment should be considered as a part of the specification.

In all exemplary embodiments shown and discussed herein, any specific values should be interpreted as merely exemplary and not limiting. Therefore, other examples of the exemplary embodiments may have different values.

It should be noted that similar reference numerals and letters indicate similar items in the following drawings. Therefore, once an item is defined in one drawing, there is no need to discuss it further in subsequent drawings.

The first objective of the present disclosure is to provide an organic compound having a structure as shown in formula I:

formula I

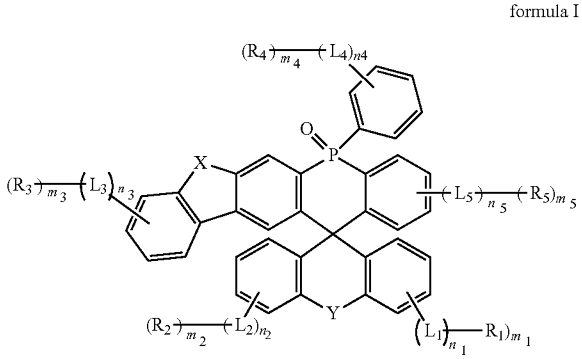

In formula I, X is selected from O, S, N—$R_{N1}$, and $CR_{C1}R_{C2}$.

In formula I, Y is selected from O, S, N—$R_{N2}$, $CR_{C3}R_{C4}$, O═S═O, $SiR_{S1}R_{S2}$, O═P—$Ar_1$, and S═P—$Ar_2$.

$R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl.

$Ar_1$ and $Ar_2$ are each independently selected from any one of substituted or unsubstituted C6~C40 aryl and substituted or unsubstituted C3~C40 heteroaryl.

In formula I, $L_1$, $L_2$, $L_3$, $L_4$, and $L_5$ are each independently selected from any one of a single bond, substituted or unsubstituted C6~C40 arylene, and substituted or unsubstituted C3~C40 heteroarylene. "$L_1$ is a single bond" means that $R_1$ is directly connected to the benzene ring. Similarly, when $L_2$, $L_3$, $L_4$, and $L_5$ are single bonds, $R_2$, $R_3$, $R_4$, and $R_5$ are directly connected to the benzene ring.

In Formula I, $R_1$, $R_2$, $R_3$, $R_4$, and $R_5$ are each independently selected from any one of deuterium, substituted or unsubstituted C1-C20 linear or branched alkyl, substituted or unsubstituted C1~C20 alkoxy, substituted or Unsubstituted C1~C20 alkylthio, substituted or unsubstituted C3~C20 cycloalkyl, substituted or unsubstituted C6~C40 aryl, substituted or unsubstituted C3~C40 heteroaryl, substituted or unsubstituted C6~C40 arylamino.

In formula I, $n_1$, $n_2$, $n_3$, $n_4$, $n_5$, $m_1$, $m_2$, $m_3$, $m_4$, and $m_5$ are integers each independently selected from 0-2, such as 0, 1, or 2.

In the present disclosure, C1~C20 may each independently be C2, C3, C4, C5, C6, C8, C10, C11, C13, C15, C17, C19, C20, or the like.

The C6 to C40 may each independently be C6, C8, C10, C12, C13, C14, C15, C16, C18, C20, C22, C24, C26, C28, C30, C32, C34, C36, C38, or the like.

The C3~C40 may each independently be C4, C5, C6, C8, C10, C12, C13, C14, C15, C16, C18, C20, C22, C24, C26, C28, C30, C32, C34, C36, C38, or the like.

The C3~C20 may each independently be C4, C5, C6, C8, C10, C11, C13, C15, C17, C19, C20, or the like.

The organic compound provided by the present disclosure is a small organic molecule compound having the structure shown in formula I. The core of the organic compound contains a spiro structure and is connected with both linking groups $L_1$-$L_5$ and specific substituents $R_1$-$R_5$ which enable the organic compound to have bipolar or unipolar characteristics, thereby being used as a host material to effectively transfer energy to the guest and further enhance the luminous efficiency. Moreover, the spiro structure in the core of the organic compound imparts the twisting characteristics of its molecular structure, which can effectively reduce the intermolecular force and avoid material stacking. Therefore, the organic compound has low molecular crystallinity, which may be beneficial for obtaining desirable film stability to improve the stability and lifetime of the devices. The organic compound has a relatively high triplet energy level and glass transition temperature Tg through the special design of the molecular structure, which may effectively transfer energy to the object and prevent energy return, thereby being beneficial for improving the efficiency of the devices. The high Tg may also make the compound easier to form an amorphous film, which may be beneficial for improving the stability of the devices.

The organic compound provided by the present disclosure can be used in the emission layer, electron transport layer or hole blocking layer of OLED devices through the design of molecular structure and the selection of substituents, which is particularly suitable for being used as the phosphorescent host material in the emission layer, thereby achieving significant improvement in the luminous efficiency and lifetime of the devices.

In one embodiment, the substituent in each of the substituted linear or branched alkyl, substituted aryl, substituted heteroaryl, substituted arylene, substituted heteroarylene, substituted alkoxy, substituted alkylthio, substituted cycloalkyl, and substituted arylamino is independently selected from at least one of deuterium, cyano, halogen, unsubstituted or unhalogenated C1~C10 (e.g., C2, C3, C4, C5, C6, C7, C8 or C9) straight or branched alkyl, C1~C10 (e.g., C2, C3, C4, C5, C6, C7, C8 or C9) alkoxy, C1~C10 (e.g., C2, C3, C4, C5, C6, C7, C8 or C9) alkylthio, C6~C20 (e.g., C6, C9, C10, C12, C14, C16, C18, or the like) aryl, C2-C20 (e.g., C3, C4, C5, C6, C8, C10, C12, C14, C16, C18, or the like) heteroaryl, or C6~C18 (e.g., C6, C9, C10, C12, C14, C16, C18, or the like) arylamino.

In the present disclosure, the halogen may include fluorine, chlorine, bromine or iodine, which may have the same meaning in following same description.

In one embodiment, $L_1$, $L_2$, $L_3$, $L_4$, and $L_5$ may be each independently selected from any one of a single bond, phenylene, biphenylene, naphthylene, or C3~C12 nitrogen-containing heteroarylene.

The C3~C12 nitrogen-containing heteroarylene may include nitrogen-containing heteroarylene containing C3, C4, C5, C6, C8, C10 or C12, which may exemplarily include, but may not be limited to, pyrrolylene, pyridylene, imidazolylidene, indolylene, carbazolylidene, quinolinylene or isoquinolinylene, and the like.

In one embodiment, the $R_1$ and $R_2$ may be each independently selected from any one of the following groups:

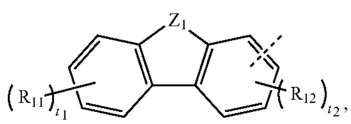

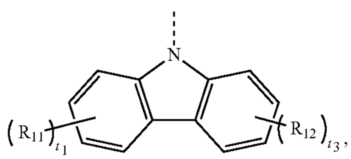

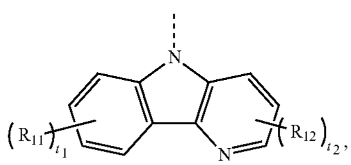

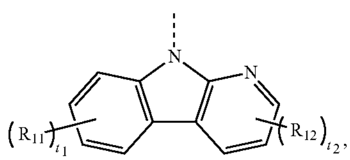

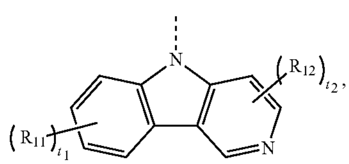

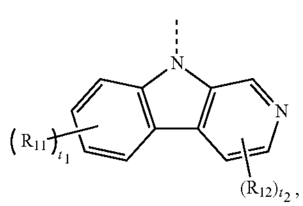

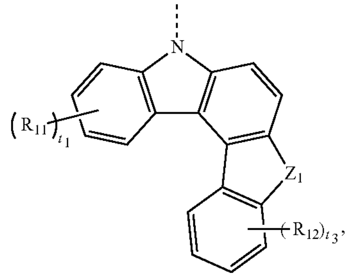

-continued

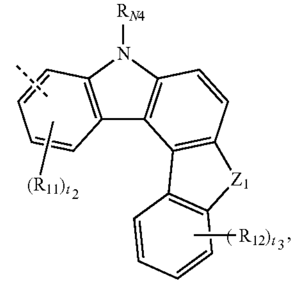

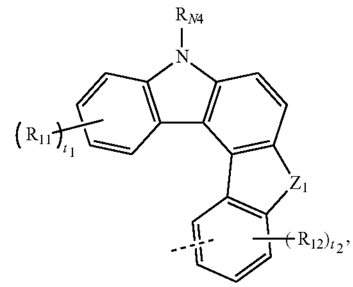

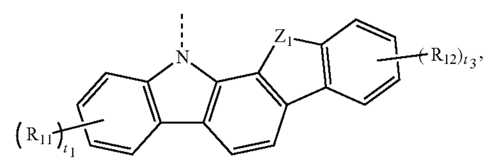

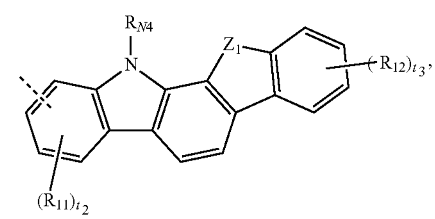

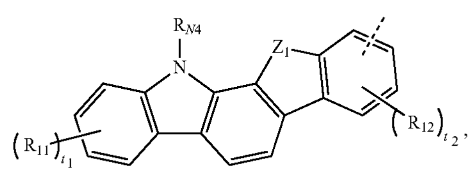

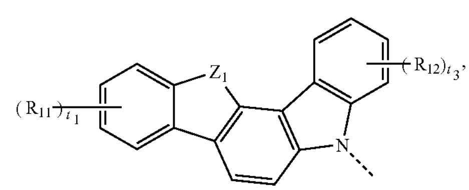

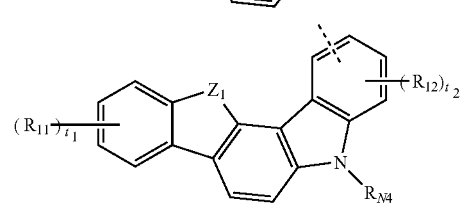

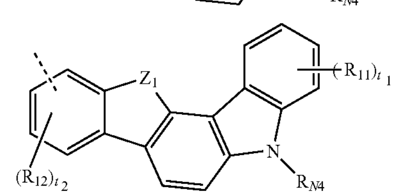

-continued

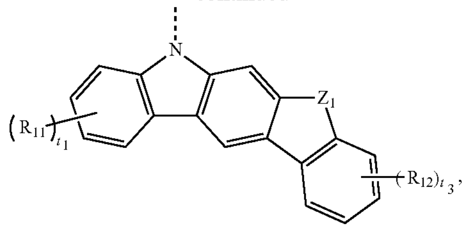

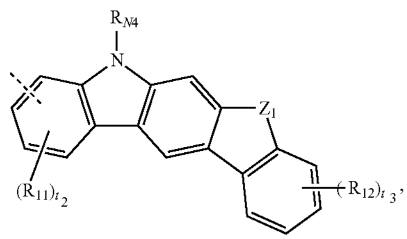

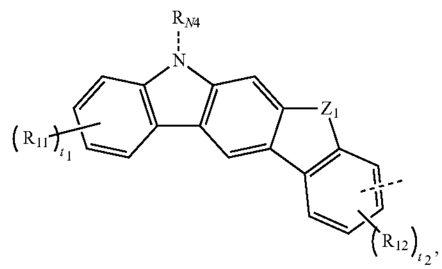

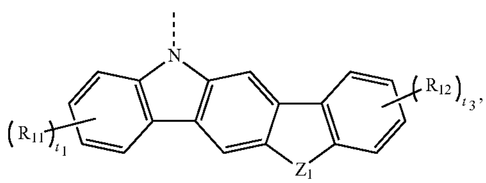

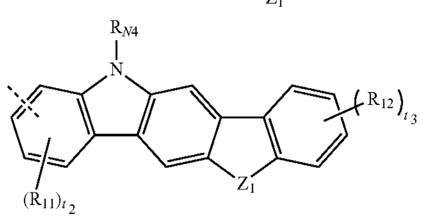

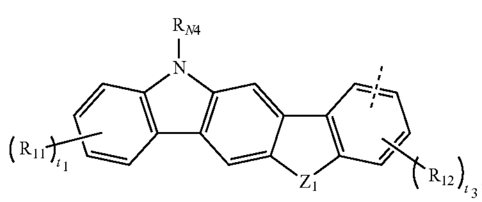

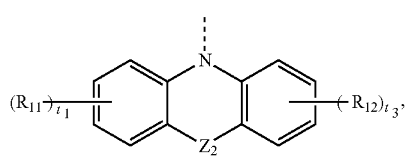

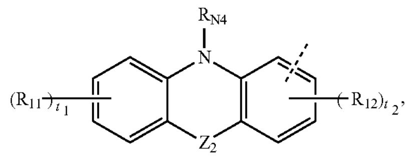

-continued

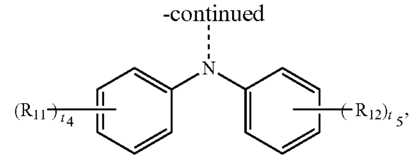

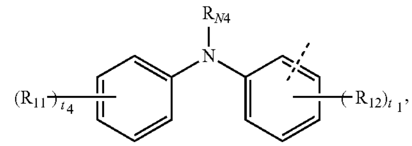

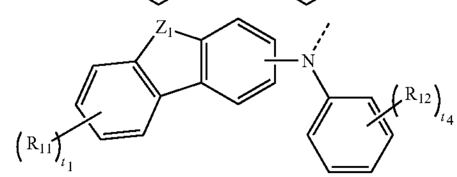

where, the dashed line denotes a connecting point of a group.

$Z_1$ and $Z_2$ are each independently selected from O, S, N—$R_{N3}$, $CR_{C5}R_{C6}$, or $SiR_{S3}R_{S4}$.

$R_{N3}$, $R_{N4}$, $R_{C5}$, $R_{C6}$, $R_{S3}$, $R_{S4}$ are each independently selected from any one of hydrogen, deuterium, unsubstituted or Rx1 substituted C1~C20 linear or branched alkyl, unsubstituted or Rx1 substituted C6~C40 aryl, unsubstituted or Rx1 substituted C3~C40 heteroaryl. $R_{C5}$ and $R_{C6}$ are not connected or connected to form a ring through chemical bonds.

The C1~C20 linear or branched alkyl may be C2, C3, C4, C5, C6, C8, C10, C11, C13, C15, C17, C19 or C20 linear or branched alkyl, which may exemplarily include, but may not be limited to, methyl, ethyl, n-propyl, isopropyl, n-butyl, isobutyl, tert-butyl, n-pentyl, isopentyl, hexyl or heptyl, and the like.

The C6~C40 aryl may be C6, C8, C10, C12, C13, C14, C15, C16, C18, C20, C22, C24, C26, C28, C30, C32, C34, C36 or C38 aryl, which may exemplarily include, but may not be limited to, phenyl, biphenyl, terphenyl, naphthyl, anthracenyl, phenanthryl, fluorenyl, pyrenyl, perylene, triphenylene, triphenylene, fluoranthene, or fluoranthene.

The C3~C40 heteroaryl may be C4, C5, C6, C8, C10, C12, C13, C14, C15, C16, C18, C20, C22, C24, C26, C28, C30, C32, C34, C36 or C38 and other heteroaryl, and heteroatoms may include N, O, S, B, Si, and/or the like. The C3~C40 heteroaryl may exemplarily include, but may not be limited to, pyrrolyl, imidazolyl, pyridyl, pyrazinyl, pyrimidinyl, pyridazinyl, triazinyl, quinolinyl, isoquinolinyl, benzopyrazinyl, benzopyridinyl Azinyl, benzopyrimidinyl, pyridopyridyl, pyridopyrazinyl, indolyl, carbazolyl, furanyl, thienyl, benzofuranyl, benzothienyl, dibenzofuranyl, two benzothienyl, phenothiazinyl, phenoxazinyl, acridinyl or hydrogenated acridinyl, and the like.

$R_{11}$, $R_{12}$, and $R_{x1}$ are each independently selected from any one of deuterium, halogen, C1~C10 (e.g., C2, C3, C4, C5, C6, C7, C8 or C9) linear or branched alkyl, C1~C10 (e.g., C2, C3, C4, C5, C6, C7, C8 or C9) alkoxy, C1~C10 (e.g., C2, C3, C4, C5, C6, C7, C8 or C9) alkylthio, C6~C20 (e.g., C6, C9, C10, C12, C14, C16, C18, and the like) aryl, C2-C20 (e.g., C3, C4, C5, C6, C8, C10, C12, C14, C16, C18, and the like) heteroaryl or C6~C18 (e.g., C6, C9, C10, C12, C14, C16, C18, and the like) arylamino.

$t_1$ and $t_3$ are integers each independently selected from 0-4, such as 0, 1, 2, 3, or 4.

$t_2$ is an integer selected from 0-3, such as 0, 1, 2 or 3.

$t_4$ and $t_5$ are integers each independently selected from 0-5, such as 0, 1, 2, 3, 4, or 5.
In one embodiment, $R_1$ and $R_2$ are each independently selected from any one of the following groups, or any one of the following groups substituted by one or more substituents:
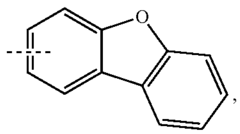
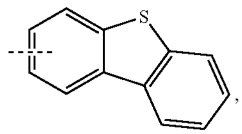
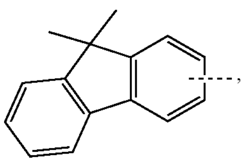
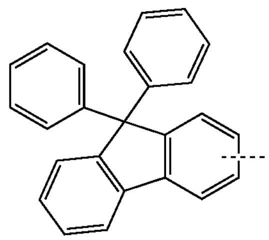
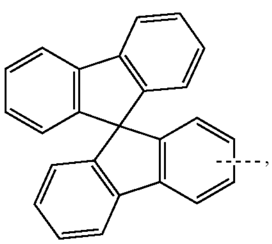
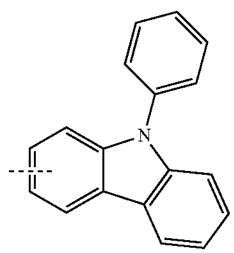
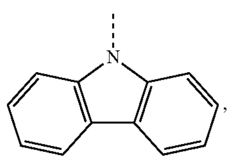
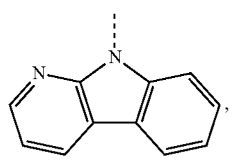
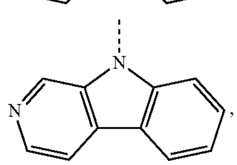
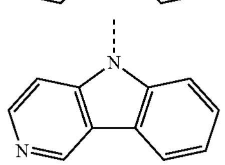
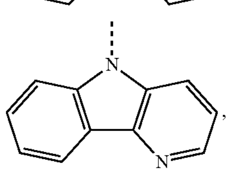
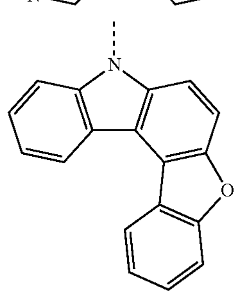
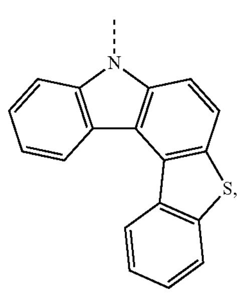
-continued
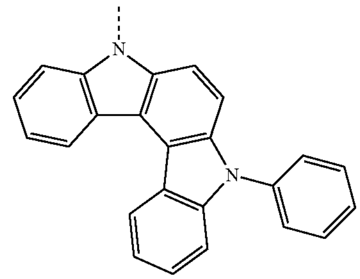
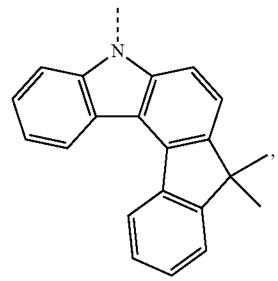
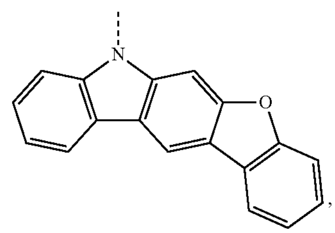
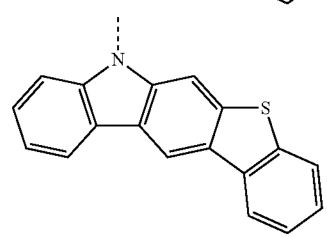
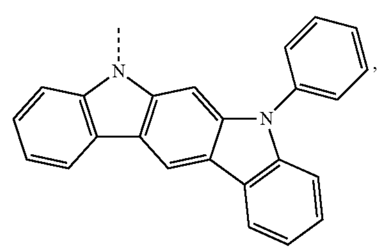
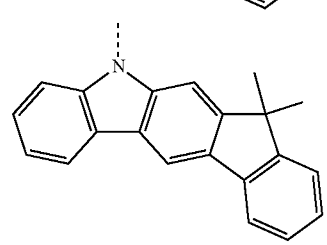
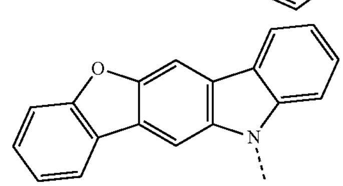

-continued
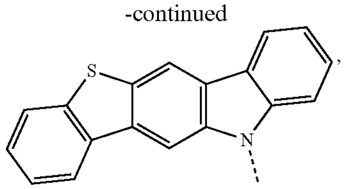
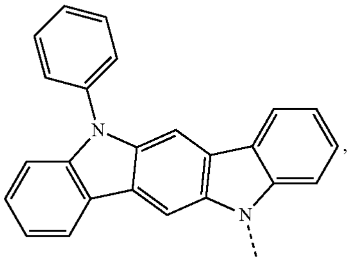
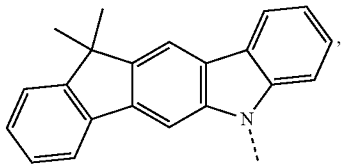
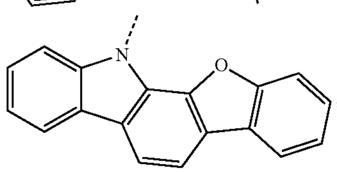
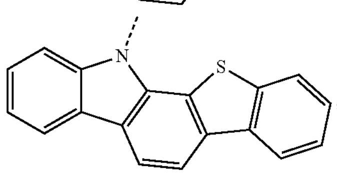
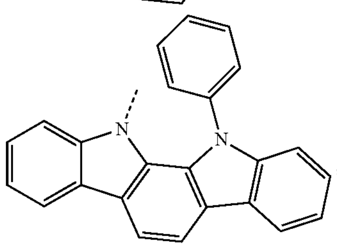
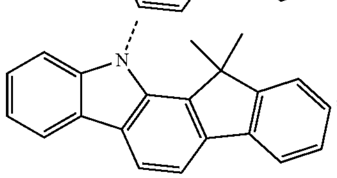
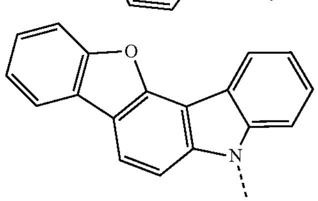
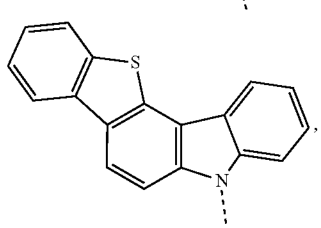
-continued
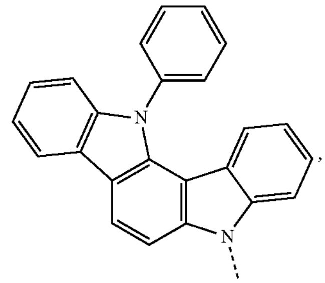
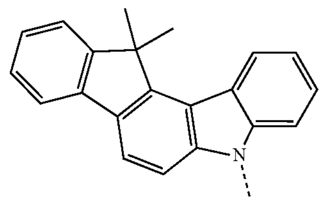
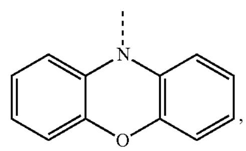
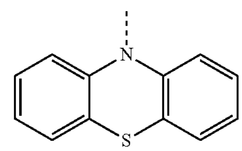
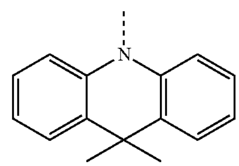
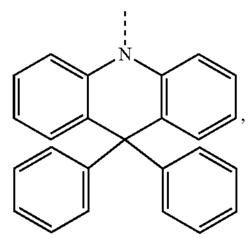
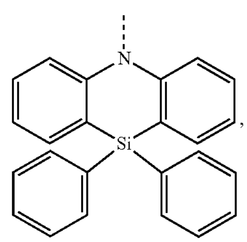
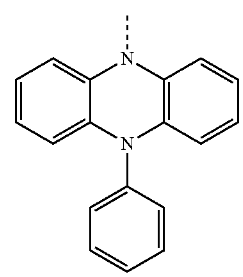
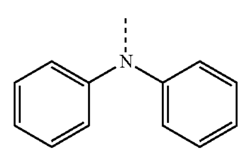
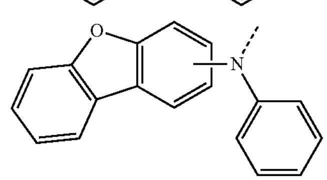
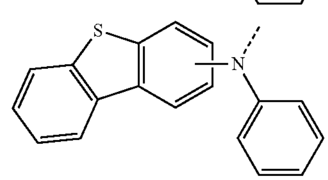

-continued

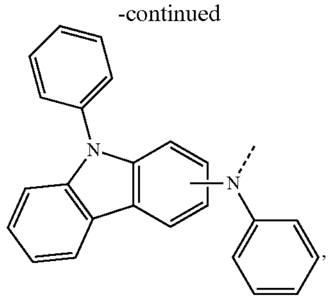

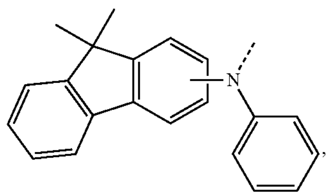

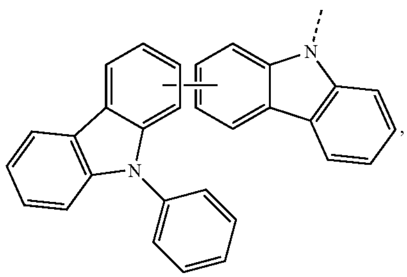

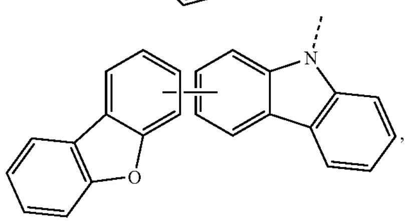

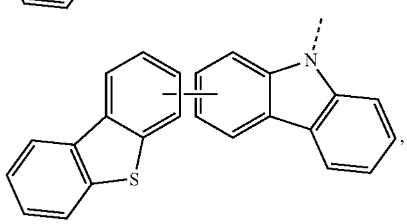

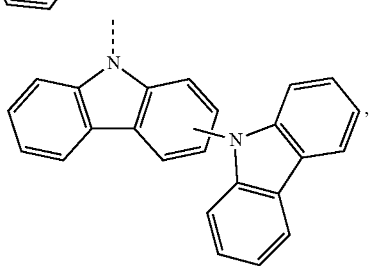

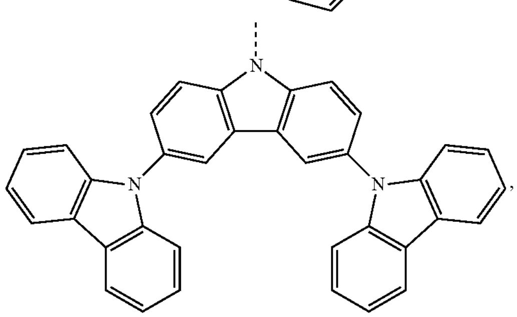

-continued

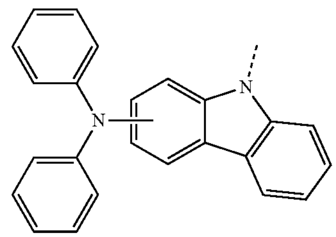

where, the dashed line denotes a connecting point of a group.

The substituents are each independently selected from at least one of deuterium, C1~C10 (e.g., C2, C3, C4, C5, C6, C7, C8 or C9) straight or branched alkyl, C1~C10 (e.g., C2, C3, C4, C5, C6, C7, C8 or C9) alkoxy, C1~C10 (e.g., C2, C3, C4, C5, C6, C7, C8 or C9) alkylthio, C6~C20 (e.g., C6, C9, C10, C12, C14, C16, C18, or the like) aryl, C2-C20 (e.g., C3, C4, C5, C6, C8, C10, C12, C14, C16, C18, or the like) heteroaryl, or C6~C18 (e.g., C6, C9, C10, C12, C14, C16, C18, or the like) arylamino.

In one embodiment, the $R_1$ and $R_2$ are each independently selected from any one of the following groups:

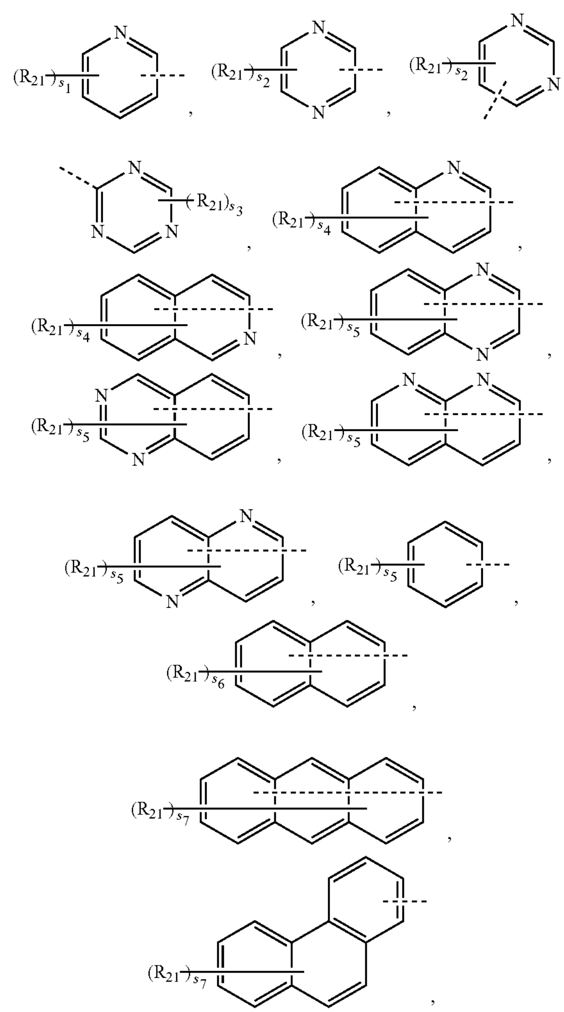

-continued

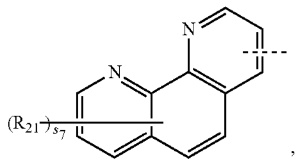

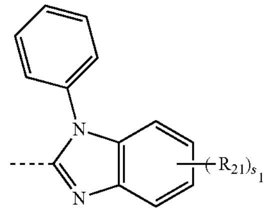

where, the dashed line denotes a connecting point of a group.

Each $R_{21}$ is independently selected from any one of deuterium, cyano, halogen, unsubstituted or unhalogenated C1~C10 (e.g., C2, C3, C4, C5, C6, C7, C8 or C9) straight or branched alkyl, C1~C10 (e.g., C2, C3, C4, C5, C6, C7, C8 or C9) alkoxy, C1~C10 (e.g., C2, C3, C4, C5, C6, C7, C8 or C9) alkylthio, C6~C20 (e.g., C6, C9, C10, C12, C14, C16, C18, or the like) aryl, C2-C20 (e.g., C3, C4, C5, C6, C8, C10, C12, C14, C16, C18, or the like) heteroaryl, or C6~C18 (e.g., C6, C9, C10, C12, C14, C16, C18, or the like) arylamino.

$s_1$ is an integer selected from 0 to 4, such as 0, 1, 2, 3, or 4; $s_2$ is an integer selected from 0 to 3, such as 0, 1, 2 or 3; $s_3$ is an integer selected from 0 to 2, such as 0, 1 or 2; $s_4$ is an integer selected from 0 to 6, such as 0, 1, 2, 3, 4, 5 or 6; $s_5$ is an integer selected from 0 to 5, such as 0, 1, 2, 3, 4 or 5; $s_6$ is an integer selected from 0 to 7, such as 0, 1, 2, 3, 4, 5, 6 or 7; $s_7$ is an integer selected from 0 to 9, such as 0, 1, 2, 3, 4, 5, 6, 7, 8, or 9.

In one embodiment, $R_1$ and $R_2$ are independently selected from any one of the following groups, or any one of the following groups substituted by one or more substituents:

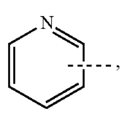
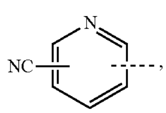
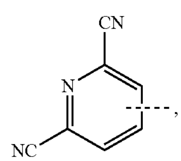

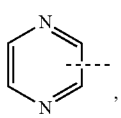
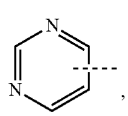
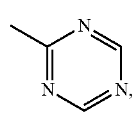

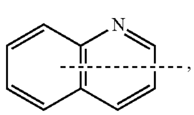
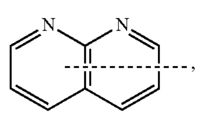

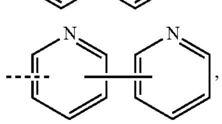
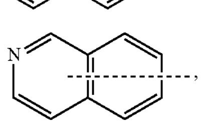

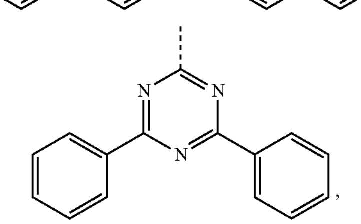

-continued

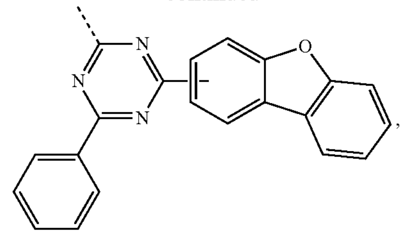

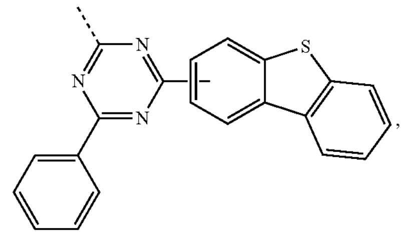

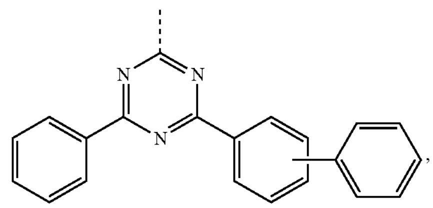

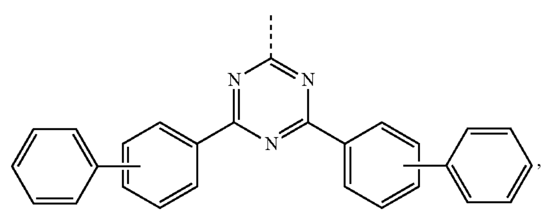

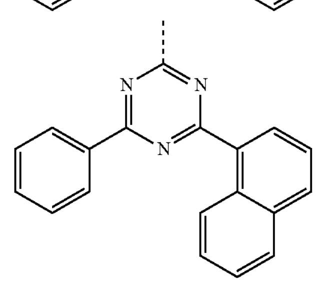

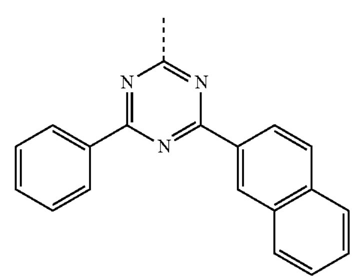

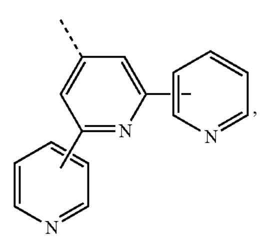
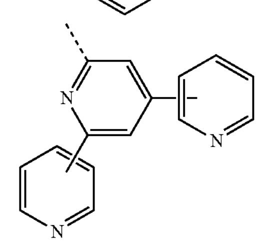

-continued

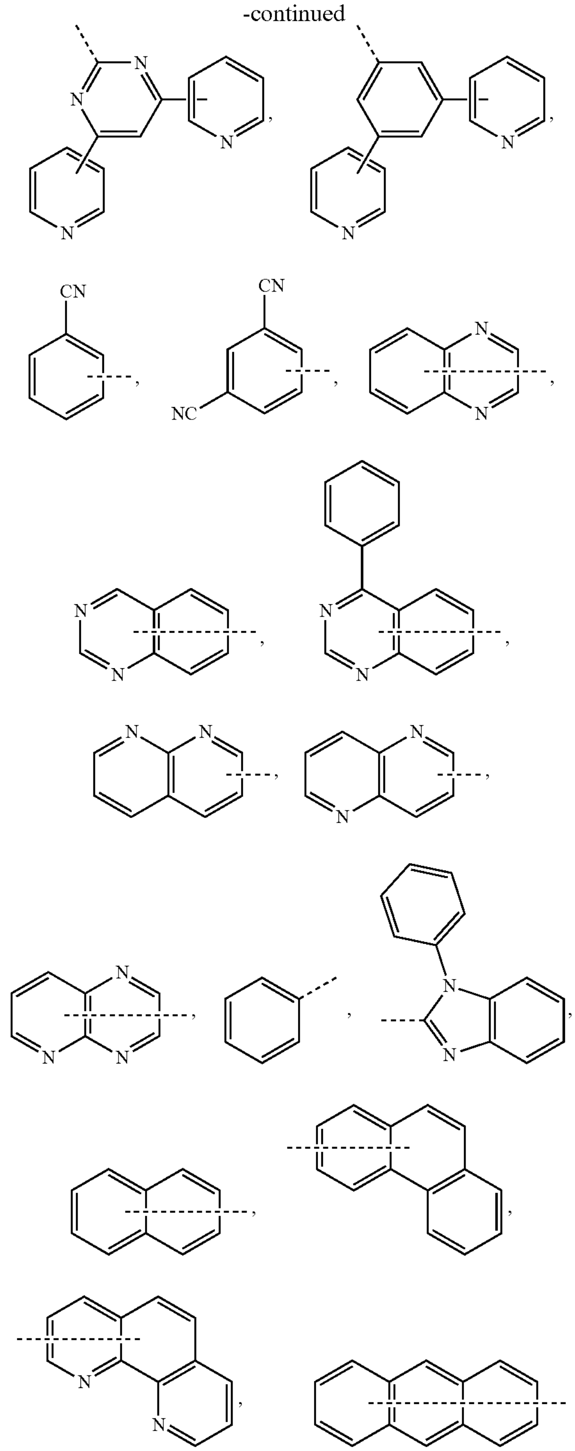

where, the dashed line denotes a connecting point of a group.

The substituents are each independently selected from at least one of deuterium, cyano, halogen, unsubstituted or unhalogenated C1~C10 (e.g., C2, C3, C4, C5, C6, C7, C8 or C9) straight or branched alkyl, C1~C10 (e.g., C2, C3, C4, C5, C6, C7, C8 or C9) alkoxy, C1~C10 (e.g., C2, C3, C4, C5, C6, C7, C8 or C9) alkylthio, C6~C20 (e.g., C6, C9, C10, C12, C14, C16, C18, or the like) aryl, C2-C20 (e.g., C3, C4, C5, C6, C8, C10, C12, C14, C16, C18, or the like) heteroaryl, or C6~C18 (e.g., C6, C9, C10, C12, C14, C16, C18, or the like) arylamino.

In one embodiment, the $R_3$, $R_4$, and $R_5$ are each independently selected from any one of deuterium, unsubstituted or $R_2$ substituted C1~C6 (e.g., C2, C3, C4 or C5) linear or branched alkyl, unsubstituted or Rx2 substituted C6~C12 (e.g., C6, C9, C10, C12, or the like) aryl, unsubstituted or $R_2$ substituted C3~C12 (e.g., C3, C4, C5, C6, C9, C10, C12, or the like) heteroaryl, diphenylamino, C1~C6 (e.g., C2, C3, C4 or C5) alkoxy, or C1~C6 (e.g., C2, C3, C4 or C5) alkylthio.

Each Rx2 is independently selected from any one of deuterium, halogen, cyano, C1~C6 (e.g., C2, C3, C4 or C5) linear or branched alkyl, C6~C12 (e.g., C6, C9, C10, C12, and the like) aryl, C3~C12 (e.g., C3, C4, C5, C6, C9, C10, C12, and the like) heteroaryl, diphenylamino, C1~C6 (e.g., C2, C3, C4 or C5) alkoxy, or C1~C6 (e.g., C2, C3, C4 or C5) alkylthio.

In one embodiment, the X is selected from O and S.

As a preferred embodiment of the present disclosure, the X is selected from O and S. At this point, a stable ring may be formed to fix certain atoms on the molecule, the rotation and twisting of the whole molecule may be reduced, and a stable ring structure may be formed with adjacent groups containing P═O. The stability of the molecule may be higher, which is more beneficial for the device stability after being prepared as OLED devices, thereby obtaining a longer lifetime.

In one embodiment, the Y is selected from O, S, N—$R_{N2}$ and $CR_{C3}R_{C4}$, and more preferably from O, S and N—$R_{N2}$.

As a preferred embodiment of the present disclosure, the Y is selected from O, S and N—$R_{N2}$, which may form a stable spiro structure with the parallel ring structure containing X and P═O. In such way, the rotation and twisting of the whole molecule may be reduced, the stability of the molecule may be higher, and the formed spiro structure may also reduce the stacking of molecules. When Y is N—$R_{N2}$, N—$R_{N2}$ has a certain electron donating ability, such that the skeleton structure has a desirable electron donating ability, which is beneficial for charge transfer.

In one embodiment, the $R_{N2}$, $R_{C3}$, and $R_{C4}$ are each independently selected from any one of substituted or unsubstituted C1~C6 (e.g., C2, C3, C4 or C5) linear or branched alkyl, substituted or unsubstituted C6~C12 (e.g., C6, C9, C10, C12, or the like) aryl, substituted or unsubstituted C3~C12 (e.g., C3, C4, C5, C6, C9, C10, C12, or the like) heteroaryl.

The substituted substituents are each independently selected from any one of deuterium, C1~C6 (e.g., C2, C3, C4 or C5) linear or branched alkyl, C6~C12 (e.g., C6, C9, C10, C12, and the like) aryl, C3~C12 (e.g., C3, C4, C5, C6, C9, C10, C12, and the like) heteroaryl, diphenylamino, C1~C6 (e.g., C2, C3, C4 or C5) alkoxy, or C1~C6 (e.g., C2, C3, C4 or C5) alkylthio.

In one embodiment, the organic compound is selected from any one of the following compounds including M1~M135 and N1~N101:

M1
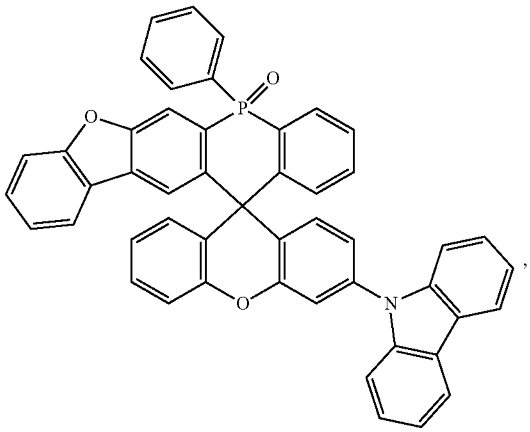
M2
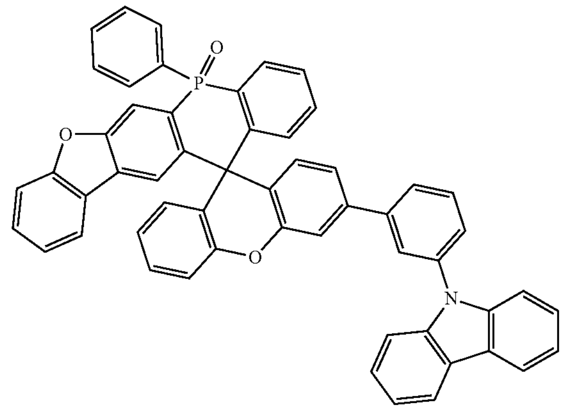
M3
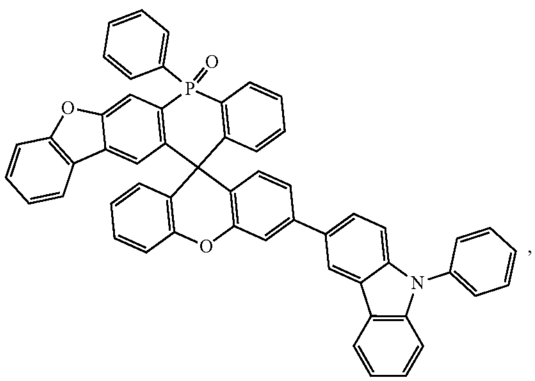
M4
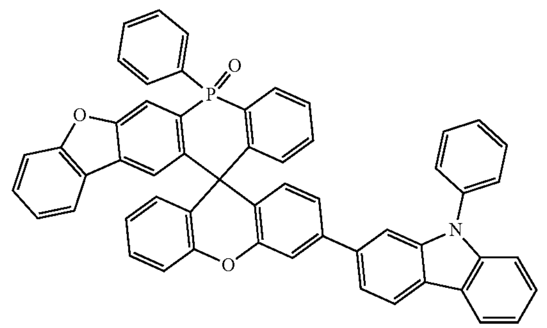
M5
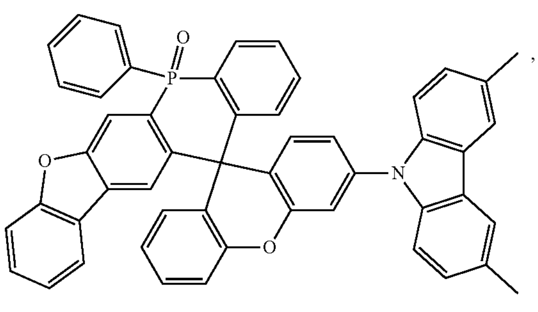
M6
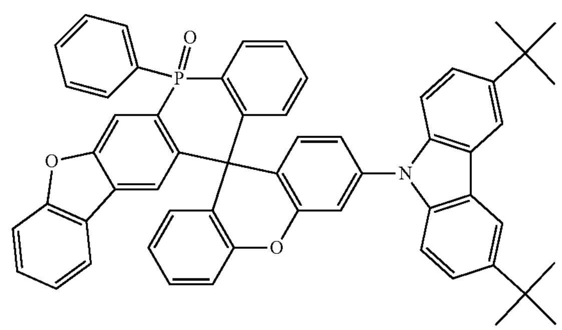
M7
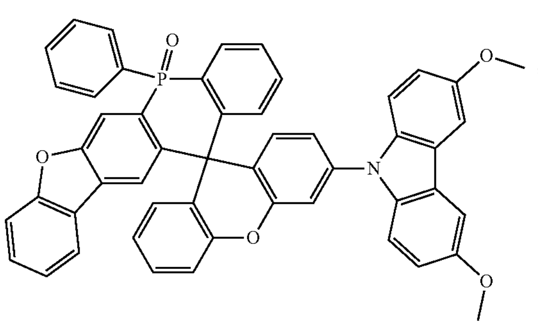
M8
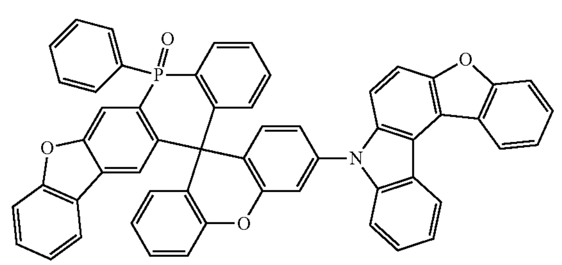

-continued
M9
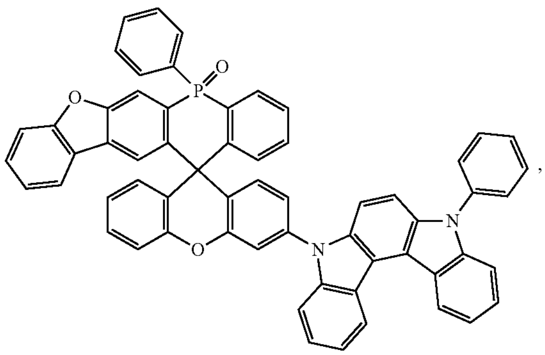
M10
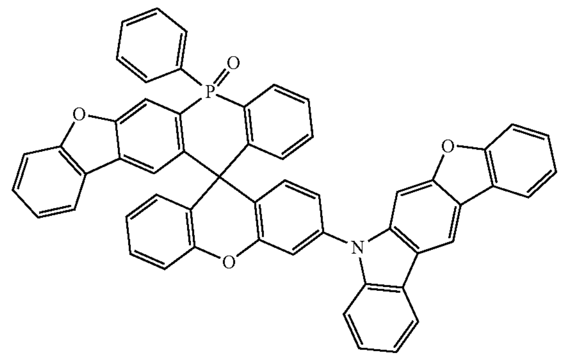
M11
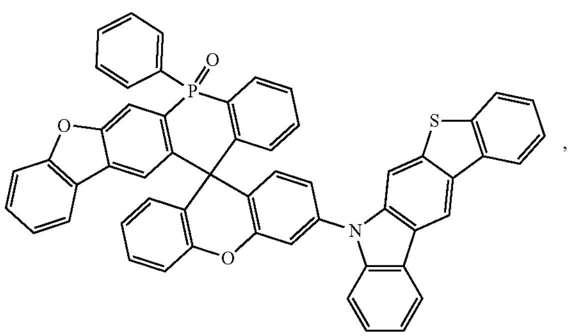
M12
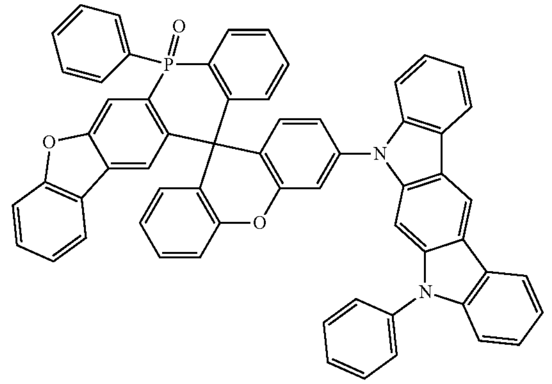
M13
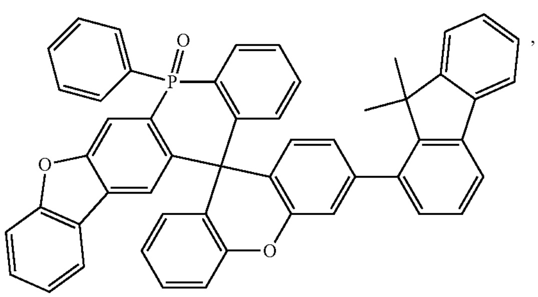
M14
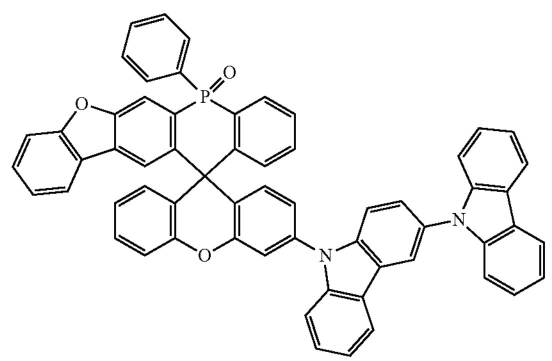
M15
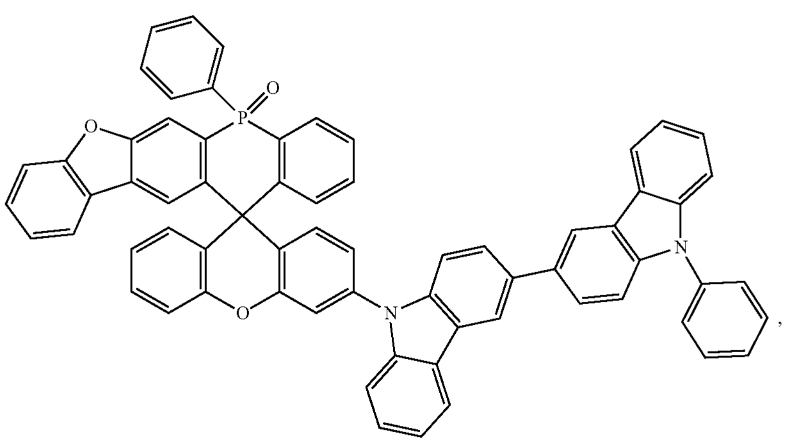

-continued
M16
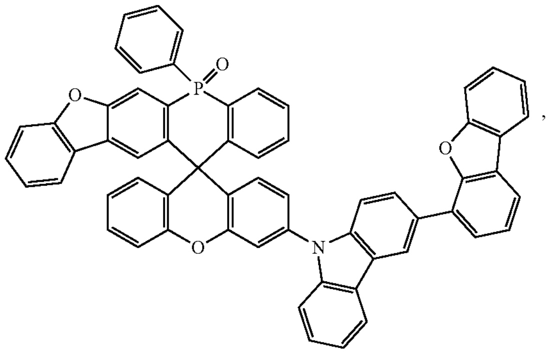
M17
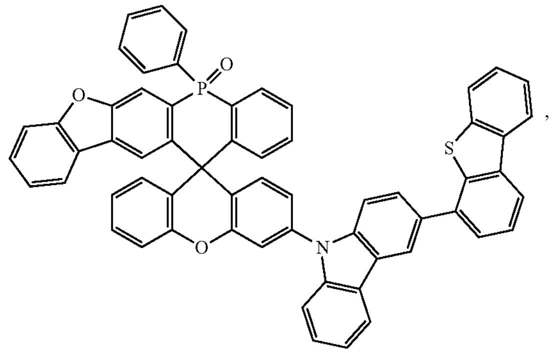
M18
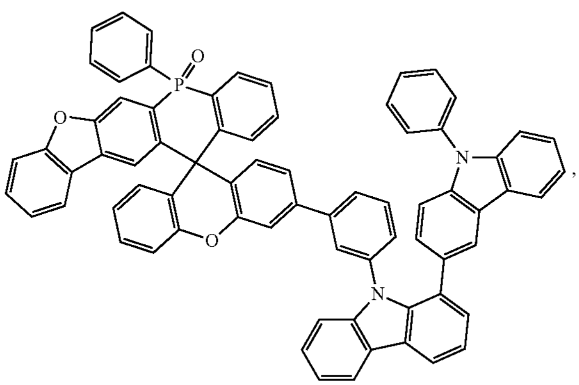
M19
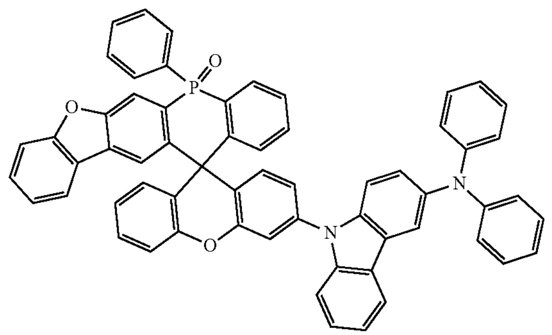
M20
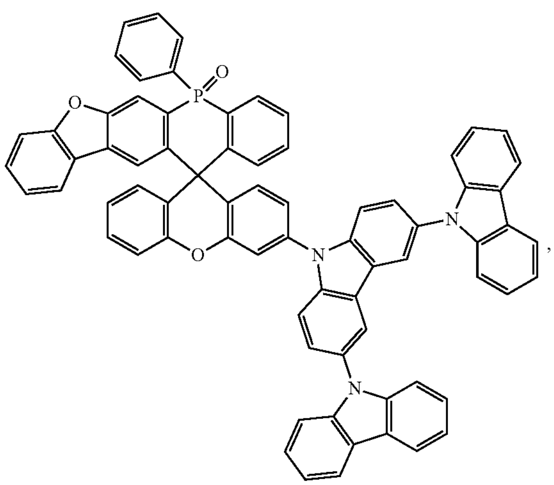
M21
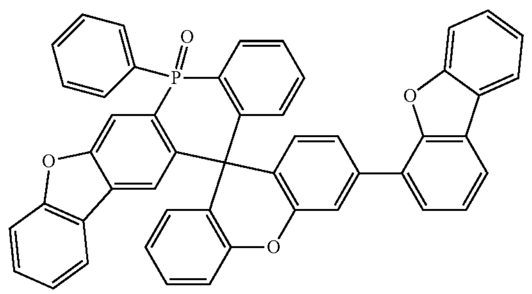
M22
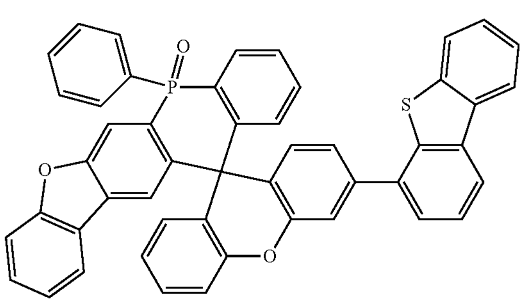
M23
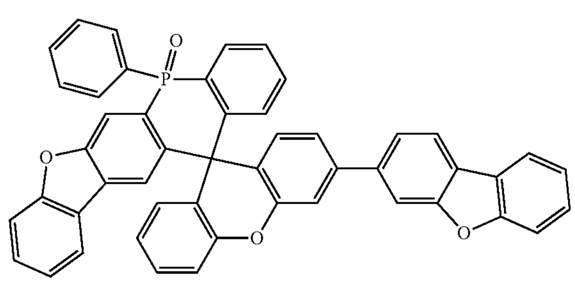

-continued
M24
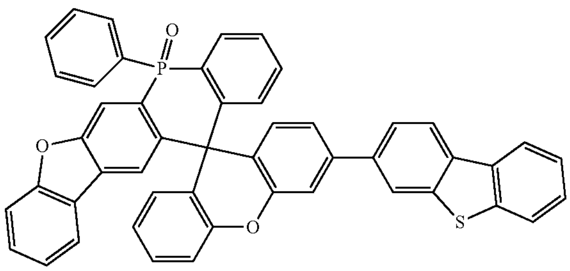
,
M25
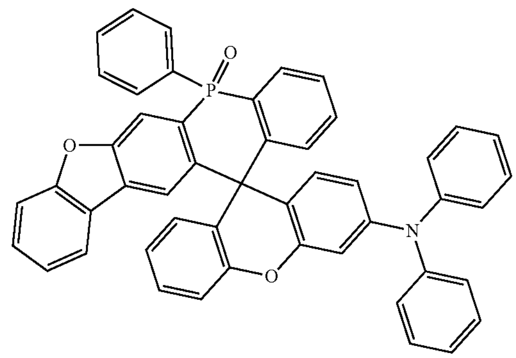
,
M26
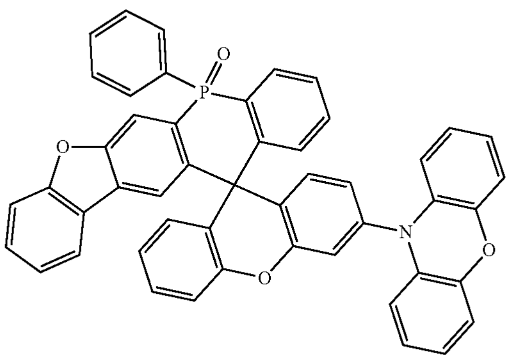
,
M27
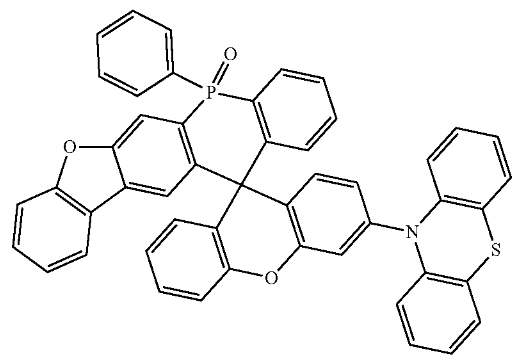
,
M28
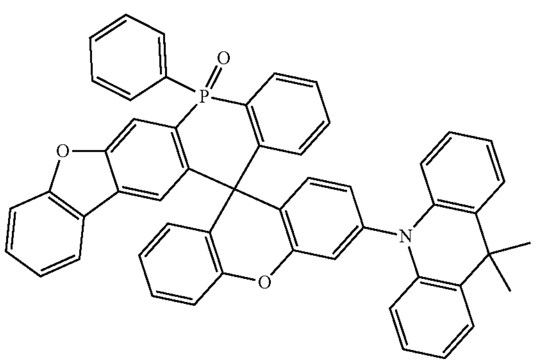
,
M29
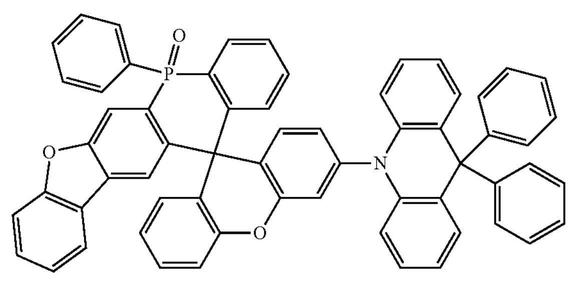
,
M30
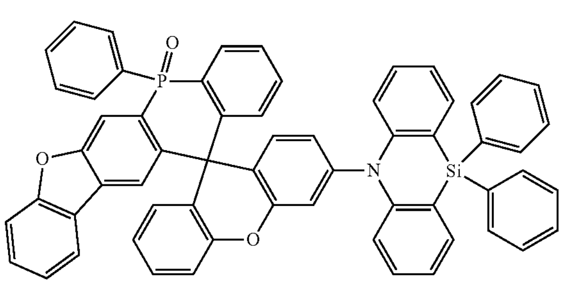
,
M31
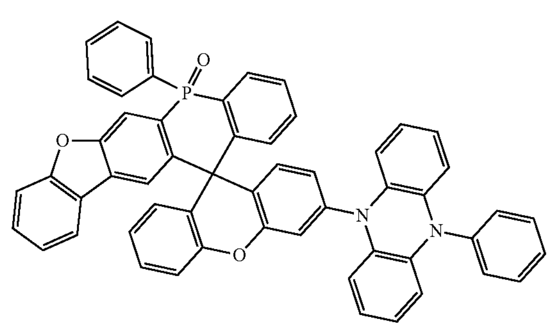
, -continued
M32
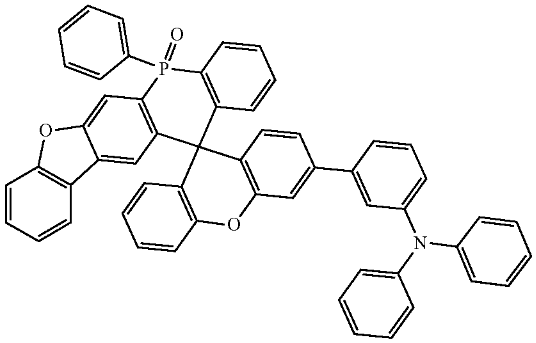
,
M33
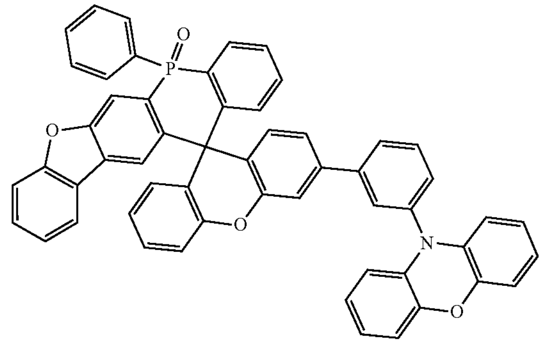
,
M34
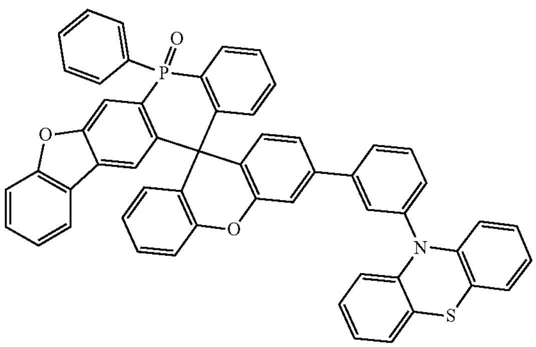
,
M35
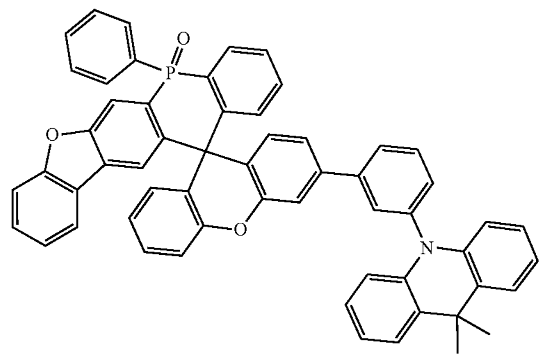
,
M36
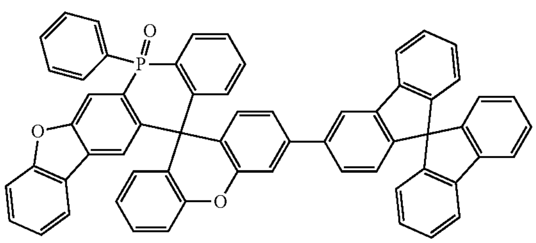
,
M37
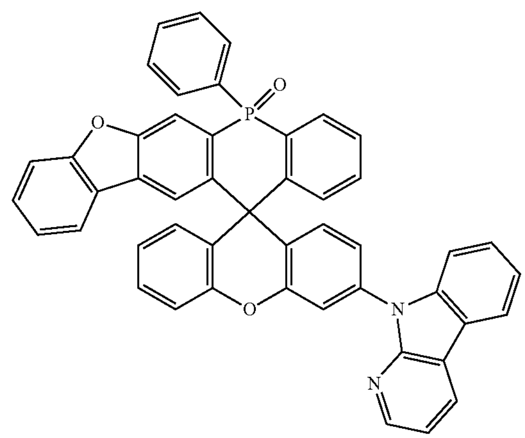
,
M38
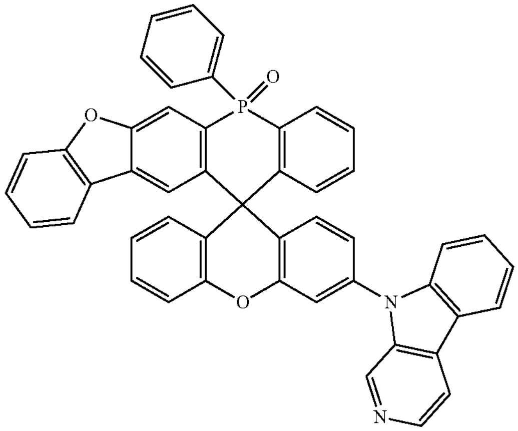
,
M39
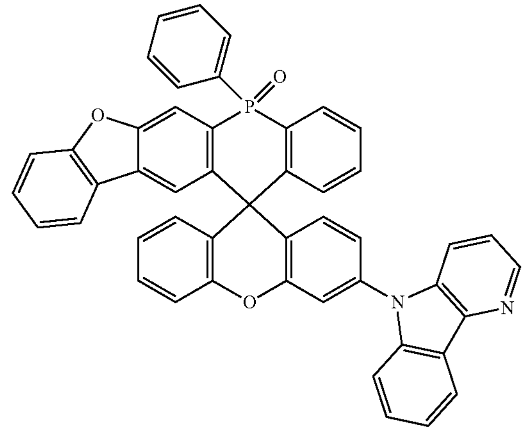
, -continued
M40
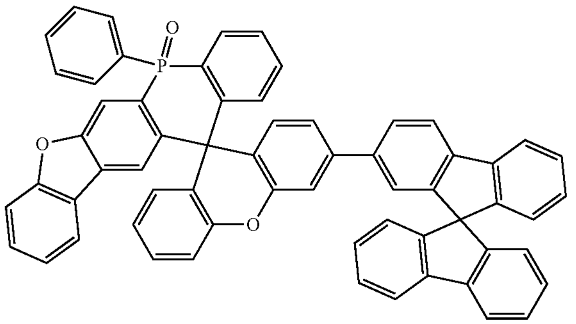
M41
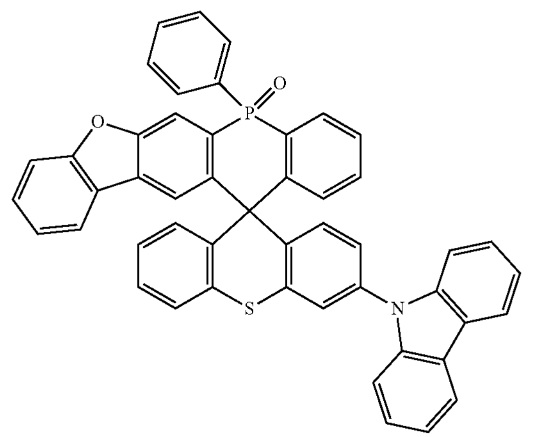
M42
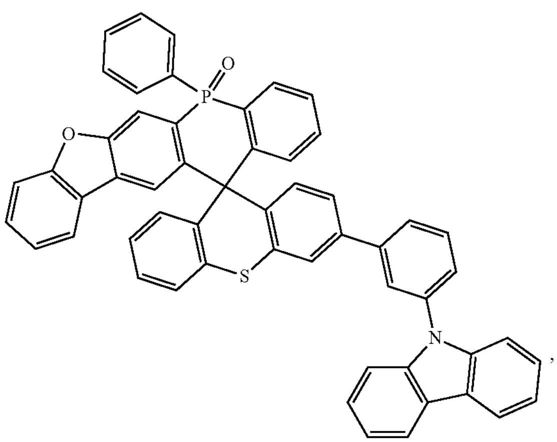
M43
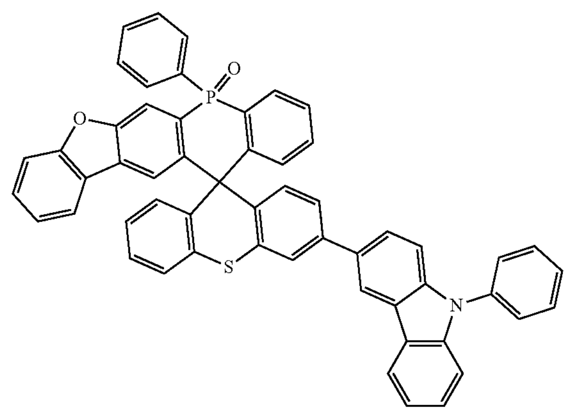
M44
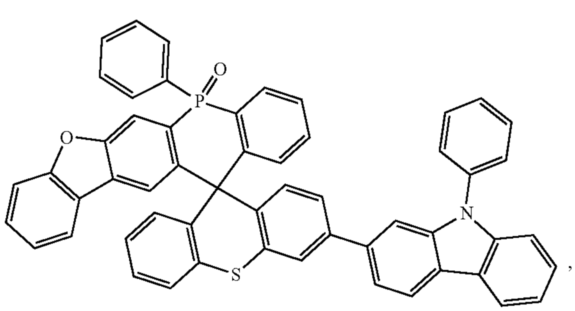
M45
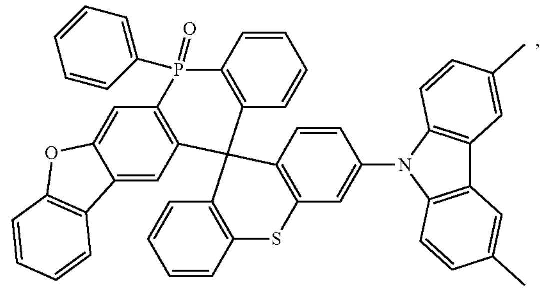
M46
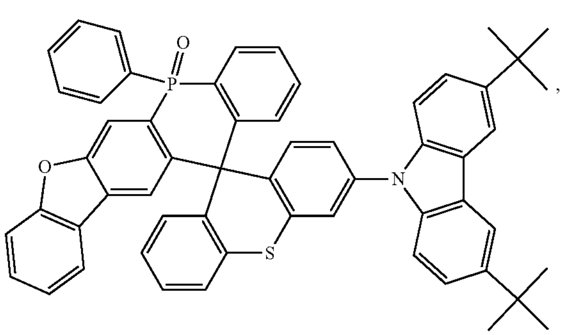
M47
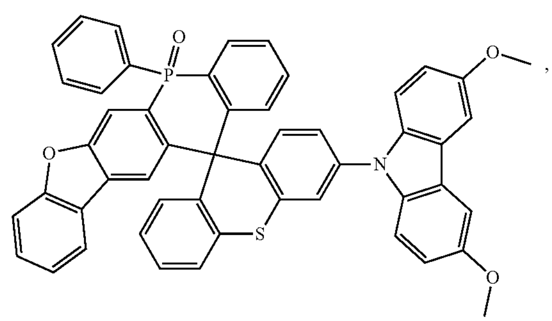

-continued
M48
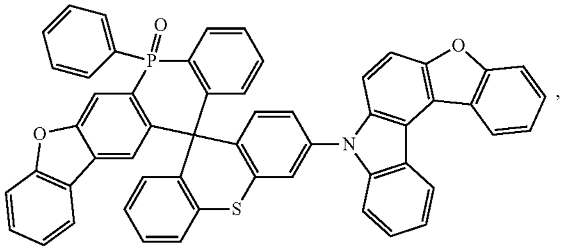
M49
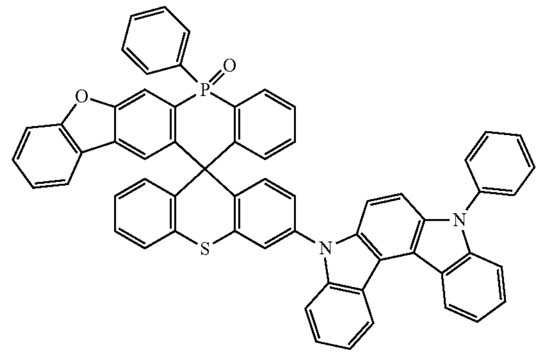
M50
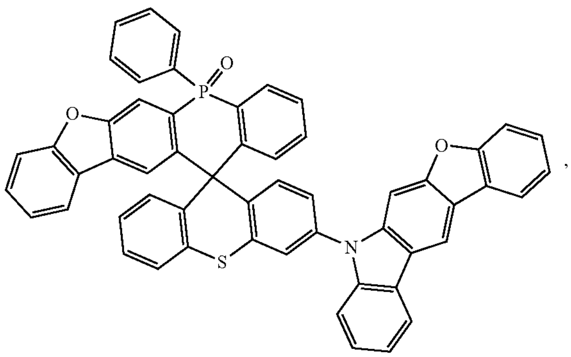
M51
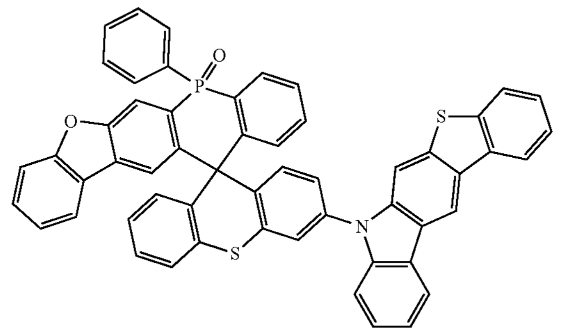
M52
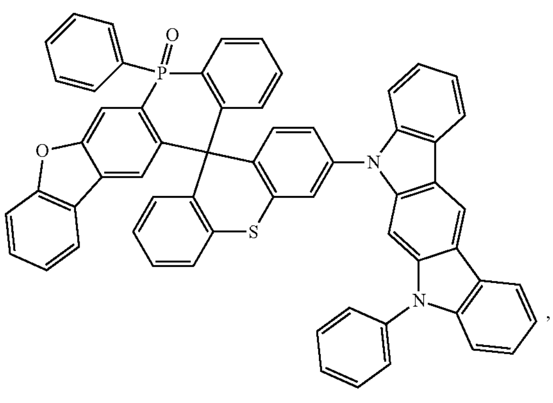
M53
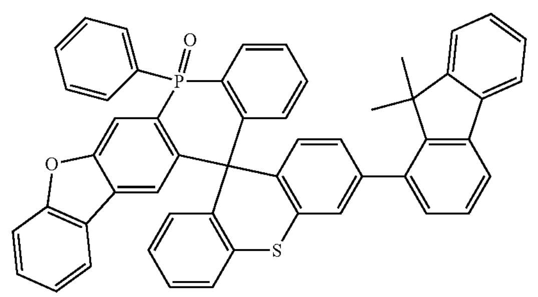
M54
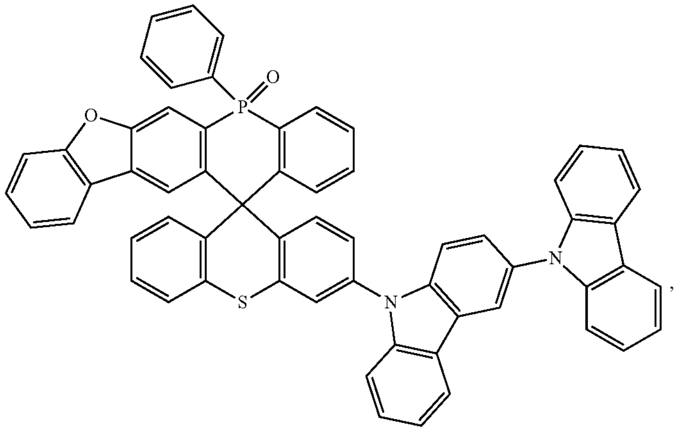

-continued
M55
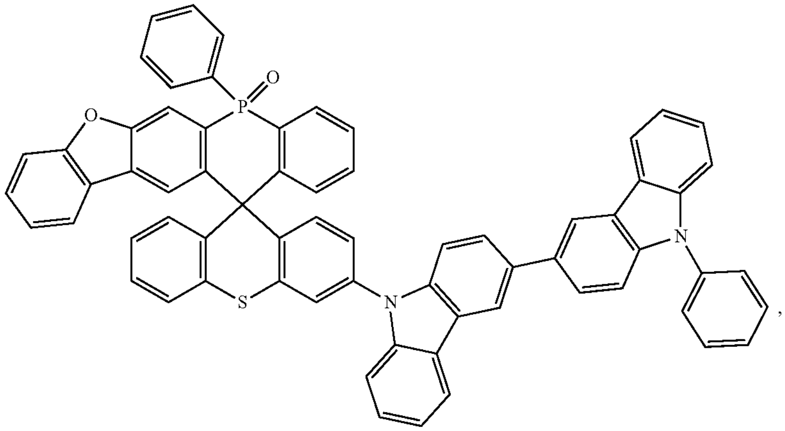
M56
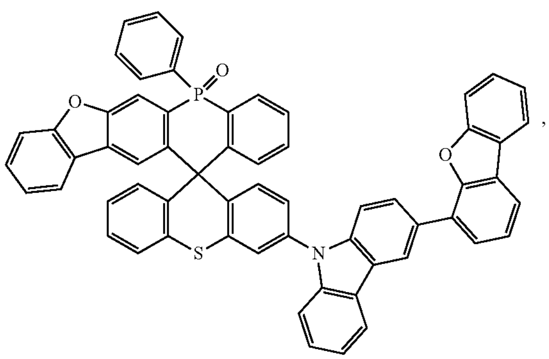
M57
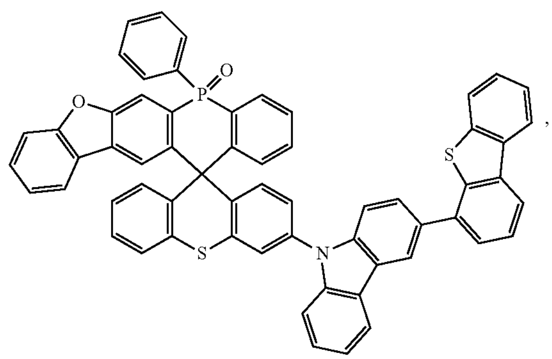
M58
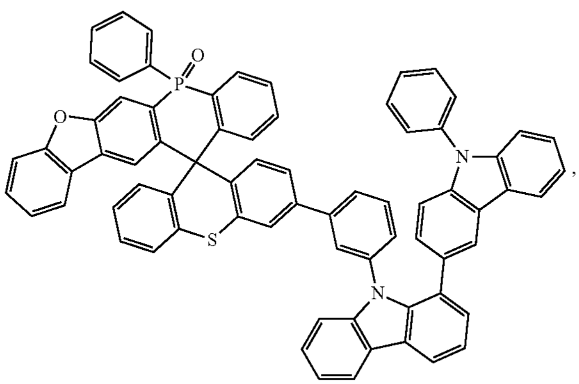
M59
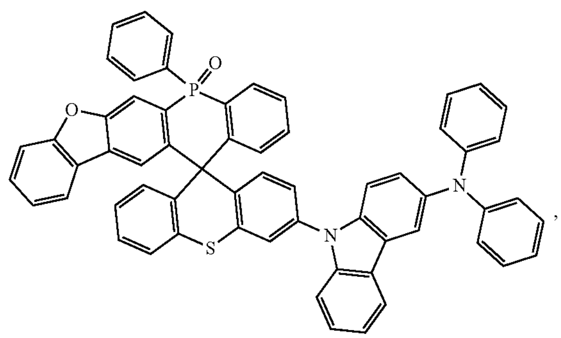

-continued
M60
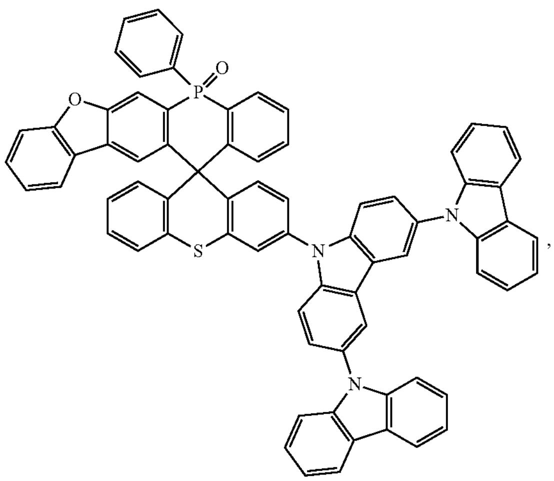
M61
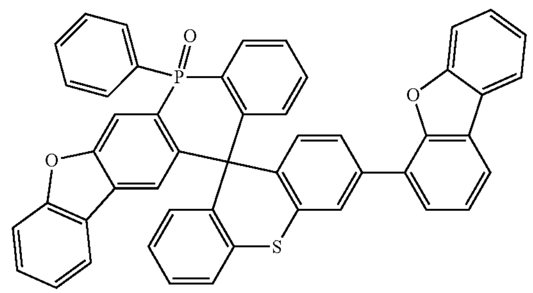
M62
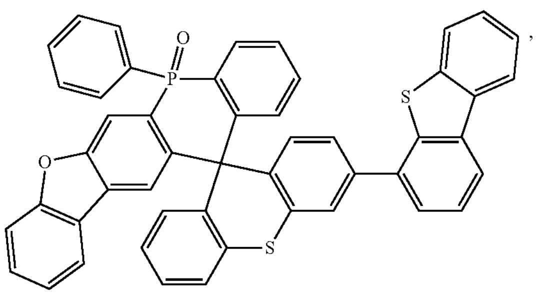
M63
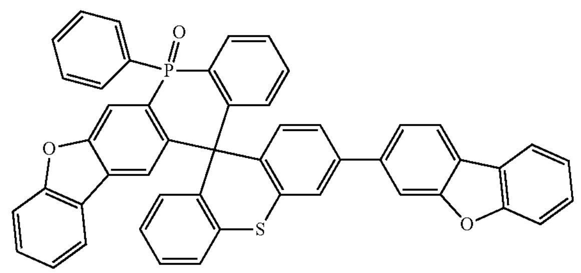
M64
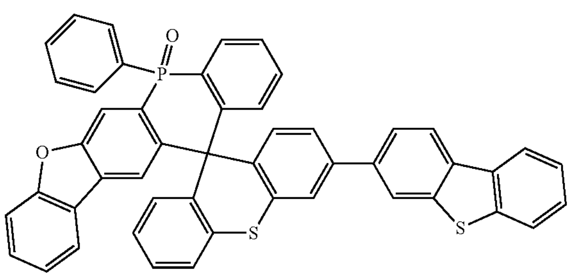
M65
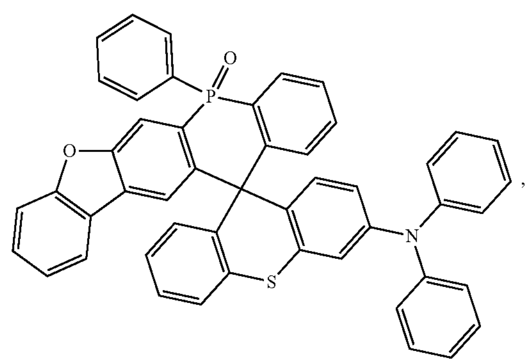
M66
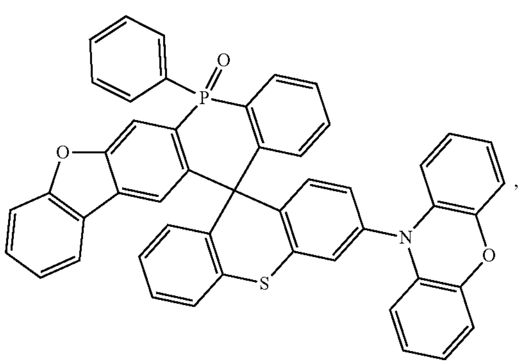
M67
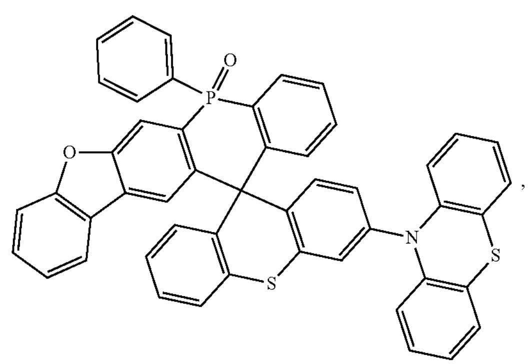

-continued
M68
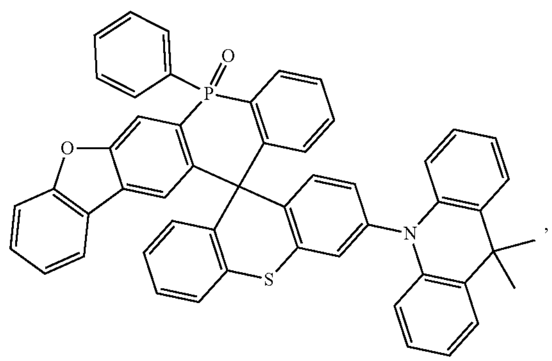
M69
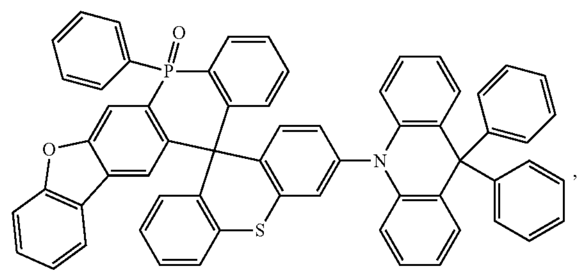
M70
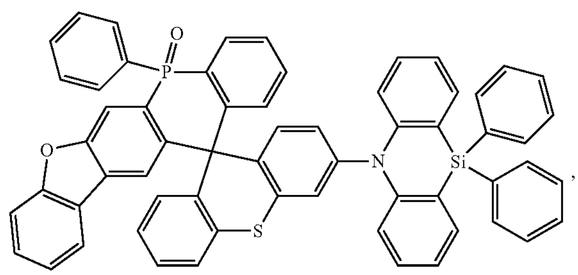
M71
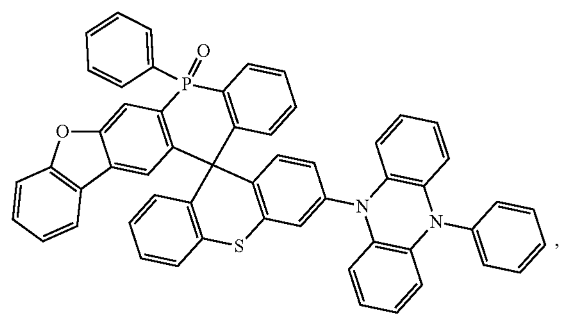
M72
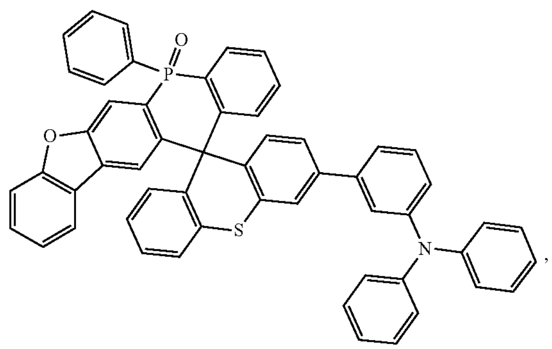
M73
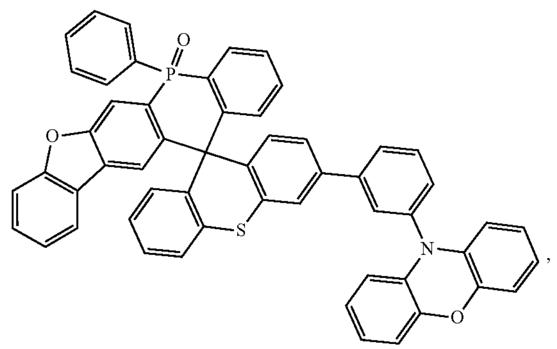
M74
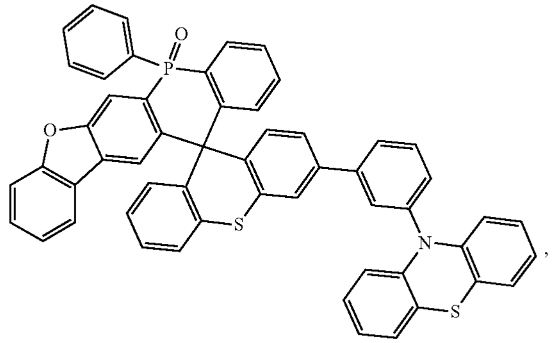
M75
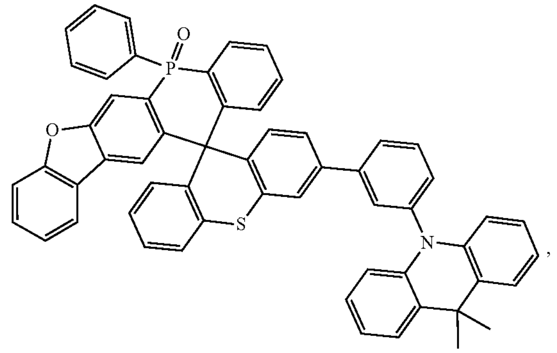

-continued
M76
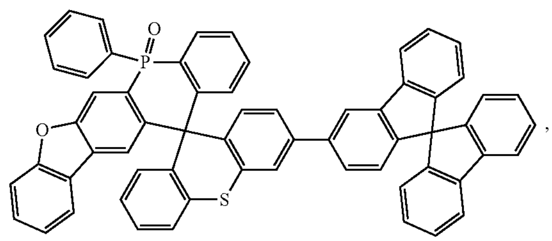
M77
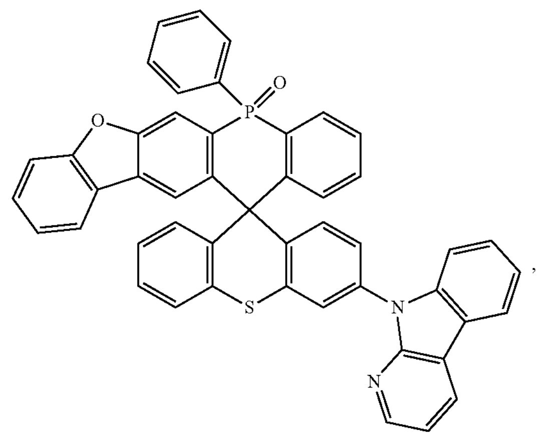
M78
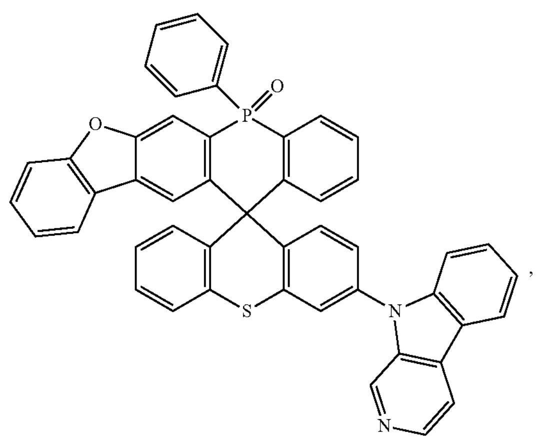
M79
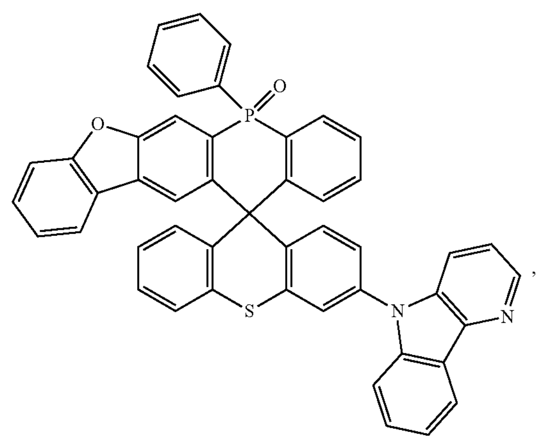
M80
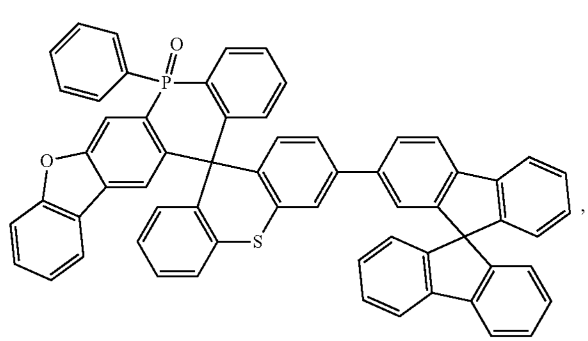
M81
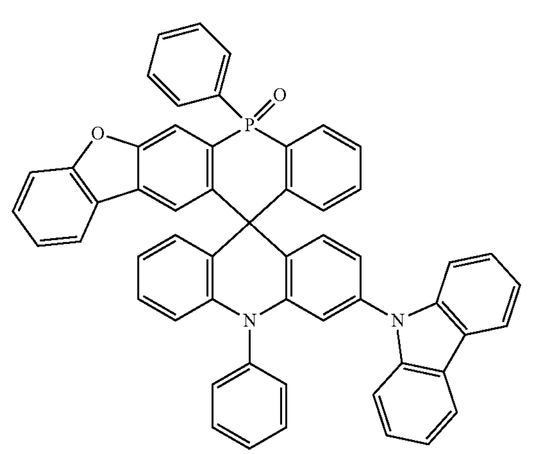

-continued
M82
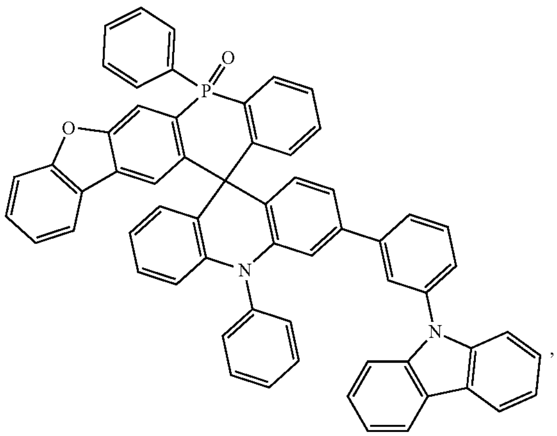
M83
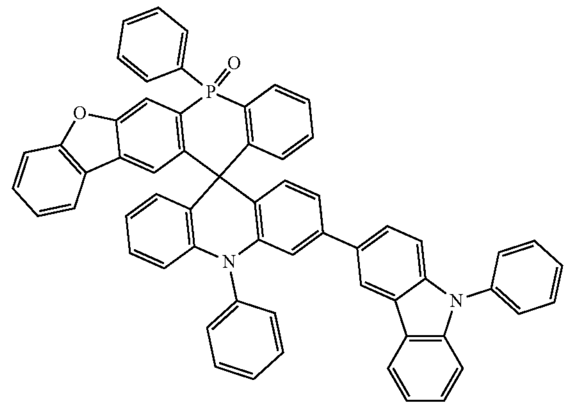
M84
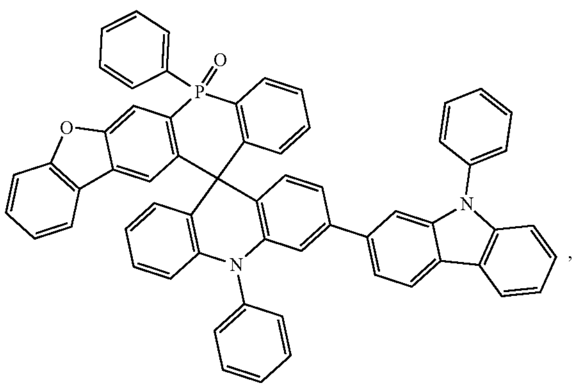
M85
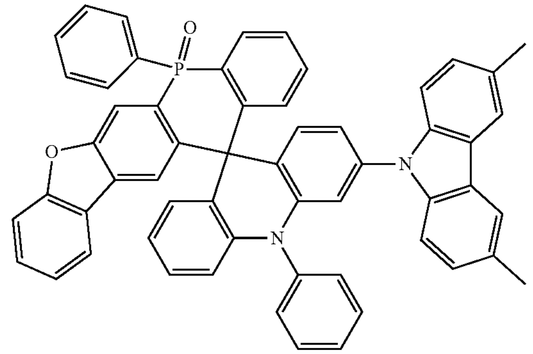
M86
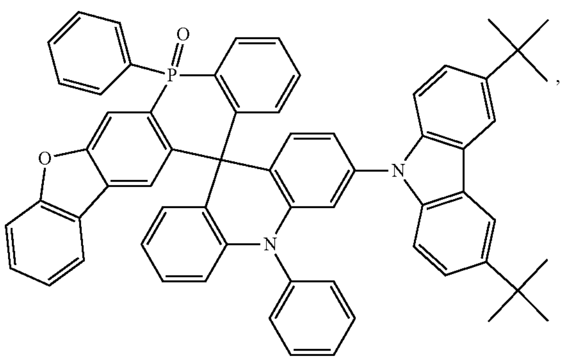
M87
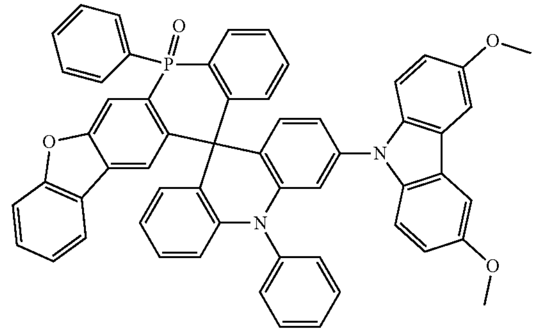
M88
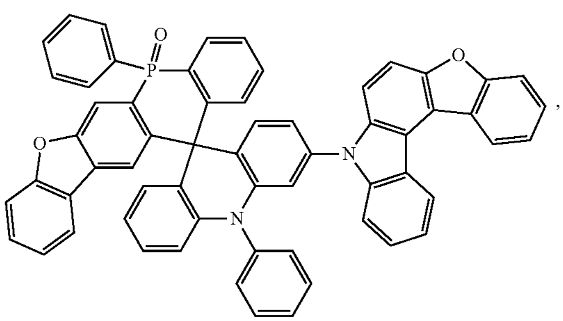
M89
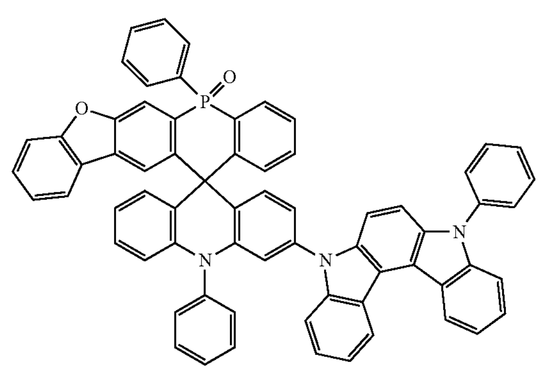

-continued
M90
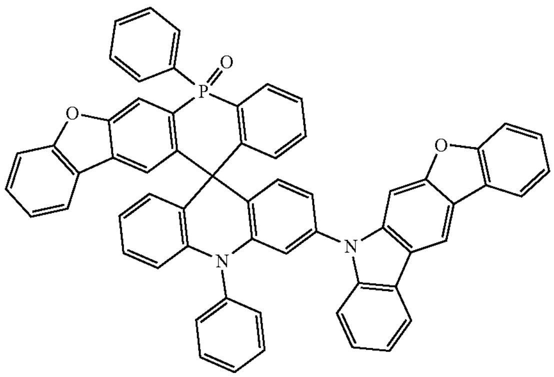
,
M91
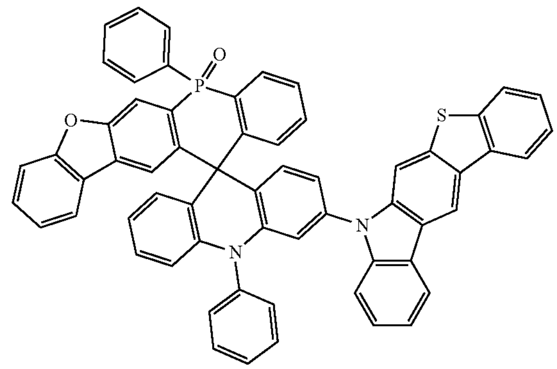
,
M92
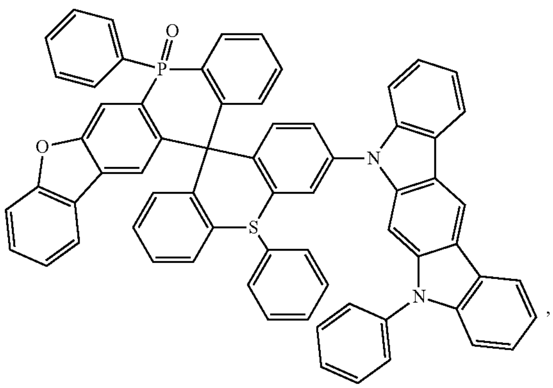
,
M93
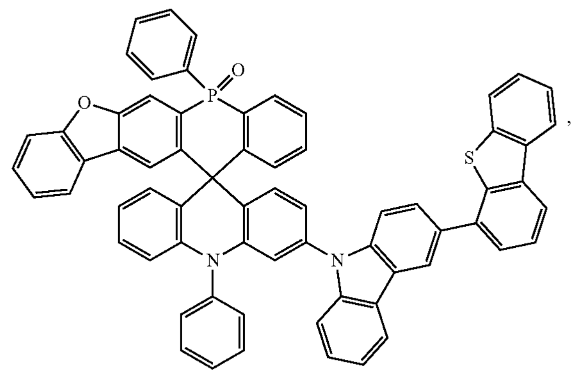
,
M94
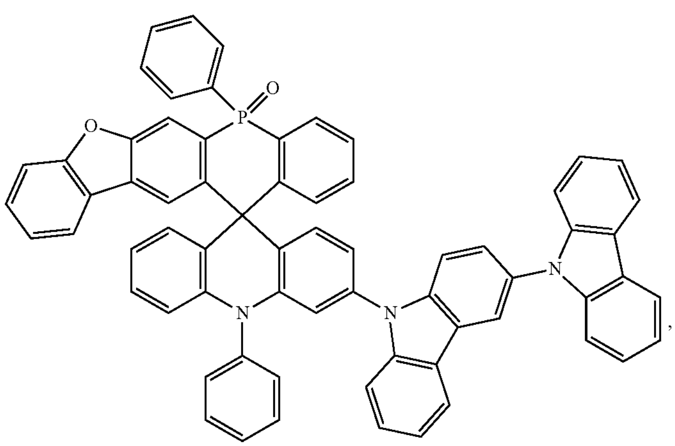
, -continued
M95
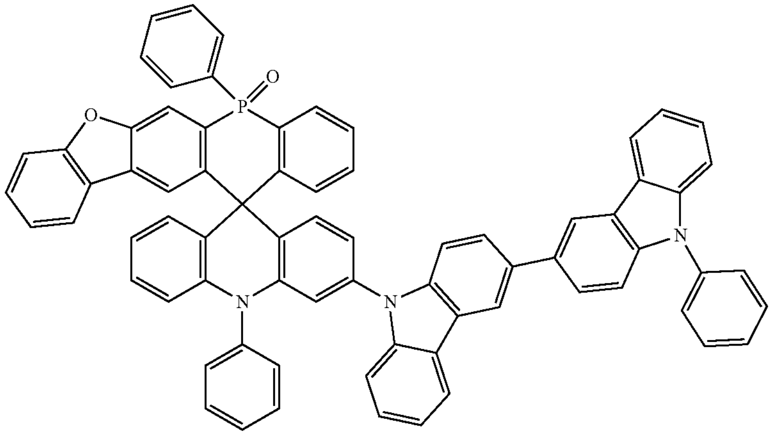
M96
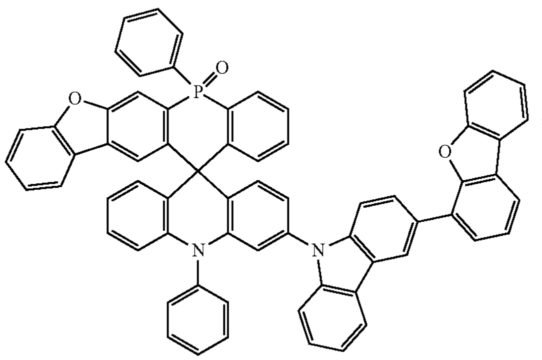
M97
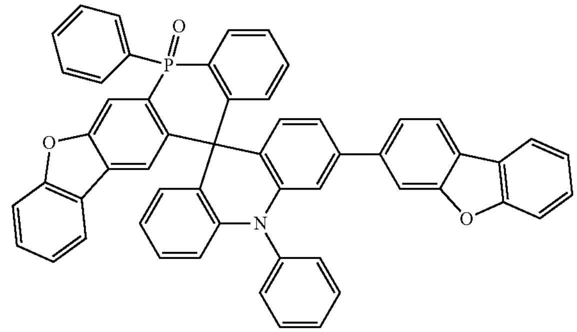
M98
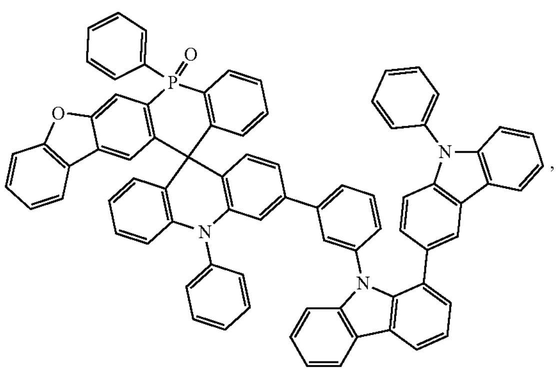
M99
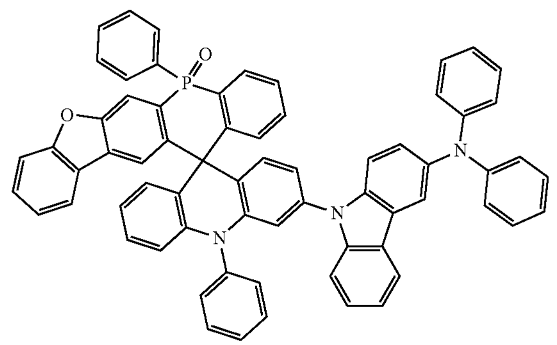
M100
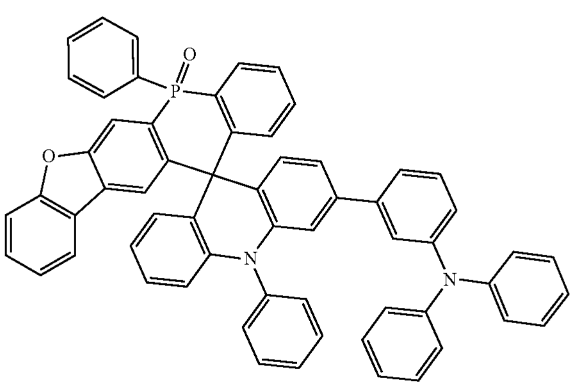
M101
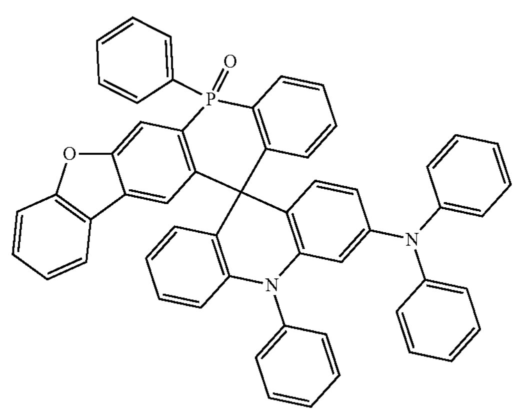

-continued
M102
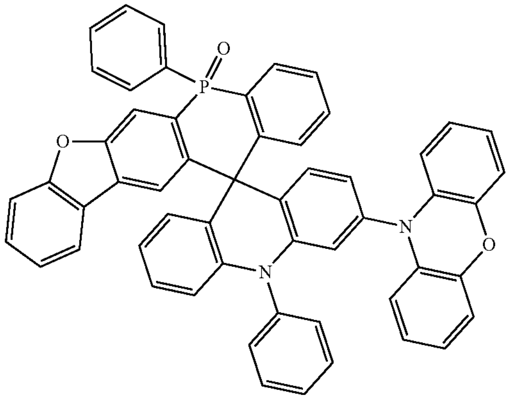
,
M103
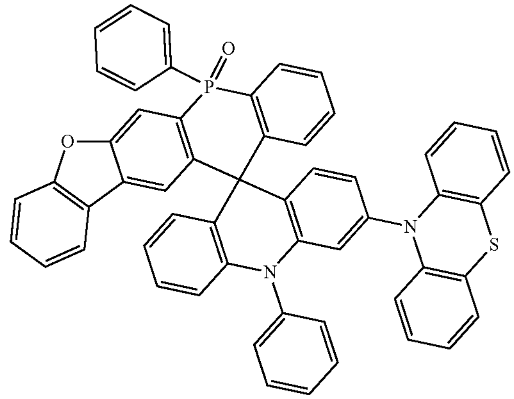
,
M104
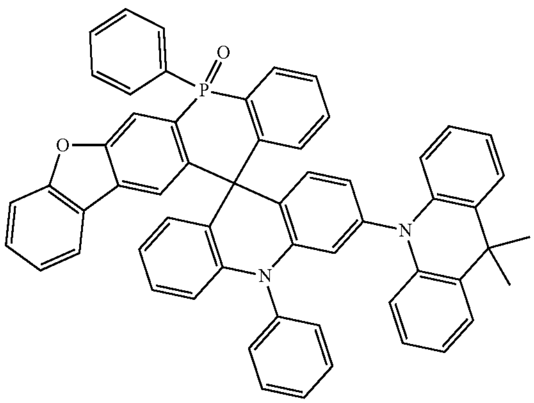
,
M105
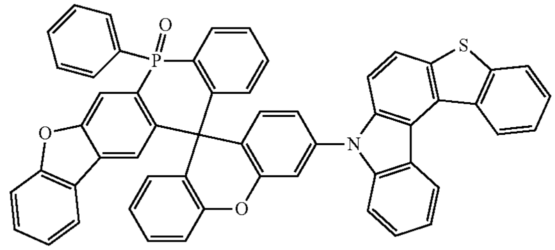
,
M106
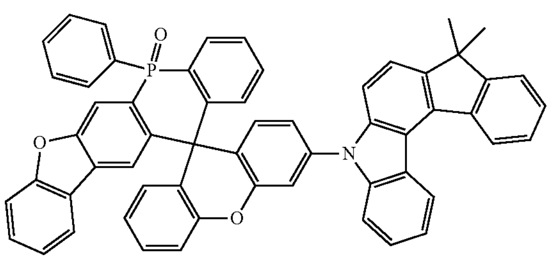
,
M107
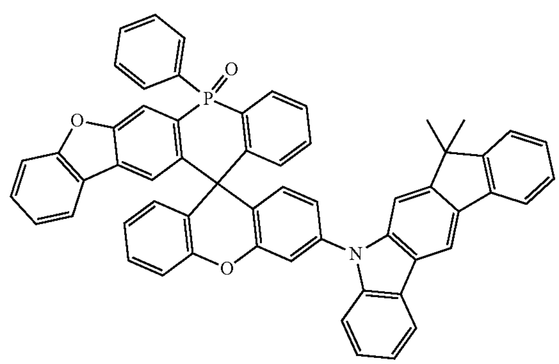
,
M108
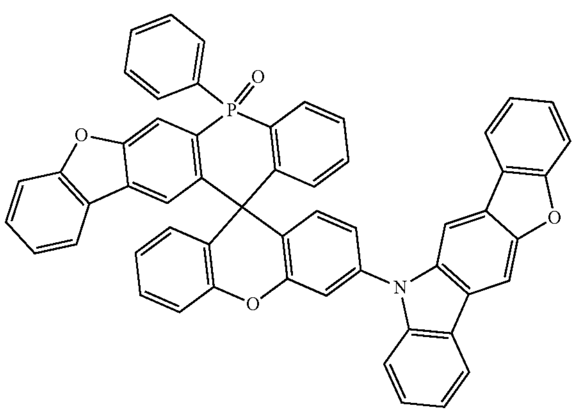
,
M109
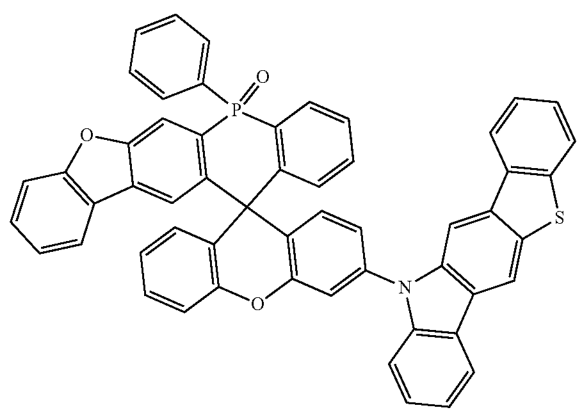
, -continued
M110
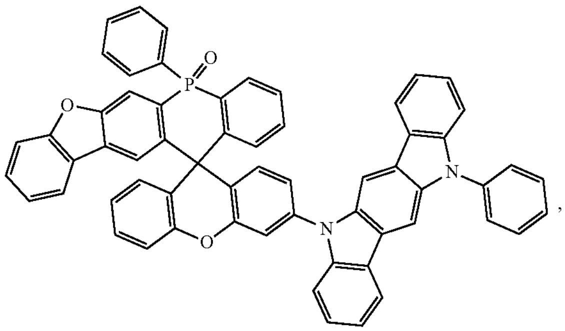
M111
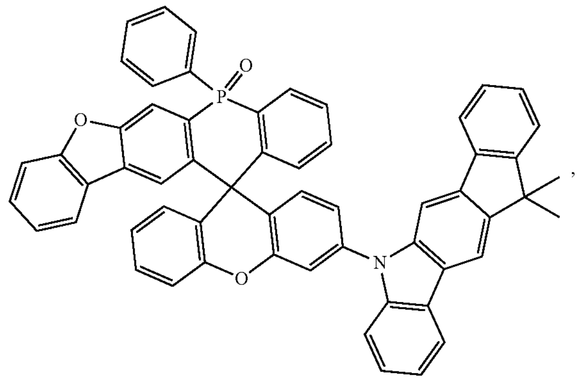
M112
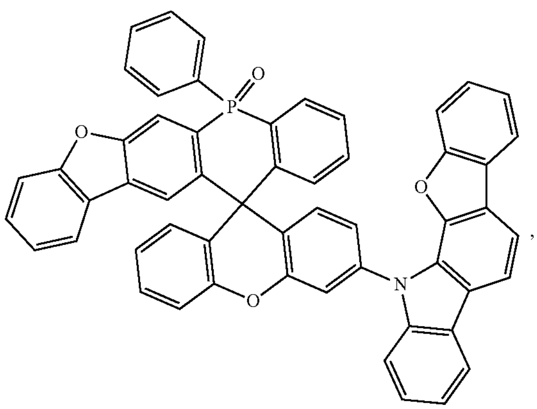
M113
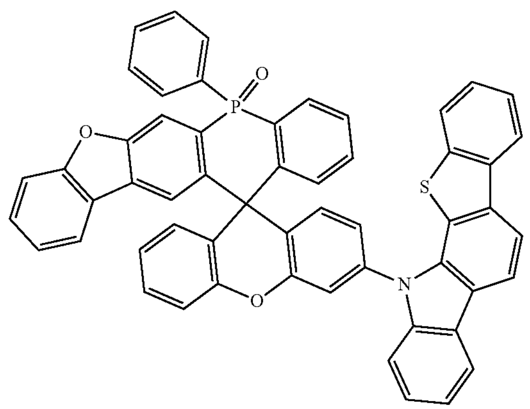
M114
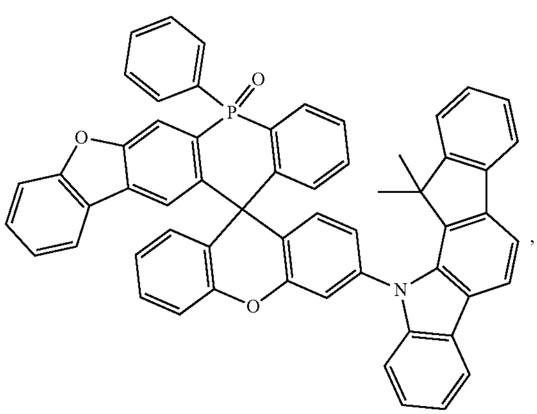
M115
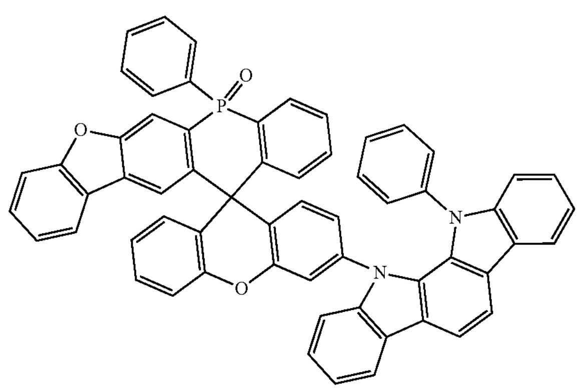

-continued
M116
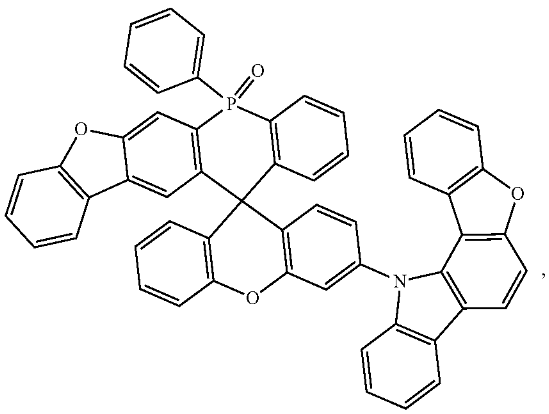
M117
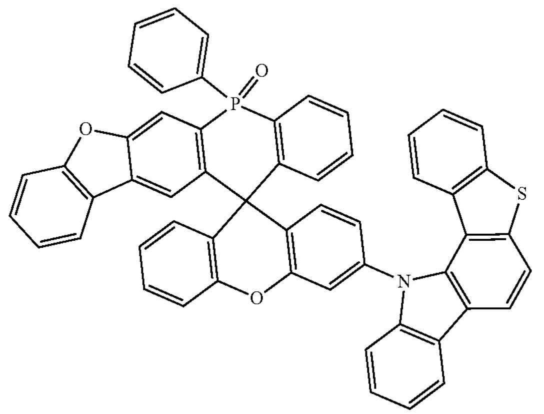
M118
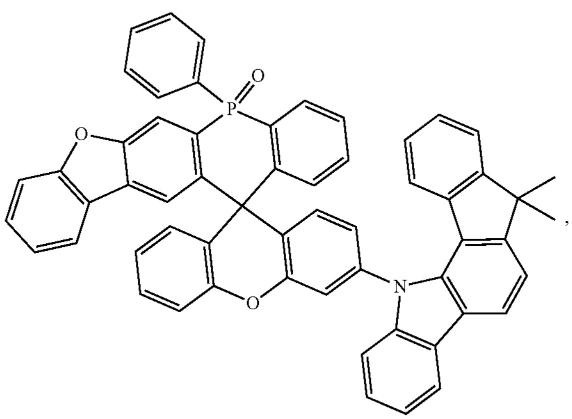
M119
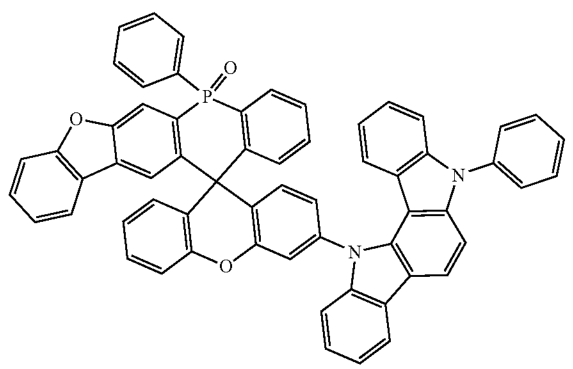
M120
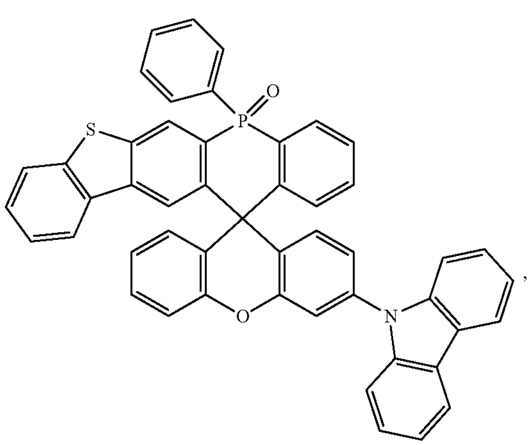
M121
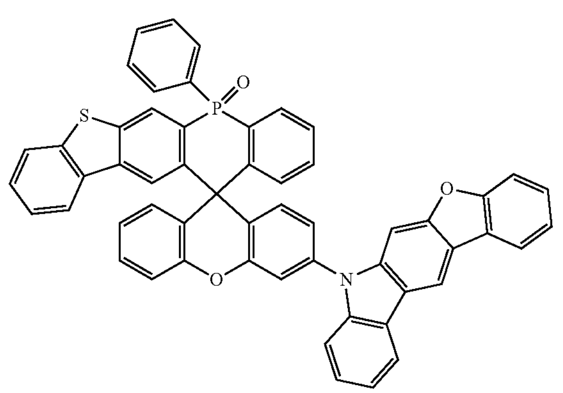

-continued
M122
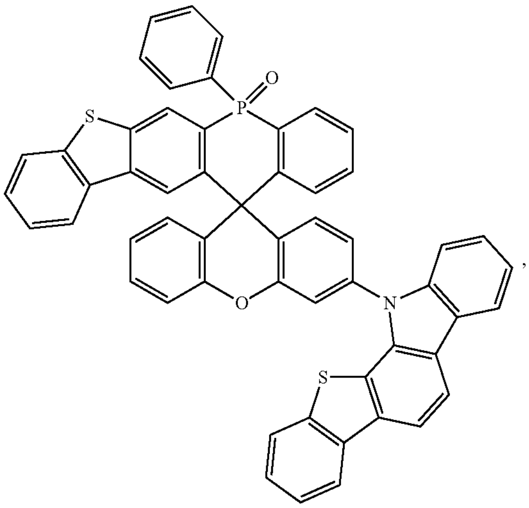
M123
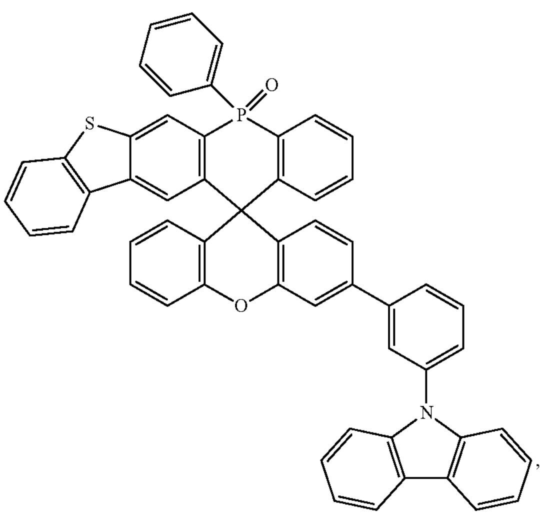
M124
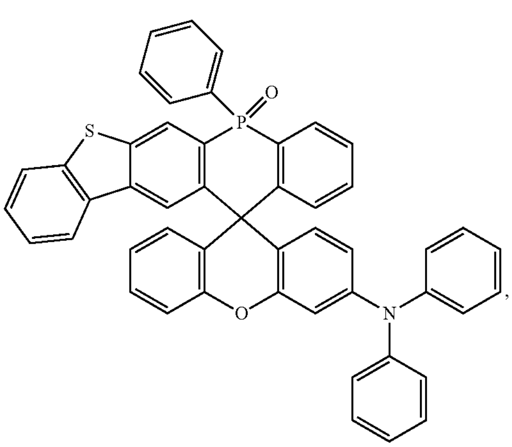
-continued
M125
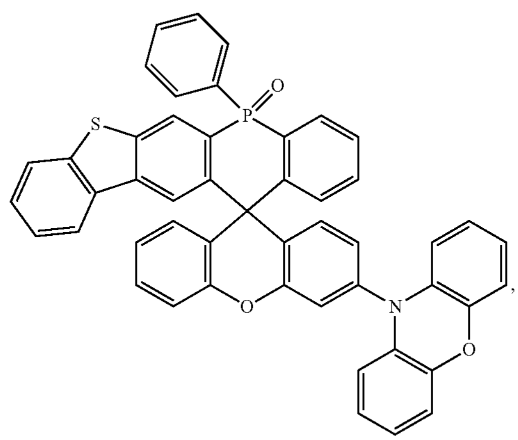
M126
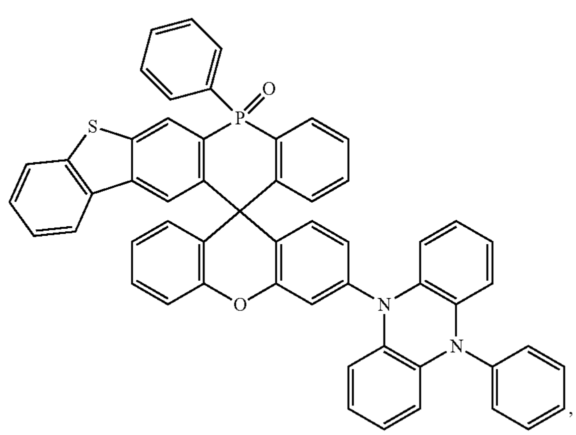

-continued
M127
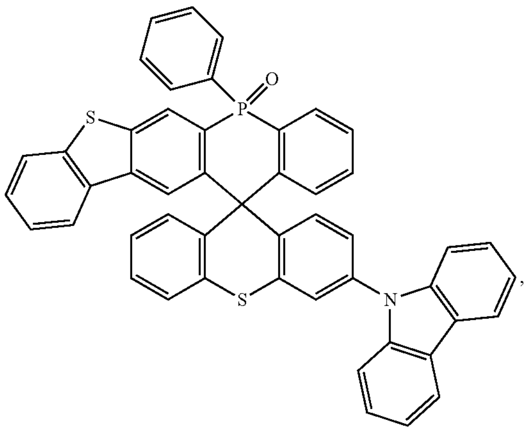
M128
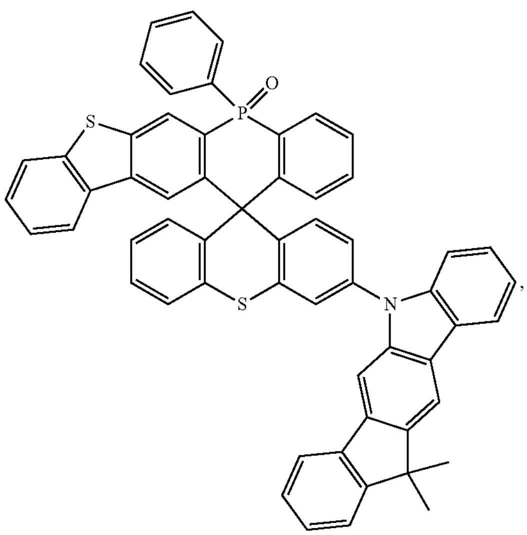
M129
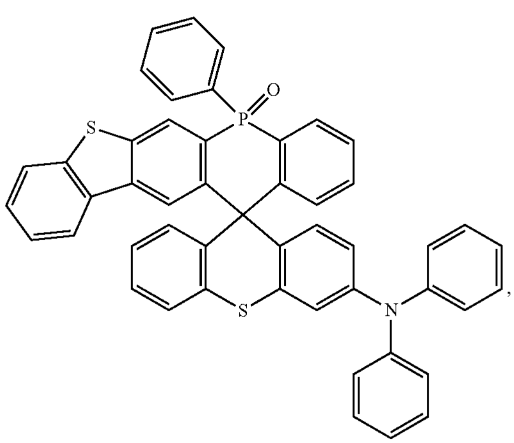
-continued
M130
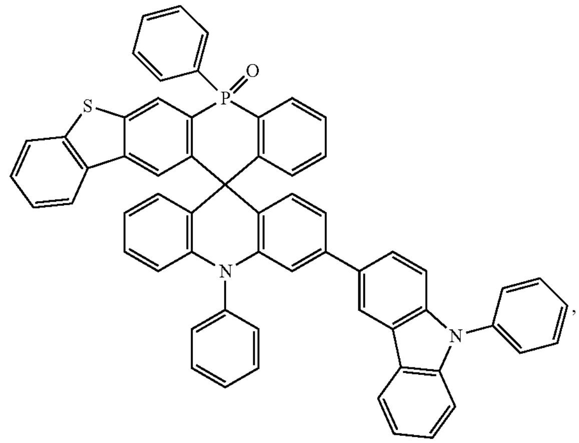
M131
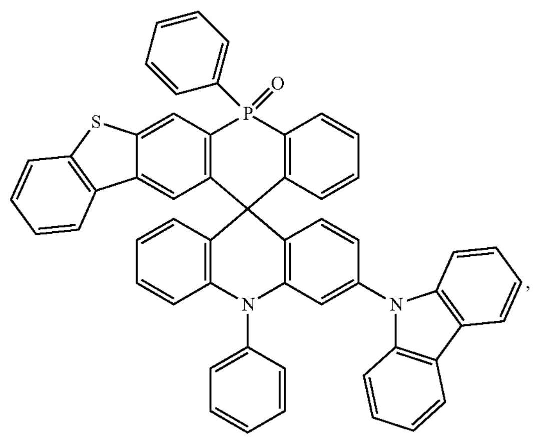
M132
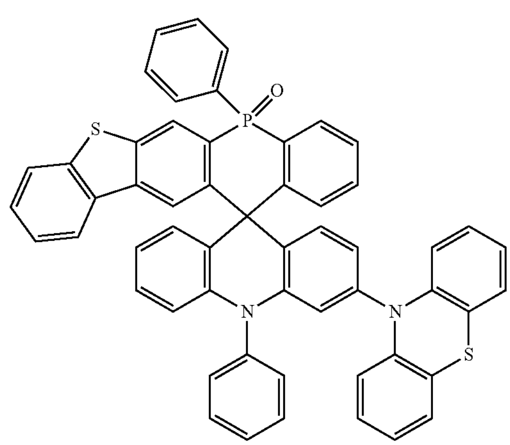

-continued
M133
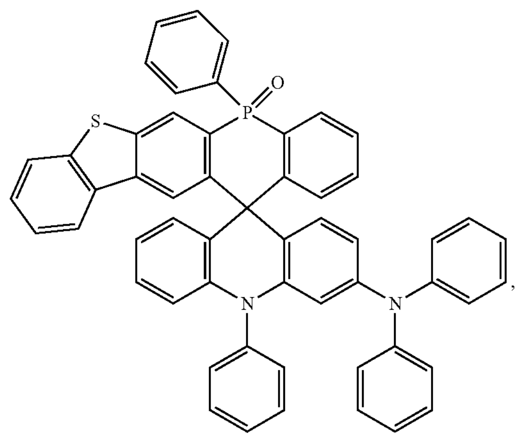
M134
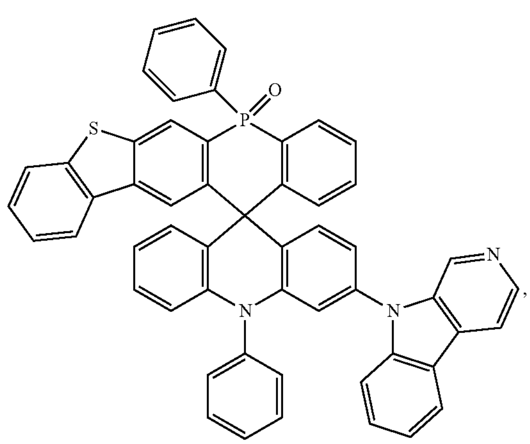
M135
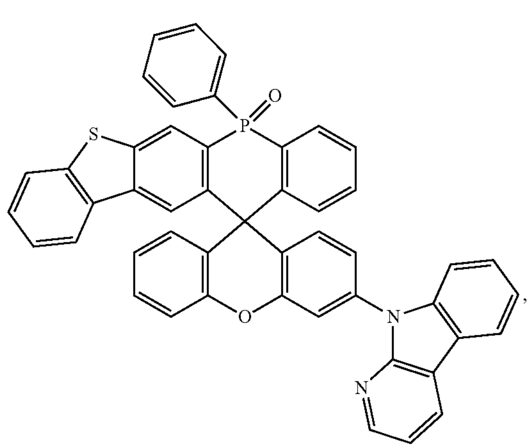
-continued
N1
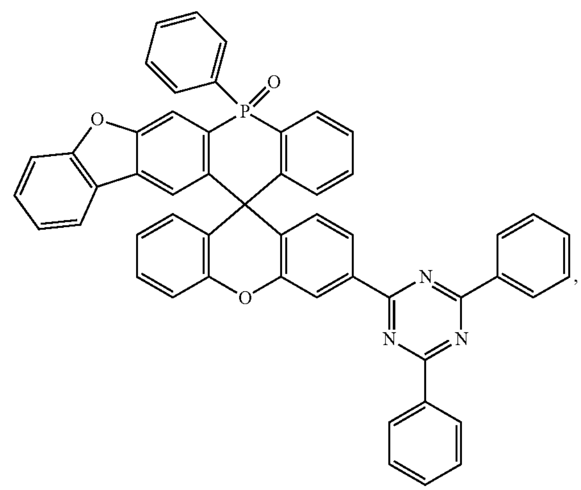
N2
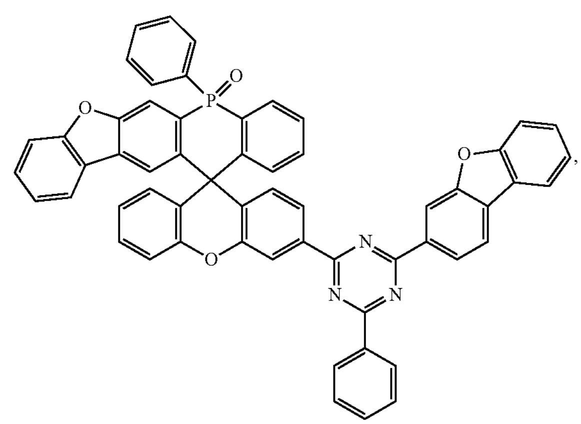
N3
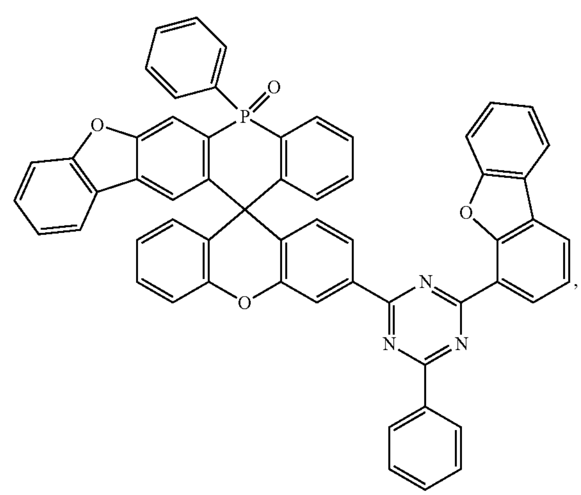

-continued
N4
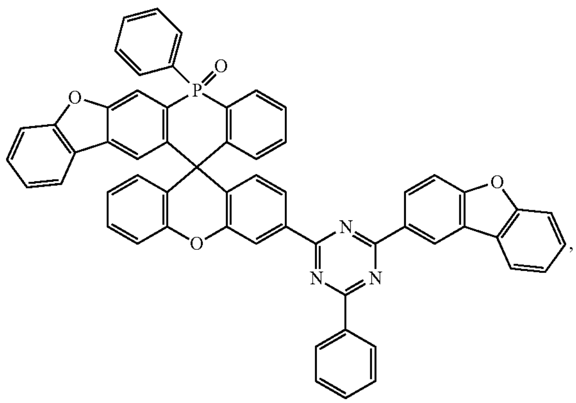
N5
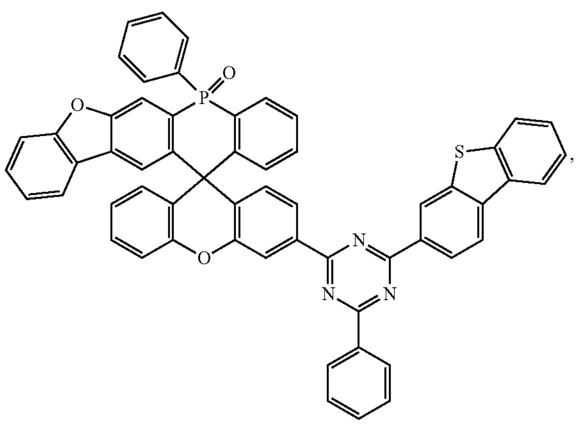
N6
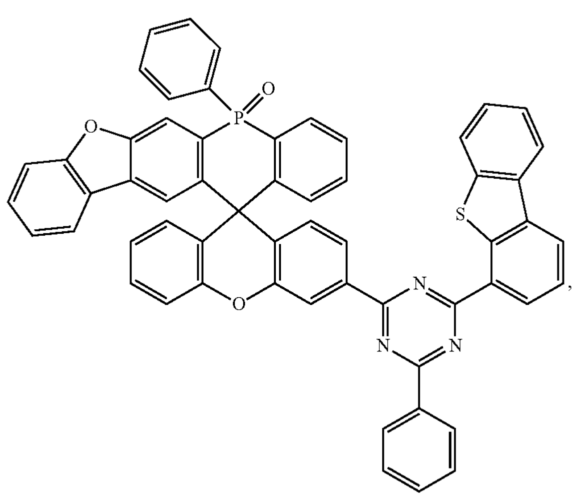
-continued
N7
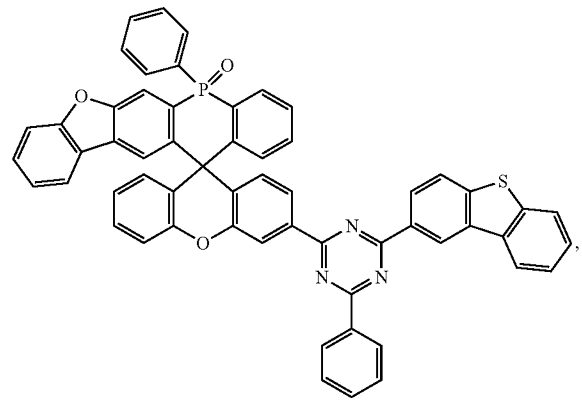
N8
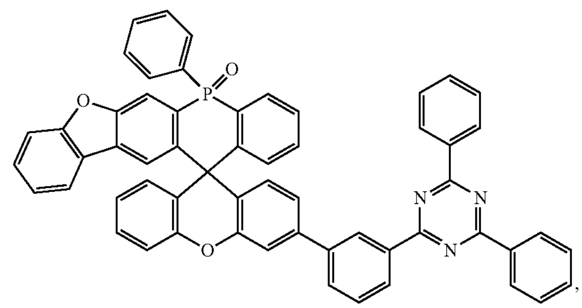
N9
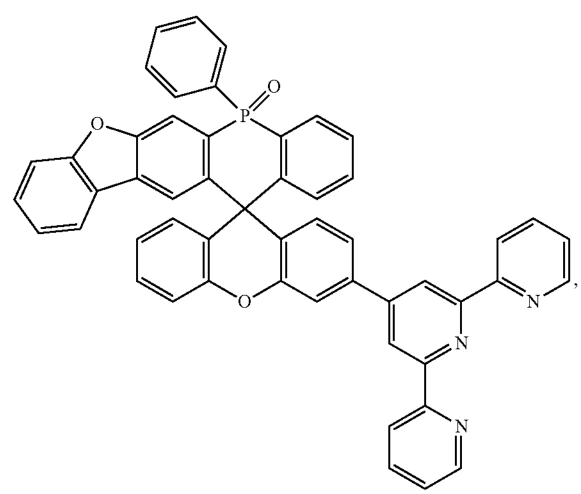

-continued
N10
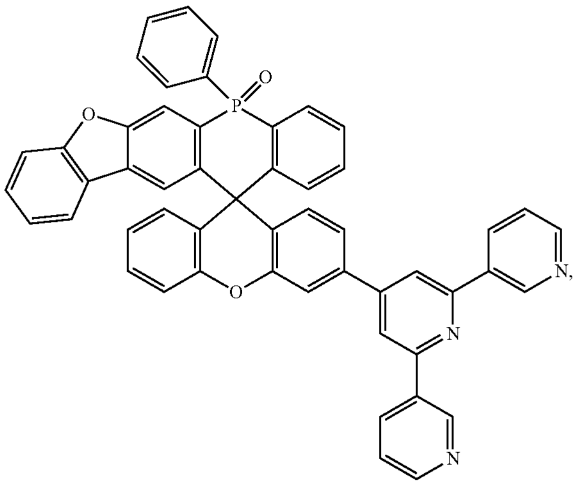
N11
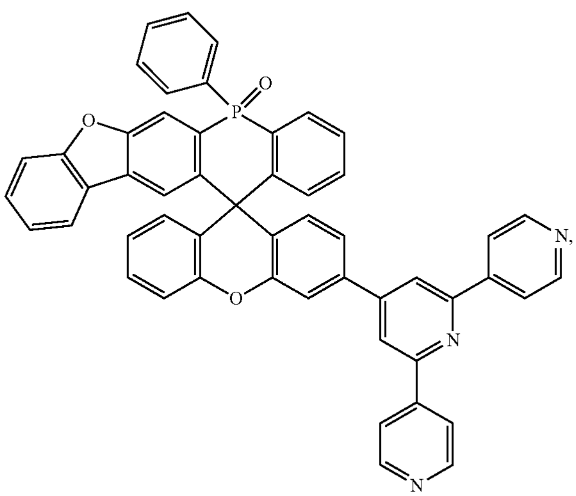
N12
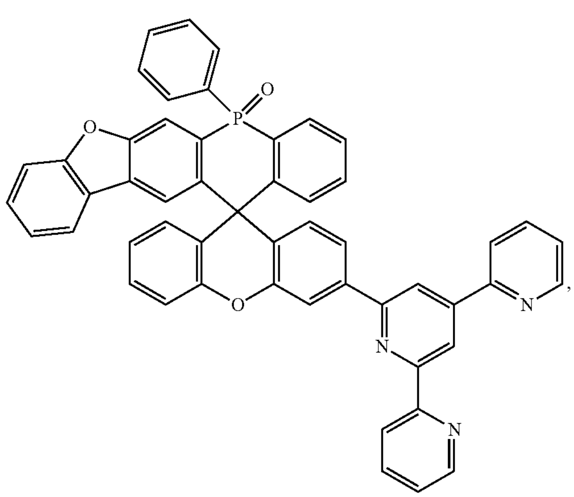
-continued
N13
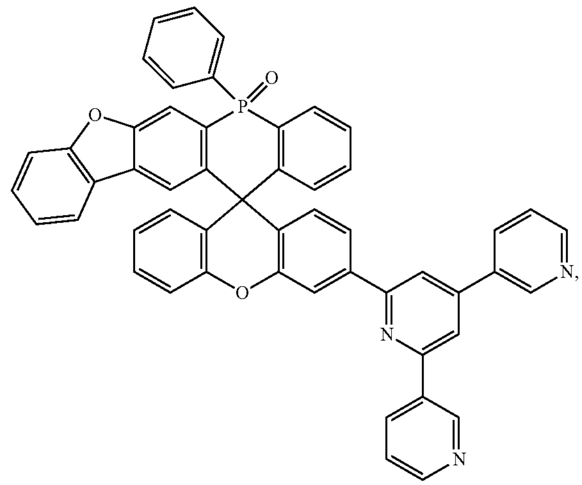
N14
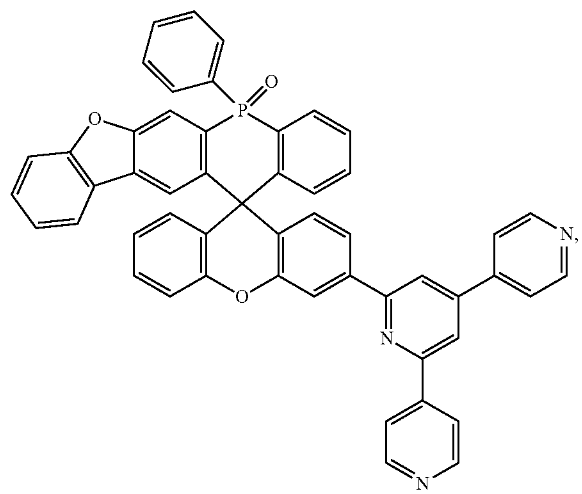
N15
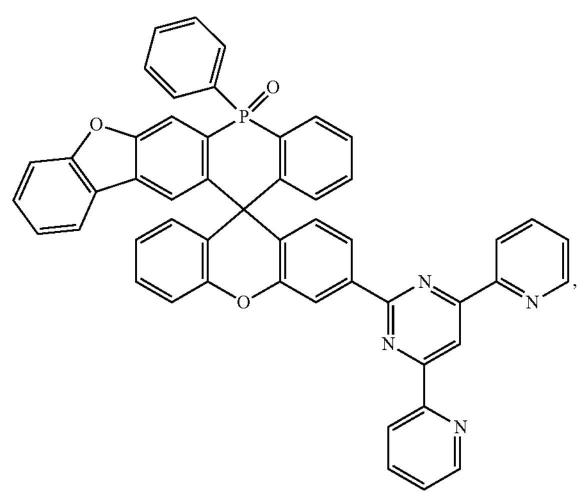

-continued
N16
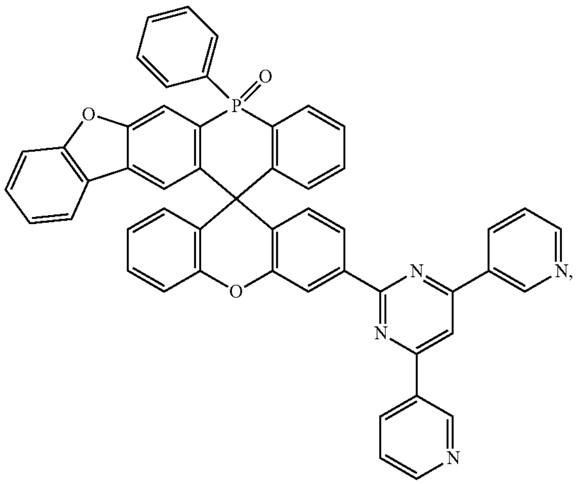
N17
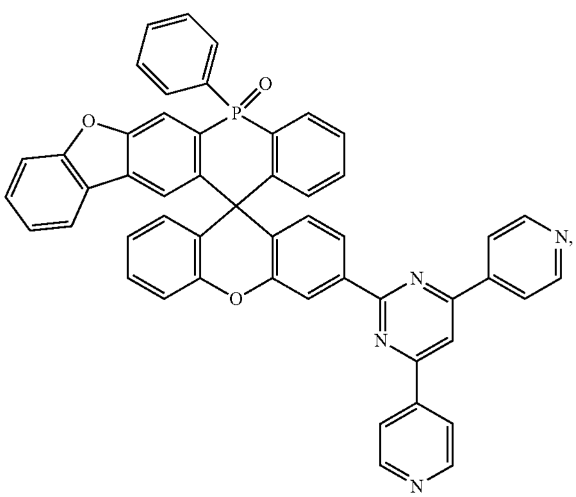
N18
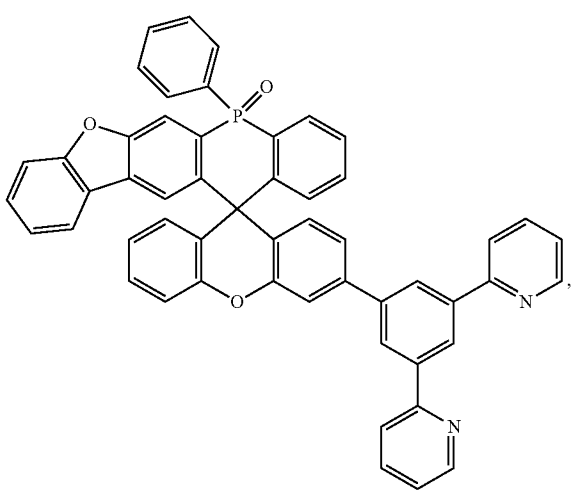
-continued
N19
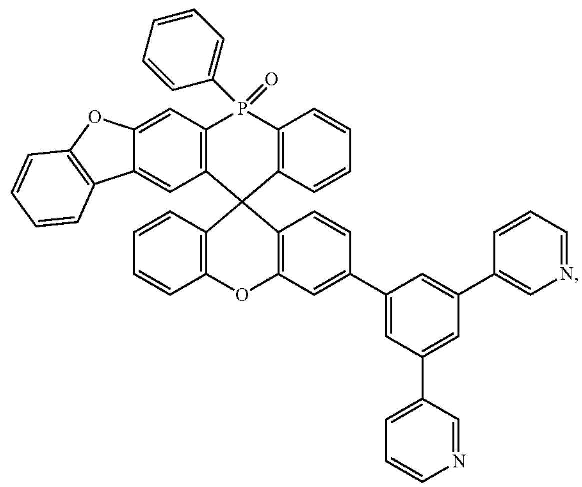
N20
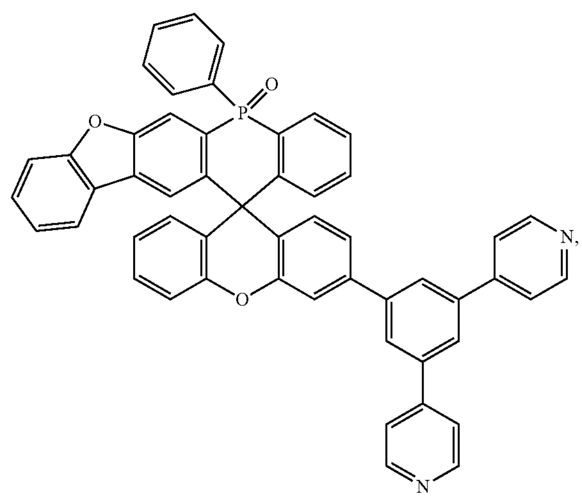
N21
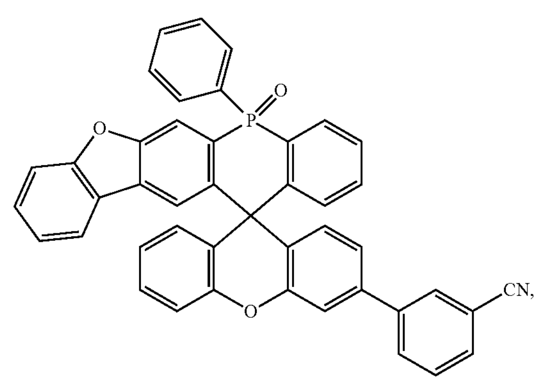

-continued
N22
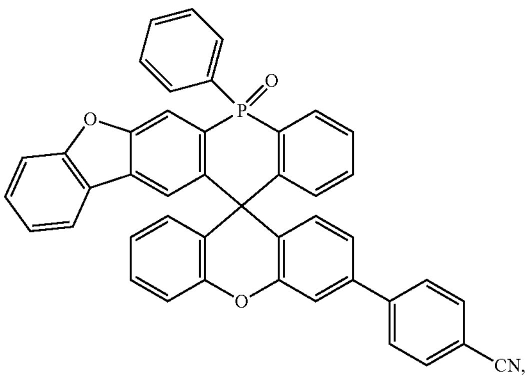
N23
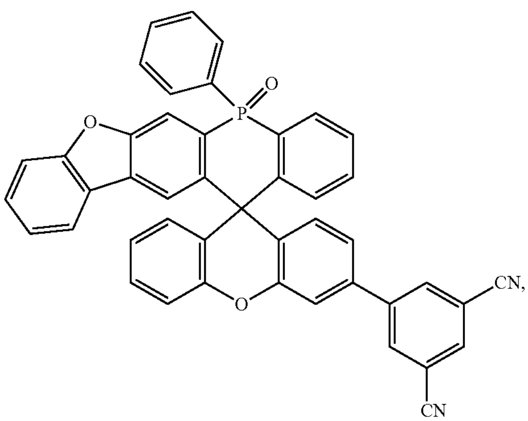
N24
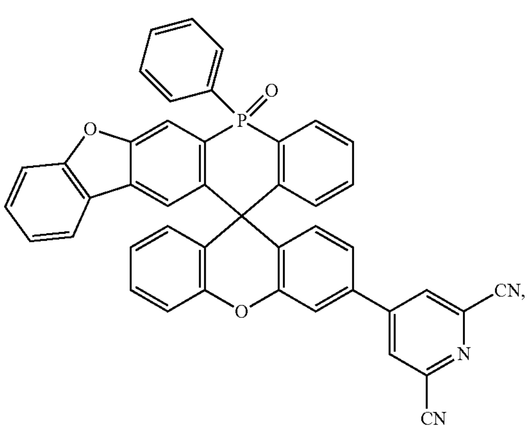
-continued
N25
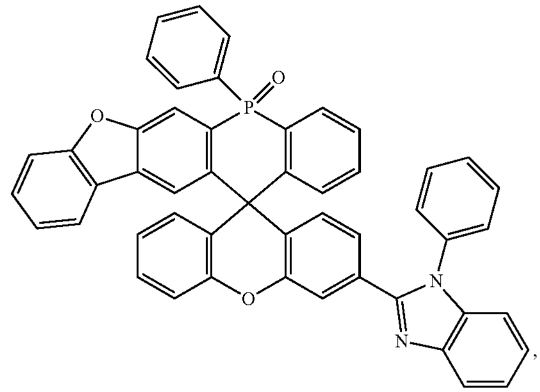
N26
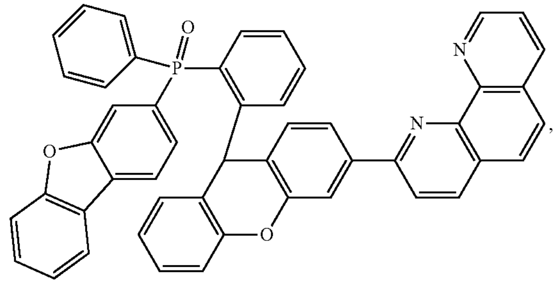
N27
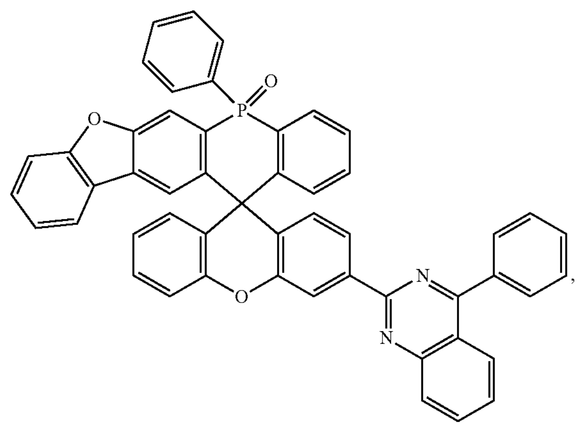
N28
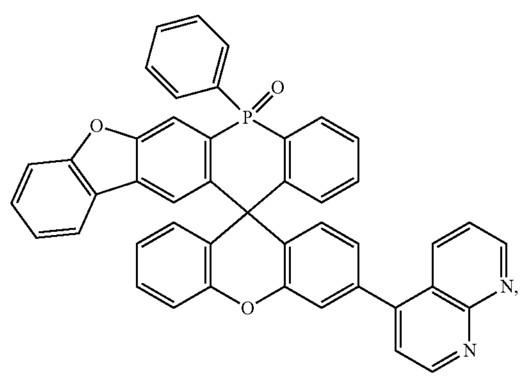

-continued
N29
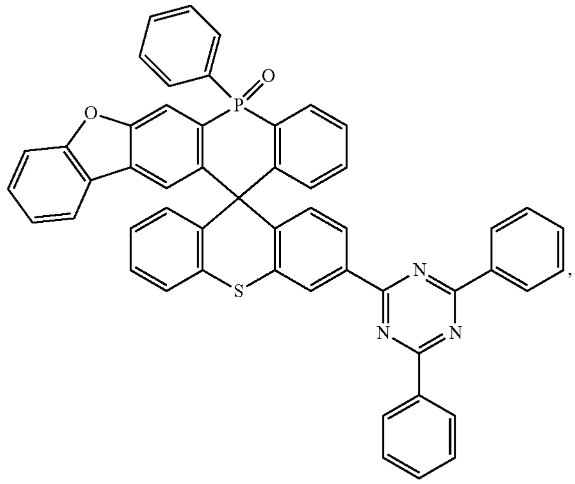
N30
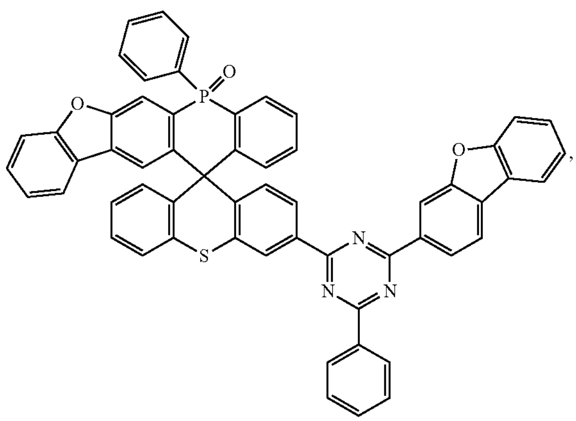
N31
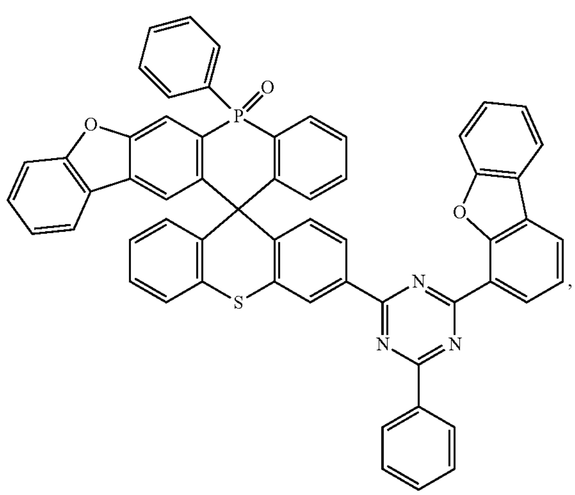
-continued
N32
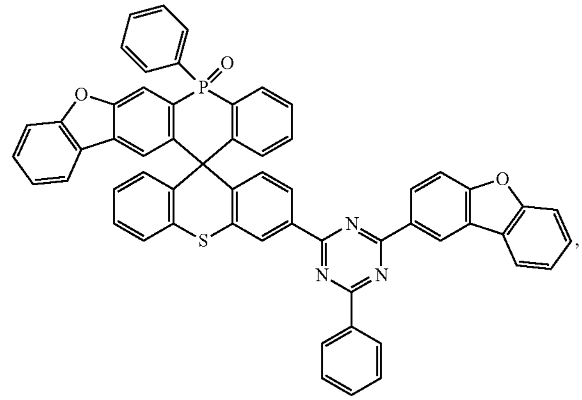
N33
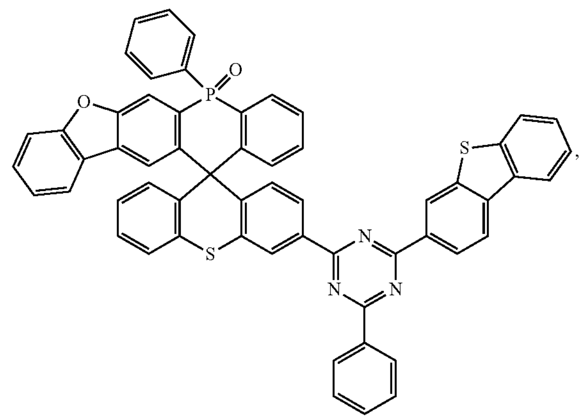
N34
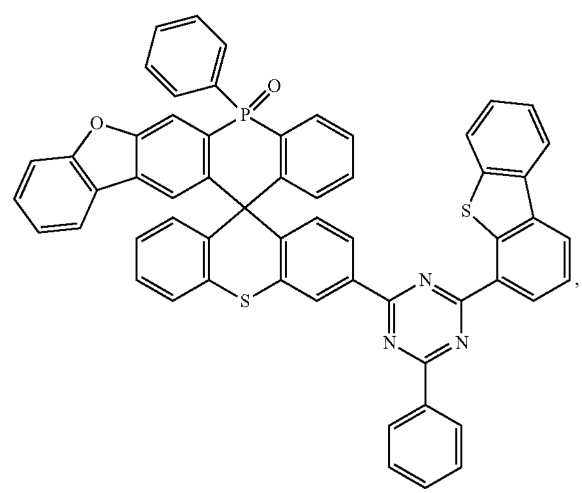

-continued
N35
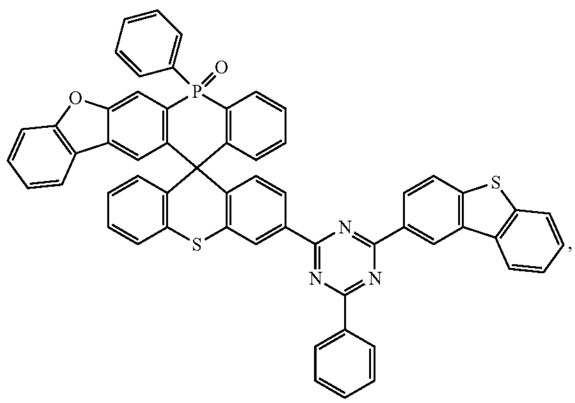
N36
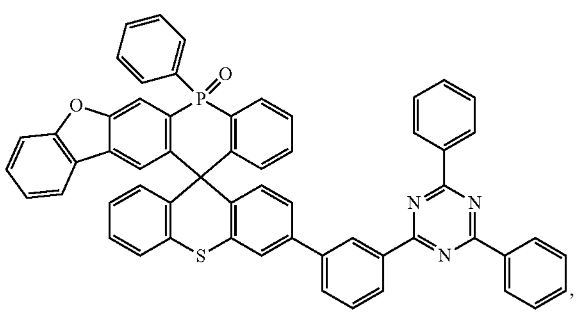
N37
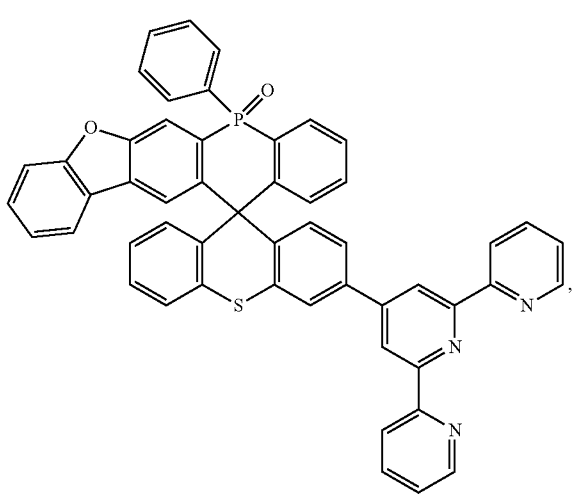
-continued
N38
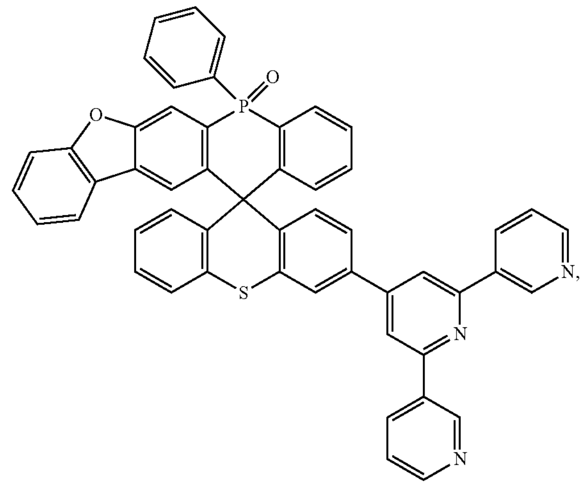
N39
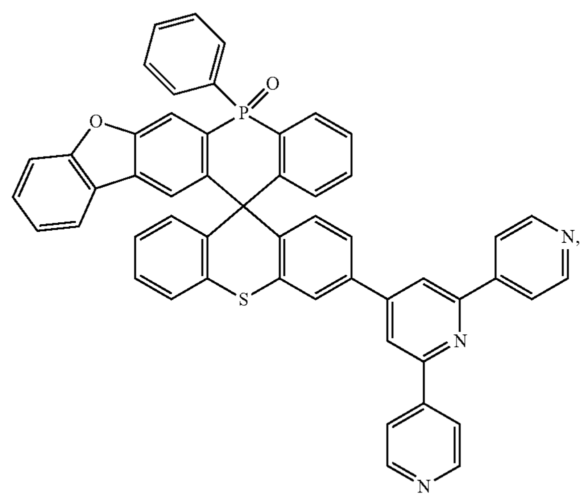
N40
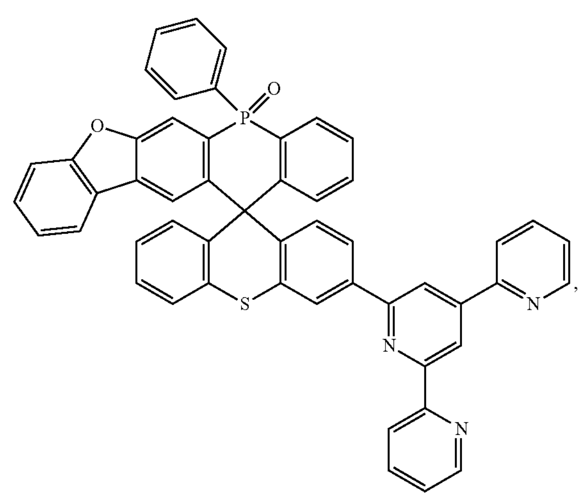

-continued
N41
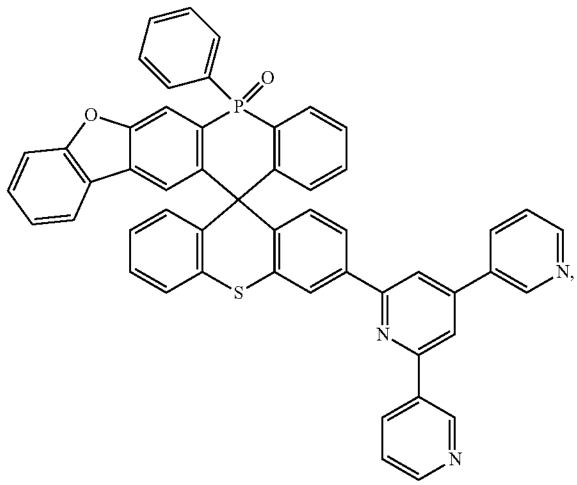
N42
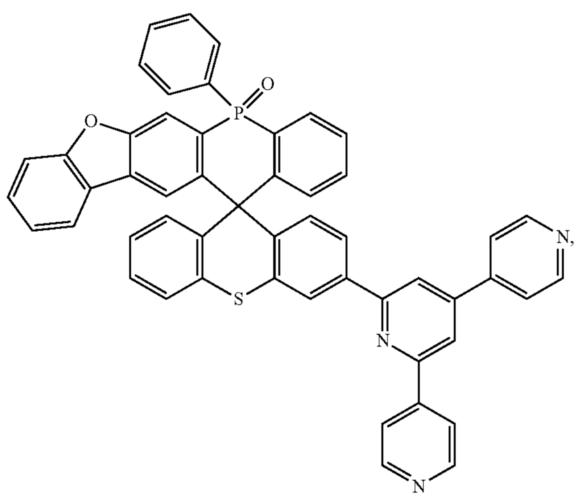
N43
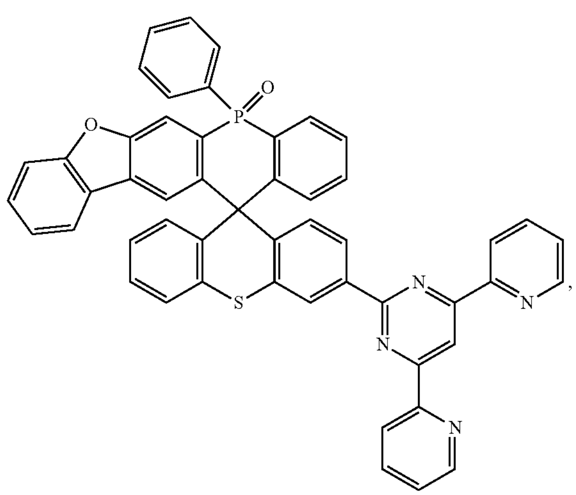
-continued
N44
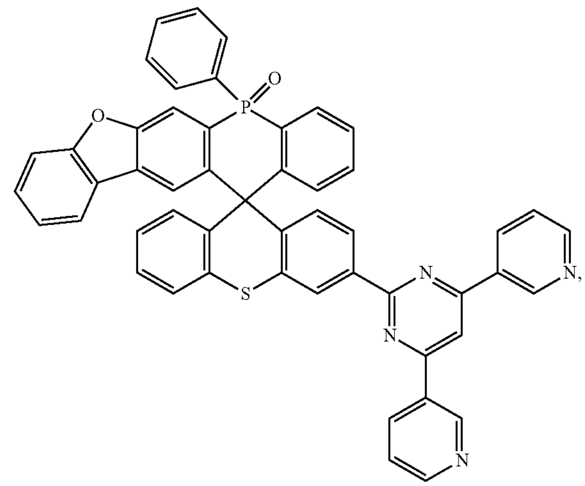
N45
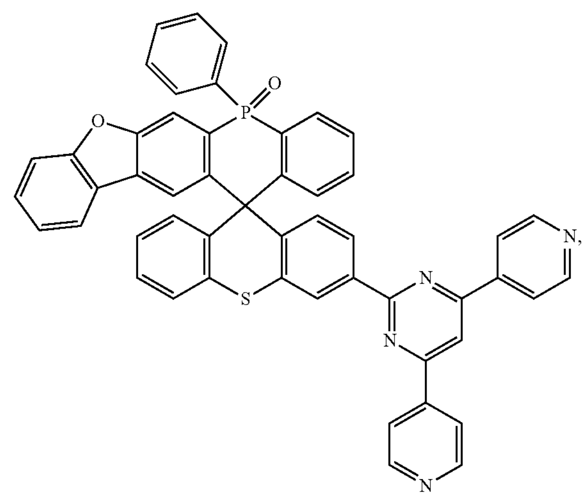
N46
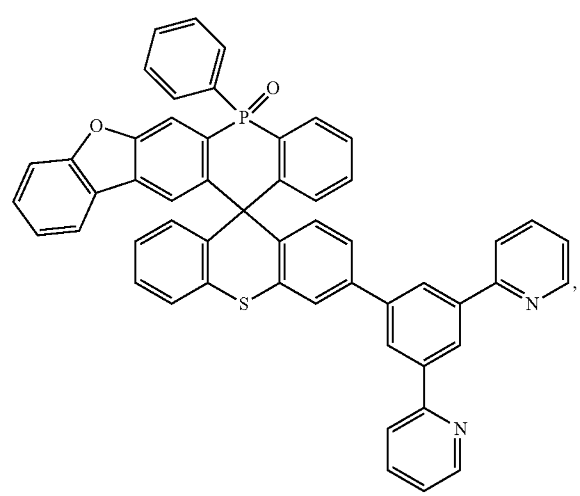

N47
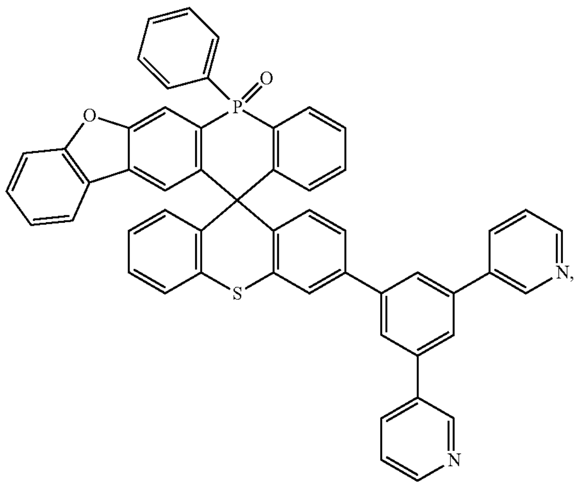
N48
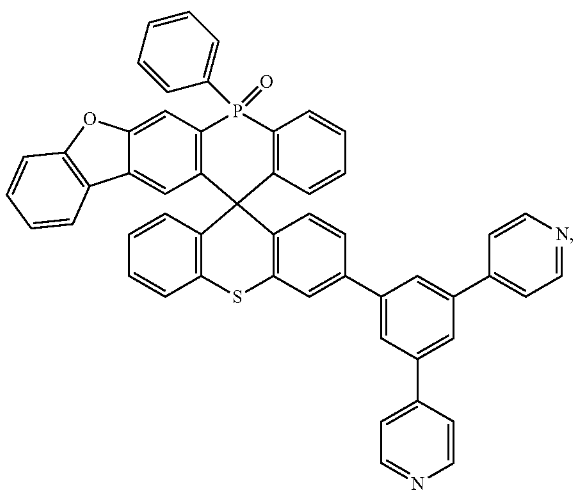
N49
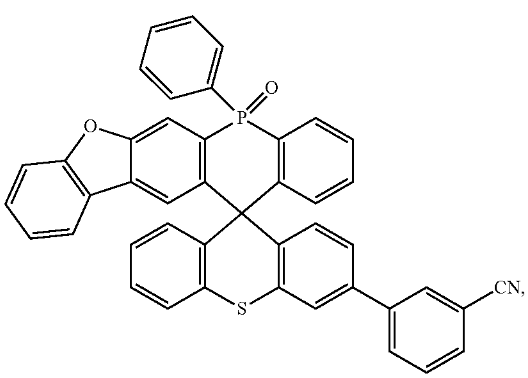
N50
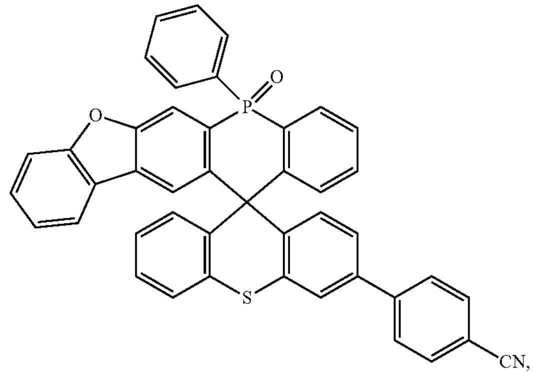
N51
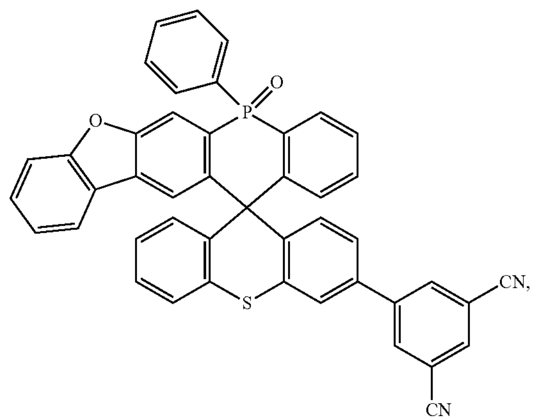
N52
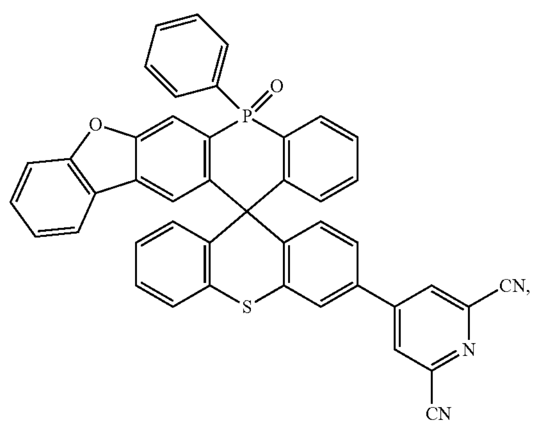

-continued
N53
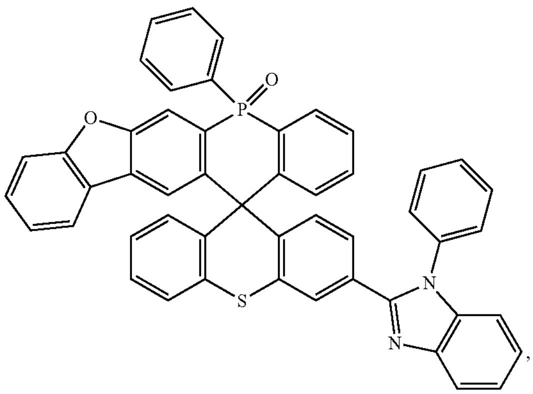
N54
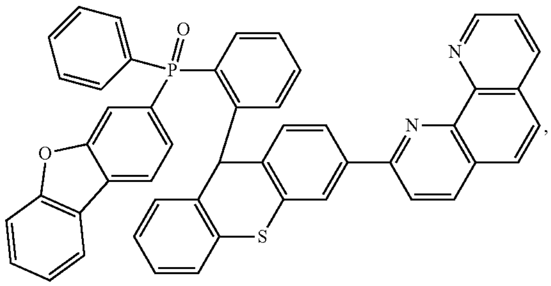
N55
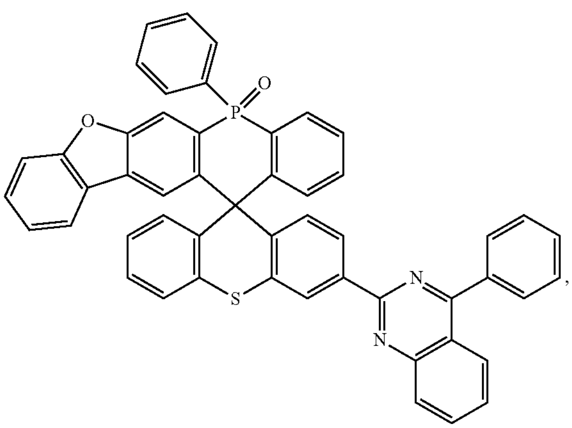
N56
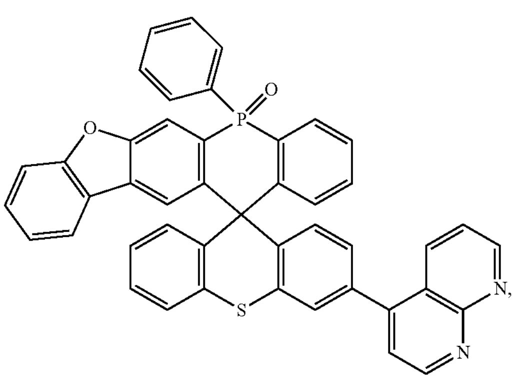
-continued
N57
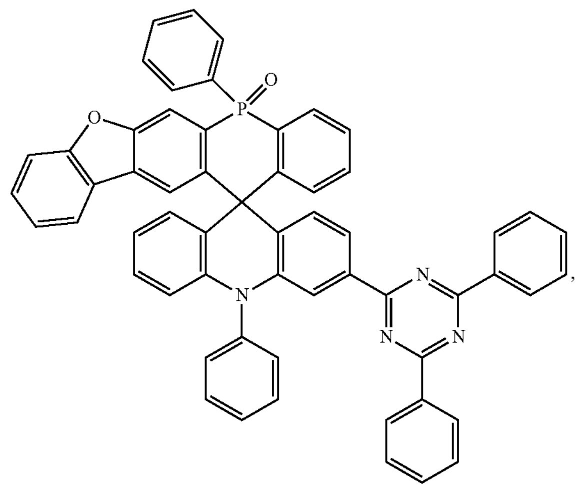
N58
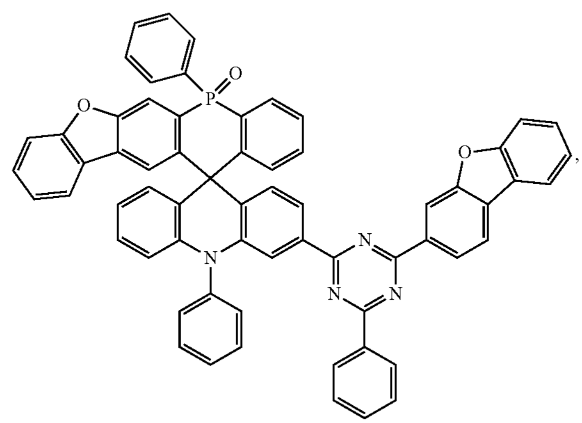
N59
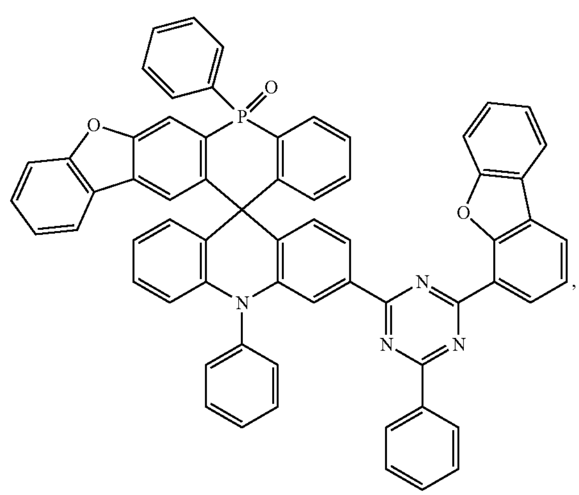

-continued
N60
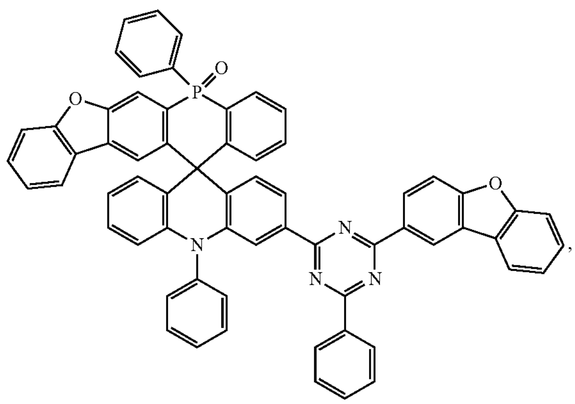
N61
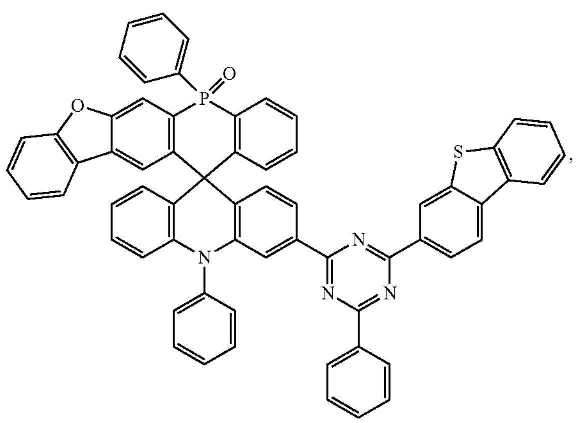
N62
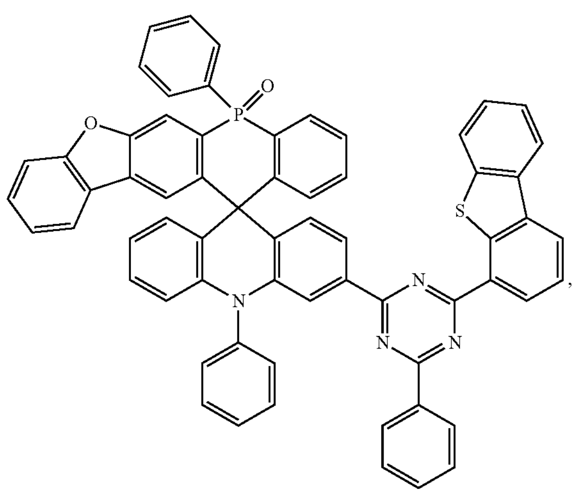
-continued
N63
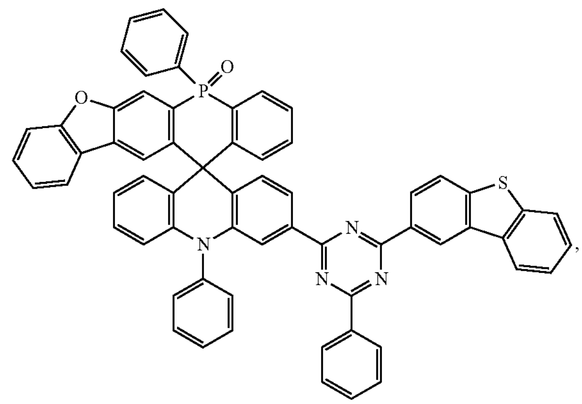
N64
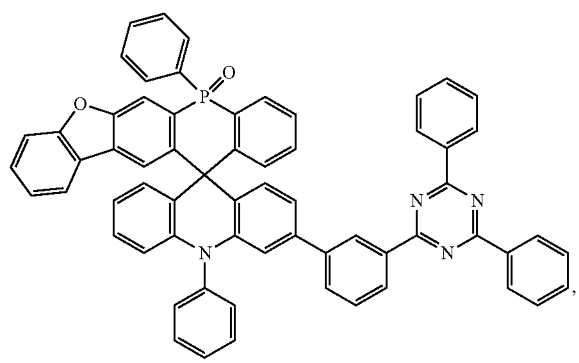
N65
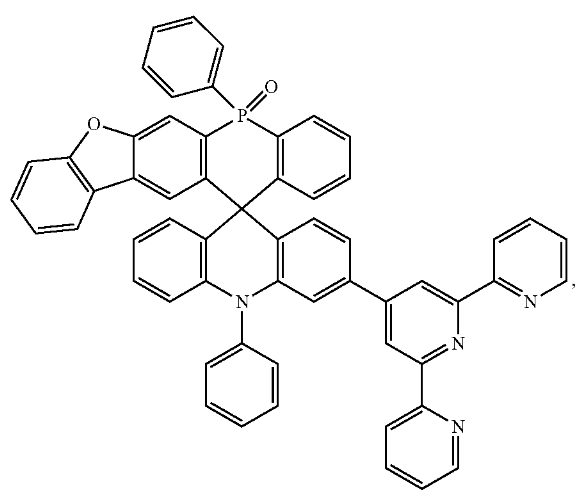

N66
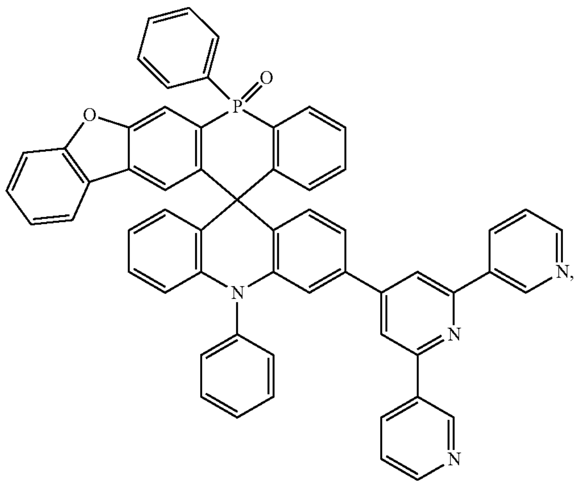
N67
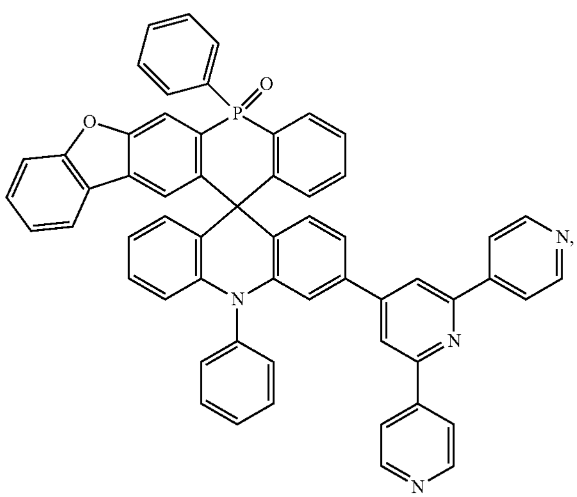
N68
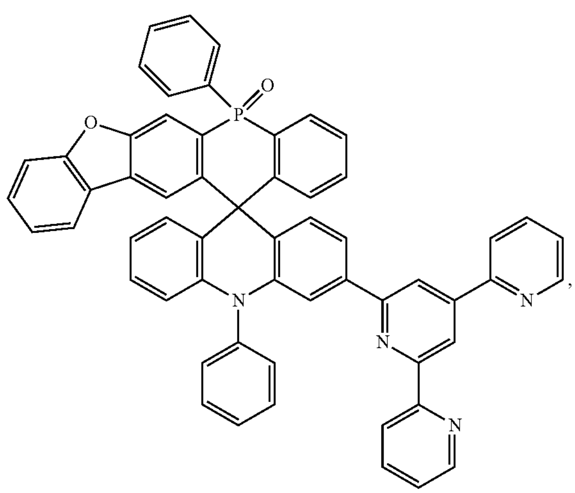
N69
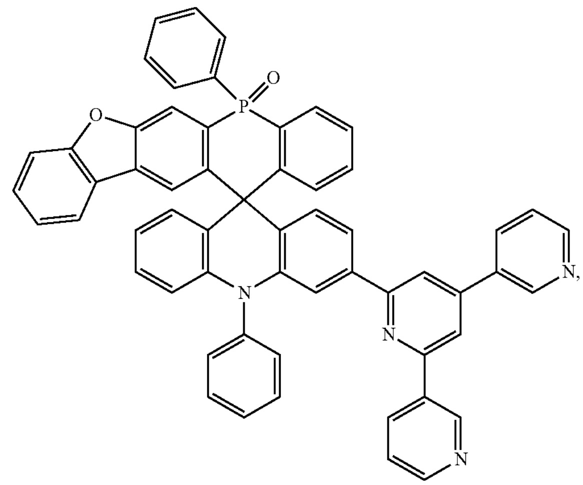
N70
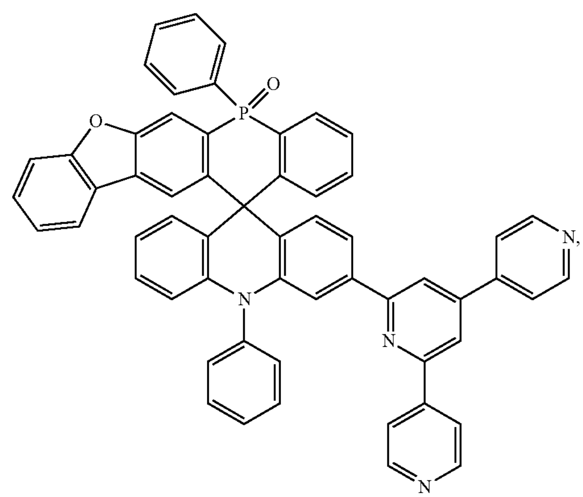
N71
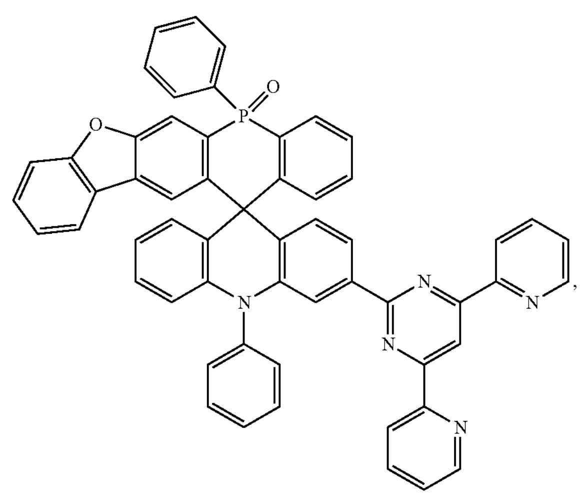

-continued
N72
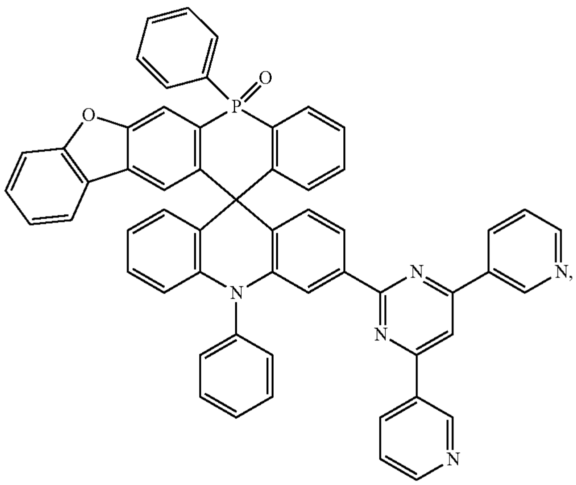
N73
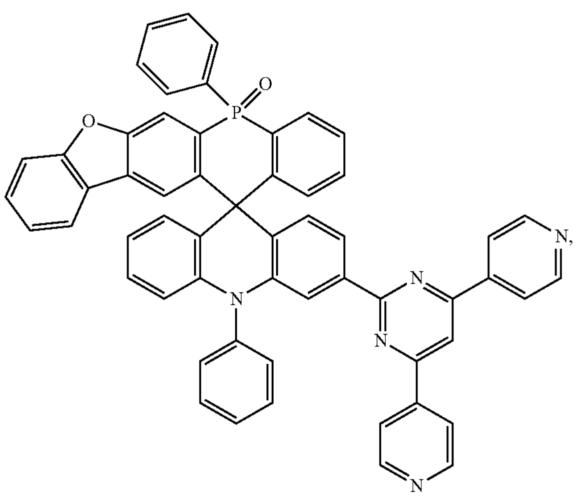
N74
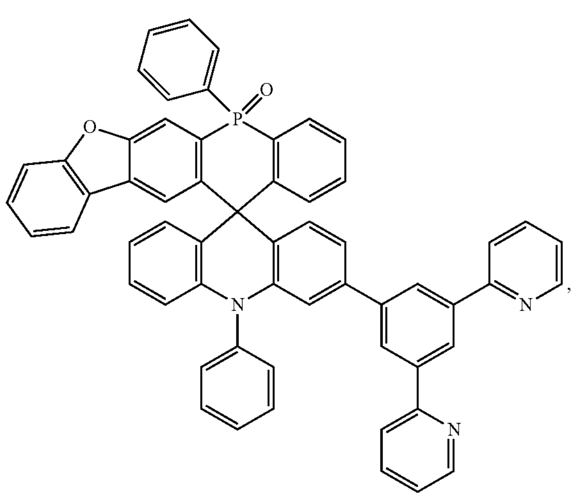
-continued
N75
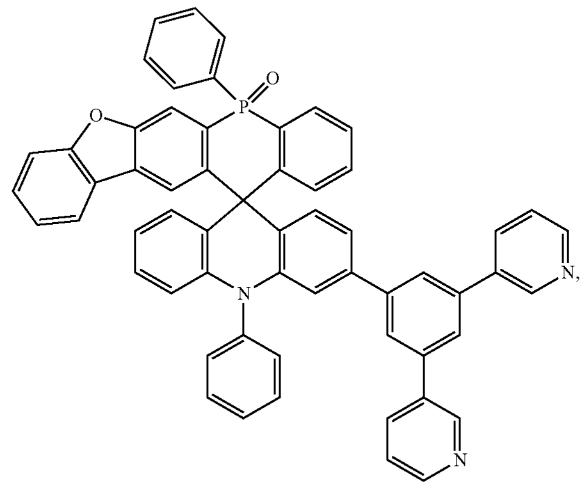
N76
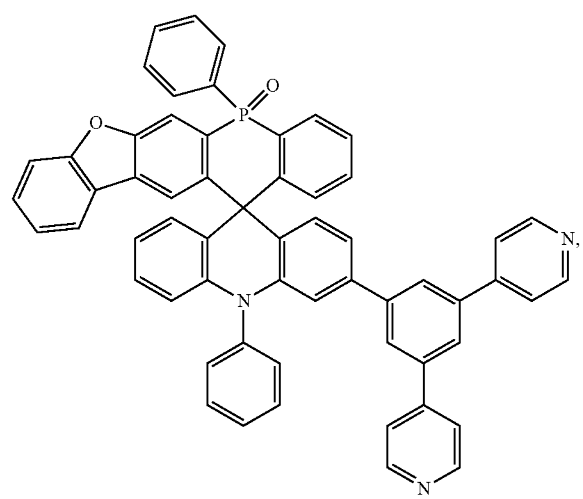
N77
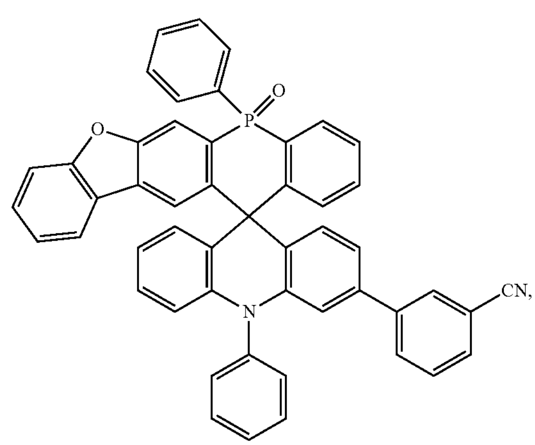

-continued
N78
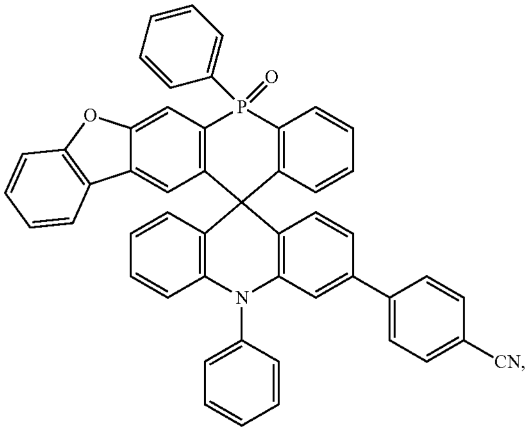
N79
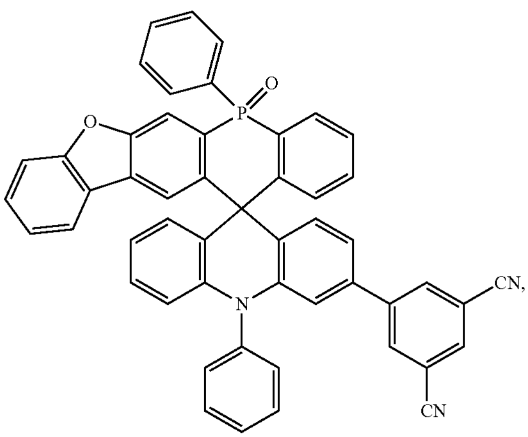
N80
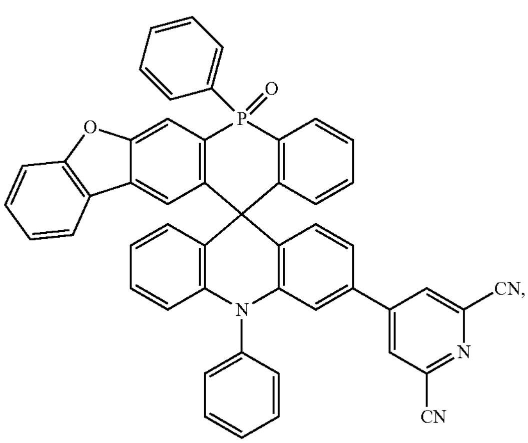
-continued
N81
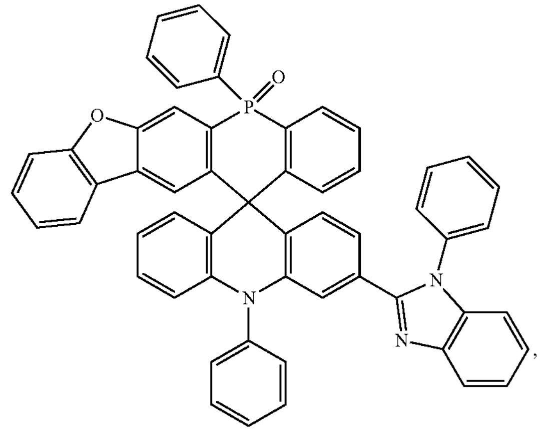
N82
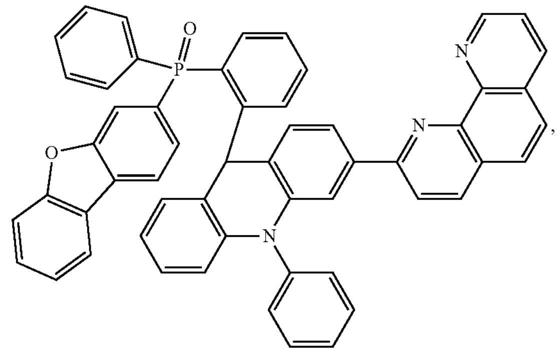
N83
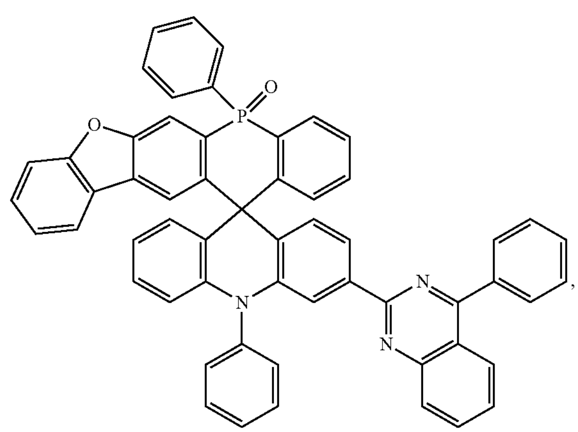

-continued
N84
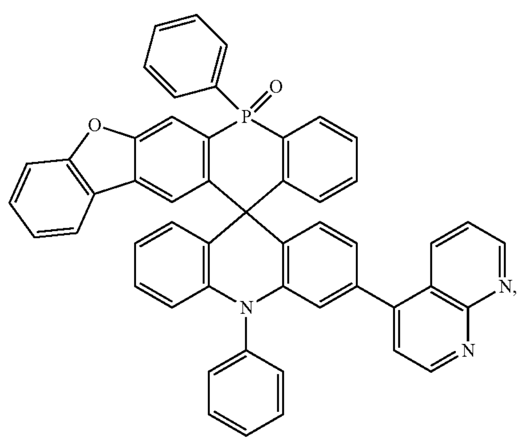
N85
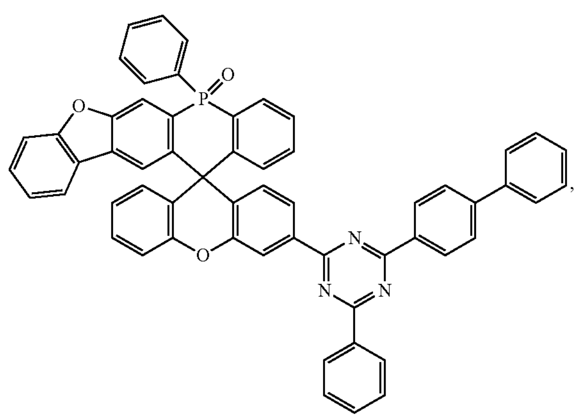
N86
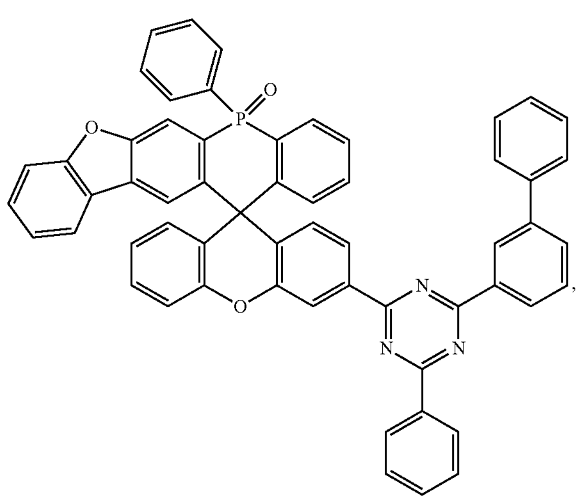
-continued
N87
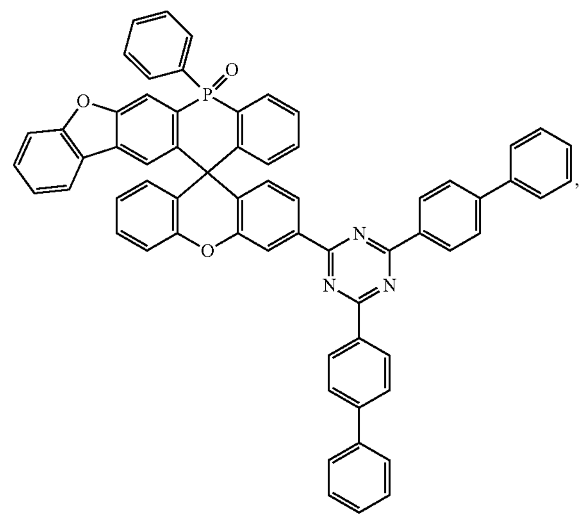
N88
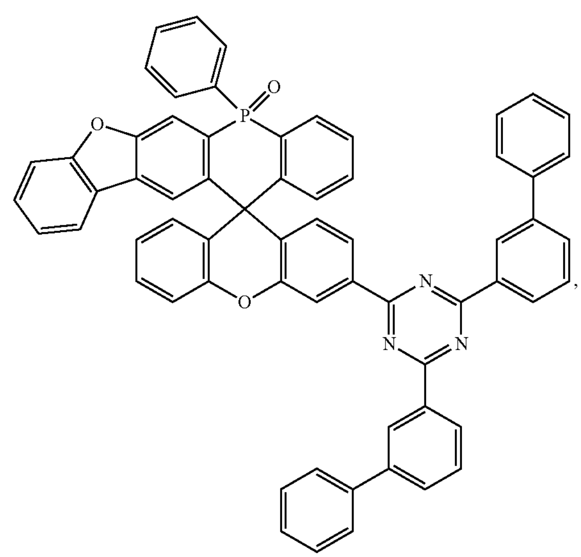
N89
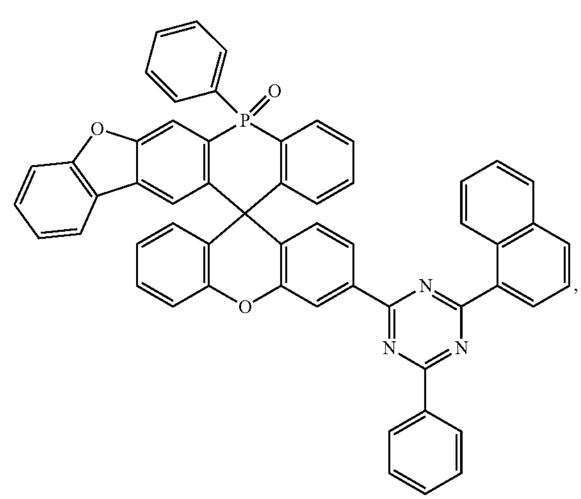

-continued
N90
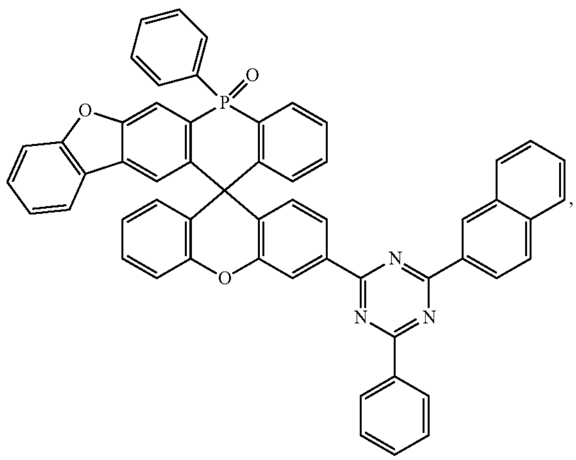
N91
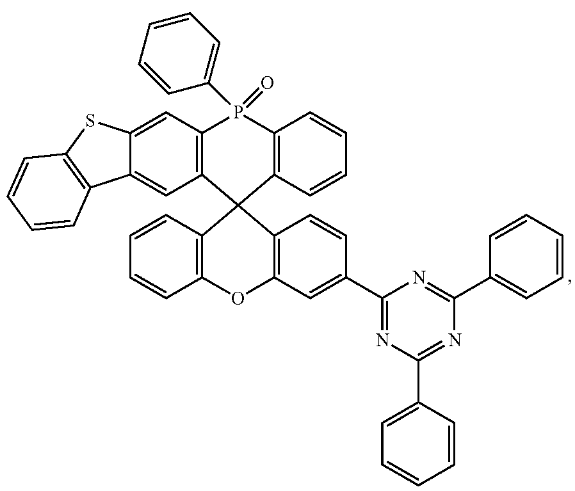
N92
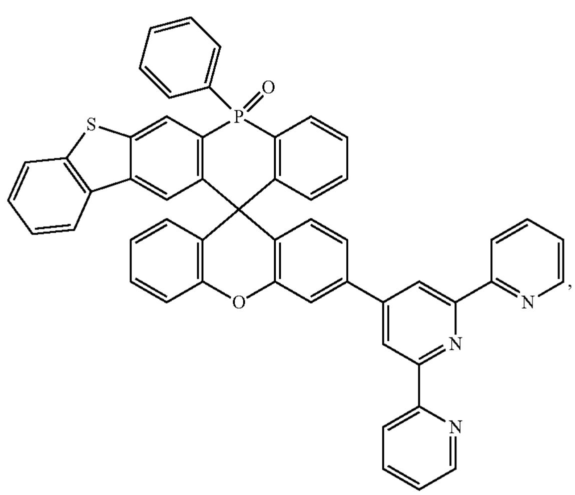
-continued
N93
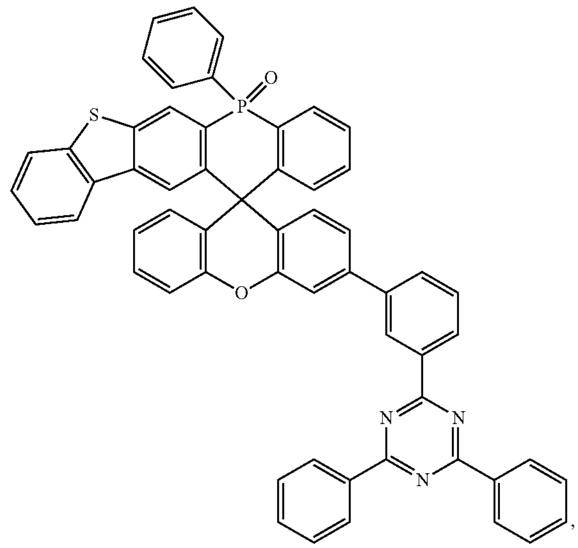
N94
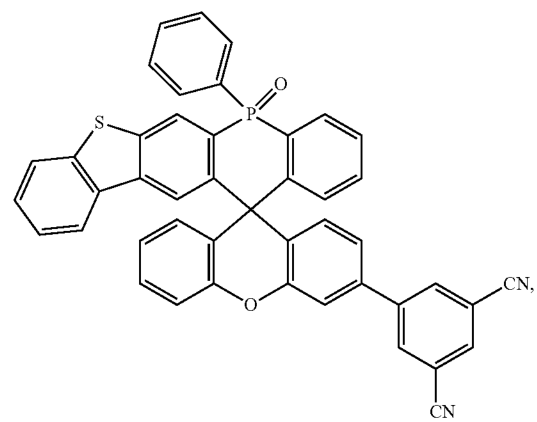
N95
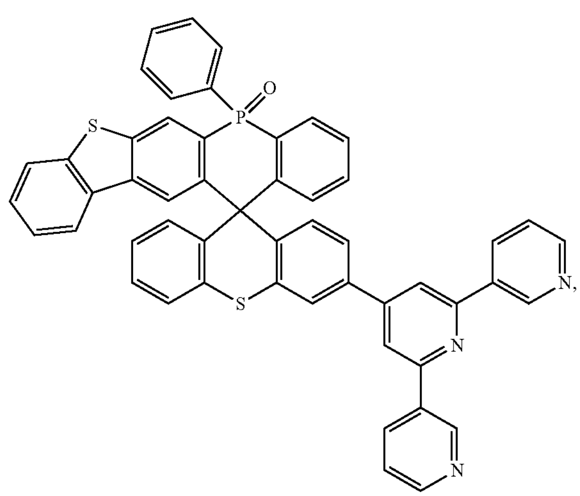

-continued
N96
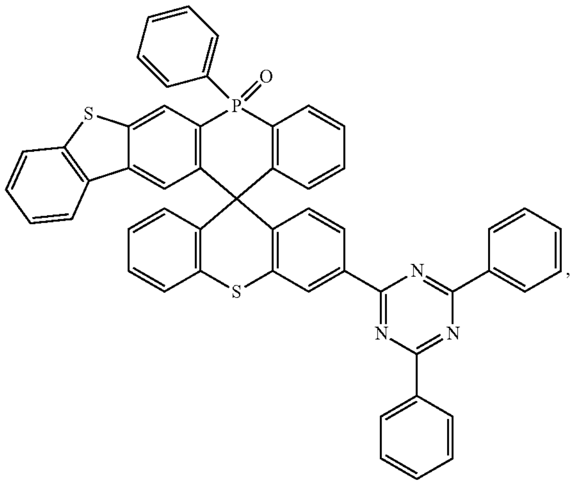
N97
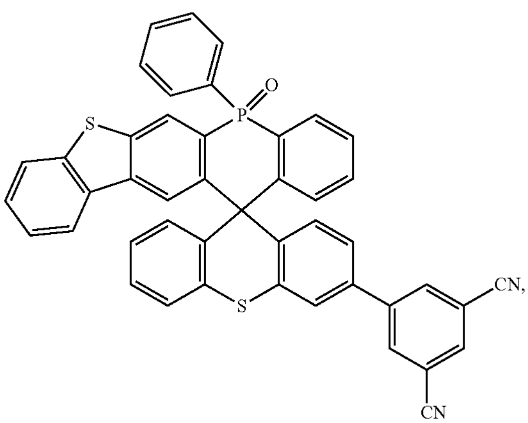
N98
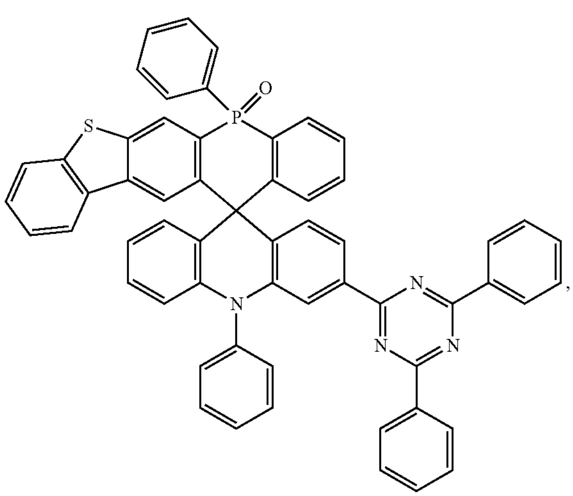
-continued
N99
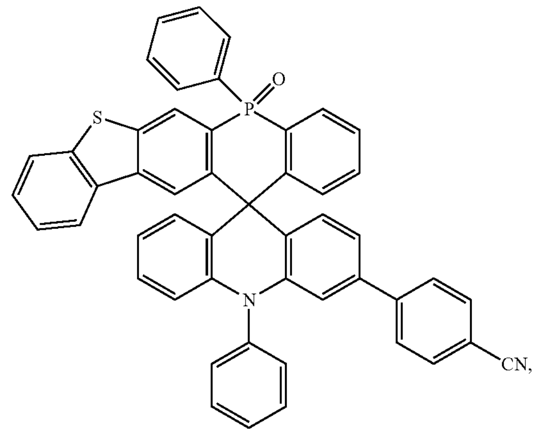
N100
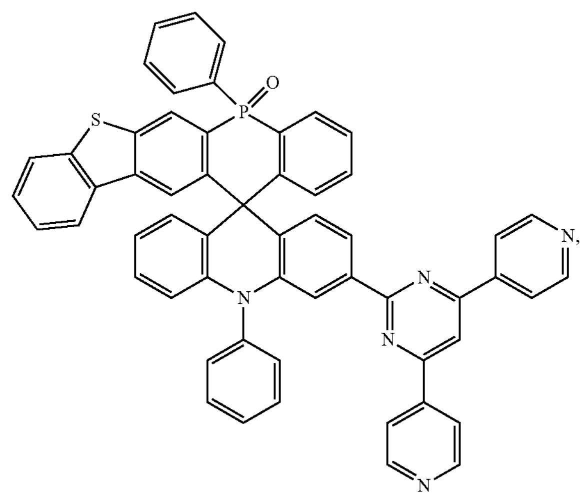
N101
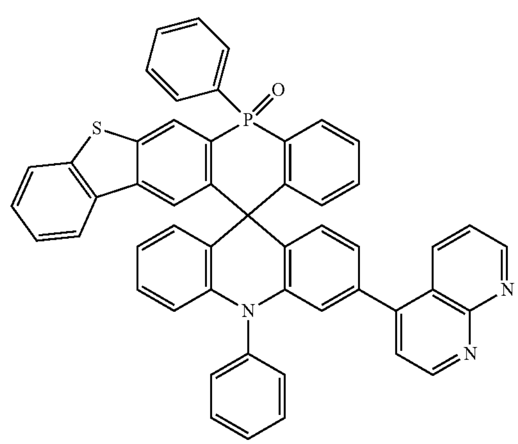
The organic compound with the structure shown in formula I provided by the present disclosure is exemplarily prepared by the following synthetic route:

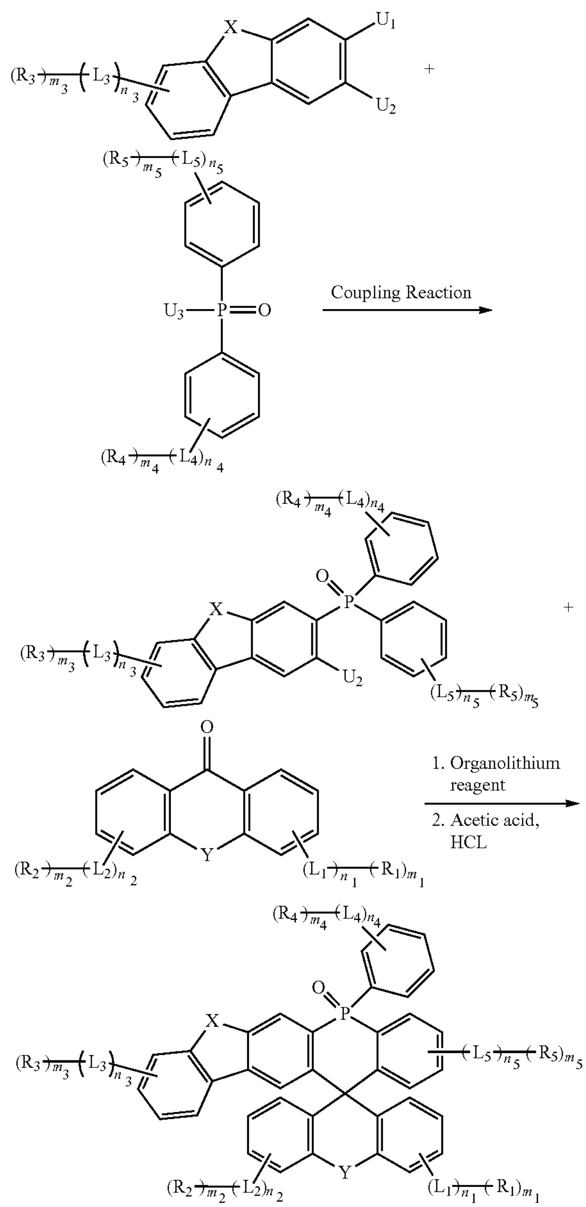

In the above-mentioned synthetic route, X, Y, $L_1$, $L_2$, $L_3$, $L_4$, $L_5$, $R_1$, $R_2$, $R_3$, $R_4$, $R_5$, $n_1$, $n_2$, $n_3$, $n_4$, $n_5$, $m_1$, ma, $m_3$, $m_4$, $m_5$ have a same defined range in formula I; and $U_1$, $U_2$, $U_3$ are each independently selected from halogens (e.g., chlorine, bromine or iodine).

The second objective of the present disclosure is to provide an electroluminescent material, which includes the organic compound as described in the first objective.

The third objective of the present disclosure is to provide a display panel including an OLED device. The OLED device may include an anode, a cathode, and an organic thin-film layer located between the anode and the cathode. The material of the organic thin-film layer may include the electroluminescent material as described in the second objective.

In one embodiment, the organic thin-film layer may include an emission layer, and the material of the emission layer may include the electroluminescent material as described in the second objective.

In one embodiment, the electroluminescent material is used as a phosphorescent host material of the emission layer.

In one embodiment, the organic thin-film layer may include an electron transport layer, and the material of the electron transport layer may include the electroluminescent material as described in the second objective.

In one embodiment, the organic thin-film layer may include a hole blocking layer, and the material of the hole blocking layer may include the electroluminescent material as described in the second objective.

In one embodiment, the organic thin-film layer further may include any one or a combination of at least two of a hole transport layer, a hole injection layer, an electron blocking layer, or an electron injection layer.

In the OLED device of the present disclosure, the anode material may be metal, metal oxide or a conductive polymer. The metal may include copper, gold, silver, iron, chromium, nickel, manganese, palladium, platinum, and alloys thereof. The metal oxide may include indium tin oxide (ITO), indium zinc oxide (IZO), zinc oxide, indium gallium zinc oxide (IGZO), and the like. The conductive polymer may include polyaniline, polypyrrole, poly(3-methylthiophene), and the like. In addition to the above-mentioned materials and combinations that facilitate hole injection, the anode material also may include known materials suitable for anodes.

In the OLED device, the cathode material may be a metal or a multilayer metal material. The metal may include aluminum, magnesium, silver, indium, tin, titanium, and alloys thereof. The multilayer metal material may include LiF/Al, $LiO_2$/Al, $BaF_2$/Al, and the like. In addition to the above-mentioned materials and combinations that facilitate electron injection, the cathode material also may include known materials suitable for cathodes.

In the OLED device, the organic thin-film layer may include at least one emission layer (EML) and one or a combination of a hole transport layer (HTL), a hole injection layer (HIL), an electron blocking layer (EBL), and a hole blocking layer (HBL), electron transport layer (ETL), and electron injection layer (EIL). The hole/electron injection layer and transport layer may be carbazole compounds, aromatic amine compounds, benzimidazole compounds, metal compounds, and the like. Optionally, a caping layer (CPL) may be provided on the cathode of the OLED device (the side away from the anode).

FIG. 1 illustrates the schematic of an OLED device including an anode 101 and a cathode 102, an emission layer 103 disposed between the anode 101 and the cathode 102. A first organic thin-film layer 104 and a second organic thin-film layer 105 are disposed on two sides of the emission layer 103. The first organic thin-film layer 104 is any one or a combination of at least two of a hole transport layer (HTL), a hole injection layer (HIL), or an electron blocking layer (EBL). The second organic thin-film layer 105 may include any one or a combination of at least two of an electron transport layer (ETL), a hole blocking layer (HBL), or an electron injection layer (EIL). A capping layer (CPL) may be optionally disposed on the cathode 102 (the side away from 105).

The OLED device may be prepared by the following. The anode is formed on a transparent or non-transparent smooth substrate, the organic thin layer is formed on the anode, and the cathode is formed on the organic thin layer, where the organic thin layer may be formed by using known film forming manners such as vapor deposition, sputtering, spin coating, dipping, and ion plating.

The fourth objective of the present disclosure is to provide an electronic device including the display panel as described in the third objective.

A plurality of organic compound embodiments of the present disclosure is exemplarily listed hereinafter.

Embodiment 1

An organic compound M1 with the following structure is provided in one embodiment:

M1

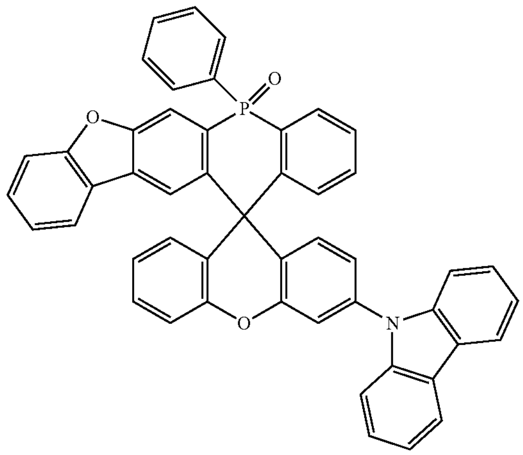

The preparation of the organic compound M1 may include the following steps.

(1)

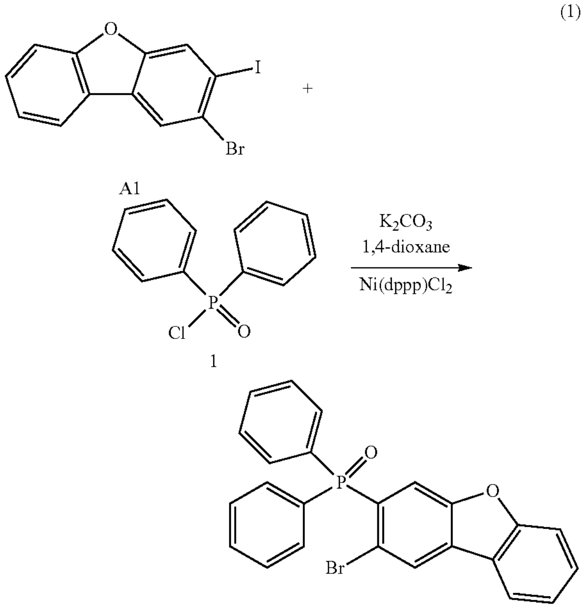

A1

1

B1

Under a nitrogen atmosphere, a reaction solvent 1,4-dioxane is added into a reaction flask, and then a reactant A1 (2 mmol), a reactant 1 (2 mmol), potassium carbonate (8 mmol), and a catalyst Ni (dppp) $Cl_2$ (0.4 mmol) are added sequentially. The reaction solution is heated to 90° C. for overnight reaction. After the reaction is completed, the reaction solution is cooled to room temperature, the organic phase is collected by suction filtration, and dichloromethane $DCM/H_2O$ is added for extraction. The collected organic phase is dried with anhydrous $Na_2SO_4$. The filtrate is collected by suction filtration, the solvent is removed by rotary evaporation, and the column chromatography is performed to obtain a purified intermediate B1 (yield 73%).

The characterization result of the intermediate B1 using matrix-assisted laser desorption ionization time-of-flight mass spectrometry analysis MALDI-TOF MS (m/z) is $C_{26}H_{24}BrO_2P$, with a calculated value about 478.07 and a test value about 478.29.

(2)

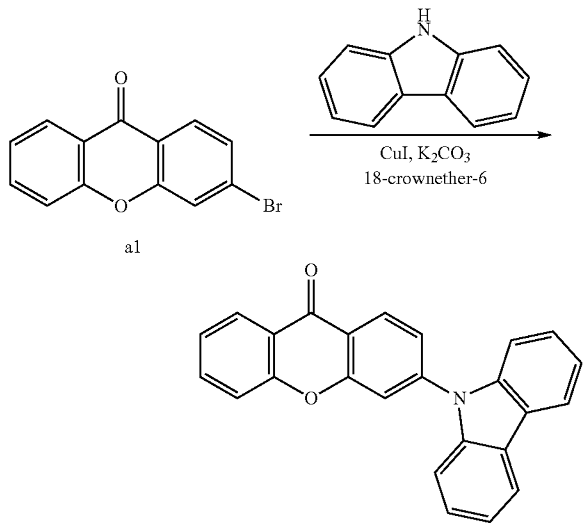

a1 b1

Under a nitrogen atmosphere, 1,2-dichlorobenzene as the reaction solvent is added to the reaction flask, a reactant a1 (2 mmol), a reactant carbazole (2.2 mmol), potassium carbonate (8 mmol), a catalyst CuI (0.4 mmol), a ligand 18-crownether-6 (0.4 mmol) are added sequentially. The reaction solution is heated to 180° C. for 24 h reaction. After the reaction is completed, the reaction solution is cooled to room temperature, the organic phase is collected by suction filtration, and $DCM/H_2O$ is added for extraction. The collected organic phase is dried with anhydrous $Na_2SO_4$. The filtrate is collected by suction filtration, the solvent is removed by rotary evaporation, and the column chromatography is performed to obtain a purified intermediate b1 (yield 75%).

The characterization result of the intermediate b1 using matrix-assisted laser desorption ionization time-of-flight mass spectrometry analysis MALDI-TOF MS (m/z) is $C_{25}H_{15}NO_2$, with a calculated value about 361.11 and a test value about 361.30.

(3)

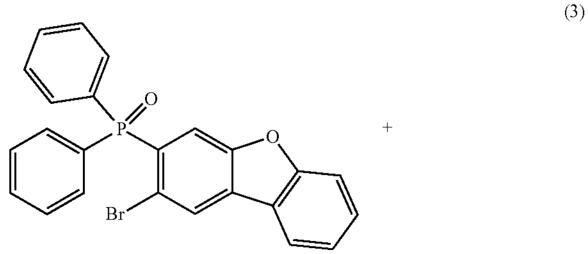

B1

-continued

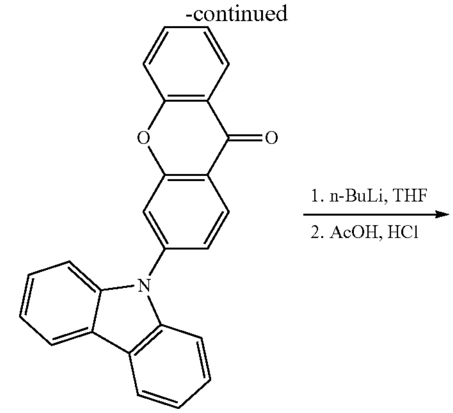

b1

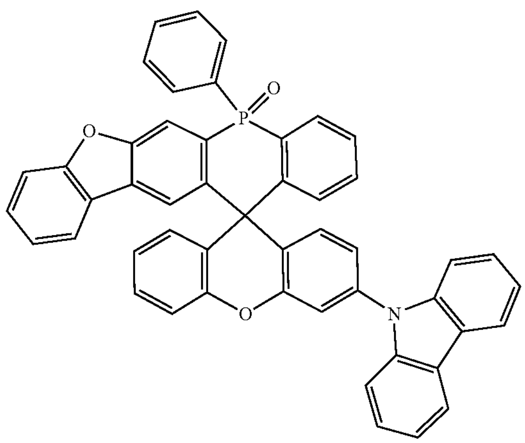

M1

Under a nitrogen atmosphere, the reaction intermediate B1 (1 mmol) is added to 60 mL of anhydrous tetrahydrofuran THF, and n-butyllithium n-BuLi (1 mmol) is added dropwise at −78° C. After the addition is completed, the reaction is performed at −78° C. for 2 h. The intermediate b1 (1 mmol) is dissolved in anhydrous THF, and then added dropwise to the reaction solution. The reaction is continued at low temperature for 1 h, and then the temperature is increased to room temperature for overnight reaction. After the reaction is completed, add a small amount of water is added to quench the reaction and DCM/$H_2O$ is added for extraction. The collected organic phase is dried with anhydrous $Na_2SO_4$. The filtrate is collected by suction filtration, and the solvent is removed by rotary evaporation, thereby obtaining a crude product.

The above-mentioned crude product is added to 30 mL of acetic acid under nitrogen, the reaction mixture is stirred, heated, and reacted at 120° C. for 2 h, then 3 mL of hydrochloric acid is added, and the reaction is heated and reacted at such temperature for 12 h. After the reaction is completed, the reaction solution is cooled, and the extraction is performed. The filtrate is collected, the solvent is removed by rotary evaporation, and the column chromatography is performed to obtain the purified target product M1 (yield 65%).

The characterization result of the organic compound M1 using matrix-assisted laser desorption ionization time-of-flight mass spectrometry analysis MALDI-TOF MS (m/z) is $C_{49}H_{30}NO_3P$, with a calculated value about 711.20 and a test value about 711.40.

The elemental analysis results of the compound are the following: calculated values (%) C 82.69, H 4.25, N 1.97; and test values C 82.68, H 4.24, N 1.98.

Embodiment 2

An organic compound M10 with the following structure is provided in one embodiment:

M10

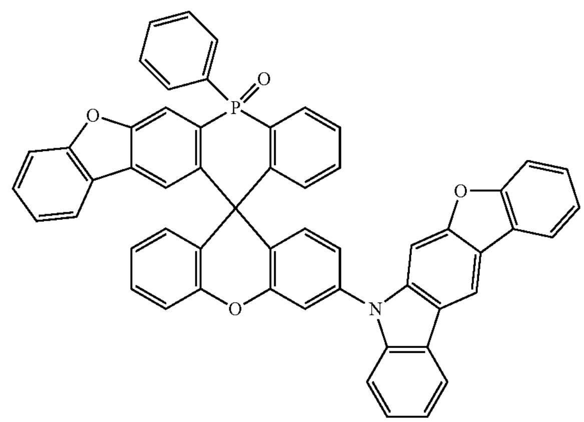

The preparation of the organic compound M10 may include the following steps.

(1)

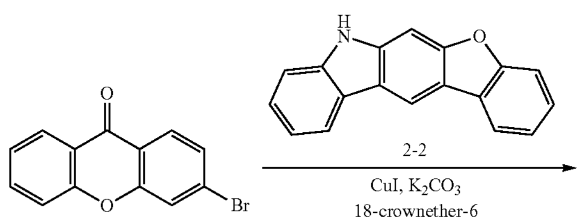

a1

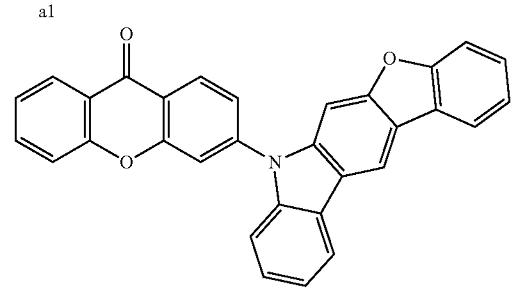

b2

The reactant carbazole in step (2) of embodiment 1 is replaced with an equimolar amount of a compound 2-2; other raw materials and reaction steps are same as step (2) of embodiment 1 to obtain an intermediate b2 (yield 70%).

The characterization result of the intermediate b2 using matrix-assisted laser desorption ionization time-of-flight mass spectrometry analysis MALDI-TOF MS (m/z) is $C_{31}H_{17}NO_3$, with a calculated value about 451.12 and a test value about 451.33.

(2)

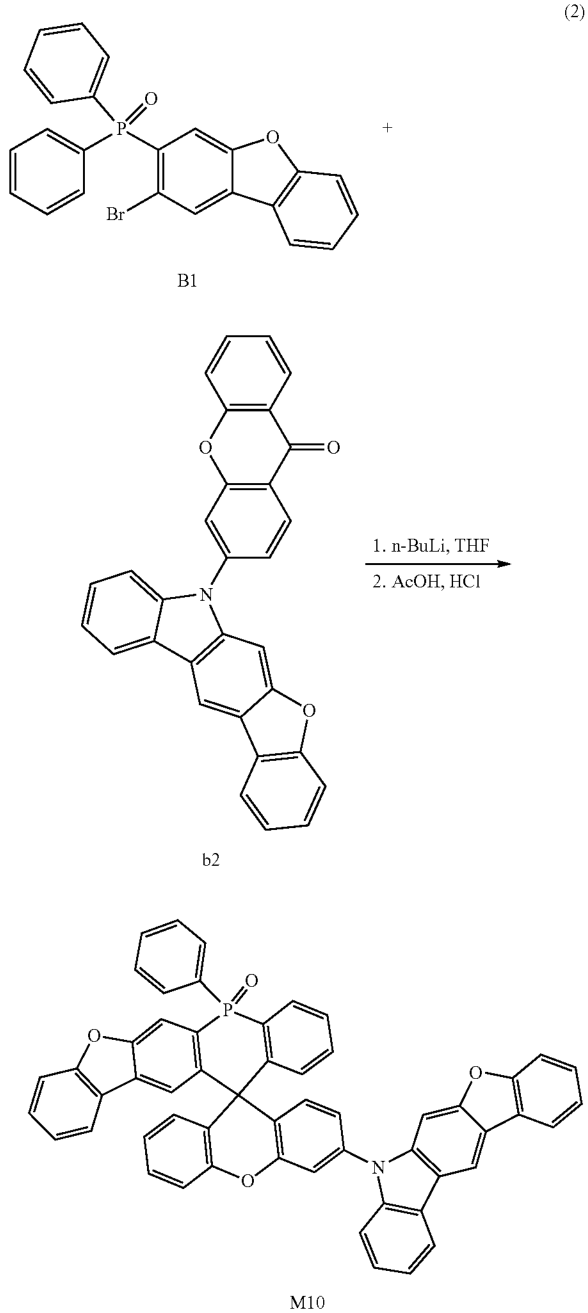

The intermediate b1 in step (3) of embodiment 1 is replaced with an equimolar amount of the intermediate b2; and other raw materials and reaction steps are same as step (3) of embodiment 1 to obtain the target product M10 (yield 62%).

The characterization result of the organic compound M10 using matrix-assisted laser desorption ionization time-of-flight mass spectrometry analysis MALDI-TOF MS (m/z) is $C_{55}H_{32}NO_4P$, with a calculated value about 801.21 and a test value about 801.40.

The elemental analysis results of the compound are the following: calculated values (%) C 82.39, H 4.02, N 1.75; and test values C 82.38, H 4.01, N 1.76.

Embodiment 3

An organic compound M25 with the following structure is provided in one embodiment:

M25

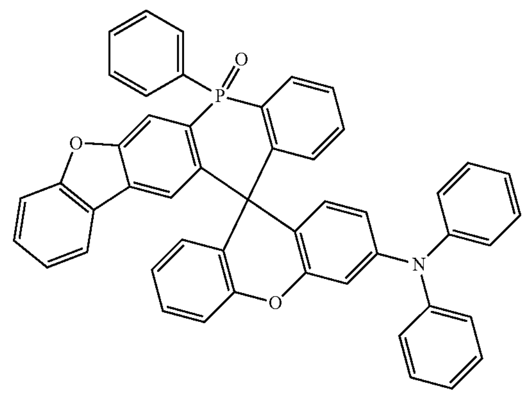

The preparation of the organic compound M25 may include the following steps.

(1)

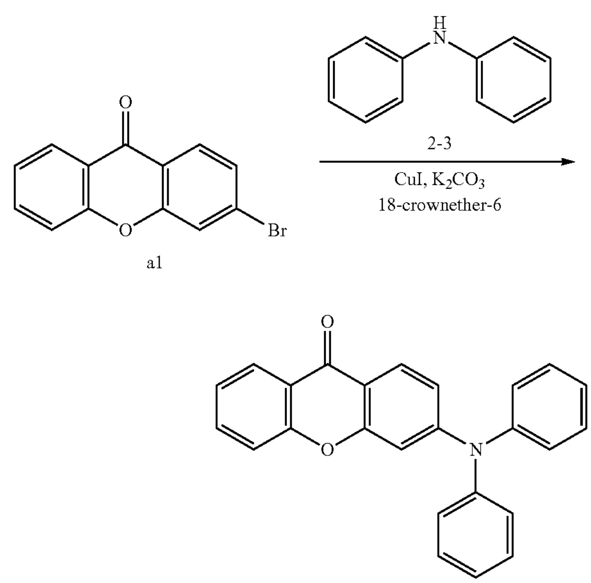

The reactant carbazole in step (2) of embodiment 1 is replaced with an equimolar amount of a compound 2-3; and other raw materials and reaction steps are same as step (2) of embodiment 1 to obtain an intermediate b3 (yield 68%).

The characterization result of the intermediate b3 using matrix-assisted laser desorption ionization time-of-flight mass spectrometry analysis MALDI-TOF MS (m/z) is $C_{25}H_{17}NO_2$, with a calculated value about 363.13 and a test value about 363.32.

(2)

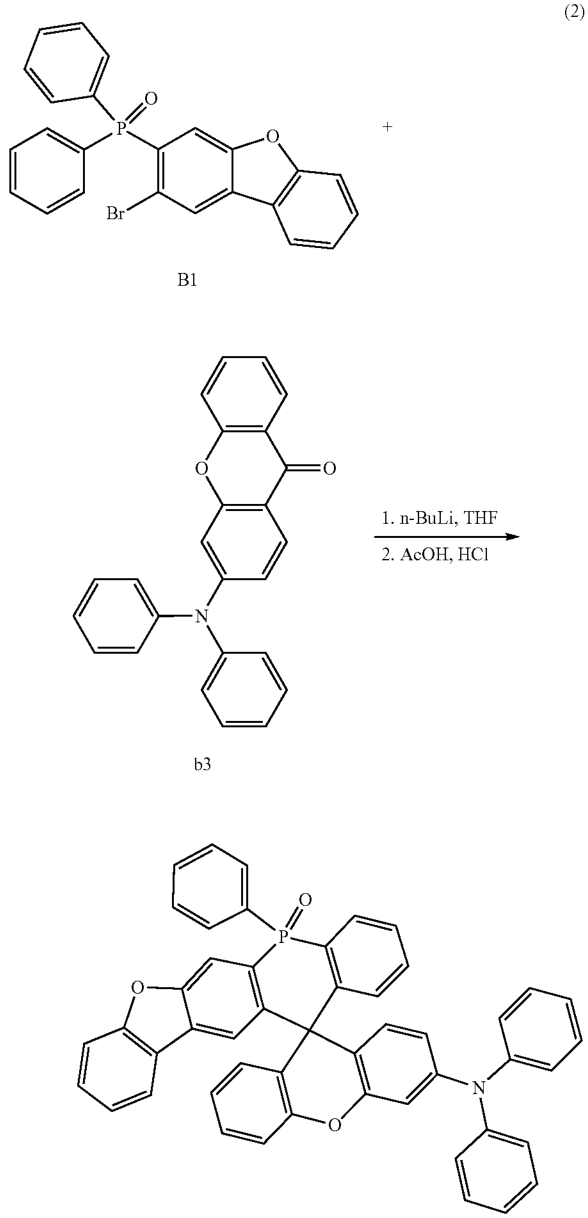

M25

The intermediate b1 in step (3) of embodiment 1 is replaced with an equimolar amount of the intermediate b3; and other raw materials and reaction steps are same as step (3) of embodiment 1 to obtain the target product M25 (yield 60%).

The characterization result of the organic compound M25 using matrix-assisted laser desorption ionization time-of-flight mass spectrometry analysis MALDI-TOF MS (m/z) is $C_{49}H_{32}NO_3P$, with a calculated value about 713.21 and a test value about 713.39.

The elemental analysis results of the compound are the following: calculated values (%) C 82.45, H 4.52, N 1.96; and test values C 82.44, H 4.51, N 1.97.

Embodiment 4

An organic compound M26 with the following structure is provided in one embodiment:

M26

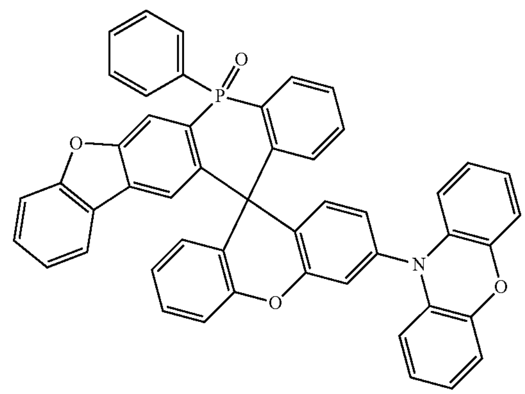

The preparation of the organic compound M26 may include the following steps.

(1)

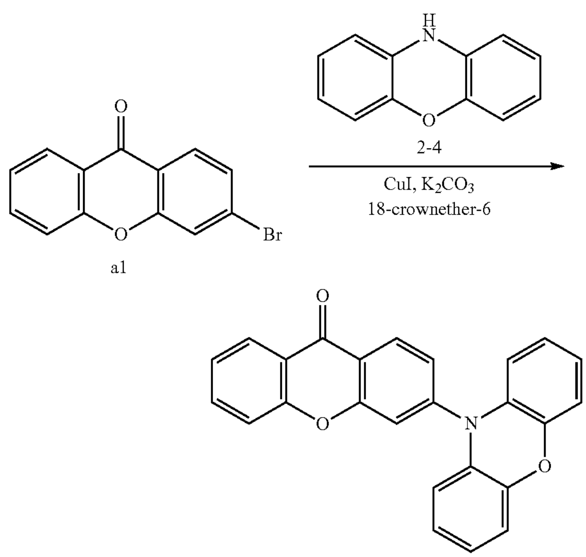

b4

The reactant carbazole in step (2) of embodiment 1 is replaced with an equimolar amount of a compound 2-4; and other raw materials and reaction steps are same as step (2) of embodiment 1 to obtain an intermediate b4 (yield 67%).

The characterization result of the intermediate b4 using matrix-assisted laser desorption ionization time-of-flight mass spectrometry analysis MALDI-TOF MS (m/z) is $C_{25}H_{15}NO_3$, with a calculated value about 377.11, and a test value about 377.31.

(2)

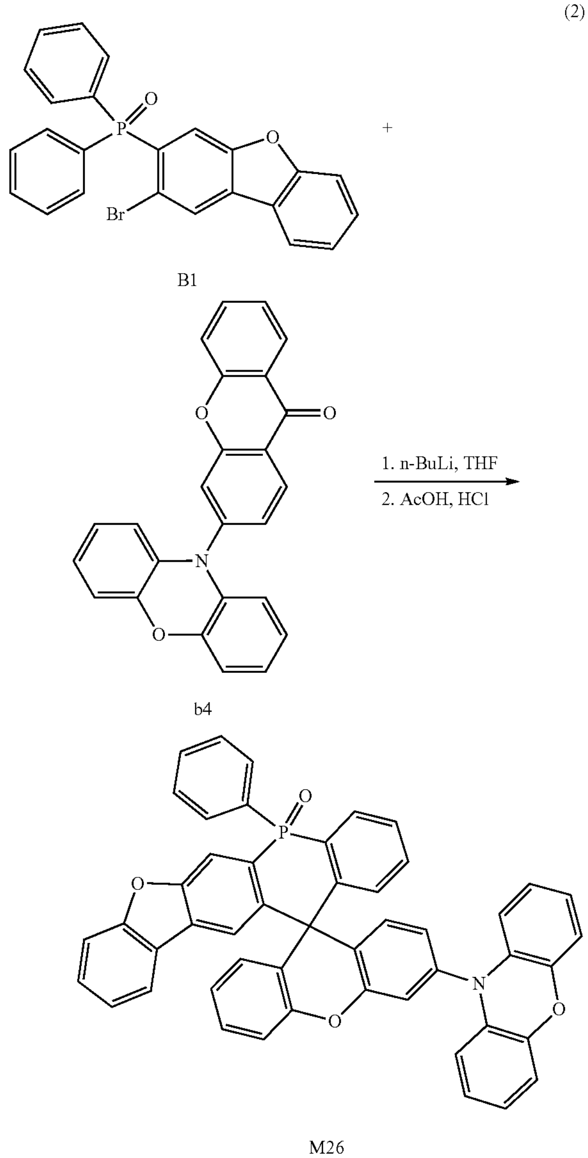

The intermediate b1 in step (3) of embodiment 1 is replaced with an equimolar amount of the intermediate b4; and other raw materials and reaction steps are same as step (3) of embodiment 1 to obtain the target product M26 (yield 60%).

The characterization result of the organic compound M26 using matrix-assisted laser desorption ionization time-of-flight mass spectrometry analysis MALDI-TOF MS (m/z) is $C_{49}H_{30}NO_4P$, with a calculated value about 727.19 and a test value about 727.38.

The elemental analysis results of the compound are the following: calculated values (%) C 80.87, H 4.16, N 1.92; and test values C 80.86, H 4.15, N 1.93.

Embodiment 5

An organic compound M2 with the following structure is provided in one embodiment:

M2

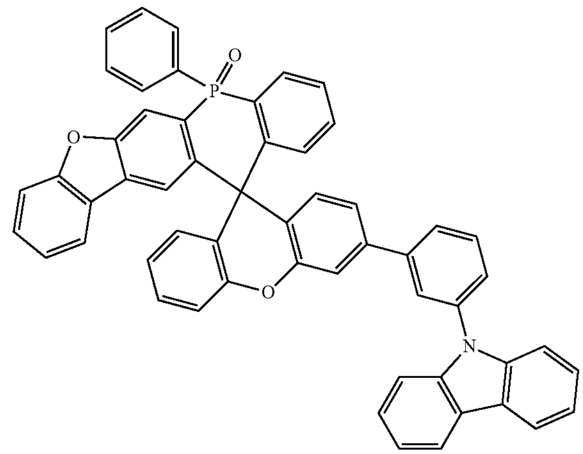

The preparation of the organic compound M2 may include the following steps.

(1)

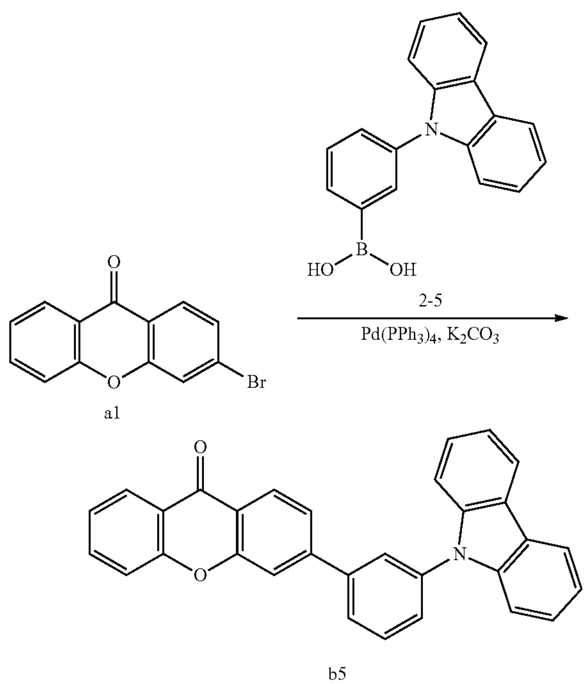

Under a nitrogen atmosphere, about 100 mL of 1,4-dioxane solvent is added to a 250 mL reaction flask, then $K_2CO_3$ (2.5 mmol), a reactant a1 (1 mmol), and a reactant 2-5 (1.2 mmol), and the palladium catalyst $Pd(PPh_3)_4$ (0.05 mmol) are sequentially added. The reaction solution is heated to 100° C. for overnight reaction. After the reaction is completed, the reaction solution is cooled to room temperature, and $DCM/H_2O$ is added for extraction. The collected organic phase is dried with anhydrous $Na_2SO_4$. The filtrate is collected by suction filtration, the solvent is removed by rotary evaporation, and the column chromatography is performed to obtain a purified intermediate b5 (yield 80%).

The characterization result of the intermediate b5 using matrix-assisted laser desorption ionization time-of-flight mass spectrometry analysis MALDI-TOF MS (m/z) is $C_{31}H_{19}NO_2$, with a calculated value about 437.14 and a test value about 437.33.

(2)

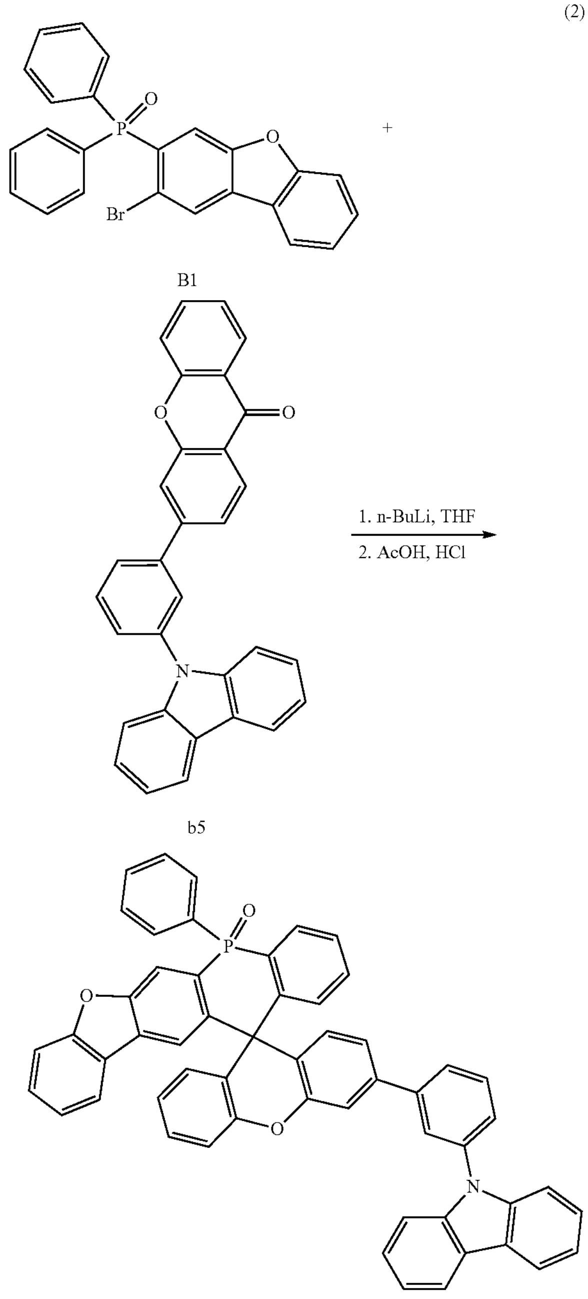

B1 b5

M2

The intermediate b1 in step (3) of embodiment 1 is replaced with an equimolar amount of the intermediate b5; and other raw materials and reaction steps are same as step (3) of embodiment 1 to obtain the target product M2 (yield 68%).

The characterization result of the organic compound M2 using matrix-assisted laser desorption ionization time-of-flight mass spectrometry analysis MALDI-TOF MS (m/z) is $C_{55}H_{34}NO_3P$, with a calculated value about 787.23 and a test value about 787.40.

The elemental analysis results of the compound are the following: calculated values (%) C 83.85, H 4.35, N 1.78; and test values C 83.86, H 4.34, N 1.79.

Embodiment 6

An organic compound M41 with the following structure is provided in one embodiment:

M41

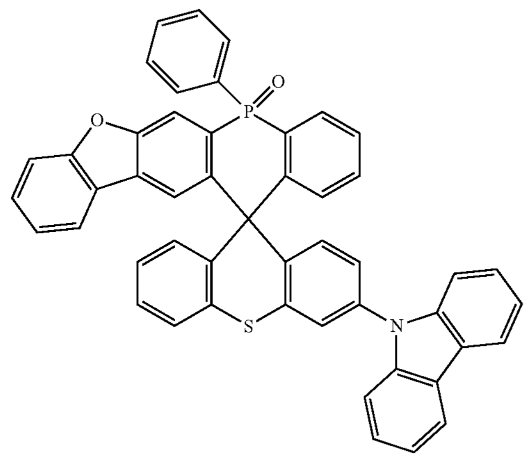

The preparation of the organic compound M41 may include the following steps.

(1)

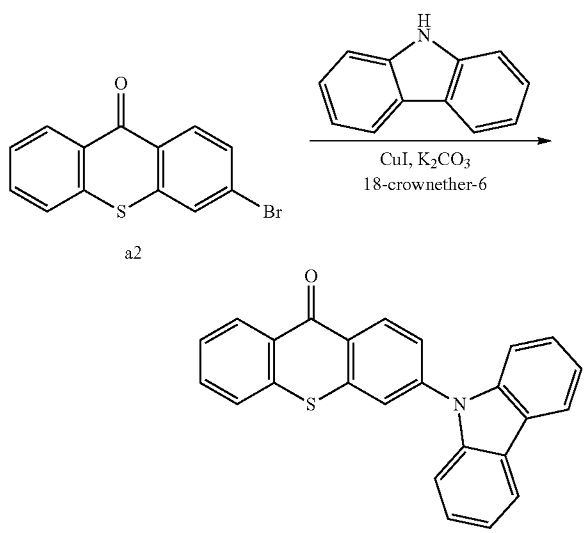

a2 c1

Under a nitrogen atmosphere, a reaction solvent 1,2-dichlorobenzene is added to a reaction flask, add a reactant a2 (2 mmol), a reactant carbazole (2.2 mmol), potassium carbonate (8 mmol), a catalyst CuI (0.4 mmol), and a ligand 18-crown ether-6 (0.4 mmol) are sequentially added. The reaction solution is heated to 180° C. for 24 h reaction. After the reaction is completed, the reaction solution is cooled to room temperature, the organic phase is collected by suction filtration, and DCM/$H_2O$ is added for extraction. The collected organic phase is dried with anhydrous $Na_2SO_4$. The filtrate is collected by suction filtration, the solvent is removed by rotary evaporation, and the column chromatography is performed to obtain purified an intermediate cl (yield 73%).

The characterization result of the intermediate cl using matrix-assisted laser desorption ionization time-of-flight mass spectrometry analysis MALDI-TOF MS (m/z) is $C_{25}H_{15}NOS$, with a calculated value about 377.09 and a test value about 377.28.

(2)

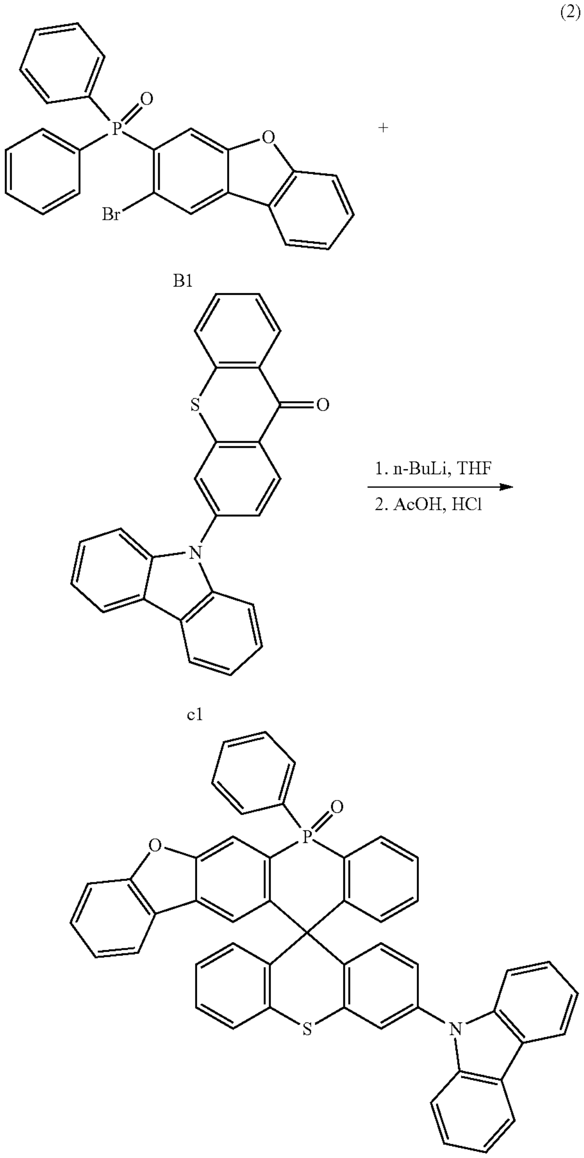

M41

The intermediate b1 in step (3) of embodiment 1 is replaced with an equimolar amount of the intermediate cl; and other raw materials and reaction steps are same as step (3) of embodiment 1 to obtain the target product M41 (yield 62%).

The characterization result of the organic compound M41 using matrix-assisted laser desorption ionization time-of-flight mass spectrometry analysis MALDI-TOF MS (m/z) is $C_{49}H_{30}NO_2PS$, with a calculated value about 727.17 and a test value about 727.35.

The elemental analysis results of the compound are the following: calculated values (%) C 80.86, H 4.15, N 1.92; and test values C 80.85, H 4.14, N 1.93.

Embodiment 7

An organic compound M81 with the following structure is provided in one embodiment:

M81

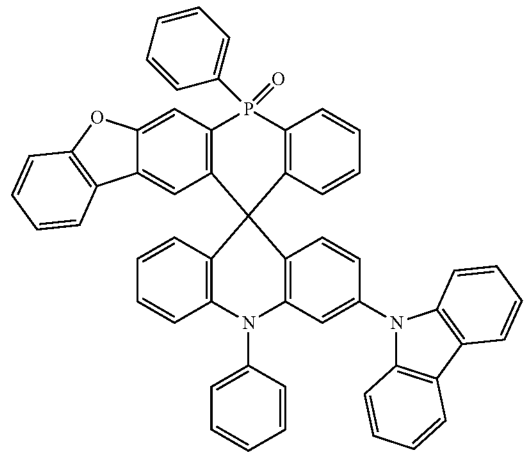

The preparation of the organic compound M81 may include the following steps.

(1)

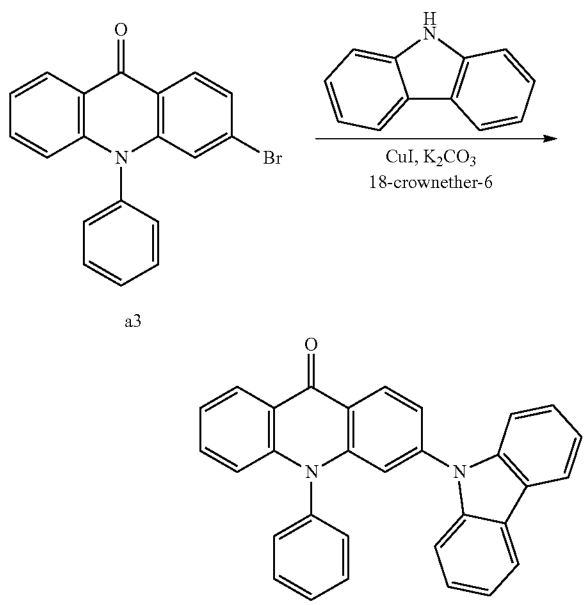

d1

Under a nitrogen atmosphere, 1,2-dichlorobenzene is added to a reaction flask, and a reactant a3 (2 mmol), a reactant carbazole (2.2 mmol), potassium carbonate (8 mmol), a catalyst CuI (0.4 mmol), and a ligand 18-crown-6 (0.4 mmol) are sequentially added. The reaction solution is heated to 180° C. for 24 h reaction. After the reaction is completed, the reaction solution is cooled to room temperature, the organic phase is collected by suction filtration, and DCM/$H_2O$ is added for extraction. The collected organic phase is dried with anhydrous $Na_2SO_4$. The filtrate is collected by suction filtration, the solvent is removed by rotary evaporation, and the column chromatography is performed to obtain purified an intermediate d1 (yield 73%).

The characterization result of the intermediate d1 using matrix-assisted laser desorption ionization time-of-flight mass spectrometry analysis MALDI-TOF MS (m/z) is $C_{31}H_{20}N_2O$, with calculated values about 436.16 and test values about 436.37.

(2)

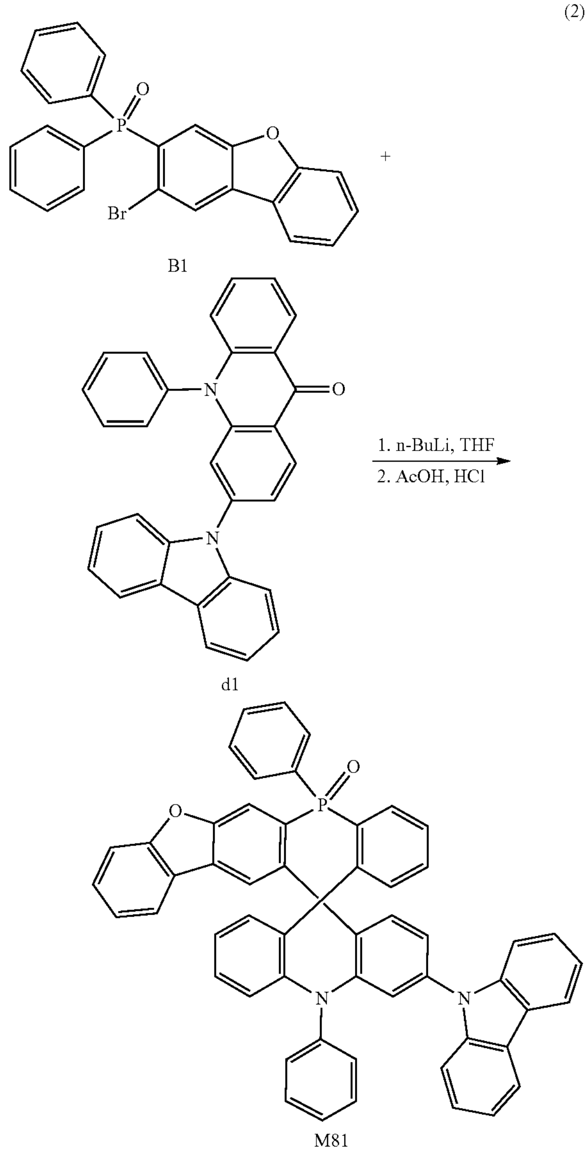

The intermediate b1 in step (3) of embodiment 1 is replaced with an equimolar amount of the intermediate d1; and other raw materials and reaction steps are same as step (3) of embodiment 1 to obtain the target product M81 (yield 60%).

The characterization result of the organic compound M81 using matrix-assisted laser desorption ionization time-of-flight mass spectrometry analysis MALDI-TOF MS (m/z) is $C_{55}H_{35}N_2O_2P$, with a calculated value about 786.24 and a test value about 786.41.

The elemental analysis results of the compound are the following: calculated values (%) C 83.95, H 4.48, N 3.56; and test values C 83.94, H 4.47, N 3.58.

Embodiment 8

An organic compound M120 with the following structure is provided in one embodiment:

M120

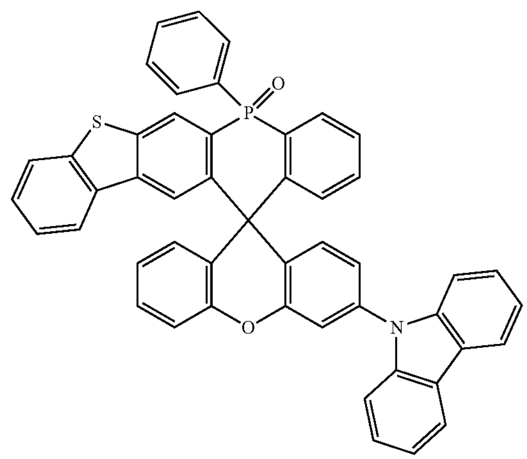

The preparation of the organic compound M120 may include the following steps.

(1)

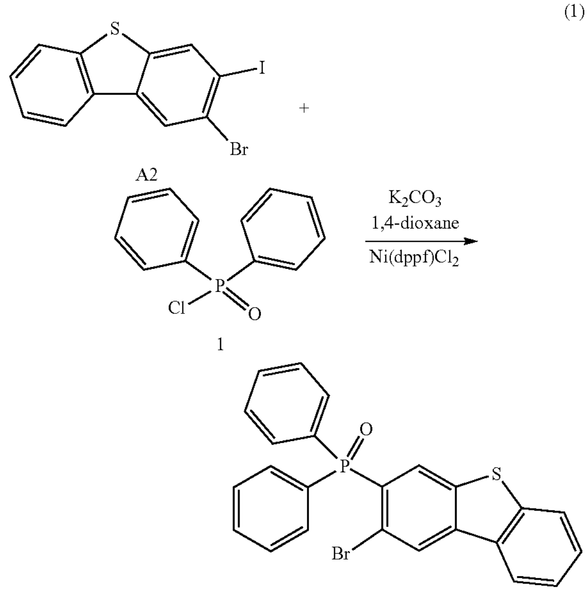

The reactant A1 in step (1) of embodiment 1 is replaced with an equimolar amount of a compound A2; and other raw materials and reaction steps are same as step (1) of embodiment 1 to obtain an intermediate B2 (yield 71%).

The characterization result of the intermediated B2 using matrix-assisted laser desorption ionization time-of-flight mass spectrometry analysis MALDI-TOF MS (m/z) is $C_{26}H_{24}BrOPS$, with calculated values about 494.05 and test values about 494.35.

(2)

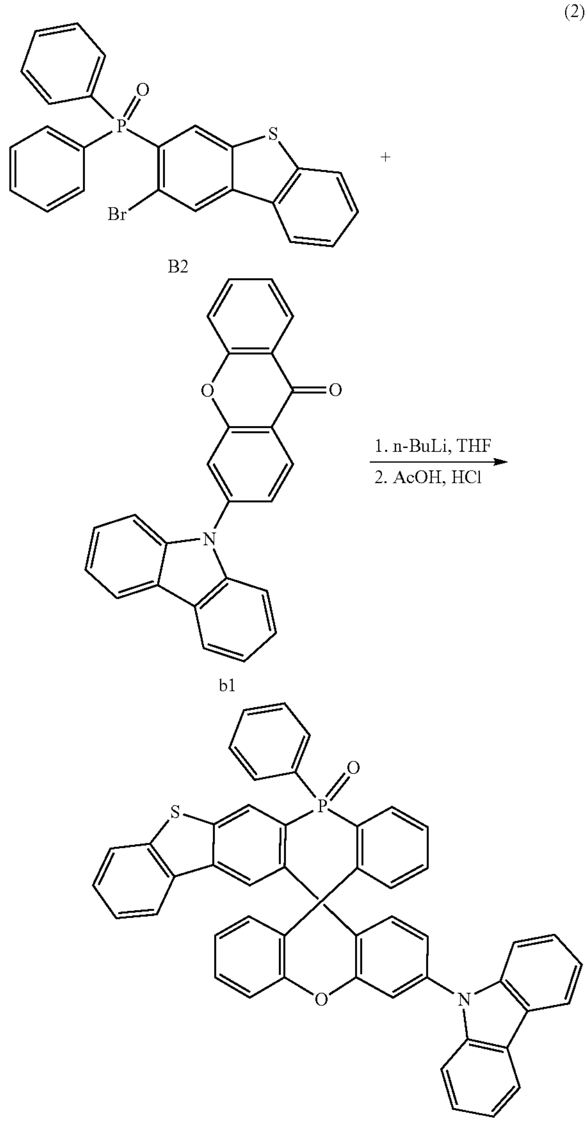

B2 b1

M120

The intermediate B1 in step (3) of embodiment 1 is replaced with an equimolar amount of the intermediate B2; and other raw materials and reaction steps are same as step (3) of embodiment 1 to obtain the target product M120 (yield 65%).

The characterization result of the organic compound M120 using matrix-assisted laser desorption ionization time-of-flight mass spectrometry analysis MALDI-TOF MS (m/z) is $C_{49}H_{30}NO_2PS$, with a calculated value about 727.17 and a test value about 727.35.

The elemental analysis results of the compound are the following: calculated values (%) C 80.86, H 4.15, N 1.92; and test values C 80.85, H 4.14, N 1.93.

Embodiment 9

An organic compound M127 with the following structure is provided in one embodiment:

M127

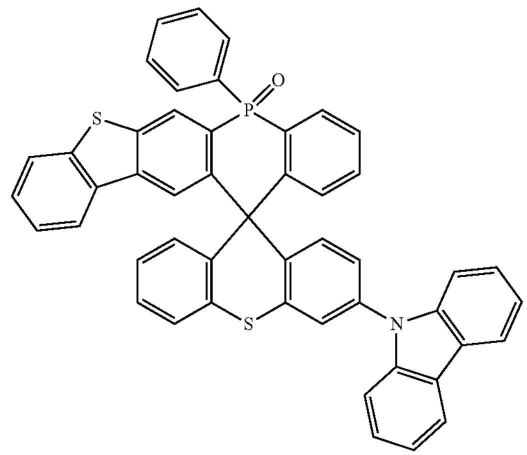

The preparation of the organic compound M127 may include the following steps.

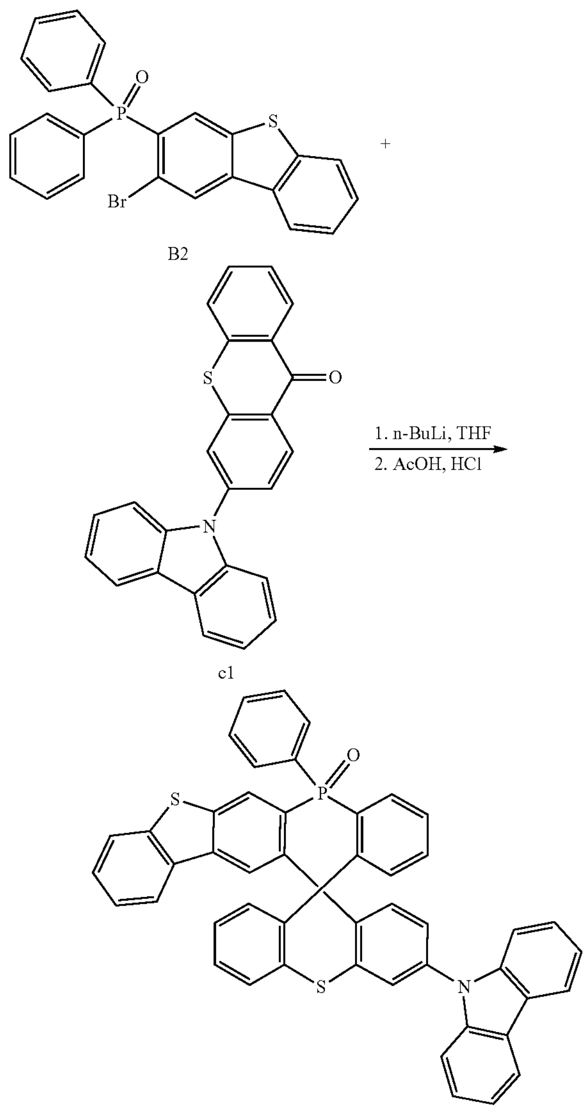

B2 c1

M127

Under a nitrogen atmosphere, the reaction intermediate B2 (1 mmol) is added to 60 mL of anhydrous tetrahydrofuran THF, and n-BuLi (1 mmol) is added dropwise at −78° C. After the addition is completed, the reaction is performed at −78° C. for 2 h. The intermediate cl (1 mmol) is dissolved in anhydrous THF, and then added dropwise to the reaction solution. The reaction is continued at low temperature for 1 h, and then the temperature is increased to room temperature for overnight reaction. After the reaction is completed, add a small amount of water is added to quench the reaction and DCM/$H_2O$ is added for extraction. The collected organic phase is dried with anhydrous $Na_2SO_4$. The filtrate is collected by suction filtration, and the solvent is removed by rotary evaporation, thereby obtaining a crude product.

The above-mentioned crude product is added to 30 mL of acetic acid under nitrogen, the reaction mixture is stirred, heated, and reacted at 120° C. for 2 h, then 3 mL of hydrochloric acid is added, and the reaction is heated and reacted at such temperature for 12 h. After the reaction is completed, the reaction solution is cooled, and the extraction is performed.

The filtrate is collected, the solvent is removed by rotary evaporation, and the column chromatography is performed to obtain the purified target product M127 (yield 63%).

The characterization result of the organic compound M127 using matrix-assisted laser desorption ionization time-of-flight mass spectrometry analysis MALDI-TOF MS (m/z) is $C_{49}H_{30}NOPS_2$, with calculated values about 743.15 and test values about 743.34.

The elemental analysis results of the compound are the following: calculated values (%) C 79.12, H 4.06, N 1.88; and test values C 79.11, H 4.05, N 1.89.

Embodiment 10

An organic compound N1 with the following structure is provided in one embodiment:

N1

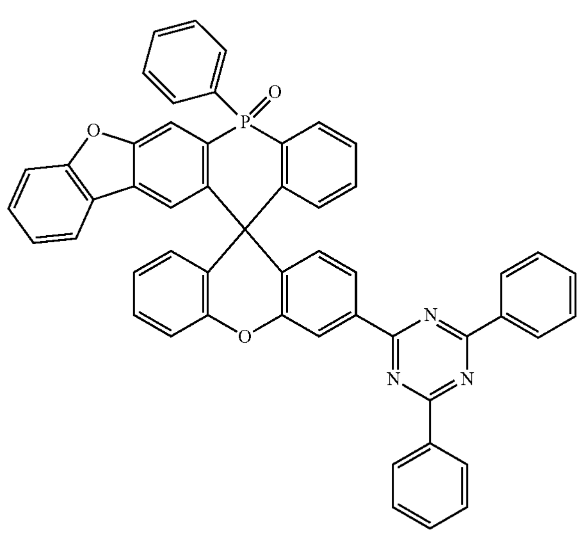

The preparation of the organic compound N1 may include the following steps.

(1)

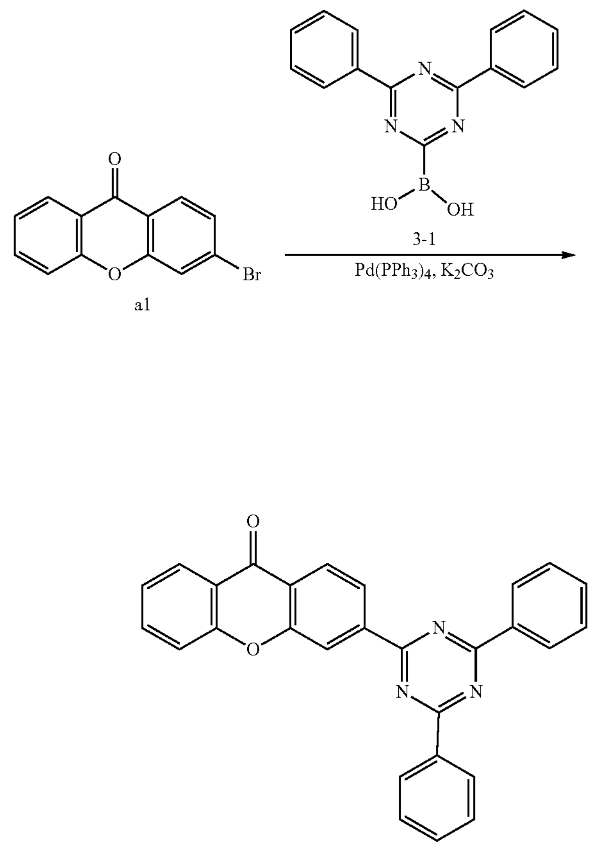

b6

Under a nitrogen atmosphere, about 100 mL of 1,4-dioxane is added to a 250 mL reaction flask, then $K_2CO_3$ (2.5 mmol), a reactant a1 (1 mmol), and a reactant 2-5 (1.2 mmol), and a palladium catalyst $Pd(PPh_3)_4$ (0.05 mmol) are sequentially added. The reaction solution is heated to 100° C. for overnight reaction. After the reaction is completed, the reaction solution is cooled to room temperature, the organic phase is collected by suction filtration, and DCM/$H_2O$ is added for extraction. The collected organic phase is dried with anhydrous $Na_2SO_4$. The filtrate is collected by suction filtration, the solvent is removed by rotary evaporation, and the column chromatography is performed to obtain a purified intermediate b6 (yield 75%).

The characterization result of the intermediate b6 using matrix-assisted laser desorption ionization time-of-flight mass spectrometry analysis MALDI-TOF MS (m/z) is $C_{28}H_{17}N_3O_2$, with a calculated value about 427.13 and a test value about 427.32.

(2)

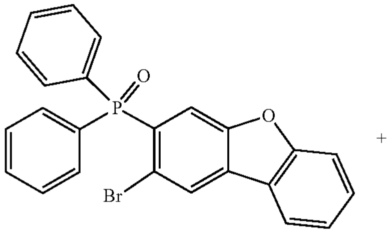

B1

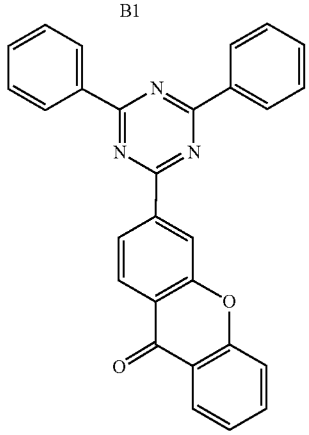

b6

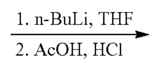

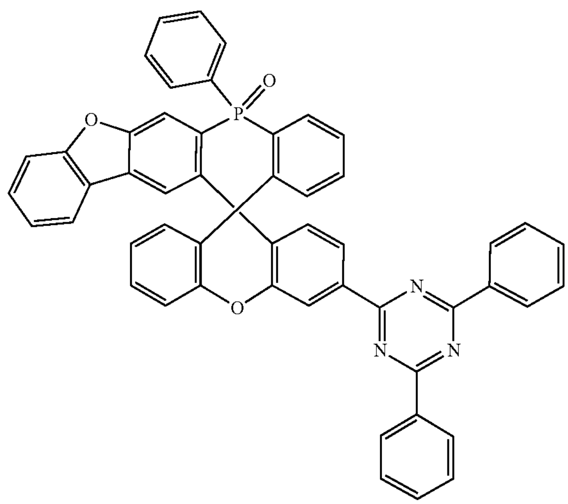

N1

The intermediate b1 in step (3) of embodiment 1 is replaced with an equimolar amount of the intermediate b6; and other raw materials and reaction steps are same as step (3) of embodiment 1 to obtain the target product N1 (yield 70%).

The characterization result of the organic compound N1 using matrix-assisted laser desorption ionization time-of-flight mass spectrometry analysis MALDI-TOF MS (m/z) is $C_{52}H_{32}N_3O_3P$, with calculated values about 777.22 and test values about 777.40.

The elemental analysis results of the compound are the following: calculated values (%) C 80.30, H 4.15, N 5.40; and test values C 80.29, H 4.14, N 5.43.

Embodiment 11

An organic compound N10 with the following structure is provided in one embodiment:

N10

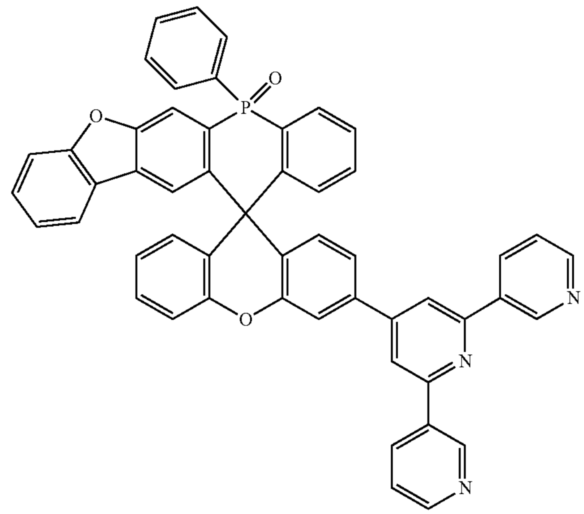

The preparation of the organic compound N10 may include the following steps.

(1)

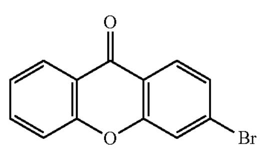

a1

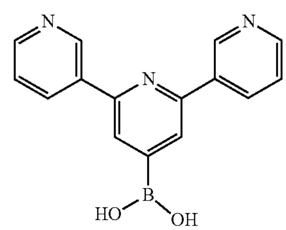

3-2

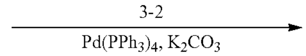

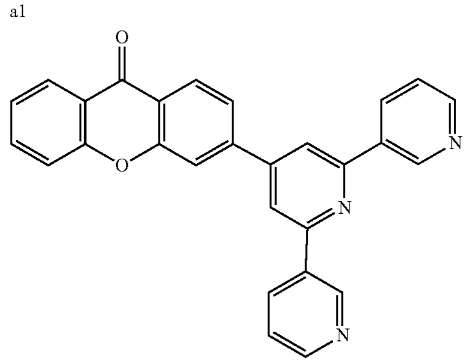

b7

The reactant 3-1 in step (1) of embodiment 10 is replaced with an equimolar amount of a reactant 3-2; and other raw materials and reaction steps are same as step (1) of embodiment 10 to obtain an intermediate b7 (yield 68%).

The characterization result of the organic compound b7 using matrix-assisted laser desorption ionization time-of-flight mass spectrometry analysis MALDI-TOF MS (m/z) is $C_{28}H_{17}N_3O_2$, with calculated values about 427.13 and test values about 427.34.

(2)

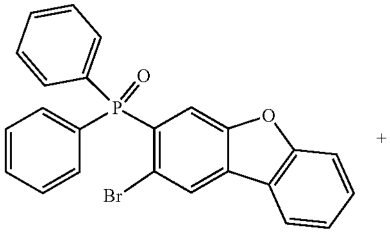

B1

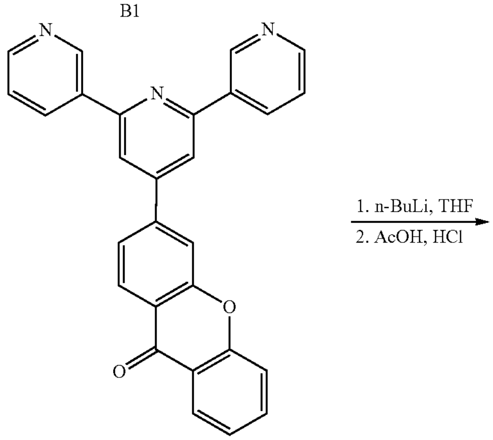

b7

1. n-BuLi, THF
2. AcOH, HCl

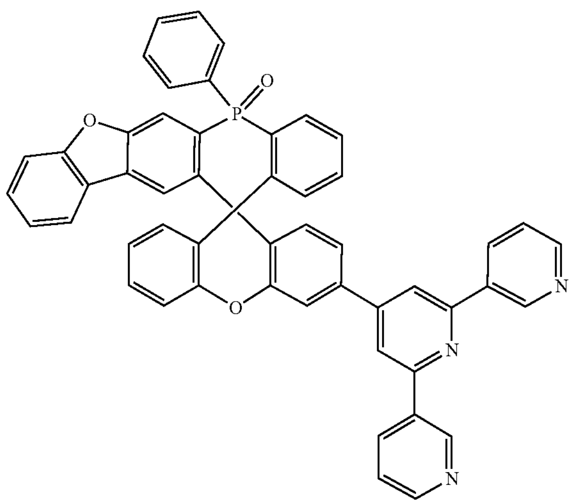

N10

The intermediate b1 in step (3) of embodiment 1 is replaced with an equimolar amount of the intermediate b7; and other raw materials and reaction steps are same as step (3) of embodiment 1 to obtain the target product N10 (yield 68%).

The characterization result of the organic compound N10 using matrix-assisted laser desorption ionization time-of-flight mass spectrometry analysis MALDI-TOF MS (m/z) is $C_{52}H_{32}N_3O_3P$, with calculated values about 777.22 and test values about 777.39.

The elemental analysis results of the compound are the following: calculated values (%) C 80.30, H 4.15, N 5.40; and test values C 80.29, H 4.14, N 5.42.

Embodiment 12

An organic compound N10 with the following structure is provided in one embodiment:

N29

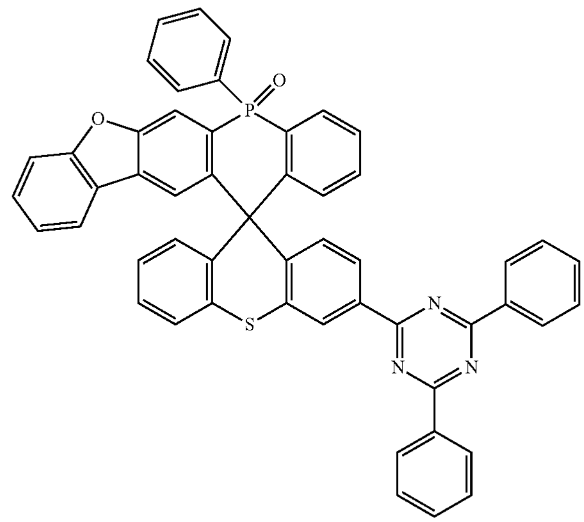

The preparation of the organic compound N29 may include the following steps.

(1)

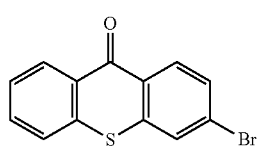

a2

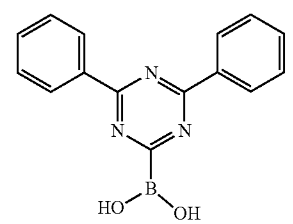

3-1

$Pd(PPh_3)_4$, $K_2CO_3$

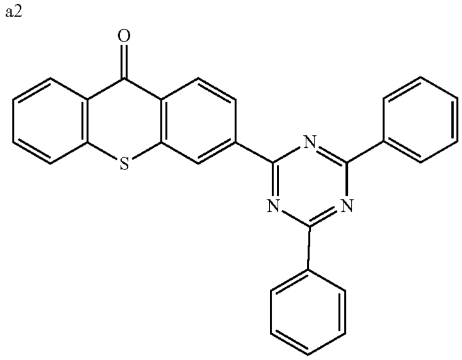

c2

The reactant a1 in step (1) of embodiment 10 is replaced with an equimolar amount of the reactant a2; and other raw materials and reaction steps are same as step (1) of embodiment 10 to obtain an intermediate c2 (yield 69%).

The characterization result of the intermediate c2 using matrix-assisted laser desorption ionization time-of-flight mass spectrometry analysis MALDI-TOF MS (m/z) is $C_{28}H_{17}N_3OS$, with calculated values about 443.11 and test values about 443.30.

(2)

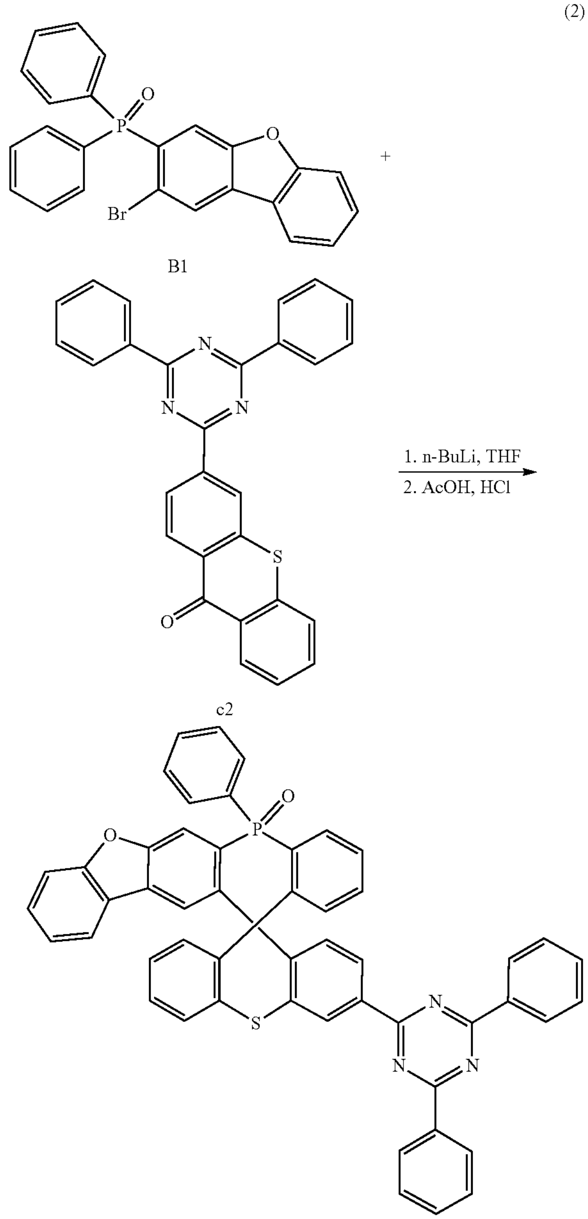

N29

The intermediate b1 in step (3) of embodiment 1 is replaced with an equimolar amount of the intermediate c2; and other raw materials and reaction steps are same as step (3) of embodiment 1 to obtain the target product N29 (yield 70%).

The characterization result of the organic compound N29 using matrix-assisted laser desorption ionization time-of-flight mass spectrometry analysis MALDI-TOF MS (m/z) is $C_{52}H_{32}N_3O_2PS$, with calculated values about 793.20 and test values about 793.39.

The elemental analysis results of the compound are the following: calculated values (%) C 78.67, H 4.06, N 5.29; and test values: C 78.66, H 4.05, N 5.31.

Embodiment 13

An organic compound N57 with the following structure is provided in one embodiment:

N57

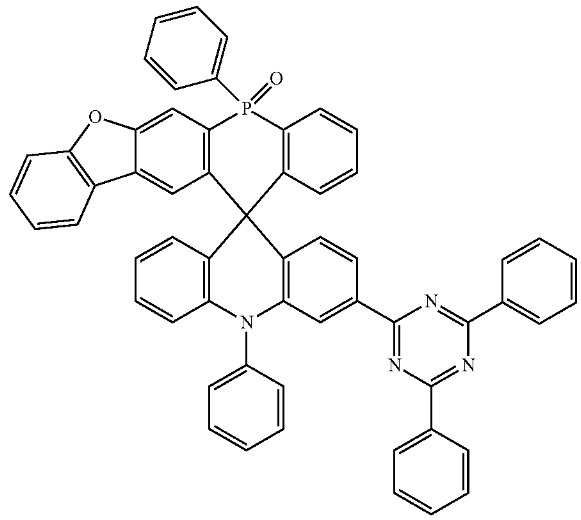

The preparation of the organic compound N57 may include the following steps.

(1)

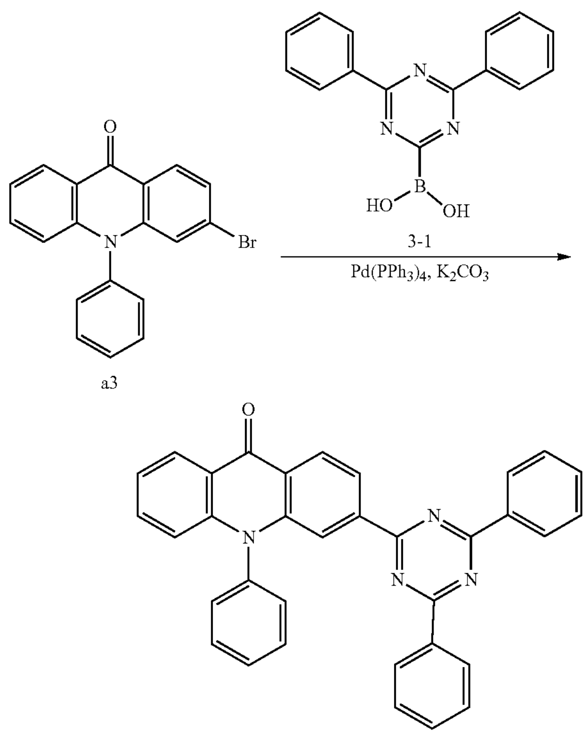

d2

The reactant a1 in step (1) of embodiment 10 is replaced with an equimolar amount of the reactant a3; and other raw materials and reaction steps are same as step (1) of embodiment 10 to obtain an intermediate d2 (yield 67%).

The characterization result of the intermediate d2 using matrix-assisted laser desorption ionization time-of-flight mass spectrometry analysis MALDI-TOF MS (m/z) is $C_{34}H_{22}N_4O$, with calculated values about 502.18 and test values about 502.35.

(2)

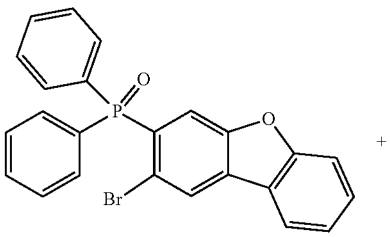

B1

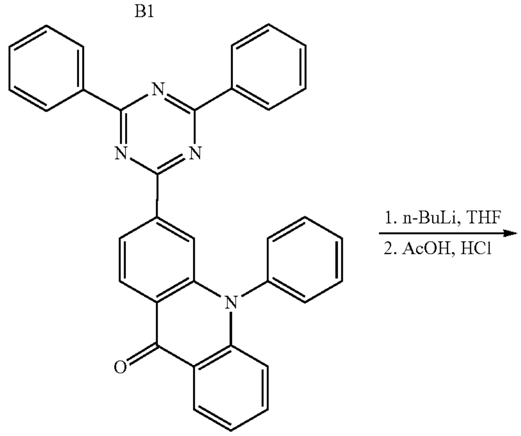

d2

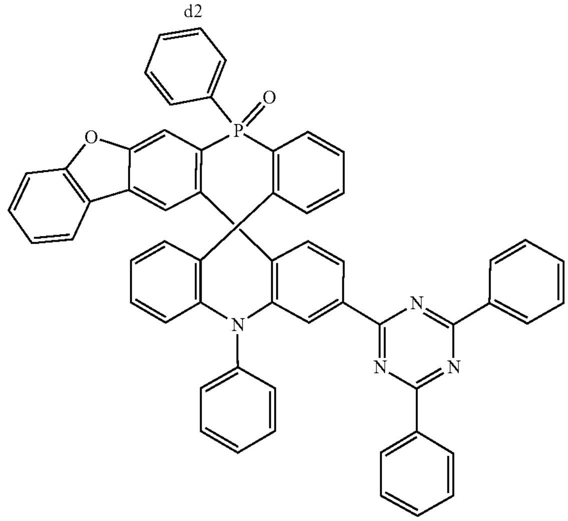

N57

The intermediate b1 in step (3) of embodiment 1 is replaced with an equimolar amount of the intermediate d2; and other raw materials and reaction steps are same as step (3) of embodiment 1 to obtain the target product N57 (yield 69%).

The characterization result of the organic compound N57 using matrix-assisted laser desorption ionization time-of-flight mass spectrometry analysis MALDI-TOF MS (m/z) is $C_{58}H_{37}N_4O_2P$, with calculated values about 852.27 and test values about 852.45.

The elemental analysis results of the compound are the following: calculated values (%) C 81.68, H 4.37, N 6.57; and test values C 81.67, H 4.36, N 6.59.

Embodiment 14

An organic compound N91 with the following structure is provided in one embodiment:

N91

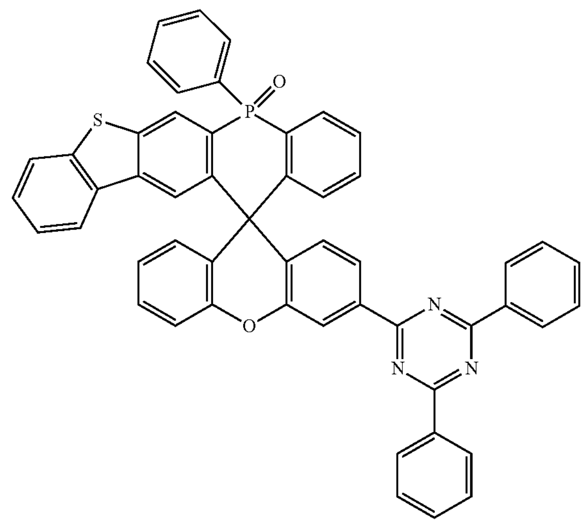

The preparation of the organic compound N91 may include the following steps.

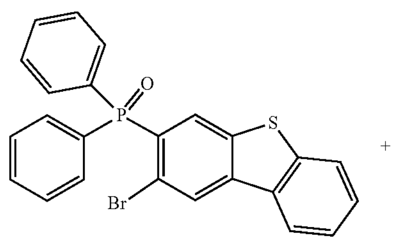

B2

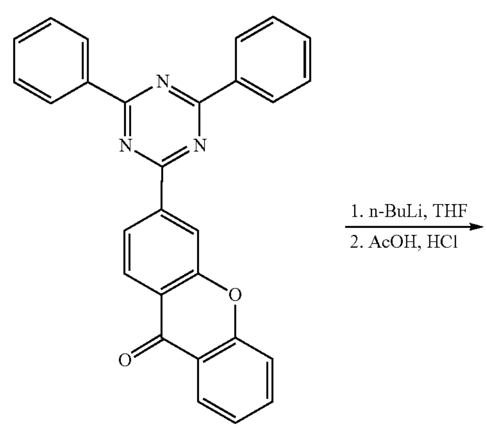

b6

-continued

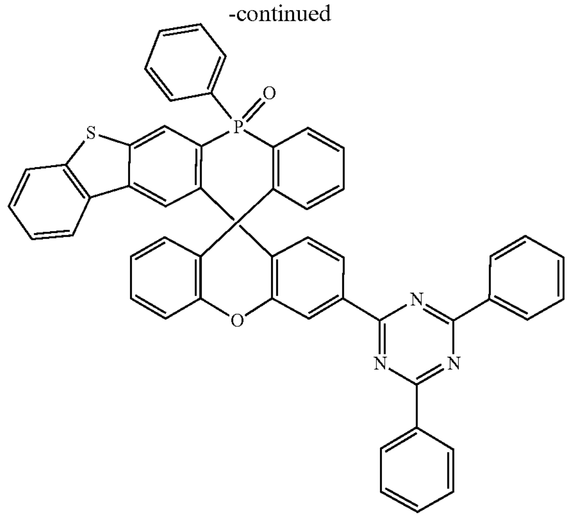

N91

The intermediate b1 in step (3) of embodiment 1 is replaced with an equimolar amount of the intermediate b6, and the intermediate B1 is replaced with an equimolar amount of B2; and other raw materials and reaction steps are same as in step (3) of embodiment 1 to obtain the target product N91 (yield 67%).

The characterization result of the organic compound N91 using matrix-assisted laser desorption ionization time-of-flight mass spectrometry analysis MALDI-TOF MS (m/z) is $C_{52}H_{32}N_3O_2PS$, with calculated values about 793.20 and test values about 793.39.

The elemental analysis results of the compound are the following: calculated values (%) C 78.67, H 4.06, N 5.29; test value C 78.66, H 4.05, N 5.31.

Embodiment 15

An organic compound N96 with the following structure is provided in one embodiment:

N96

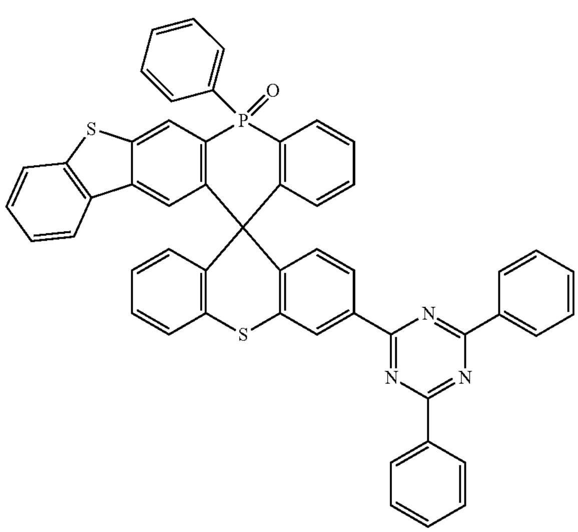

The preparation of the organic compound N91 may include the following steps.

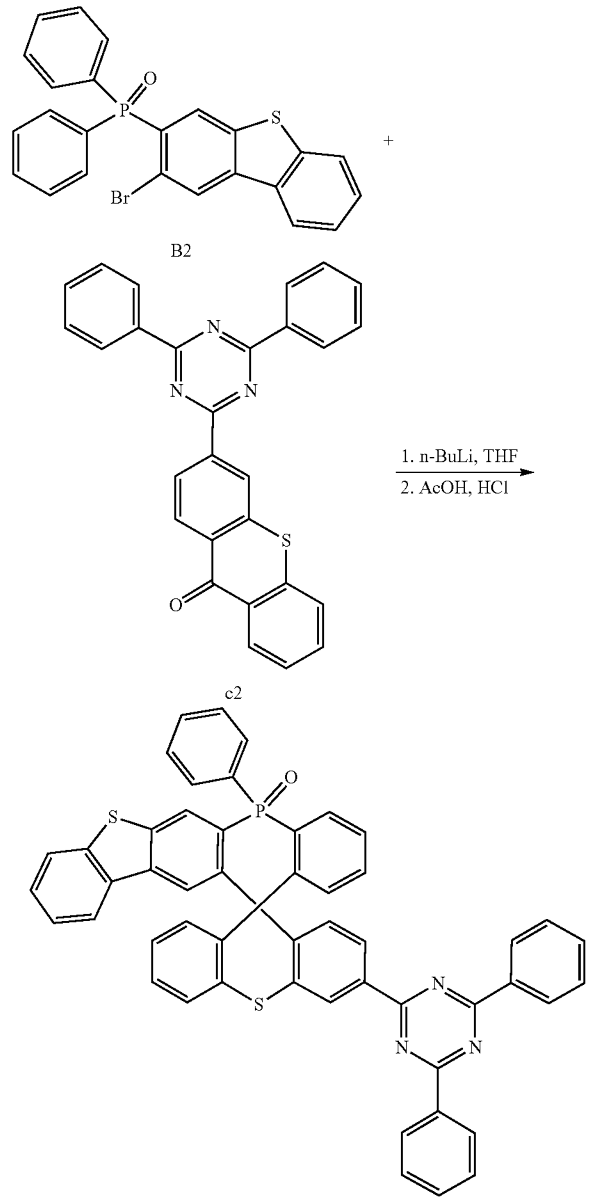

B2 c2

N96

The intermediate b1 in step (3) of embodiment 1 is replaced with an equimolar amount of the intermediate c2, and the intermediate B1 is replaced with an equimolar amount of B2; and other raw materials and reaction steps are same as in step (3) of embodiment 1 to obtain the target product N96 (yield 69%).

The characterization result of the organic compound N91 using matrix-assisted laser desorption ionization time-of-flight mass spectrometry analysis MALDI-TOF MS (m/z) is $C_{52}H_{32}N_3OPS_2$, with calculated values about 809.17 and test values about 809.35.

The elemental analysis results of the compound are the following: calculated values (%) C 77.11, H 3.98, N 5.19, and test values C 77.10, H 3.97, N 5.21.

Listed below are a plurality of application examples of the organic compounds of the present disclosure applied to OLED devices.

Application Example 1

The present application example provides an OLED device, which may sequentially include a glass substrate with an ITO anode (100 nm), a hole injection layer of 10 nm, a hole transport layer of 40 nm, an electron blocking layer of 10 nm, and an emission layer of 20 nm, a hole blocking layer of 10 nm, an electron transport layer of 30 nm, an electron injection layer of 5 nm, and a cathode (aluminum electrode) of 100 nm.

The OLED device may be prepared as the following.

1) The glass substrate is cut into a size of 50 mm×50 mm×0.7 mm, which is ultrasonically treated in isopropanol and deionized water for 30 min and then exposed to ozone cleaning for 10 minutes; and the obtained glass substrate with the ITO anode is installed on a vacuum deposition equipment.

2) Under a vacuum of $2\times10^{-6}$ Pa, a compound a is vacuum evaporated on the ITO anode layer as the hole injection layer with a thickness of about 10 nm.

3) A compound b is vacuum evaporated on the hole injection layer as the hole transport layer with a thickness of about 40 nm.

4) A compound c is vacuum evaporated on the hole transport layer as the electron blocking layer with a thickness of about 10 nm.

5) The organic compound M1 and the doped material compound d with a doping ratio of 3% (mass ratio) provided in embodiment 1 of the present disclosure are jointly vacuum evaporated on the electron blocking layer as the emission layer with a thickness of about 20 nm.

6) A compound f is vacuum evaporated on the emission layer as the hole blocking layer with a thickness of about 10 nm.

7) A compound g and a compound h are jointly vacuum evaporated on the hole blocking layer, where the doping mass ratio is 1:1, as the electron transport layer with a thickness of about 30 nm.

8) LiF is vacuum evaporated on the electron transport layer as the electron injection layer with a thickness of about 5 nm.

9) An aluminum electrode is vacuum evaporated on the electron injection layer as the cathode with a thickness of about 100 nm.

The structures of the compounds used in the OLED device are as follows:

Compound a

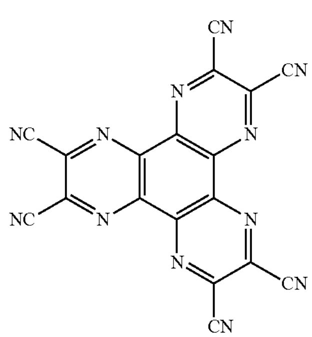

-continued

Compound b

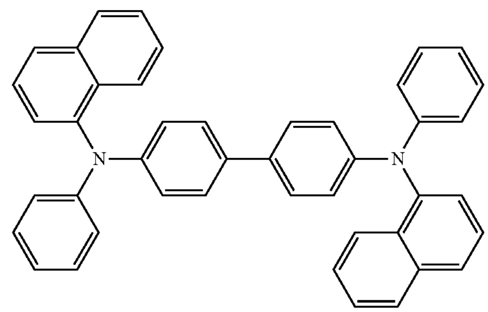

Compound c

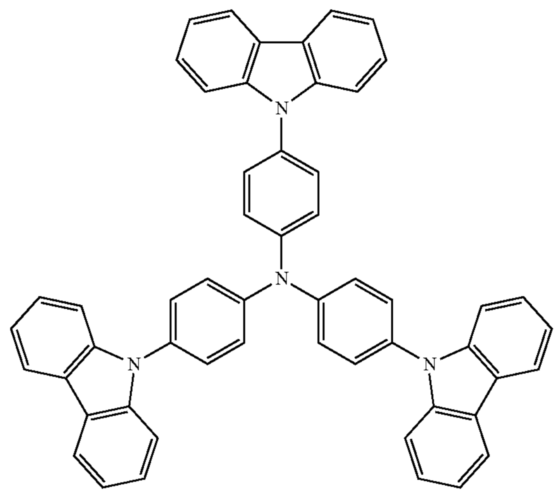

Compound d

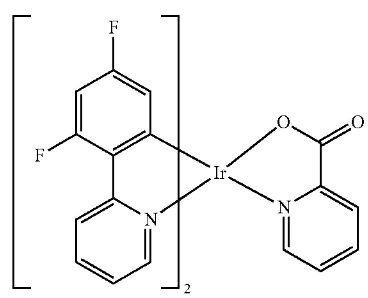

Compound e

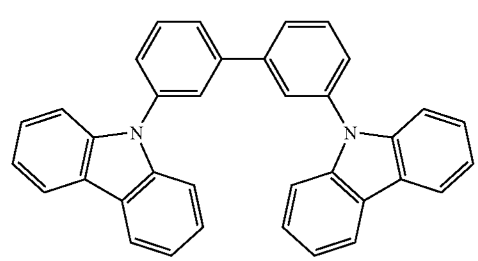

-continued

Compound f

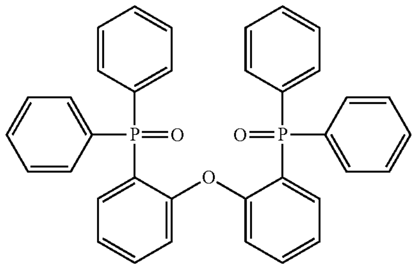

Compound g

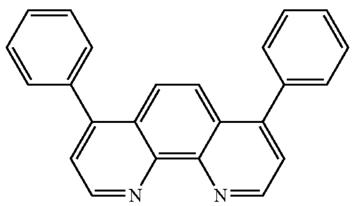

Compound h

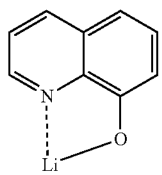

Comparative compound 1

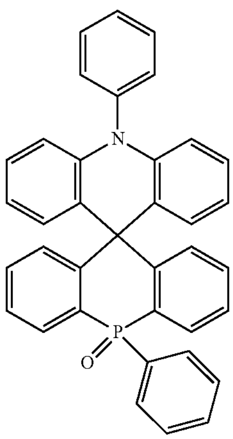

Comparative compound 2

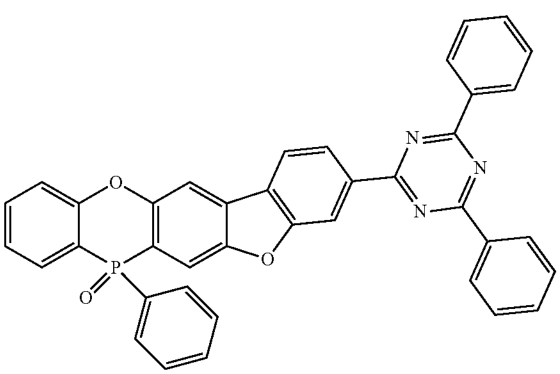

Application Example 2

The difference between the present application example and the application example 1 is only that the organic compound M1 in step (5) is replaced with the same amount of organic compound M10; and the other preparation steps are same.

Application Example 3

The difference between the present application example and the application example 1 is only that the organic compound M1 in step (5) is replaced with the same amount of organic compound M25; and the other preparation steps are same.

Application Example 4

The difference between the present application example and the application example 1 is only that the organic compound M1 in step (5) is replaced with the same amount of organic compound M26; and the other preparation steps are same.

Application Example 5

The difference between the present application example and the application example 1 is only that the organic compound M1 in step (5) is replaced with the same amount of organic compound M2; and the other preparation steps are same.

Application Example 6

The difference between the present application example and the application example 1 is only that the organic compound M1 in step (5) is replaced with the same amount of organic compound M41; and the other preparation steps are same.

Application Example 7

The difference between the present application example and the application example 1 is only that the organic compound M1 in step (5) is replaced with the same amount of organic compound M81; and the other preparation steps are same.

Application Example 8

The difference between the present application example and the application example 1 is only that the organic compound M1 in step (5) is replaced with the same amount of organic compound M120; and the other preparation steps are same.

Application Example 9

The difference between the present application example and the application example 1 is only that the organic compound M1 in step (5) is replaced with the same amount of organic compound M127; and the other preparation steps are same.

Comparative Example 1

The difference between the present comparative example and the application example 1 is only that the organic compound M1 in step (5) is replaced with the same amount of a comparative compound 1; and other preparation steps are same.

Application Example 10

The present application example provides an OLED device, which may sequentially include a glass substrate with an ITO anode (100 nm), a hole injection layer of 10 nm, a hole transport layer of 40 nm, an electron blocking layer of 10 nm, and an emission layer of 20 nm, a hole blocking layer of 10 nm, an electron transport layer of 30 nm, an electron injection layer of 5 nm, and a cathode (aluminum electrode) of 100 nm.

The OLED device may be prepared as the following.

1) The glass substrate is cut into a size of 50 mm×50 mm×0.7 mm, which is ultrasonically treated in isopropanol and deionized water for 30 min and then exposed to ozone cleaning for 10 minutes; and the obtained glass substrate with the ITO anode is installed on a vacuum deposition equipment.

2) Under a vacuum of $2\times10^{-6}$ Pa, a compound a is vacuum evaporated on the ITO anode layer as the hole injection layer with a thickness of about 10 nm.

3) A compound b is vacuum evaporated on the hole injection layer as the hole transport layer with a thickness of about 40 nm.

4) A compound c is vacuum evaporated on the hole transport layer as the electron blocking layer with a thickness of about 10 nm.

5) A compound e and a doped compound d with a doping ratio of 3% (mass ratio) are jointly vacuum evaporated on the electron blocking layer as the emission layer with a thickness of about 20 nm.

6) The organic compound N1 provided in the present disclosure is vacuum evaporated on the emission layer as the hole blocking layer with a thickness of about 10 nm.

7) A compound g and a compound h are jointly vacuum evaporated on the hole blocking layer, where the doping mass ratio is 1:1, as the electron transport layer with a thickness of about 30 nm.

8) LiF is vacuum evaporated on the electron transport layer as the electron injection layer with a thickness of about 5 nm.

9) An aluminum electrode is vacuum evaporated on the electron injection layer as the cathode with a thickness of about 100 nm.

Application Example 11

The difference between the present application example and the application example 10 is only that the organic compound N1 in step (6) is replaced with the same amount of organic compound N10; and other preparation steps are same.

Application Example 12

The difference between the present application example and the application example 10 is only that the organic compound N1 in step (6) is replaced with the same amount of organic compound N29; and other preparation steps are same.

Application Example 13

The difference between the present application example and the application example 10 is only that the organic compound N1 in step (6) is replaced with the same amount of organic compound N57; and other preparation steps are same.

Application Example 14

The difference between the present application example and the application example 10 is only that the organic compound N1 in step (6) is replaced with the same amount of organic compound N91; and other preparation steps are same.

Application Example 15

The difference between the present application example and the application example 10 is only that the organic compound N1 in step (6) is replaced with the same amount of organic compound N96; and other preparation steps are same.

Comparative Example 2

The difference between the present comparative example and the application example 10 is only that the organic compound N1 in step (6) is replaced with the same amount of a comparative compound 2; and other preparation steps are same.

Performance Testing (1) Compound Simulation Calculation

Using the density functional theory (DFT), for the organic compounds provided by the present disclosure, the distribution and energy levels of molecular frontier orbitals HOMO and LUMO may be optimized and calculated through the Guassian 09 program package (Guassian Inc.) at the B3LYP/6-31G(d) calculation level; and the lowest singlet energy level ES1 and the lowest triplet energy level ET1 of the compound molecules may be simulated and calculated based on the time-dependent density functional theory (TD-DFT), where the results are shown in Table 1.

TABLE 1

| Organic compound | HOMO (eV) | LUMO (eV) | $E_{S1}$ (eV) | $E_{T1}$ (eV) |
|---|---|---|---|---|
| M1 | −5.23 | −1.48 | 3.40 | 3.09 |
| M10 | −5.15 | −1.43 | 3.38 | 3.07 |
| M25 | −5.12 | 1.41 | 3.36 | 3.03 |
| M26 | −5.10 | −1.40 | 3.35 | 3.02 |
| M2 | −5.19 | −1.45 | 3.37 | 3.05 |
| M41 | −5.22 | −1.47 | 3.40 | 3.09 |
| M81 | −5.20 | −1.46 | 3.39 | 3.08 |
| M120 | −5.22 | −1.48 | 3.40 | 3.09 |
| M127 | −5.21 | −1.47 | 3.39 | 3.08 |
| N1 | −5.81 | −1.78 | 3.54 | 3.09 |
| N10 | −5.79 | −1.76 | 3.51 | 3.07 |
| N29 | −5.81 | −1.79 | 3.54 | 3.09 |
| N57 | −5.80 | −1.77 | 3.52 | 3.08 |
| N91 | −5.81 | −1.80 | 3.54 | 3.09 |
| N96 | −5.80 | −1.78 | 3.53 | 3.08 |

It can be seen from the data in Table 1 that the organic compounds provided by the present disclosure have more suitable HOMO and LUMO energy levels through the special design of the molecular structures, which may match the energy levels with adjacent layers and cover a guest energy level. Moreover, the organic compounds of the present disclosure have higher triplet energy levels. When used as the host materials in the emission layer, triplet excitons of the organic compounds of the present disclosure may be effectively transferred to the guest, and energy may be prevented from flowing back from the guest to the host. In addition, the organic compounds M1, M10, M25, M26, M2, M41, M81, M120, and M127 of the present disclosure have suitable HOMO energy levels (−5.10~−5.23 eV), which may match the HOMO energy levels of the adjacent layers to lower the barrier and realize efficient exciton recombination; and all of the organic compounds have relatively high triplet energy levels (ET≥3.02 eV), which may prevent the guest energy from flowing back to the host, confine the excitons in the emission layer, and finally achieve high luminous efficiency. Furthermore, the compounds N1, N10, N29, N57, N91, N96 of the present disclosure have suitable HOMO and LUMO energy levels, relatively high triplet energy levels, and may be used as host materials in the emission layer; and the above compounds have relatively deep HOMO energy levels (≤−5.79 eV), which may effectively block holes, and have relatively deep LUMO energy levels (≤−1.76 eV), which may transport electrons efficiently, such that the above compounds may also be used as the hole blocking layer. In addition, their relatively high triplet energy levels may also block excitons from crossing the emission layer, block the excitons in the emission layer, improve the utilization rate of excitons, and achieve relatively high efficiency.

The organic compound provided by the present disclosure has a spiro structure, so that the molecules have a relatively distorted structure which may reduce the stacking of the molecules to avoid crystallization and have excellent thermal stability and film stability. Therefore, the application of the organic compound in the device may be more stable, which is beneficial for improving the device lifetime.

(2) Performance Evaluation of OLED Devices

Keithley 2365A digital nanovoltmeter may be used to test the current of the OLED device under different voltages, and then the current may be divided by a light-emitting area to obtain the current density of the OLED device under different voltages; Konicaminolta CS-2000 spectroradiometer may be used to test the brightness and radiant energy density of OLED device under different voltages; according to the current density and brightness of the OLED device under different voltages, a working voltage V and a current efficiency CE (cd/A) at a same current density (10 $mA/cm^2$) may be obtained; and the lifetime T95 may be obtained by measuring the time when the brightness of the OLED device reaches 95% of the initial brightness (under 50 $mA/cm^2$ test condition), where the test data is shown in Table 2 and Table 3.

TABLE 2

| OLED device | Emission layer host material | Voltage (V) | CE (cd/A) | LT95 (h) |
|---|---|---|---|---|
| application example 1 | M1 | 3.93 | 17.6 | 79 |
| application example 2 | M10 | 3.85 | 17.9 | 81 |
| application example 3 | M25 | 3.84 | 16.9 | 69 |
| application example 4 | M26 | 3.83 | 17.0 | 70 |
| application example 5 | M2 | 3.87 | 17.7 | 80 |
| application example 6 | M41 | 3.92 | 17.5 | 78 |
| application example 7 | M81 | 3.89 | 17.6 | 75 |
| application example 8 | M120 | 3.91 | 17.4 | 77 |
| application example 9 | M127 | 3.90 | 17.3 | 76 |
| comparative example 1 | comparative compound 1 | 4.11 | 16.1 | 61 |

According to the test data in Table 2, it can be seen that the organic compounds provided by the present disclosure, as the host materials of the OLED devices, may enable the devices to have relatively low driving voltage, relatively high luminous efficiency, and relatively long device lifetime, where the working voltage is ≤3.93 V, the current efficiency CE is ≥16.9 cd/A, and the lifetime is LT95 ≥69 h. Compared with the comparative example 1, the working voltages of the OLED devices using the organic compounds of the present disclosure are reduced, and the efficiency and lifetime are improved, which may be due to the fact that the organic compounds of the present disclosure have suitable energy levels which are more matched with the adjacent layers, and have higher triplet energy levels (≥3.02 eV). Therefore, it may effectively transfer energy to the guest and prevent the energy from flowing back from the guest to the host, which effectively improves the efficiency of the OLED devices. Meanwhile, the organic compound of the present disclosure may be connected to the parallel ring where the P═O unit is located to form the spiro structure, which may make the molecules relatively twisted and effectively reduce the stacking of the molecules. Therefore, the crystallinity of the molecules may be reduced to ensure excellent thermal stability and film stability, and the working OLED devices may be more stable, thereby increasing the lifetime of the OLED devices.

TABLE 3

| OLED device | Hole blocking layer material | Voltage (V) | CE (cd/A) | LT95 (h) |
|---|---|---|---|---|
| application example 10 | N1 | 3.93 | 17.1 | 71 |
| application example 11 | N10 | 3.96 | 16.5 | 67 |
| application example 12 | N29 | 3.91 | 17.0 | 70 |
| application example 13 | N57 | 3.94 | 16.7 | 68 |
| application example 14 | N91 | 3.90 | 16.9 | 70 |
| application example 15 | N96 | 3.92 | 16.8 | 69 |
| comparative example 2 | comparative compound 2 | 4.13 | 15.9 | 59 |

According to the test data in Table 3, it can be seen that the organic compounds provided by the present disclosure, as the hole blocking layer host materials, may enable the OLED devices to have relatively low driving voltage, relatively high luminous efficiency, and relatively long device lifetime, where the working voltage is ≤3.96 V, the current efficiency CE is ≥16.5 cd/A, and the lifetime LT95 is ≥67 h. Compared with the comparative example 2, the working voltages of the OLED devices using the organic compounds of the present disclosure are reduced, and the efficiency and lifetime are improved, which may be due to the fact that the organic compounds of the present disclosure have relatively deep HOMO energy levels and LUMO energy levels and relatively high triplet energy levels to lower the electron injection barrier and the voltages; moreover, holes may be effectively blocked to restrict excitons in the emission layer, which effectively improves the efficiency and lifetime of the devices. Meanwhile, the organic compound of the present disclosure may be connected to the parallel ring where the P═O unit is located to form the spiro structure, which may make the molecules relatively twisted and effectively reduce the stacking of the molecules. Therefore, the crystallinity of the molecules may be reduced to ensure excellent thermal stability and film stability, and the working OLED devices may be more stable, which is beneficial for the stability of the OLED devices.

From the above-mentioned embodiments, it can be seen that the organic compound, the electroluminescent material, the display panel, and the electronic device provided by the present disclosure may achieve at least the following beneficial effects.

The present disclosure provides an organic small molecule compound containing the spiro structure. Through the design of the spiro structure in the core and the introduction of specific substituents, material stacking may be effectively prevented to reduce the crystallinity of the material. The organic compound has also excellent electron transport and hole transport properties, relatively high triplet energy levels ET, suitable HOMO and LUMO energy levels, relatively high glass transition temperature, and desirable molecular thermal stability, which may effectively improve the balanced migration of carriers, expand the exciton recombination zone, and improve the luminous efficiency and lifetime of the device. The organic compound may be applied in the emission layer, the electron transport layer, or the hole blocking layer of the OLED device, and may be particularly suitable as the phosphorescent host material applied to the emission layer of the OLED device, which may significantly improve the luminous efficiency, reduce the starting voltage and energy consumption, and extend the lifetime of the device.

The core of the organic compound contains the spiro structure and is connected with both linking groups $L_1$-$L_5$ and specific substituents $R_1$-$R_5$ which enable the organic compound to have bipolar or unipolar characteristics, thereby being used as a host material to effectively transfer energy to the guest and further enhance the luminous efficiency. Moreover, the spiro structure in the core of the organic compound imparts the twisting characteristics of its molecular structure, which can effectively reduce the intermolecular force and avoid material stacking. Therefore, the organic compound has low molecular crystallinity, which may be beneficial for obtaining desirable film stability to improve the stability and lifetime of the devices. The organic compound has a relatively high triplet energy level and a relatively high glass transition temperature Tg through the special design of the molecular structure, which may effectively transfer energy to the object and prevent energy return, thereby being beneficial for improving the efficiency of the devices. The high Tg may also make the compound easier to form an amorphous film, which may be beneficial for improving the stability of the devices. The organic compound provided by the present disclosure can be used in the emission layer, electron transport layer or hole blocking layer of OLED devices through the design of molecular structure and the selection of substituents, which is particularly suitable for being used as the phosphorescent host material in the emission layer, thereby achieving significant improvement in the luminous efficiency and lifetime of the devices.

The present disclosure may use the above-mentioned embodiments to illustrate the organic compounds, electroluminescent materials and their applications of the present disclosure, but the present disclosure may not be limited to the above-mentioned process steps, that is, it may not imply that the present disclosure must rely on the above-mentioned process steps to be implemented. Those skilled in the art should understand that any improvements of the present disclosure, the equivalent replacement of the raw materials selected in the present disclosure, the addition of auxiliary components, the selection of specific methods and the like may fall within the protection scope and disclosure scope of the present disclosure.

What is claimed is:

1. An organic compound, having a structure shown in formula I:

formula I

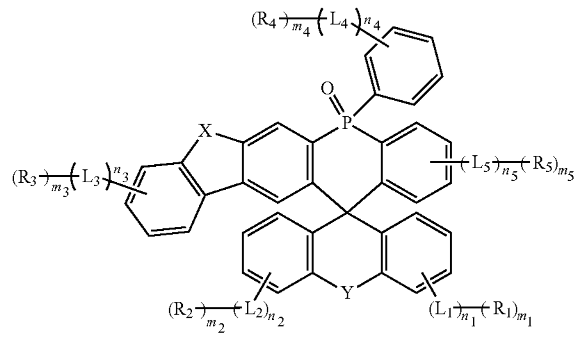

wherein:

X is selected from O, S, N—$R_{N1}$, and $CR_{C1}R_{C2}$;

Y is selected from O, S, N—$R_{N2}$, $CR_{C3}R_{C4}$, O═S═O, $SiR_{S1}R_{S2}$, O═P—$Ar_1$, and S═P—$Ar_2$, $R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl;

$Ar_1$ and $Ar_2$ are each independently selected from any one of substituted or unsubstituted C6~C40 aryl, and substituted or unsubstituted C3~C40 heteroaryl;

$L_1$, $L_2$, $L_3$, $L_4$, and $L_5$ are each independently selected from any one of a single bond, substituted or unsubstituted C6~C40 arylene, and substituted or unsubstituted C3~C40 heteroarylene;

$R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

2. The organic compound according to claim 1, wherein:

a substituent in each of the substituted C1~C20 linear or branched alkyl, the substituted C6~C40 aryl, the substituted C3~C40 heteroaryl, the substituted C6~C40 arylene, the substituted C3~C40 heteroarylene, the substituted C1~C20 alkoxy, the substituted C1~C20 alkylthio, the substituted C3~C20 cycloalkyl, and the substituted C6~C40 arylamino is independently selected from at least one of deuterium, cyano, halogen, unsubstituted or unhalogenated C1~C10 straight or branched alkyl, C1~C10 alkoxy, C1~C10 alkylthio, C6~C20 aryl, C2~C20 heteroaryl, or C6~C18 arylamino.

3. The organic compound according to claim 2, wherein $R_1$ and $R_2$ are each independently selected from any one of following groups:

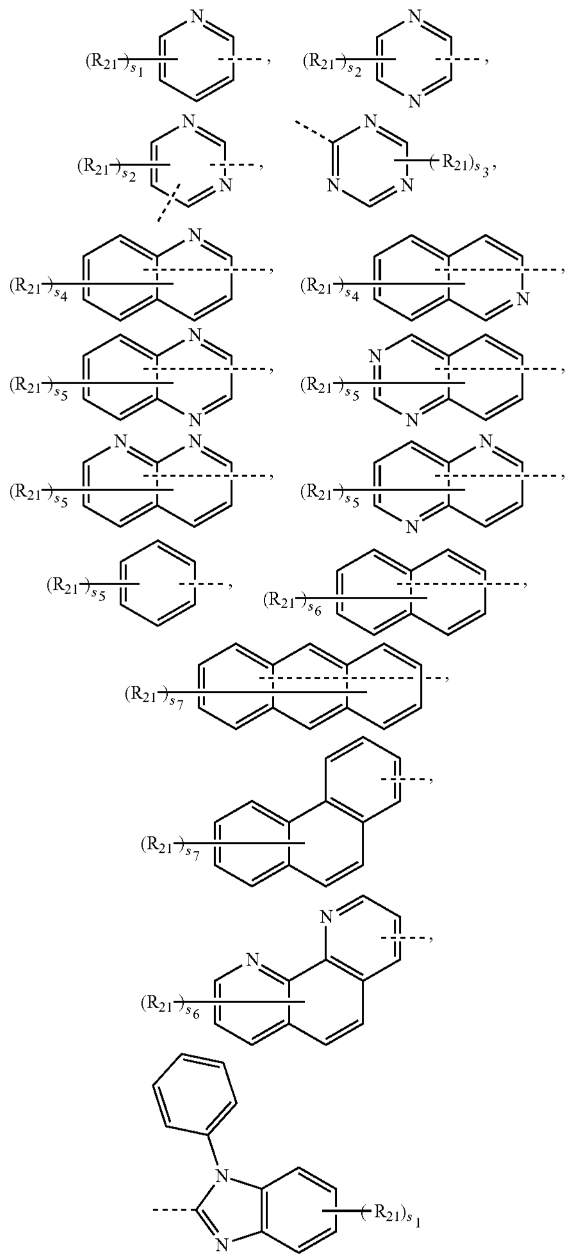

wherein:

a dashed line denotes a connecting point of a group;

$R_{21}$ is selected from any one of deuterium, cyano, halogen, unsubstituted or unhalogenated C1~C10 straight or branched alkyl, C1~C10 alkoxy, C1~C10 alkylthio, C6~C20 aryl, C2~C20 heteroaryl, and C6~C18 arylamino; and $s_1$ is an integer selected from 0~4; $s_2$ is an integer selected from 0~3; $s_3$ is an integer selected from 0~2; $s_4$ is an integer selected from 0~6; $s_5$ is an integer selected from 0~5; $s_6$ is integer selected from 0~7; and $s_7$ is an integer selected from 0~9.

4. The organic compound according to claim 3, wherein $R_1$ and $R_2$ is each independently selected from any one of following groups, or any one of following groups substituted by one or more substituents:

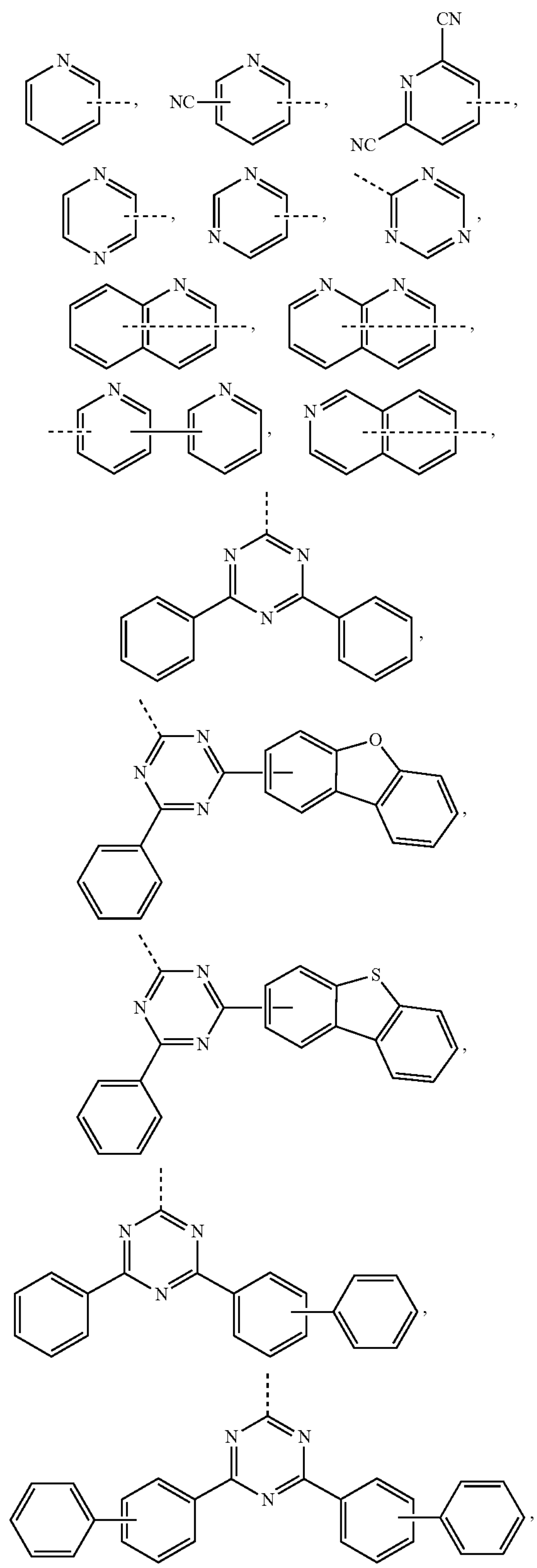

-continued

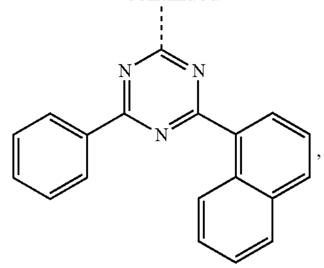

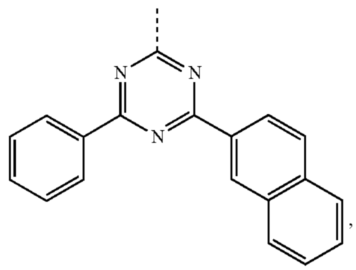

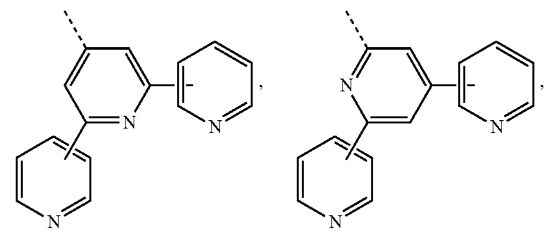

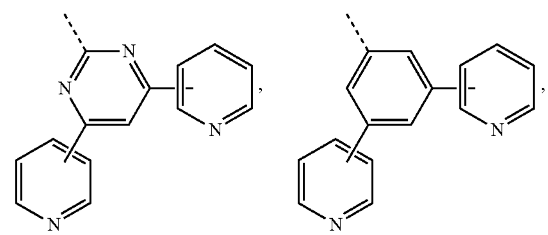

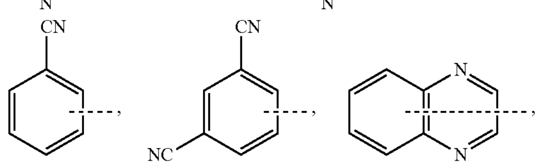

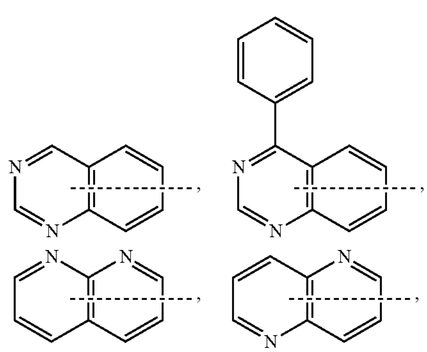

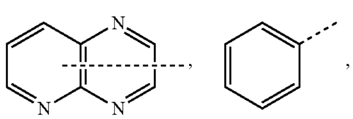

-continued

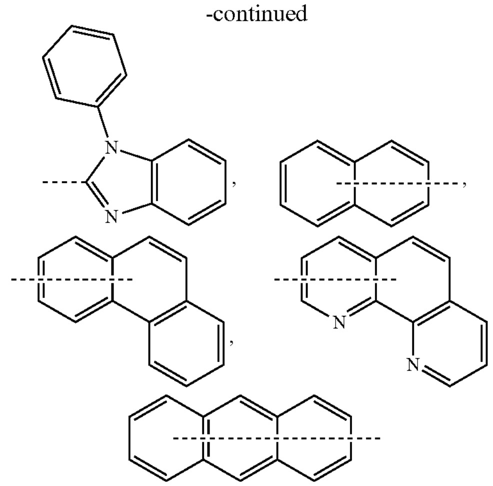

wherein:

a dashed line denotes a connecting point of a group; and the one or more substituents are each independently selected from at least one of deuterium, C1~C10 straight or branched alkyl, C1~C10 alkoxy, C1~C10 alkylthio, C6~C20 aryl, C2~C20 heteroaryl, and C6~C18 arylamino.

5. The organic compound according to claim 2, wherein:

$R_3$, $R_4$, and $R_5$ are each independently selected from any one of deuterium, unsubstituted or $R_{x2}$ substituted C1~C6 linear or branched alkyl, unsubstituted or $R_{x2}$ substituted C6~C12 aryl, unsubstituted or $R_{x2}$ substituted C3~C12 heteroaryl, diphenylamino, C1~C6 alkoxy, and C1~C6 alkylthio; and $R_{x2}$ is selected from any one of deuterium, halogen, cyano, C1~C6 linear or branched alkyl, C6~C12 aryl, C3~C12 heteroaryl, diphenylamino, C1~C6 alkoxy, and C1~C6 alkylthio.

6. The organic compound according to claim 1, wherein:

$L_1$, $L_2$, $L_3$, $L_4$, and $L_5$ are each independently selected from any one of a single bond, phenylene, biphenylene, naphthylene, and C3~C12 nitrogen-containing heteroarylene.

7. The organic compound according to claim 1, wherein $R_1$ and $R_2$ are each independently selected from any one of following groups:

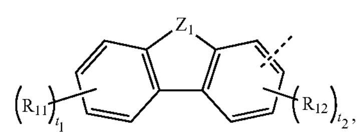

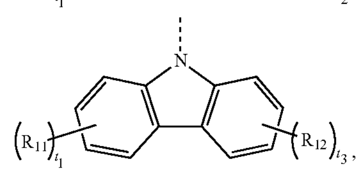

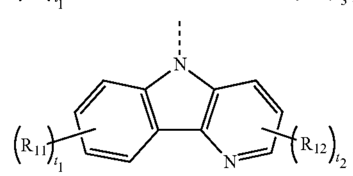

-continued
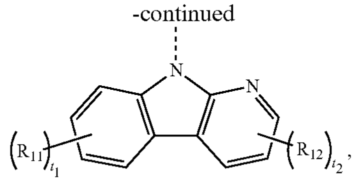
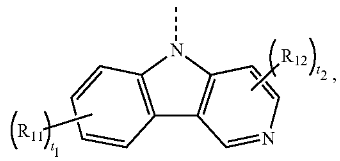
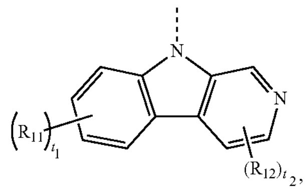
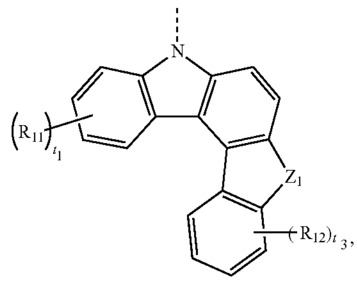
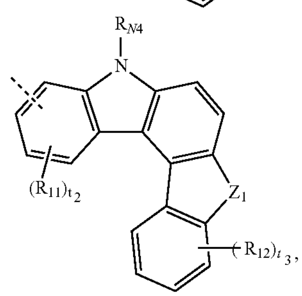
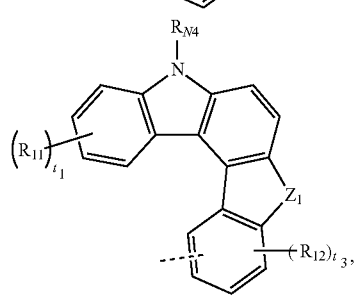
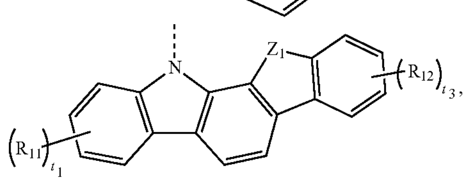
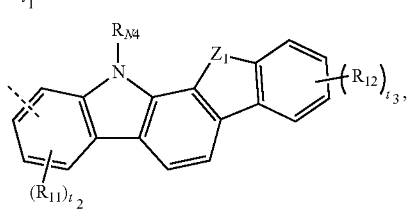
-continued
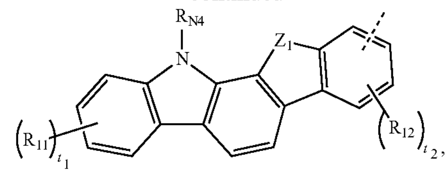
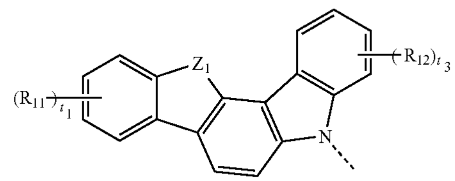
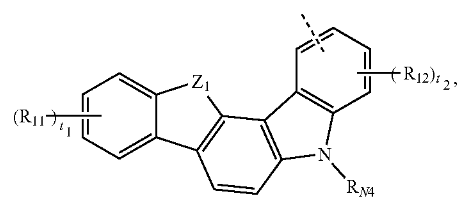
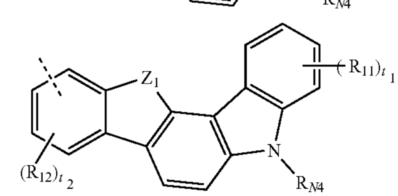
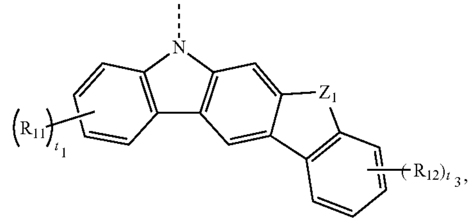
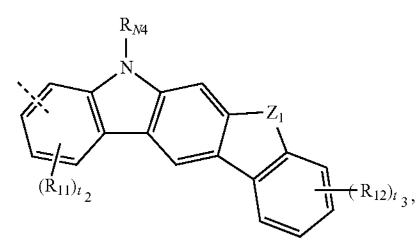
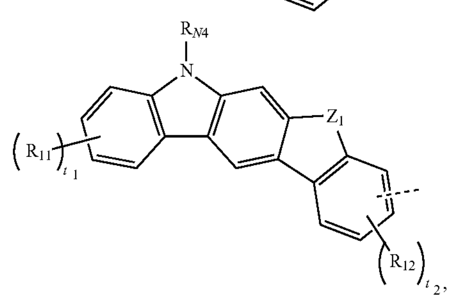
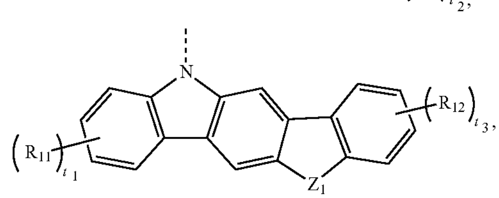

-continued

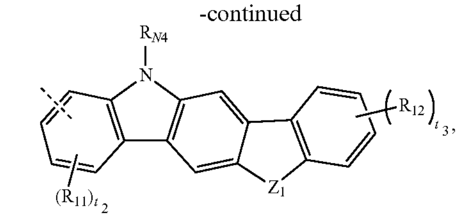

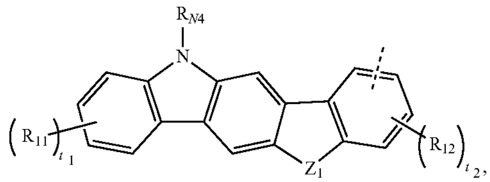

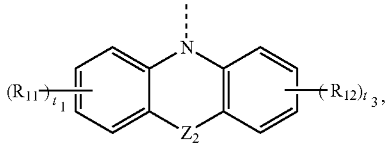

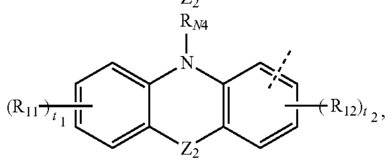

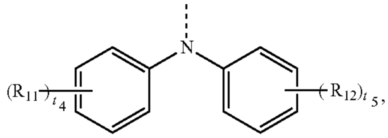

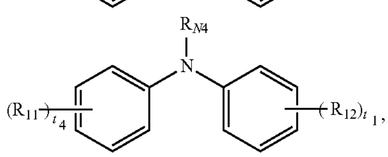

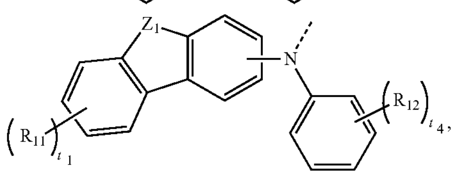

wherein:

a dashed line denotes a connecting point of a group;

$Z_1$ and $Z_2$ are each independently selected from O, S, N—$R_{N3}$, $CR_{C5}R_{C6}$ or $SiR_{S3}R_{S4}$;

$R_{N3}$, $R_{N4}$, $R_{C5}$, $R_{C6}$, $R_{S3}$, and $R_{S4}$ are each independently selected from any one of hydrogen, deuterium, unsubstituted or Rd substituted C1~C20 linear or branched alkyl, unsubstituted or $R_{x1}$ substituted C6~C40 aryl, and unsubstituted or $R_{x1}$ substituted C3~C40 heteroaryl; and $R_{C5}$ and $R_{C6}$ are not connected or connected to form a ring through chemical bonds;

$R_{11}$, $R_{12}$, and $R_{x1}$ are each independently selected from any one of deuterium, halogen, C1~C10 linear or branched alkyl, C1~C10 alkoxy, C1~C10 alkylthio, C6~C20 aryl, C2~C20 heteroaryl, and C6~C18 arylamino;

$t_1$ and $t_3$ are integers each independently selected from 0-4;

$t_2$ is an integer selected from 0-3; and $t_4$ and $t_5$ are integers each independently selected from 0-5.

8. The organic compound according to claim 7, wherein:

$R_1$ and $R_2$ are each independently selected from any one of following groups, or any one of following groups substituted by one or more substituents:

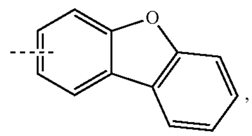

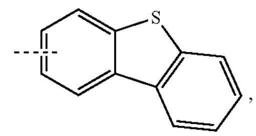

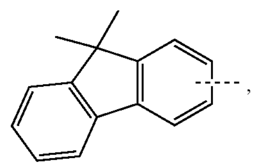

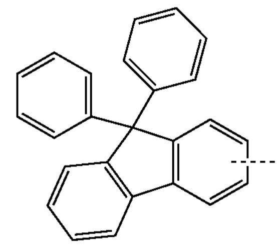

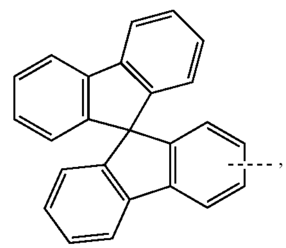

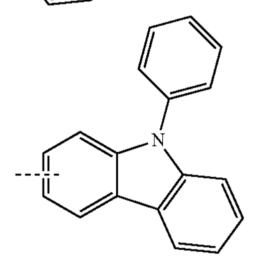

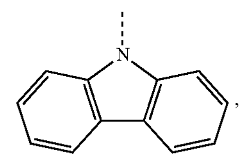

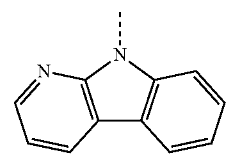

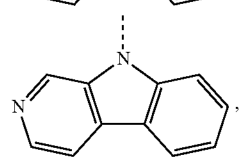

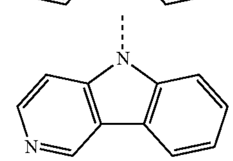

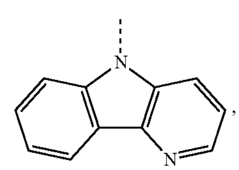

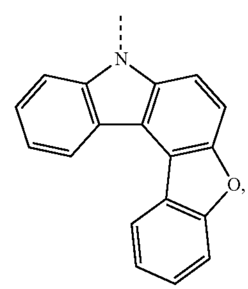

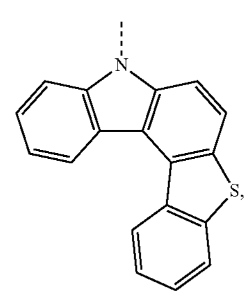

-continued
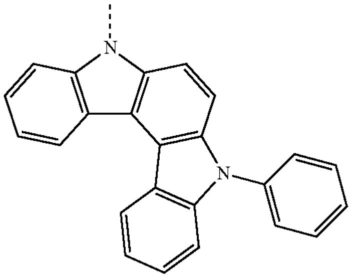
,
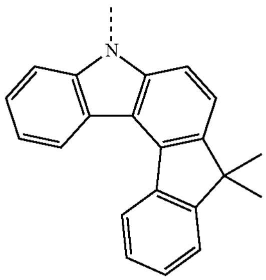
,
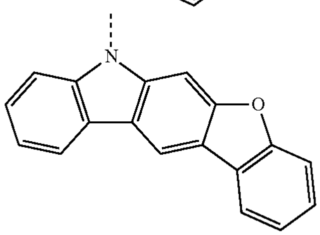
,
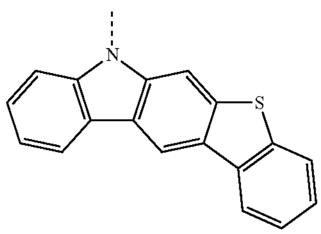
,
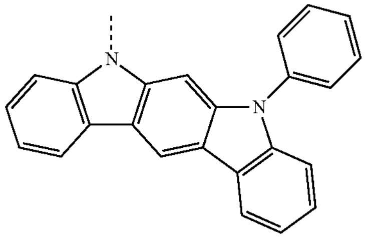
,
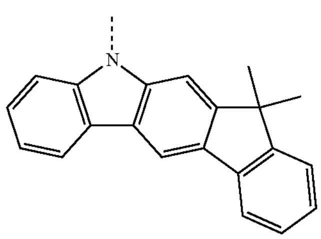
,
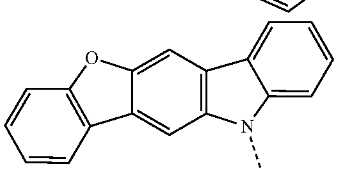
,
-continued
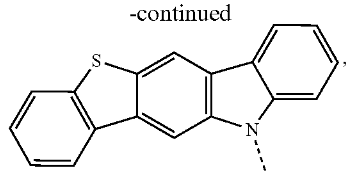
,
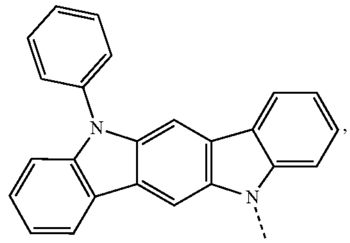
,
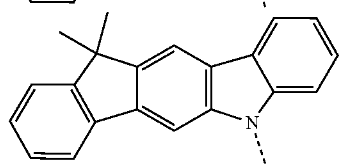
,
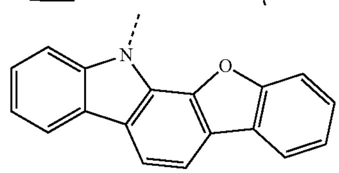
,
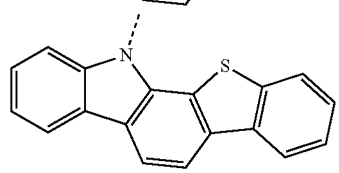
,
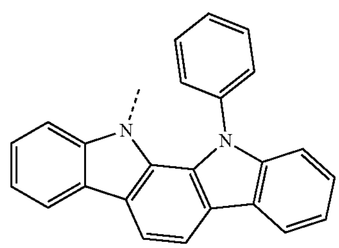
,
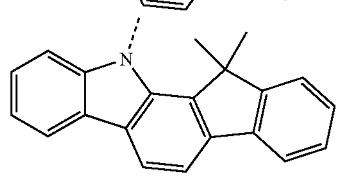
,
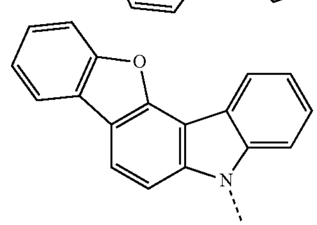
,
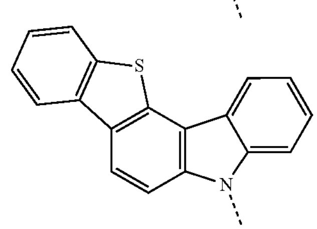
, -continued
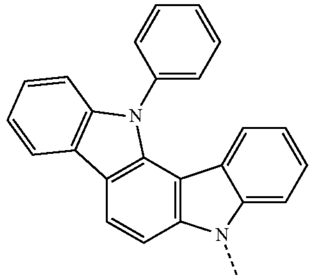
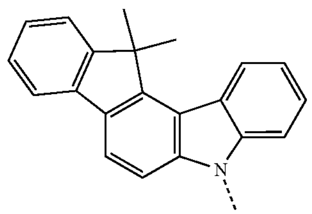
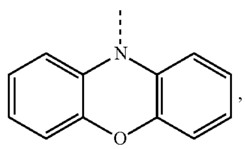
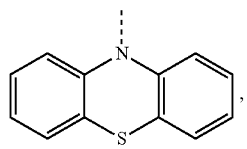
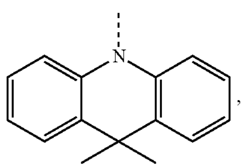
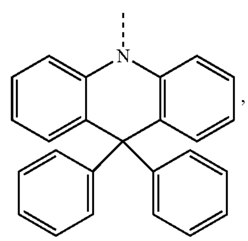
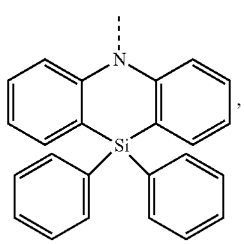
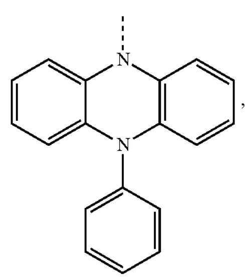
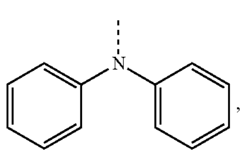
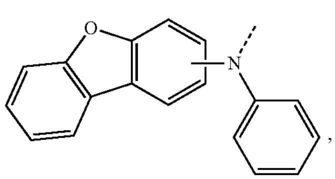
-continued
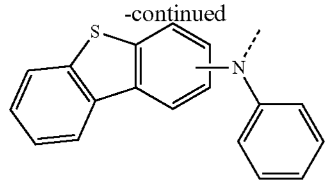
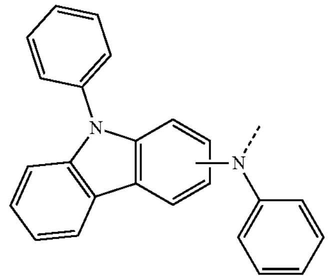
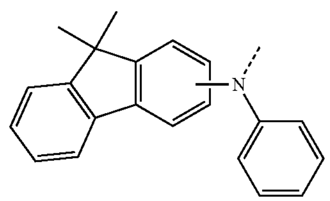
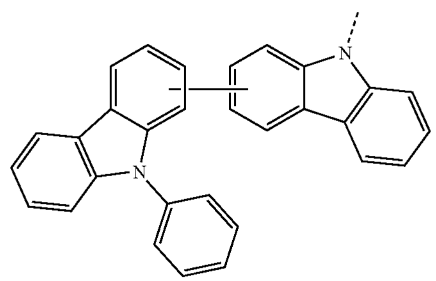
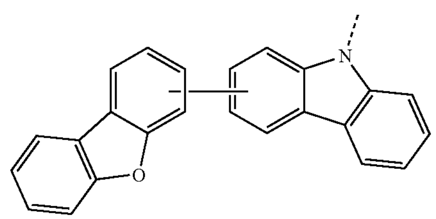
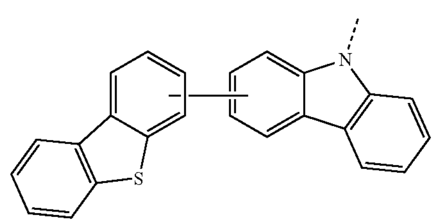
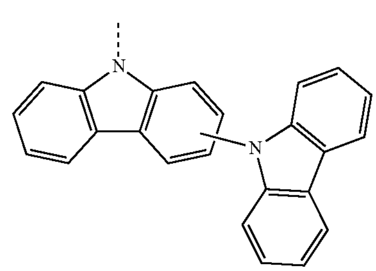

-continued

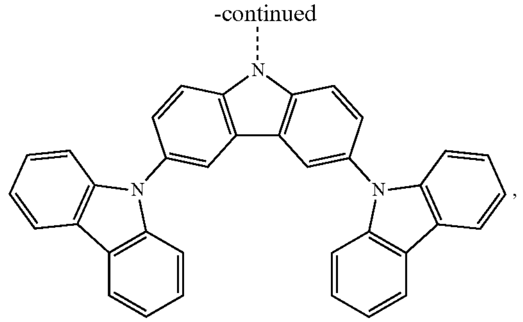

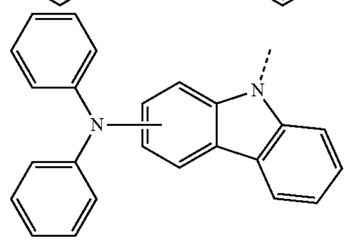

wherein:

a dashed line denotes a connecting point of a group; and the one or more substituents are each independently selected from at least one of deuterium, C1~C10 straight or branched alkyl, C1~C10 alkoxy, C1~C10 alkylthio, C6~C20 aryl, C2~C20 heteroaryl, and C6~C18 arylamino.

9. The organic compound according to claim 1, wherein:

X is selected from O and S.

10. The organic compound according to claim 1, wherein:

Y is selected from O, S, N—$R_{N2}$ and $CR_{C3}R_{C4}$.

11. The organic compound according to claim 10, wherein:

$R_{N2}$, $R_{C3}$, and $R_{C4}$ are each independently selected from any one of substituted or unsubstituted C1~C6 linear or branched alkyl, substituted or unsubstituted C6~C12 aryl, and substituted or unsubstituted C3~C12 heteroaryl; and a substituent in each of the substituted C1~C6 linear or branched alkyl, the substituted C6~C12 aryl, and the substituted C3~C12 heteroaryl is independently selected from any one of deuterium, C1~C6 linear or branched alkyl, C6~C12 aryl, C3~C12 heteroaryl, diphenylamino, C1~C6 alkoxy, and C1~C6 alkylthio.

12. The organic compound according to claim 1, wherein the organic compound is selected from any one of compounds M1 through M135 and N1 through N101:

M1

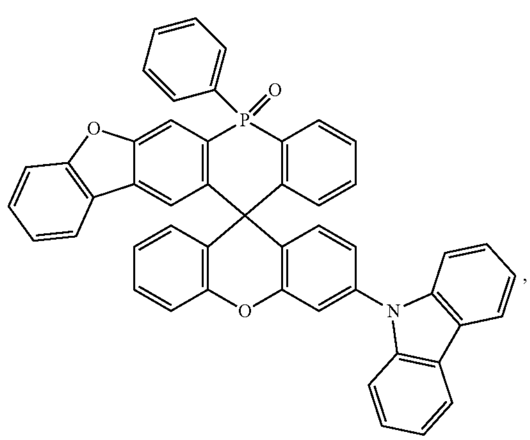

-continued

M2

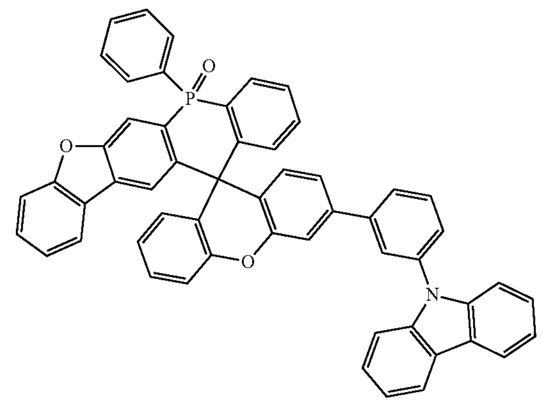

M3

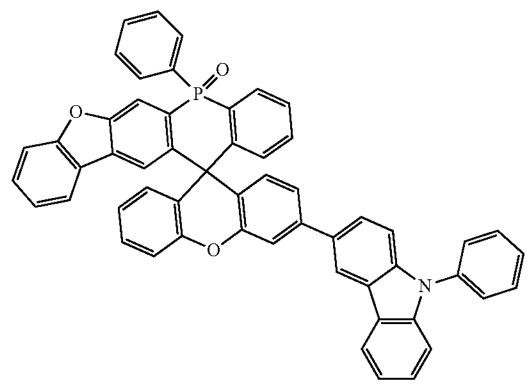

M4

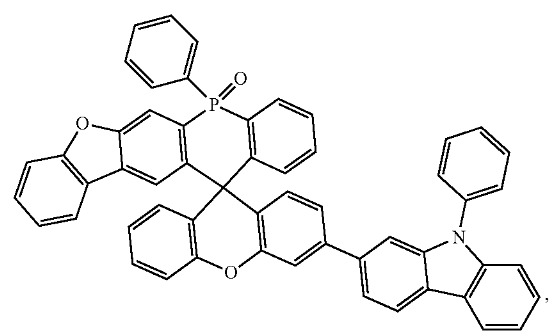

M5

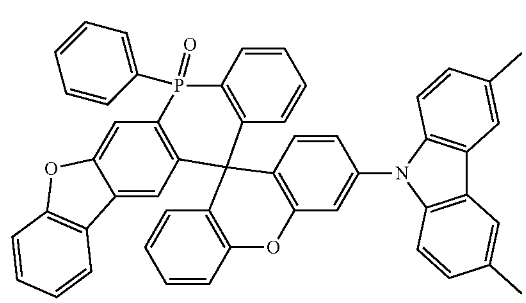

-continued
M6
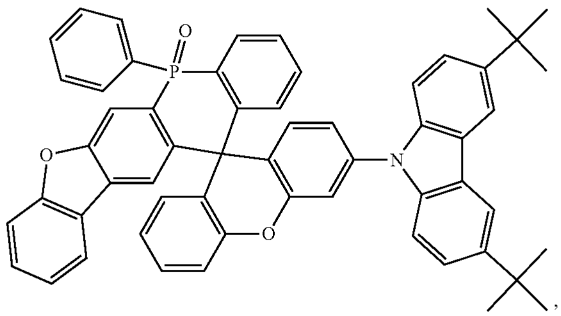
M7
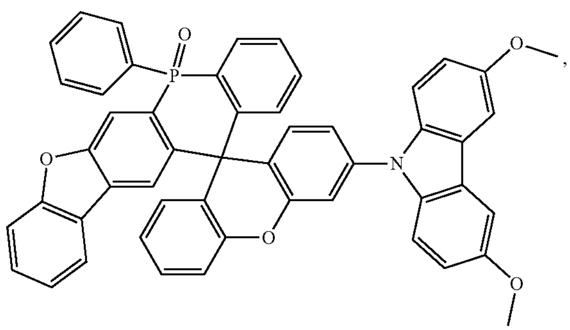
M8
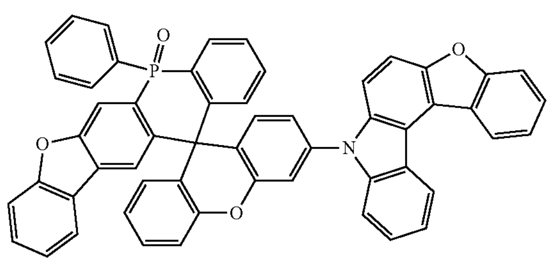
M9
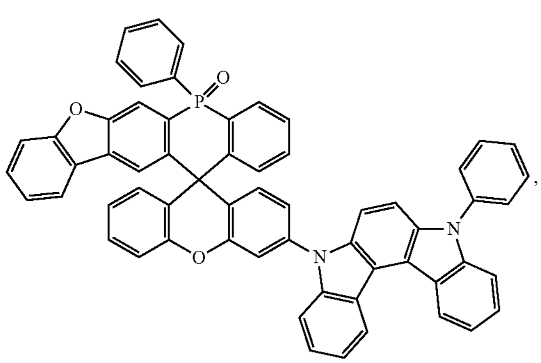
-continued
M10
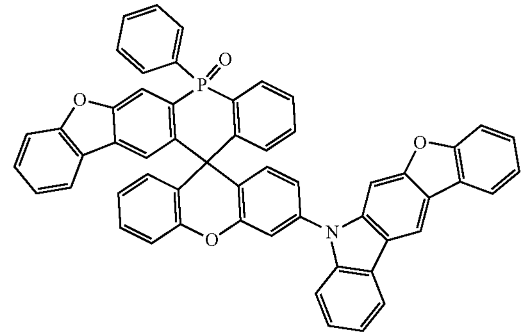
M11
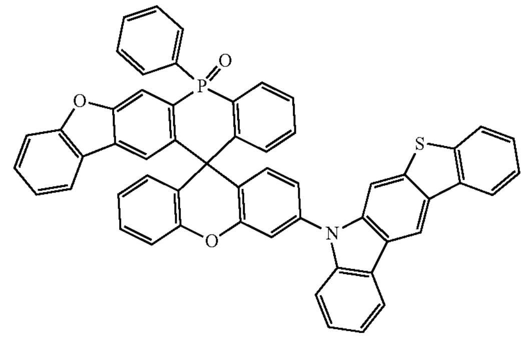
M12
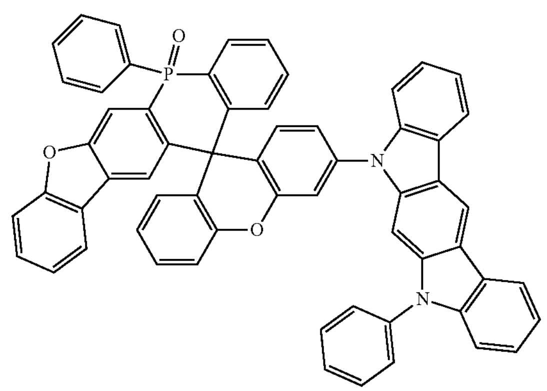
M13
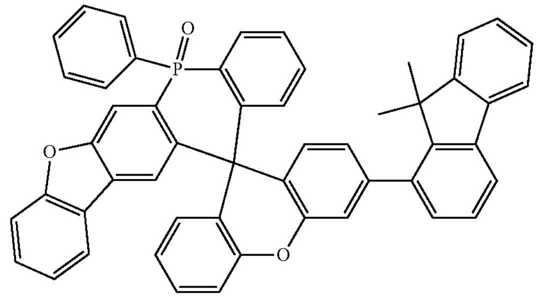

-continued
M14
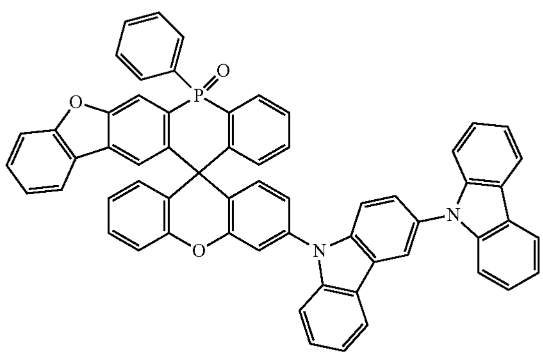
M15
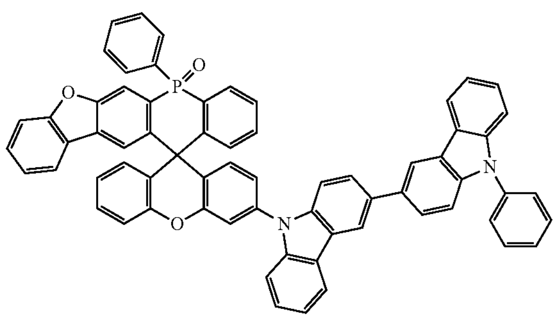
M16
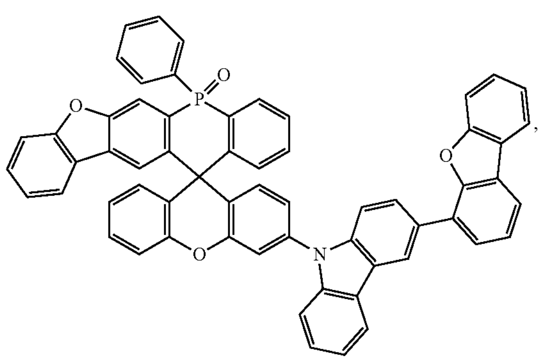
M17
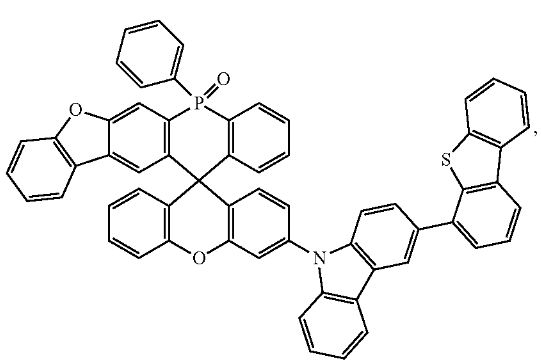
-continued
M18
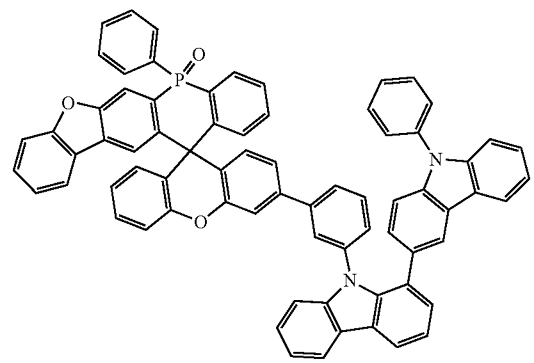
M19
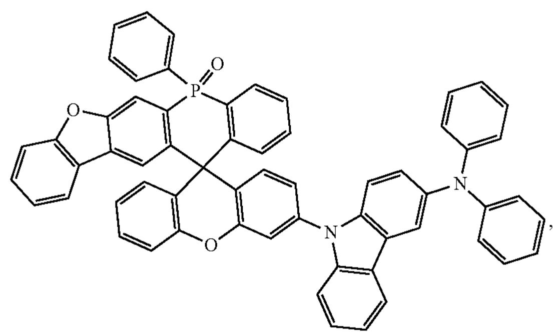
M20
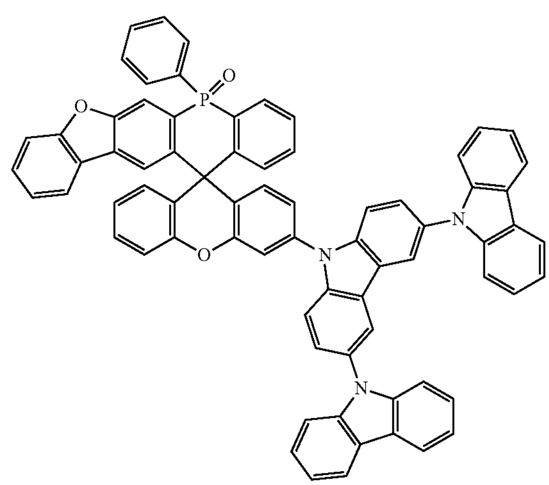
M21
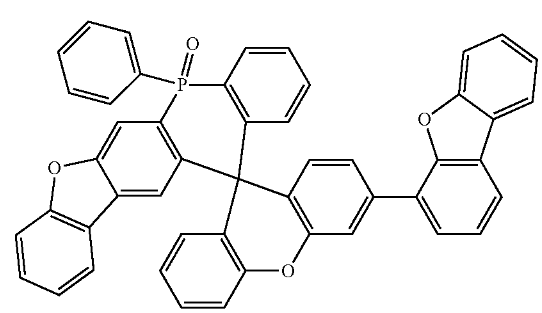

-continued
M22
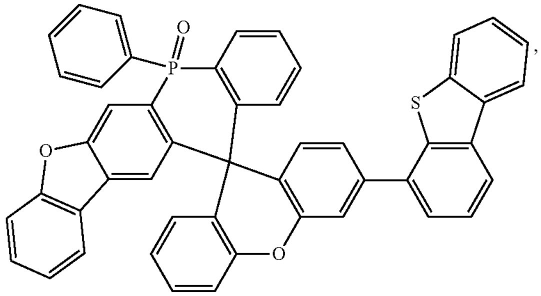
M23
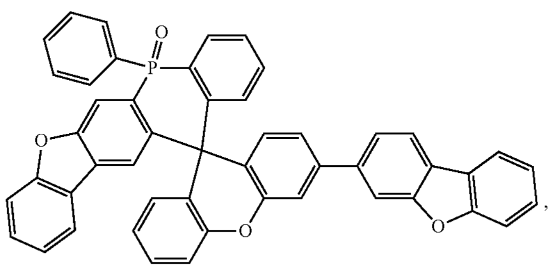
M24
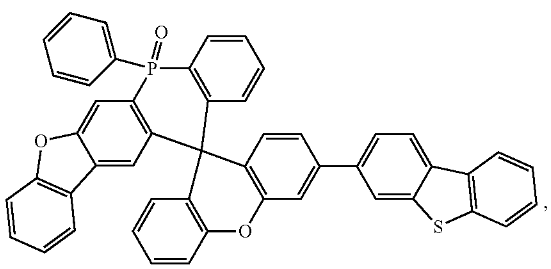
M25
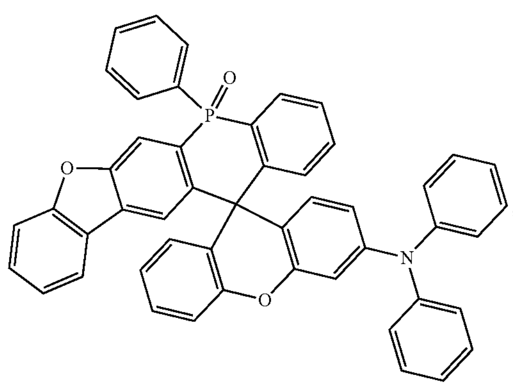
-continued
M26
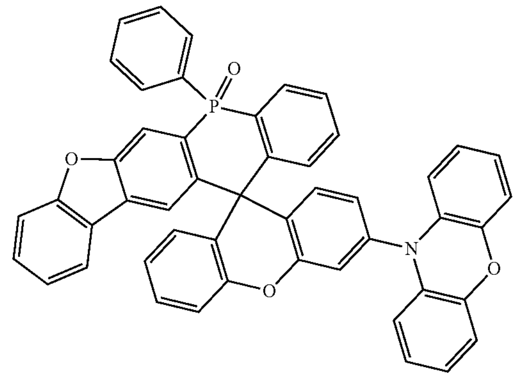
M27
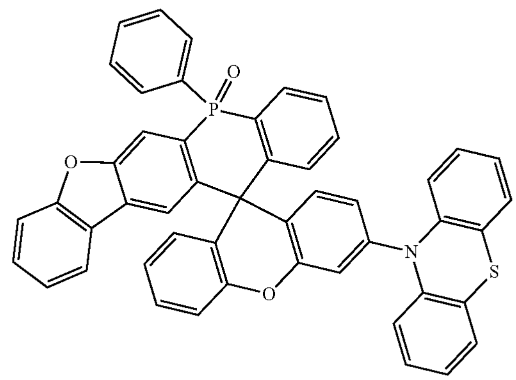
M28
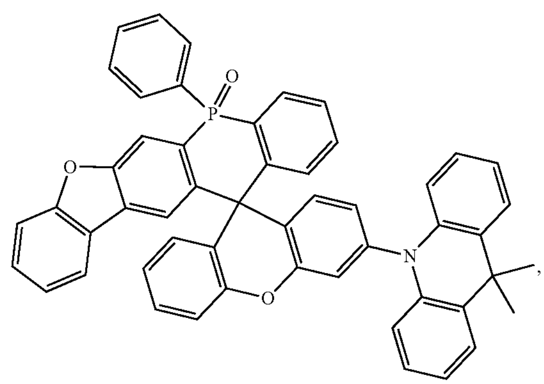
M29
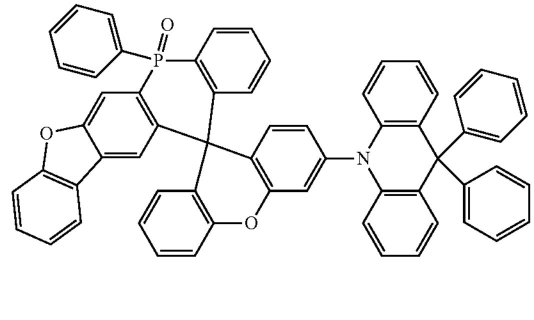

-continued
M30
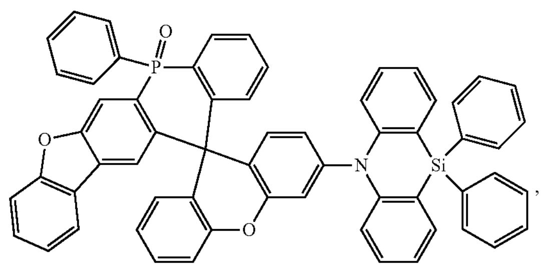
M31
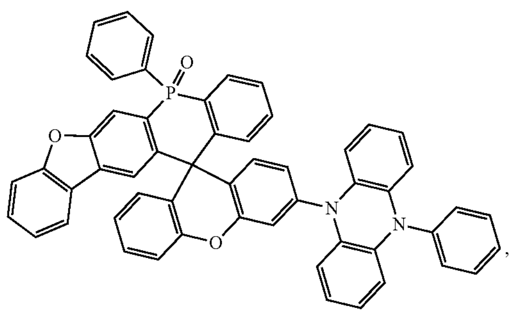
M32
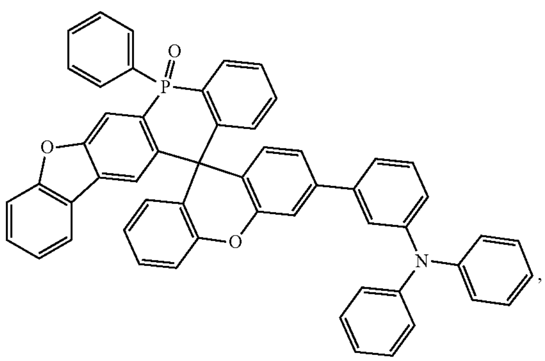
M33
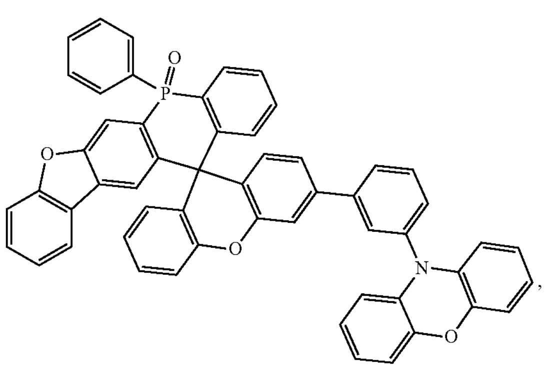
-continued
M34
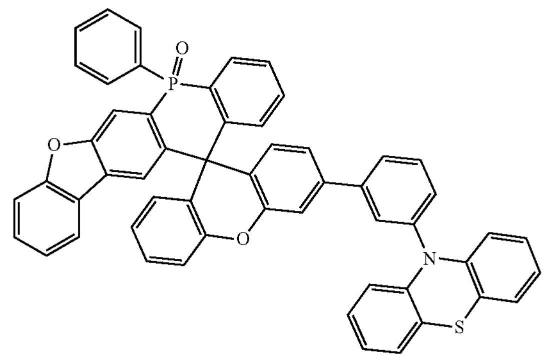
M35
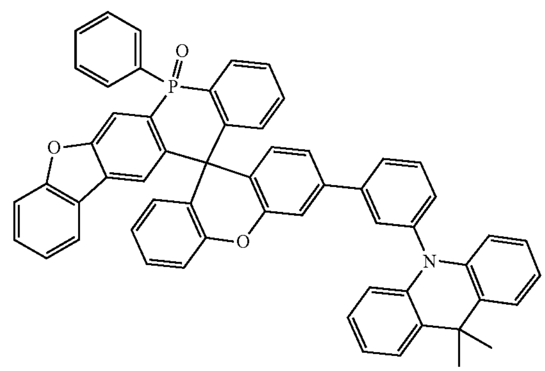
M36
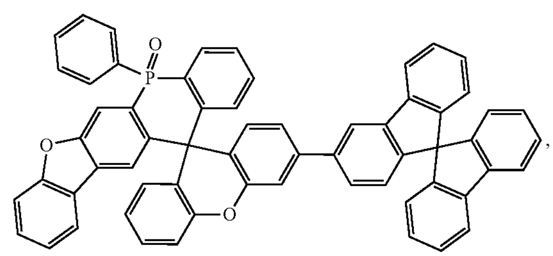
M37
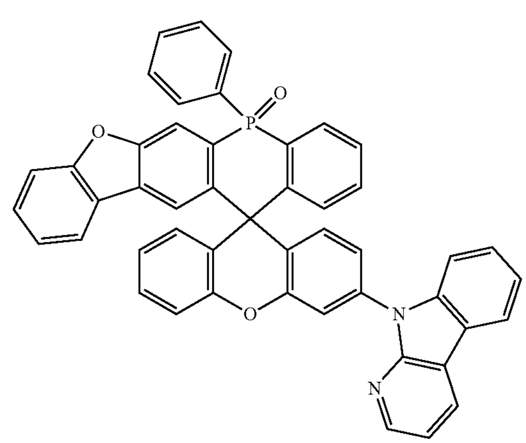

-continued
M38
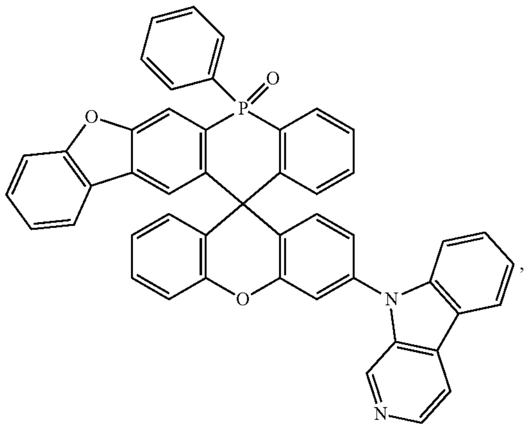
M39
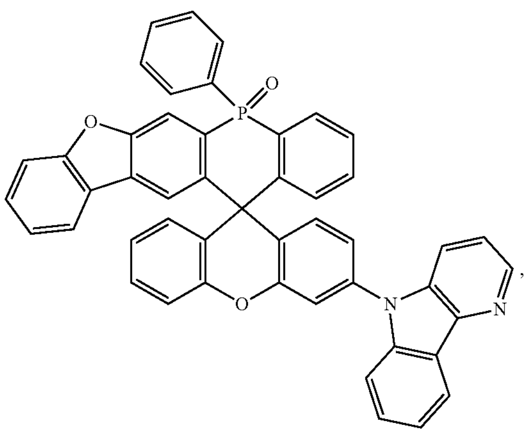
M40
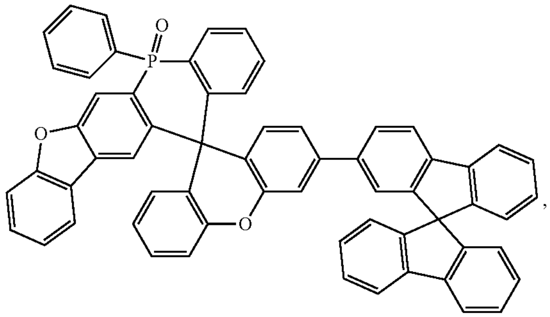
-continued
M41
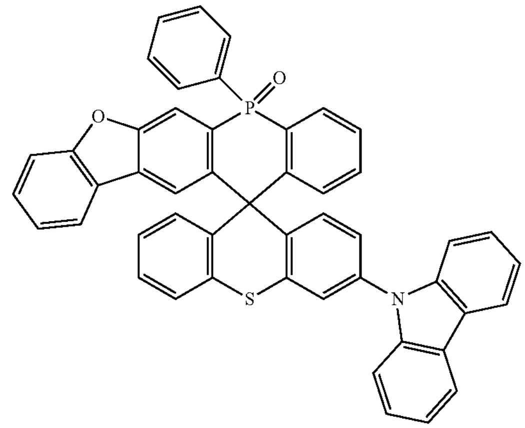
M42
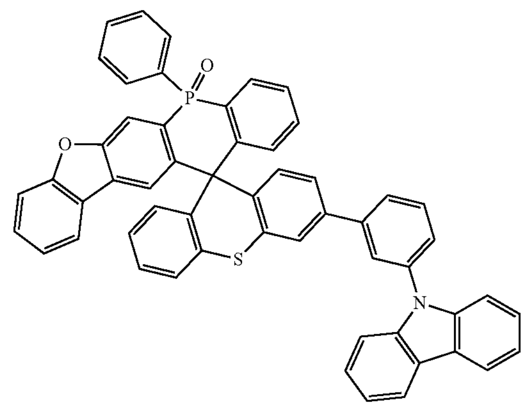
M43
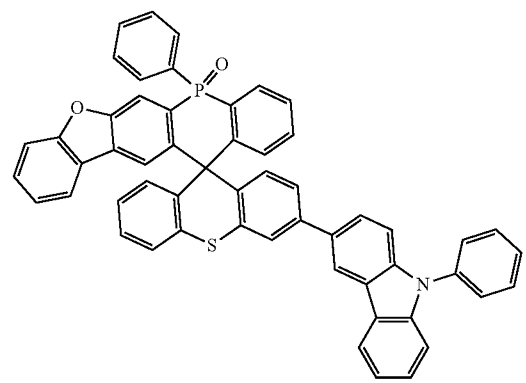
M44
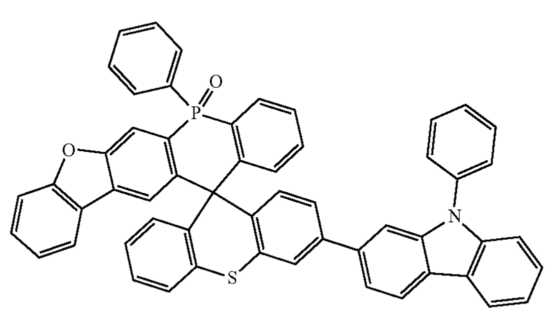

M45
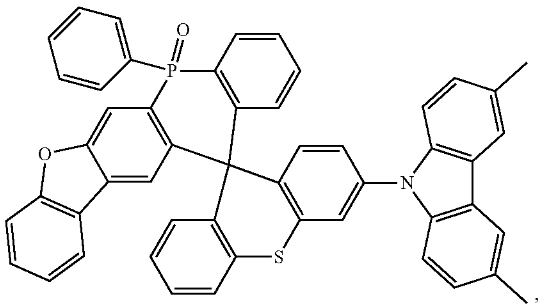
M46
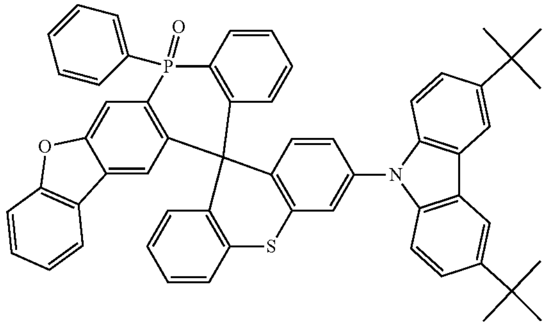
M47
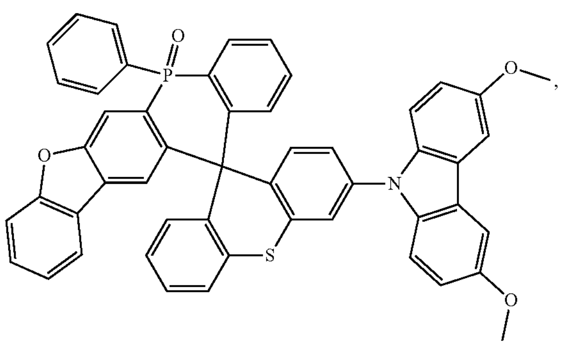
M48
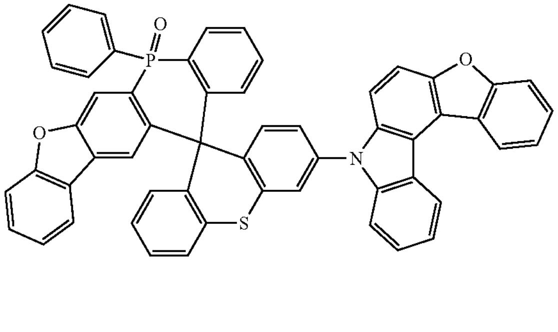
M49
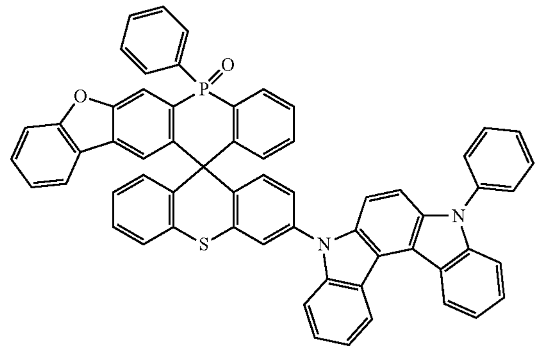
M50
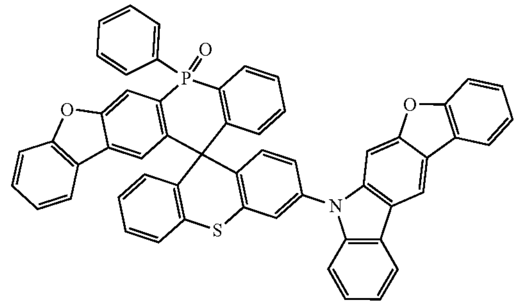
M51
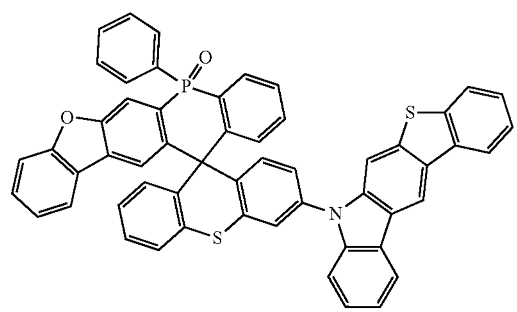
M52
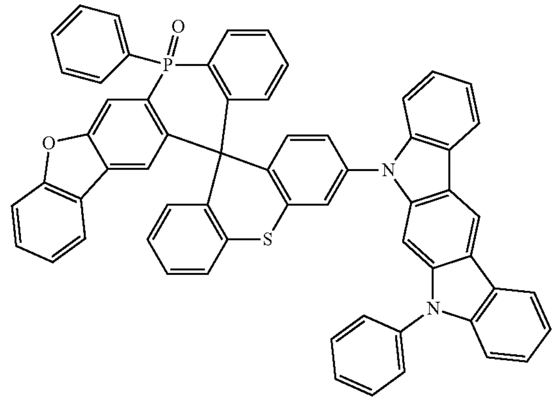

-continued
M53
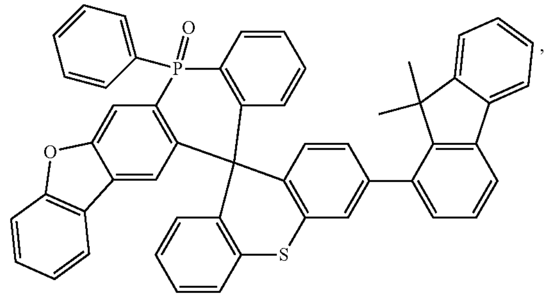
M54
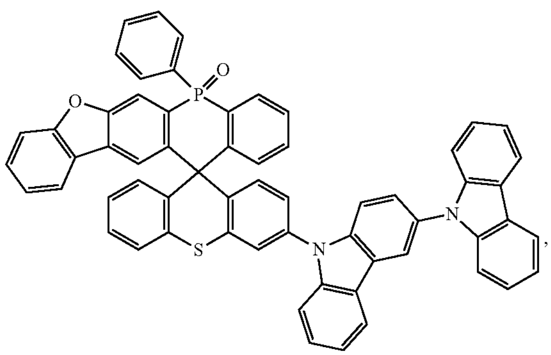
M55
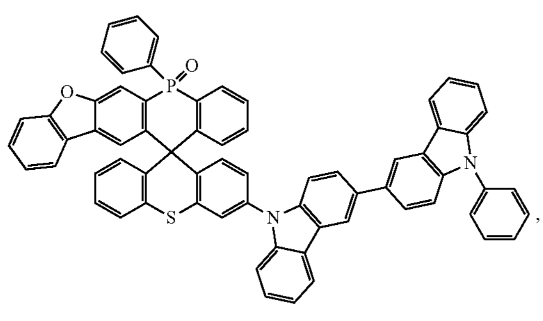
M56
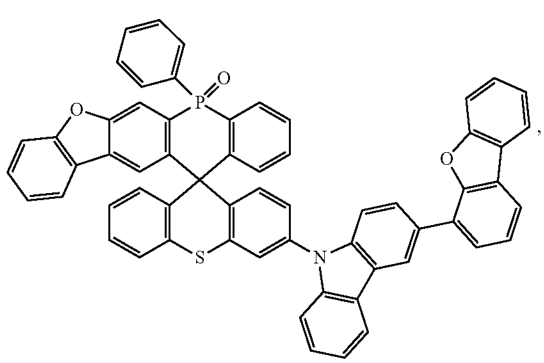
-continued
M57
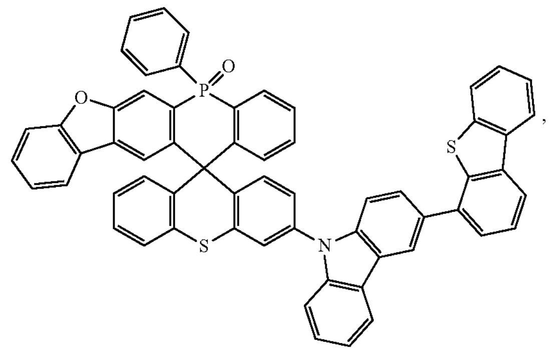
M58
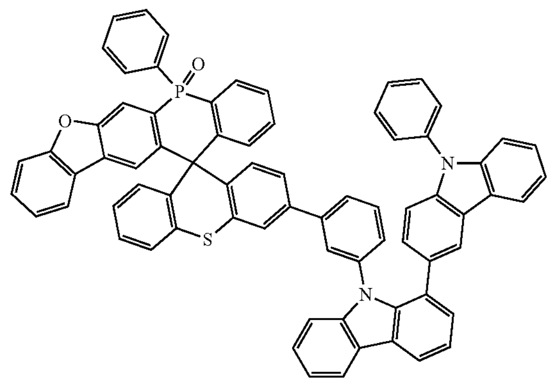
M59
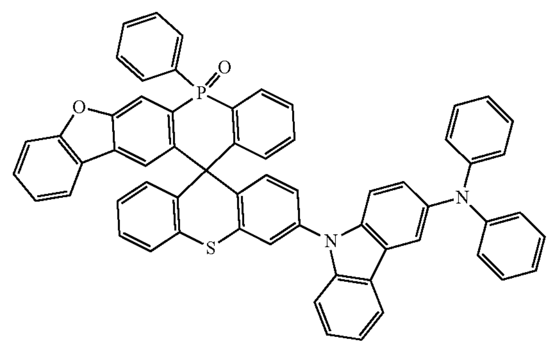
M60
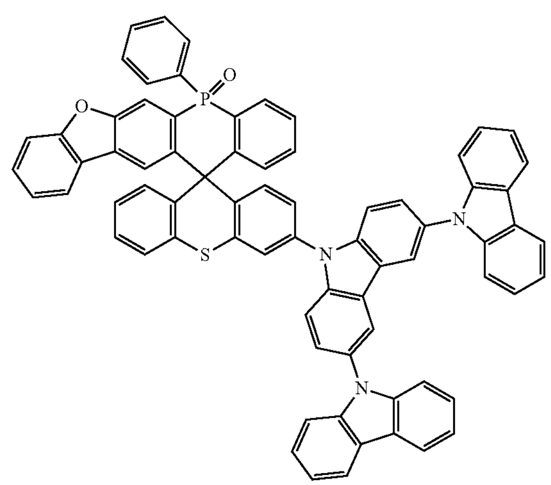

-continued
M61
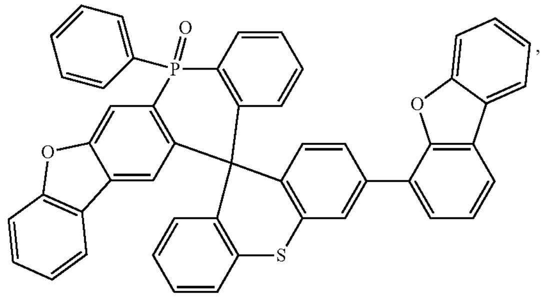
M62
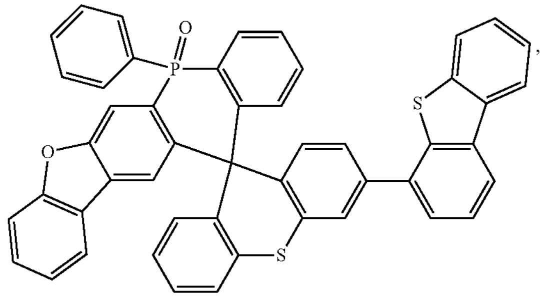
M63
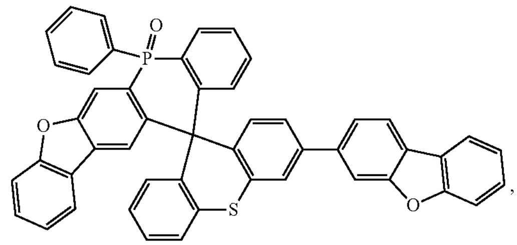
M64
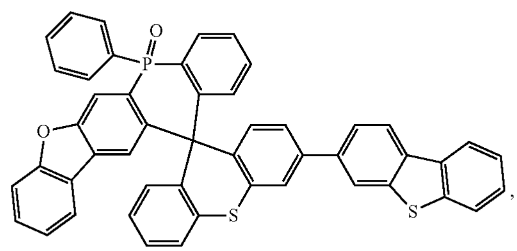
M65
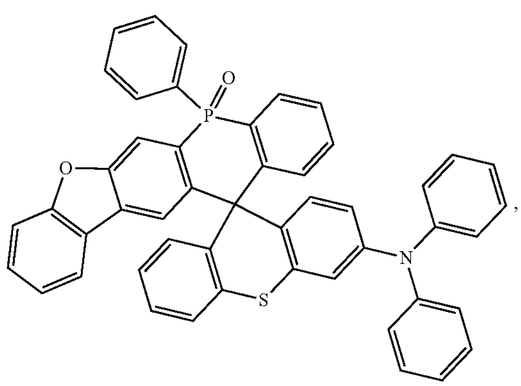
-continued
M66
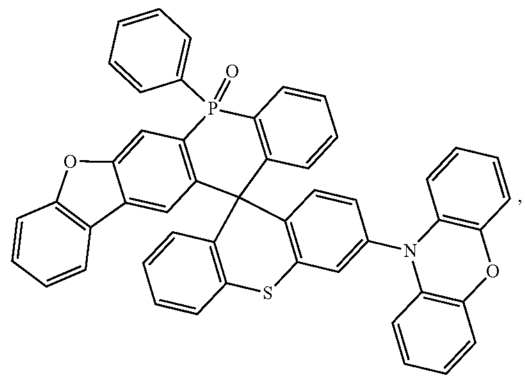
M67
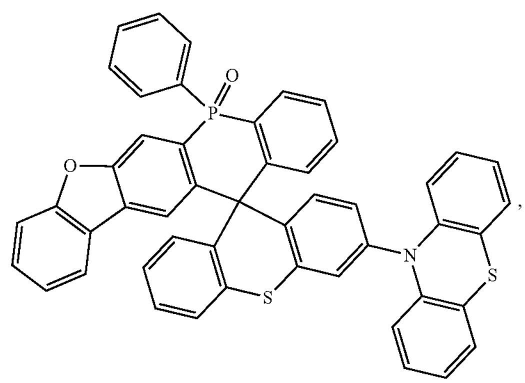
M68
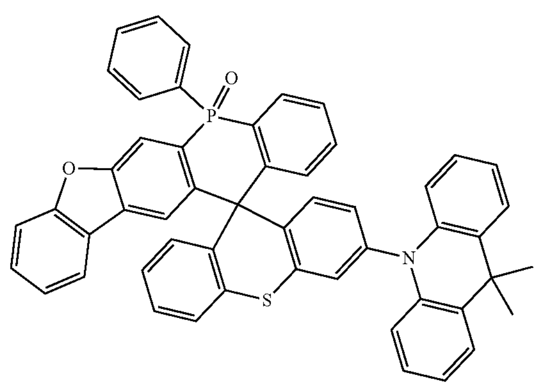
M69
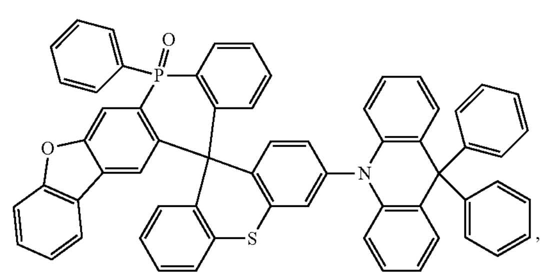

-continued
M70
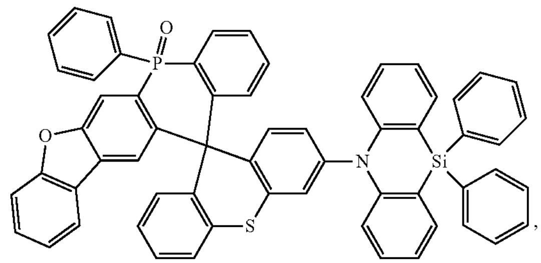
M71
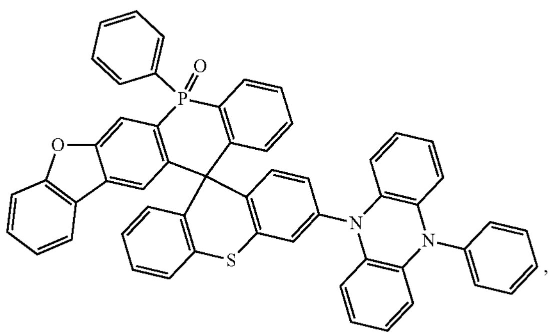
M72
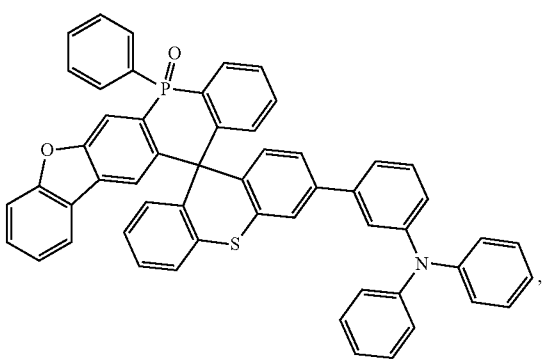
M73
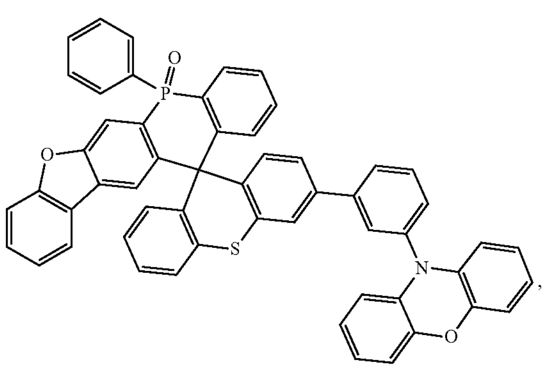
-continued
M74
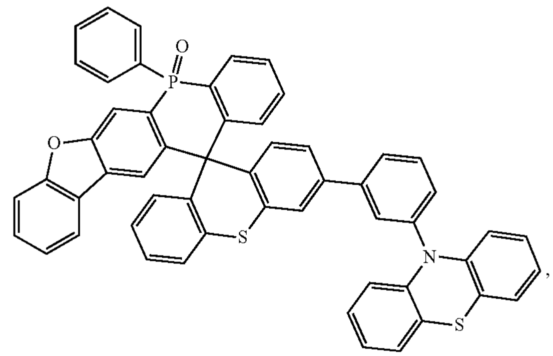
M75
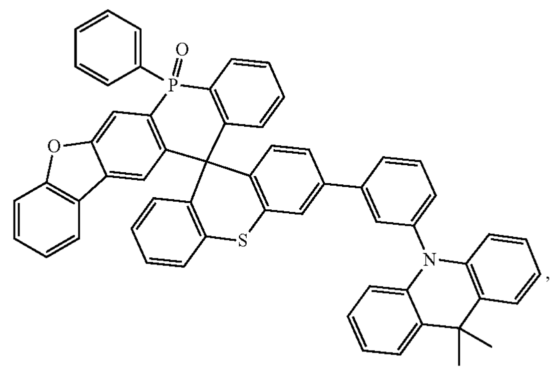
M76
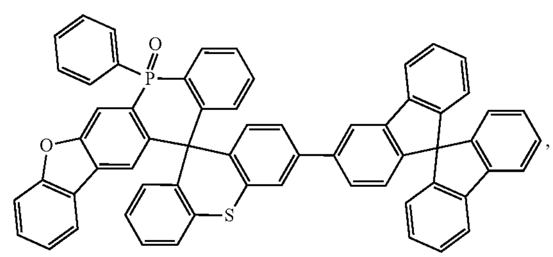
M77
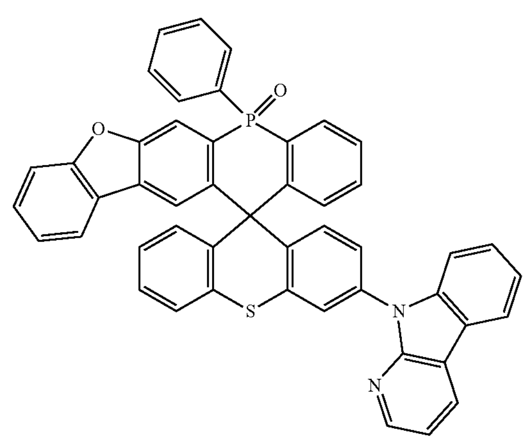

-continued
M78
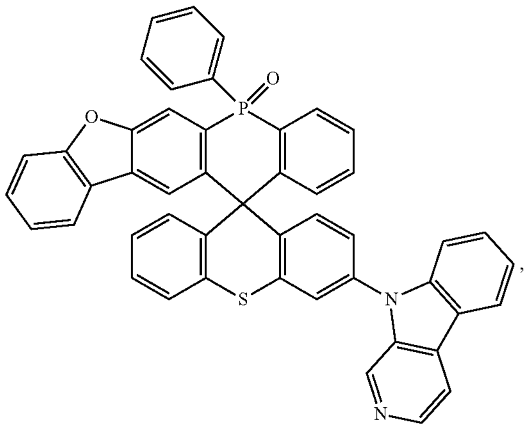
M79
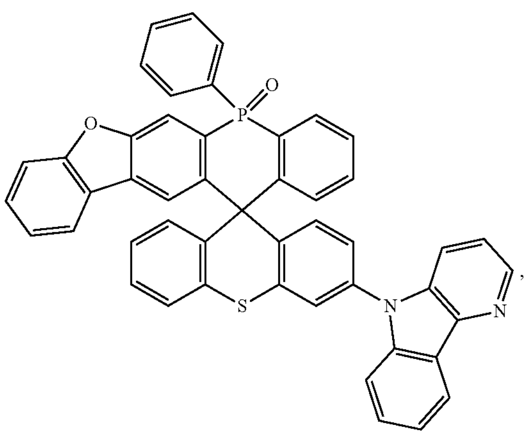
M80
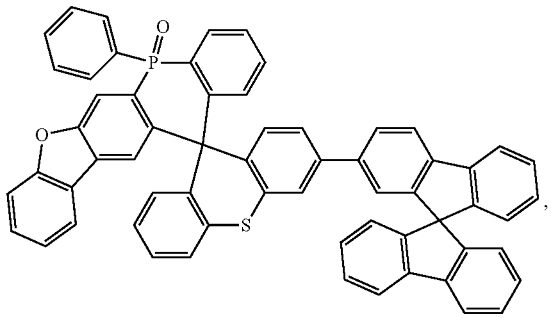
-continued
M81
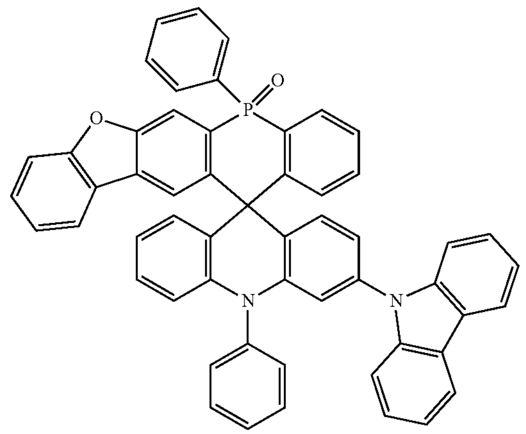
M82
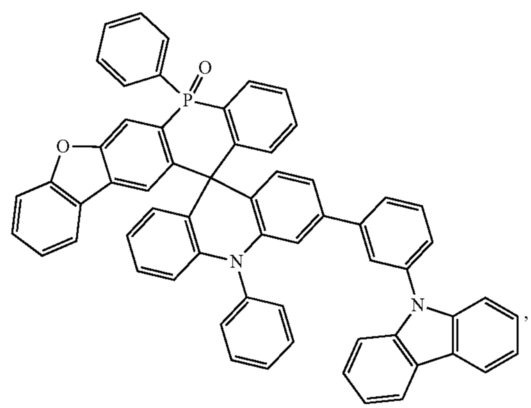
M83
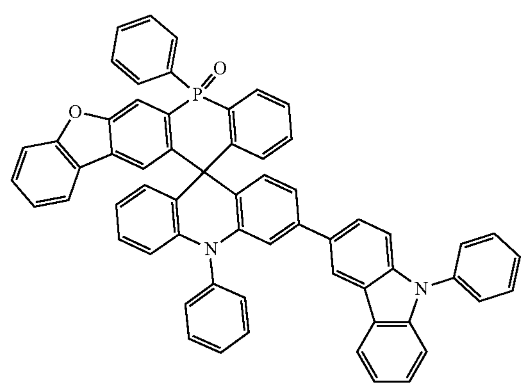

-continued
M84
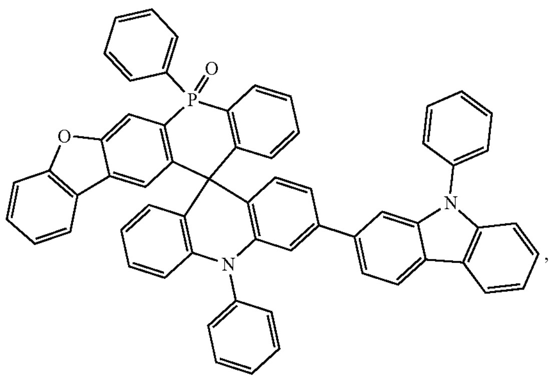
M85
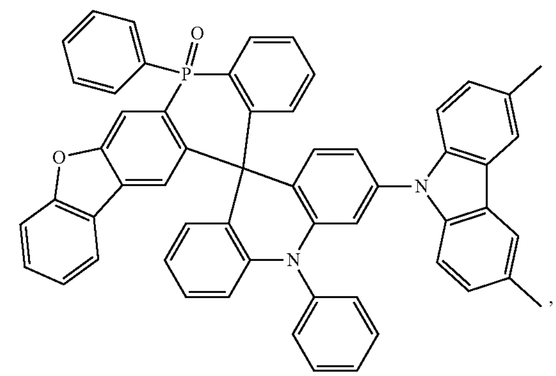
M86
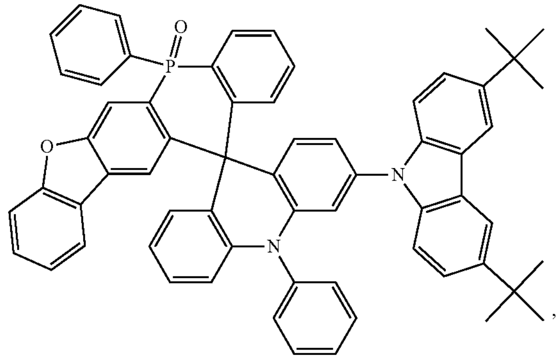
M87
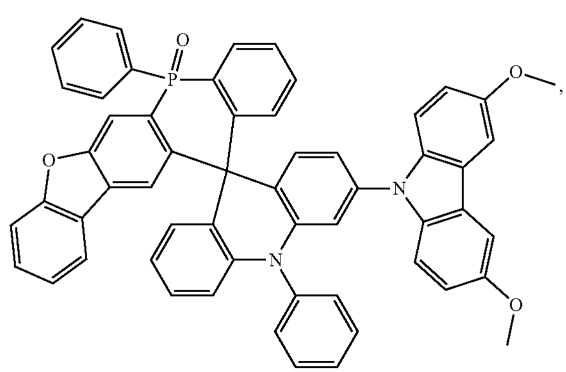
-continued
M88
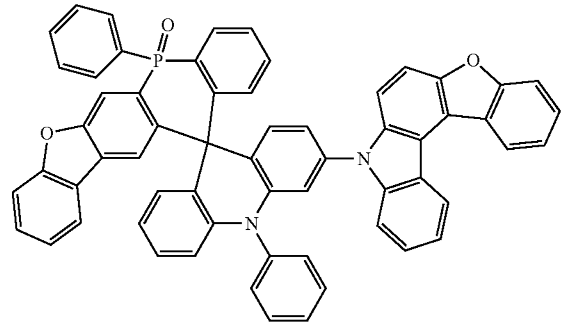
M89
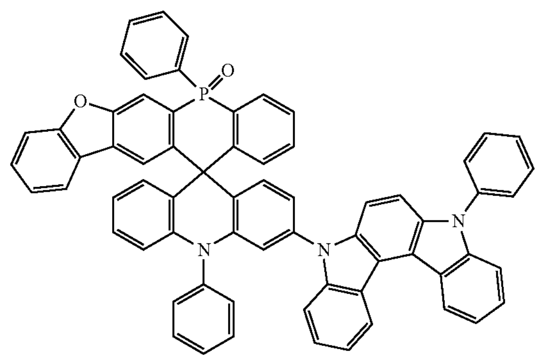
M90
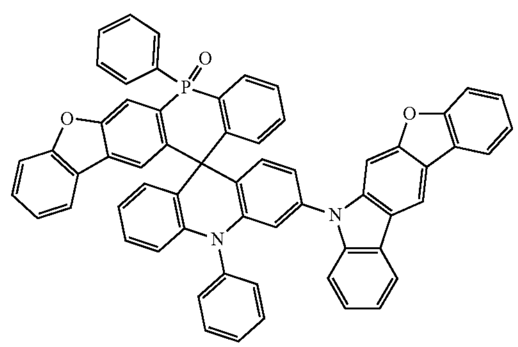
M91
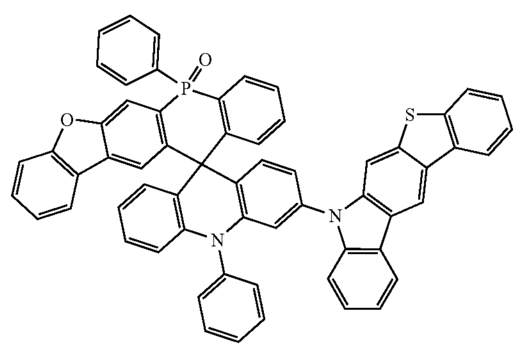

-continued
M92
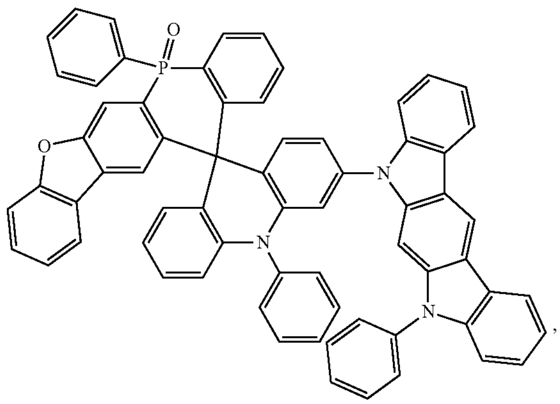
M93
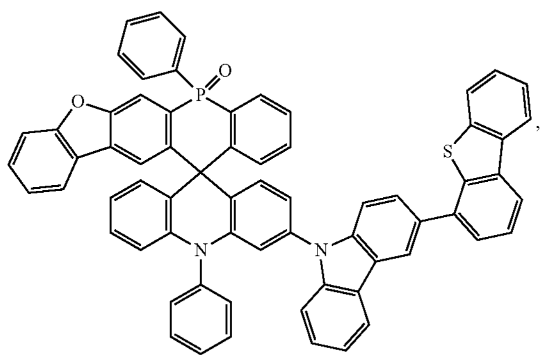
M94
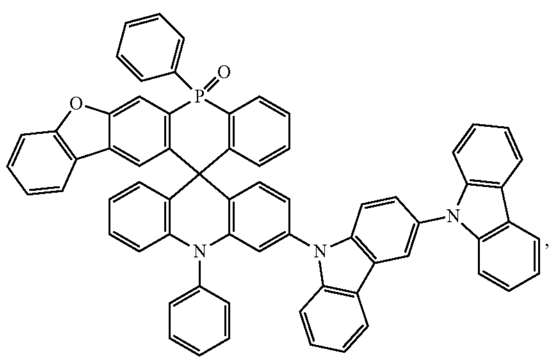
M95
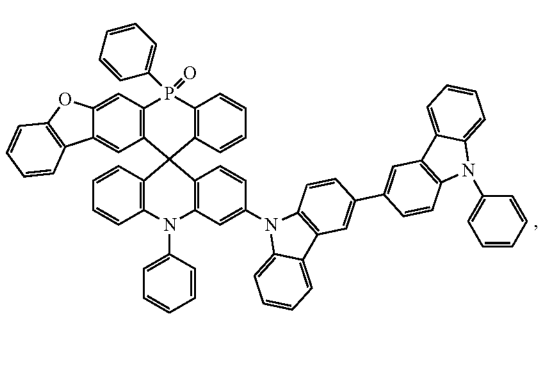
-continued
M96
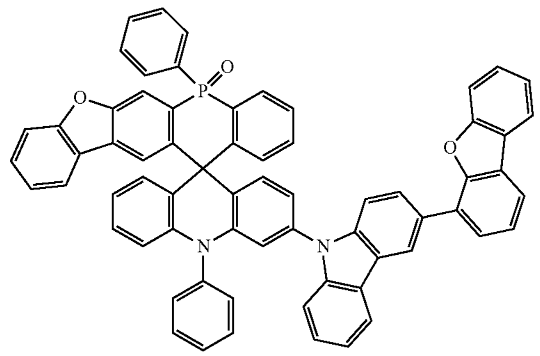
M97
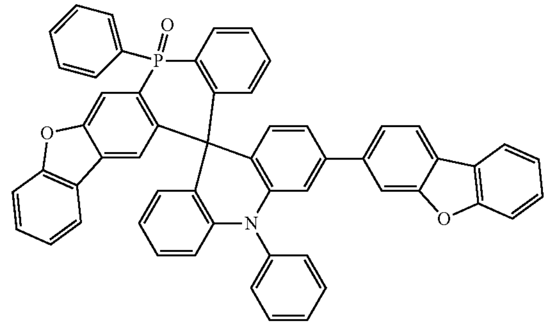
M98
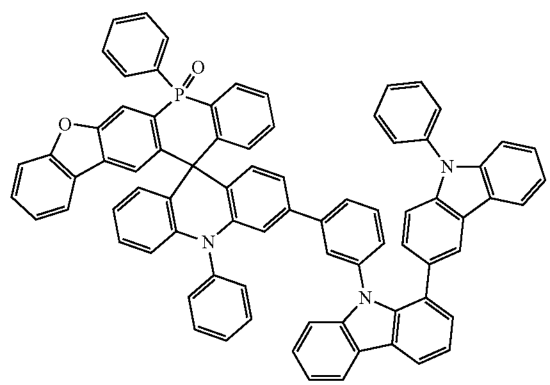
M99
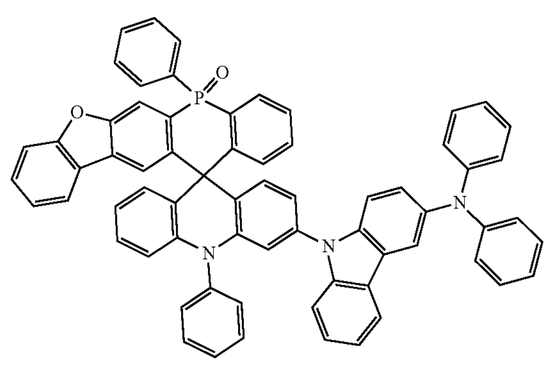

-continued
M100
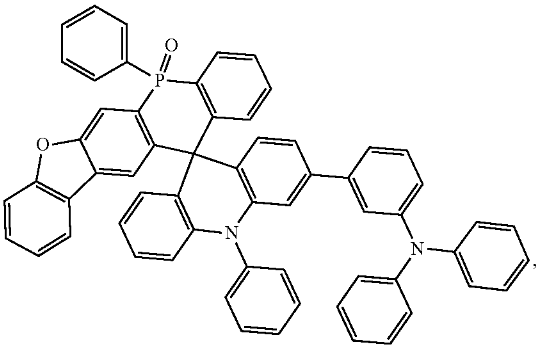
M101
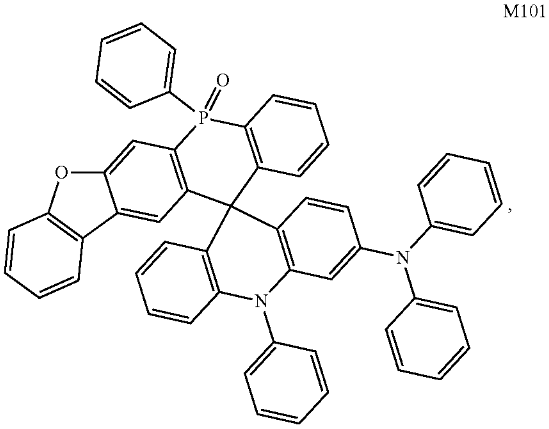
M102
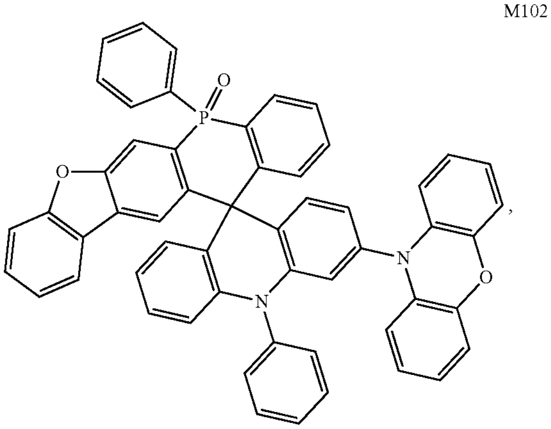
M103
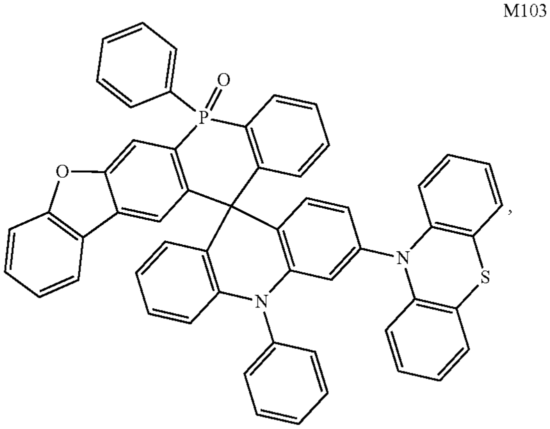
-continued
M104
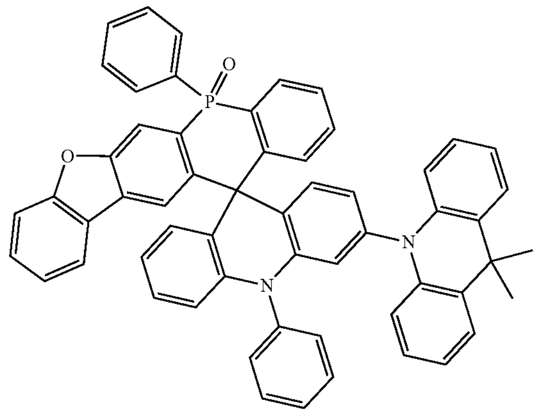
M105
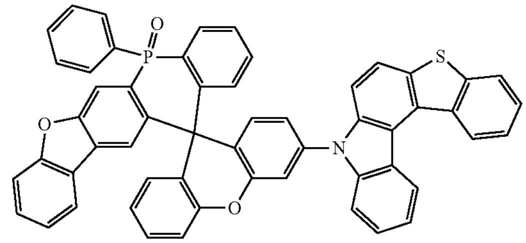
M106
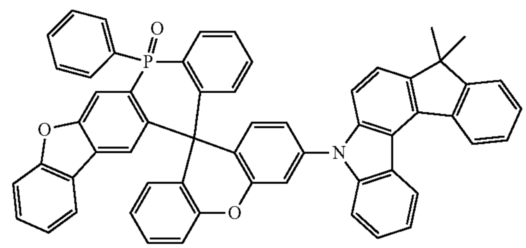
M107
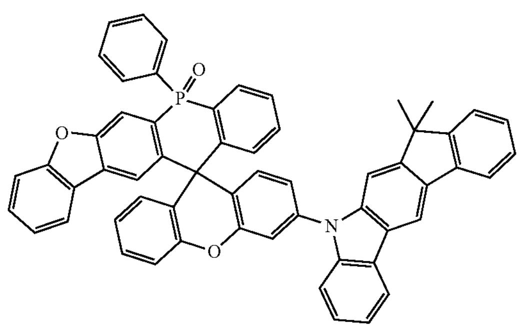

-continued
M108
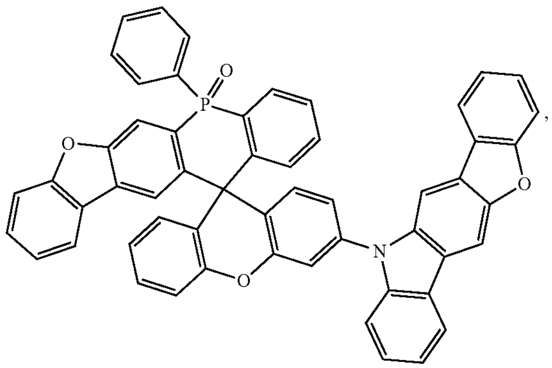
M109
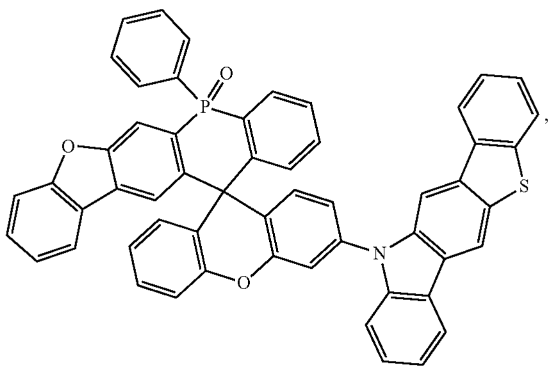
M110
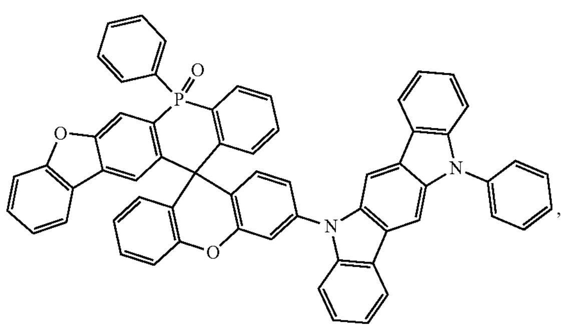
M111
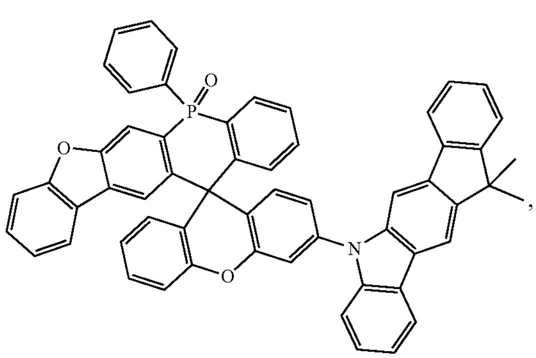
-continued
M112
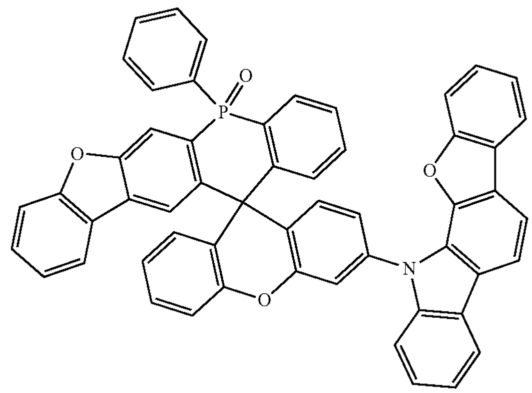
M113
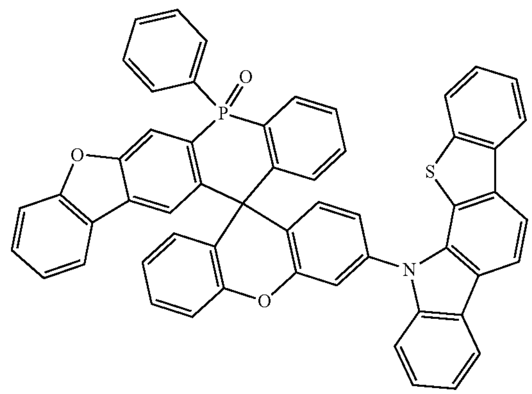
M114
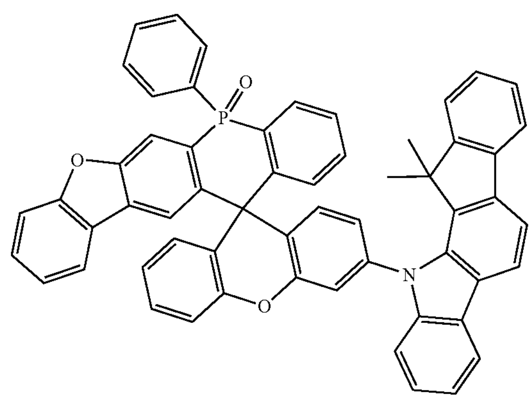
M115
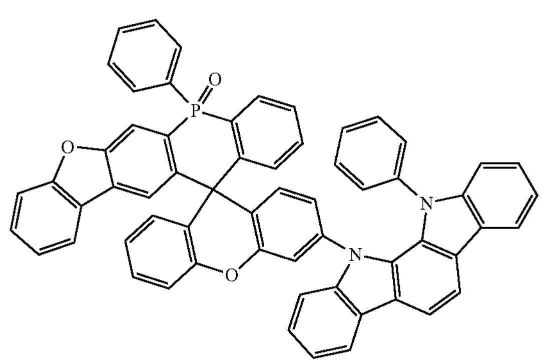

-continued
M116
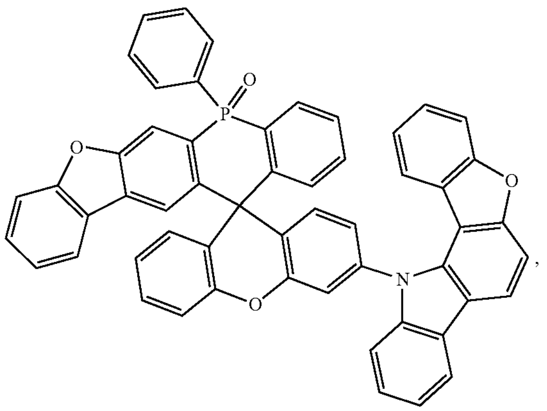
M117
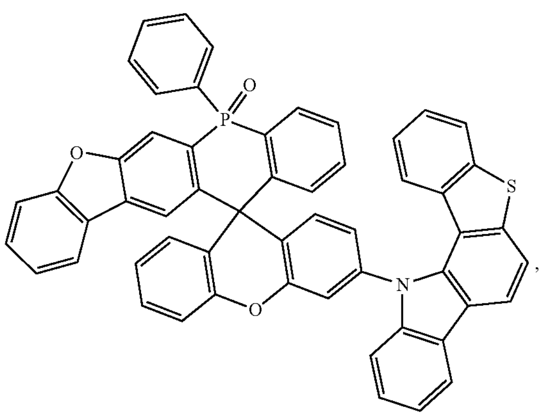
M118
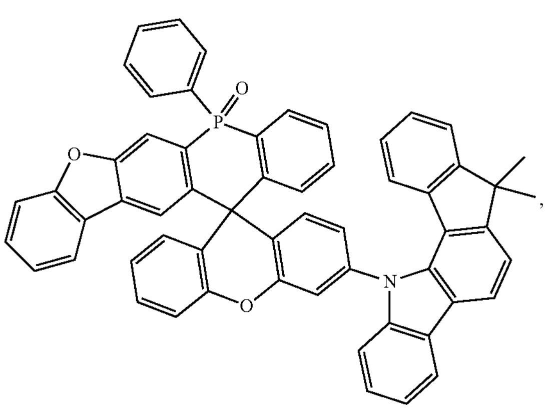
M119
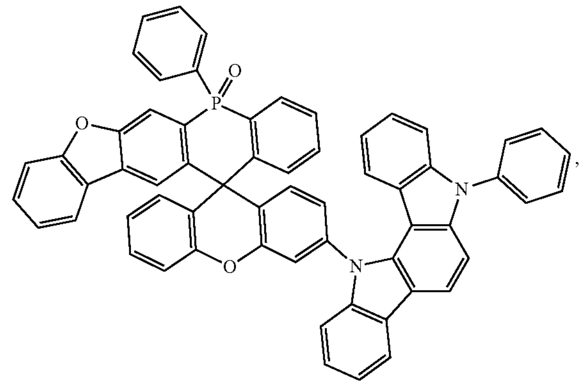
M120
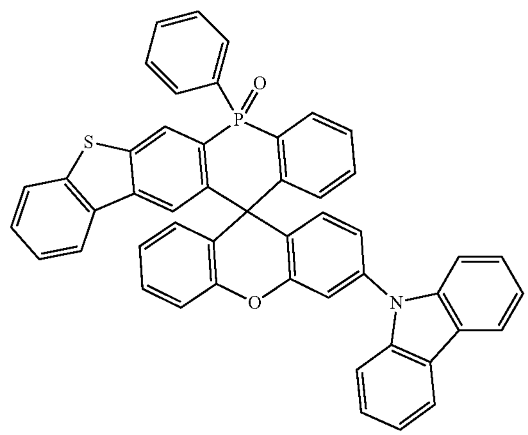
M121
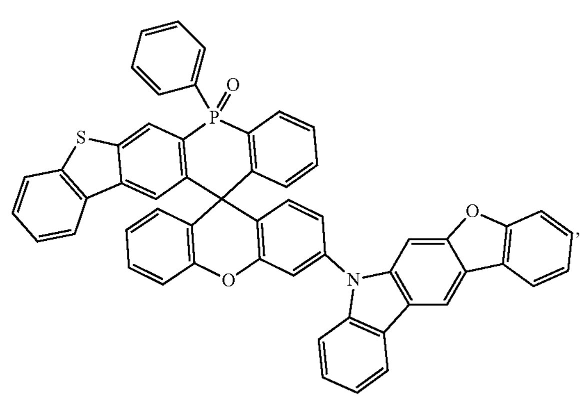

-continued
M122
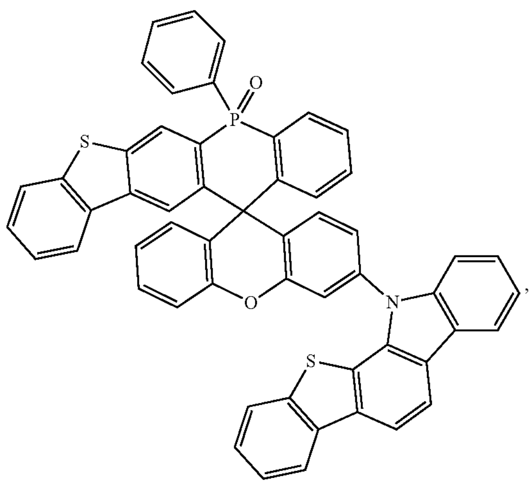
M123
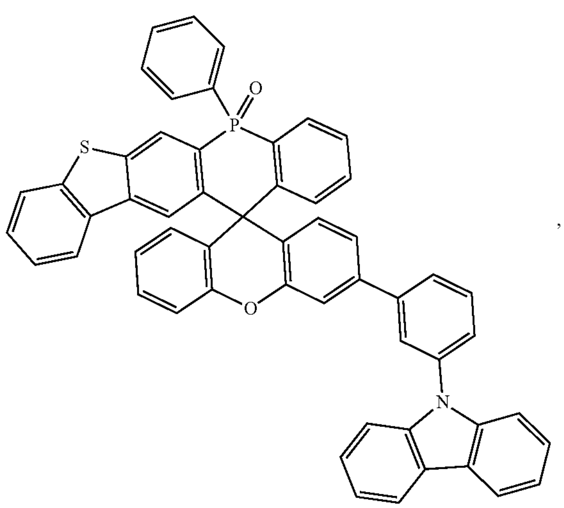
M124
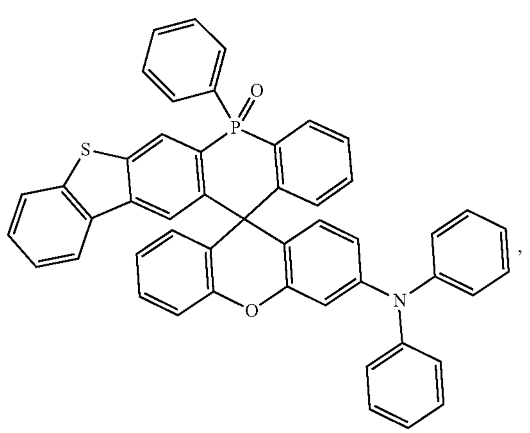
-continued
M125
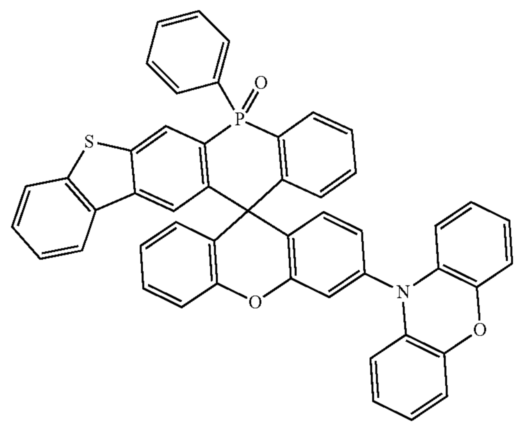
M126
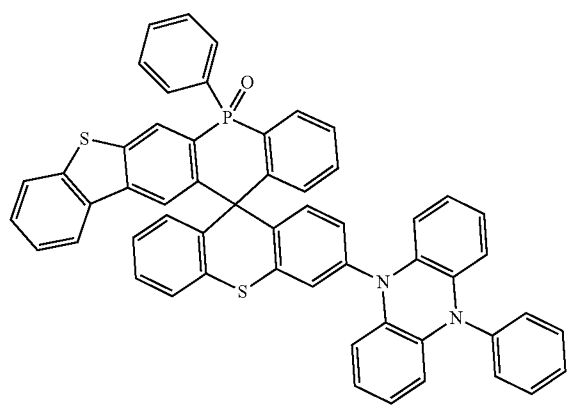
M127
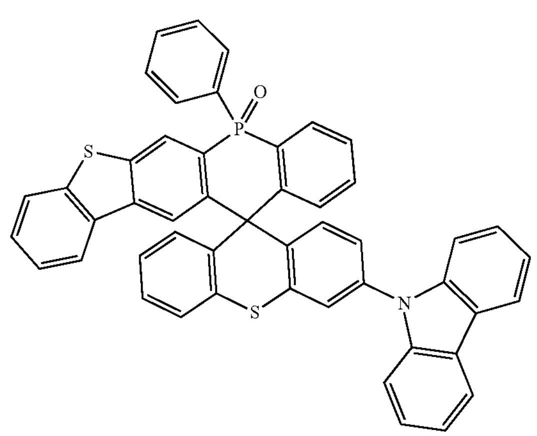

-continued
M128
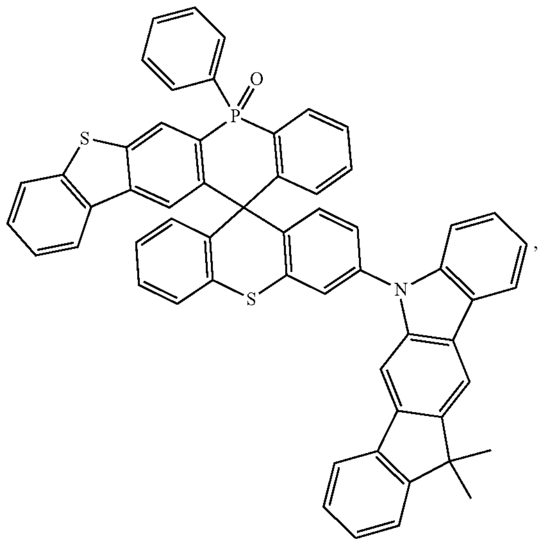
M129
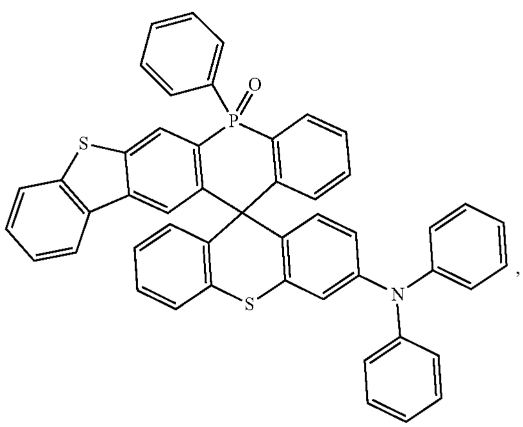
M130
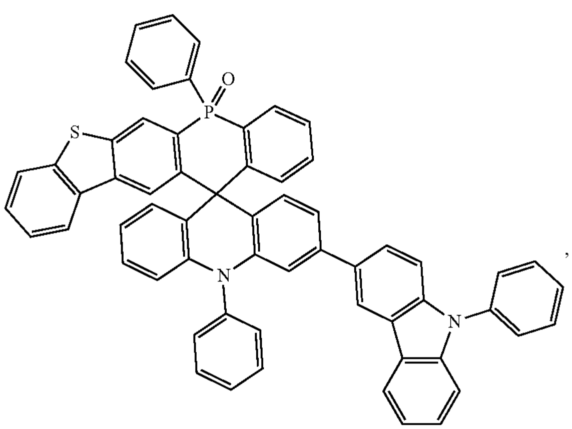
-continued
M131
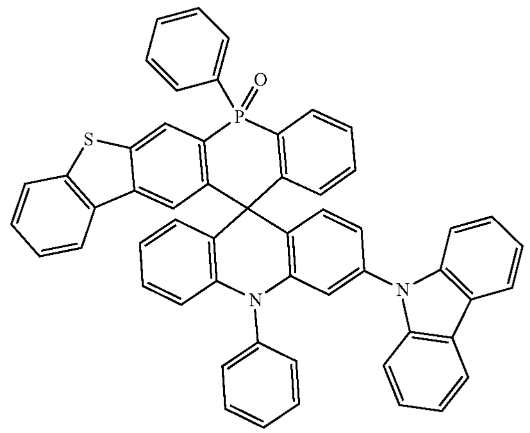
M132
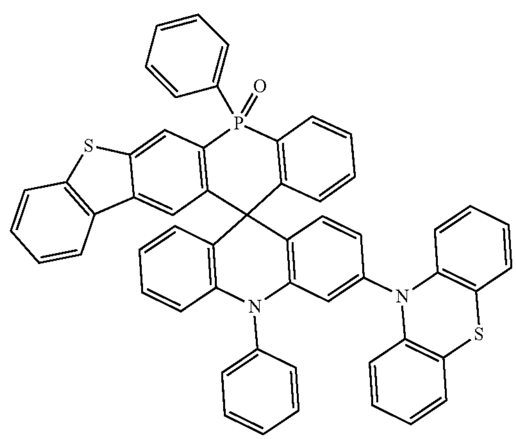
M133
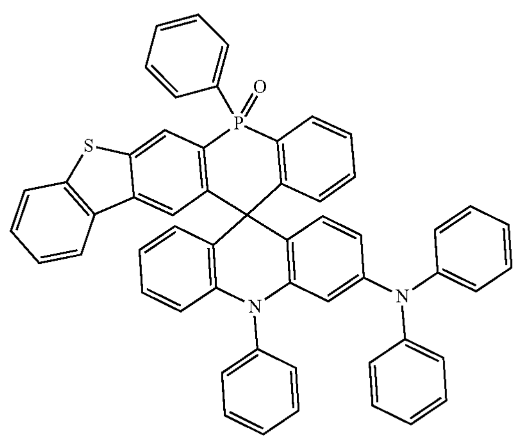

-continued
M134
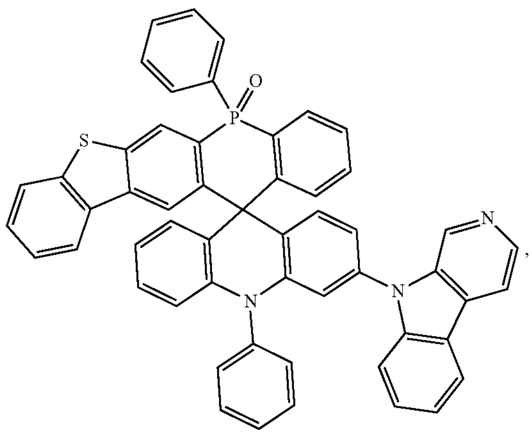
M135
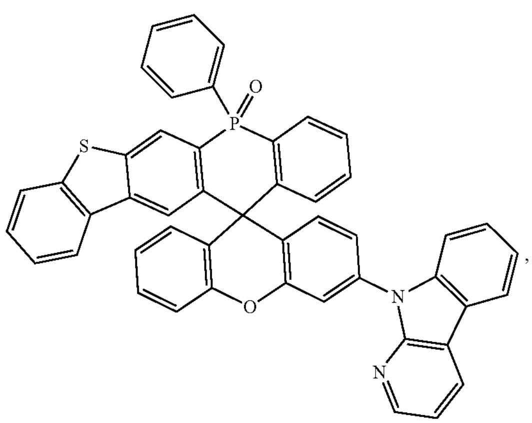
N1
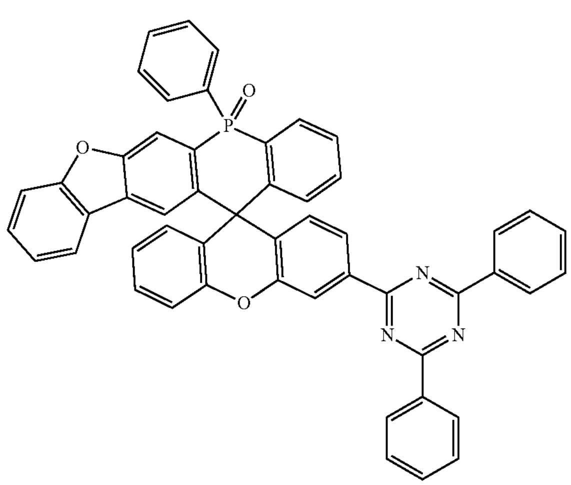
-continued
N2
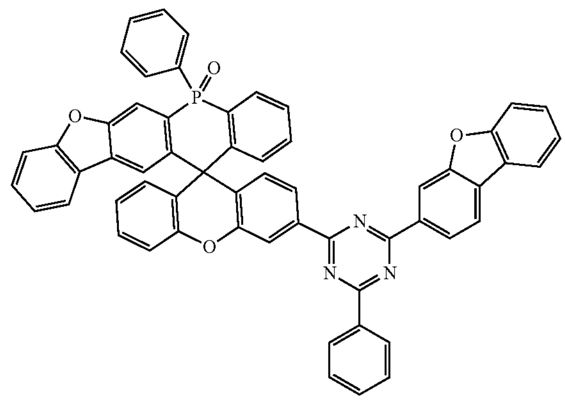
N3
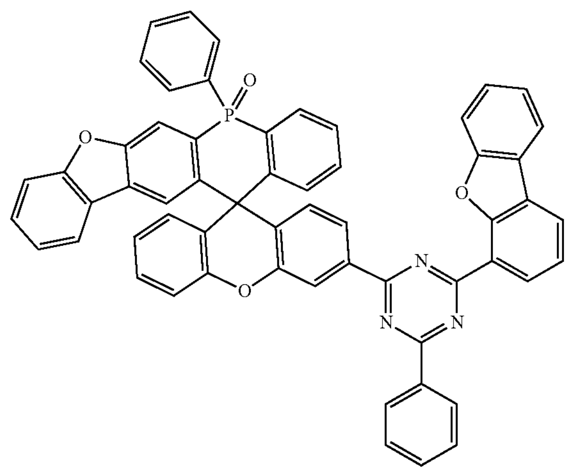
N4
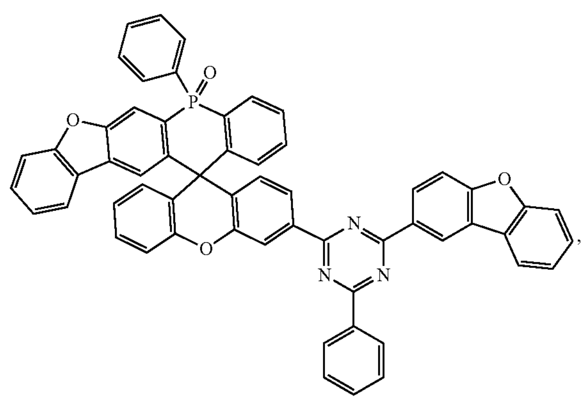

-continued
N5
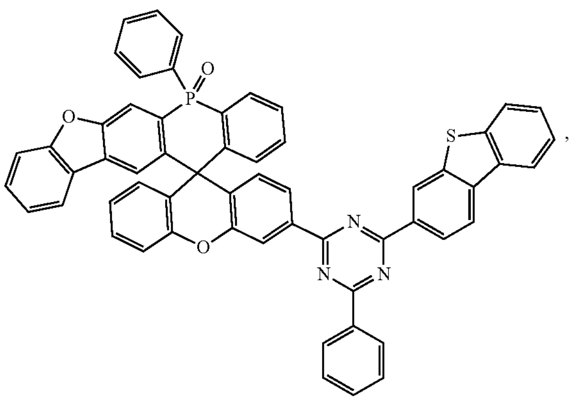
N6
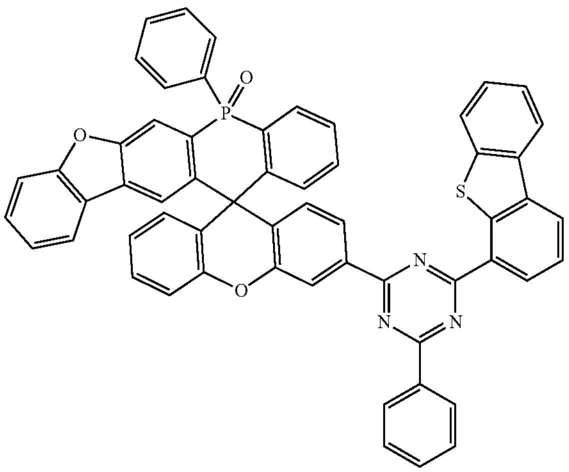
N7
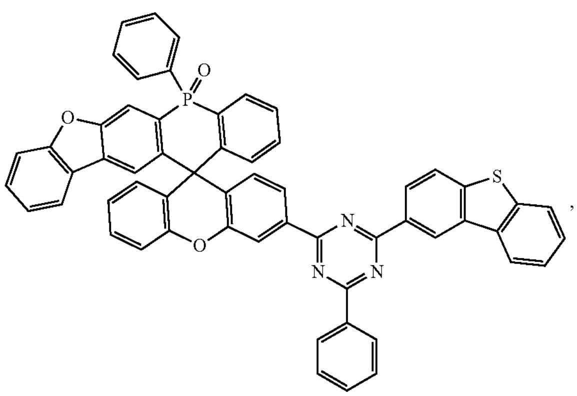
N8
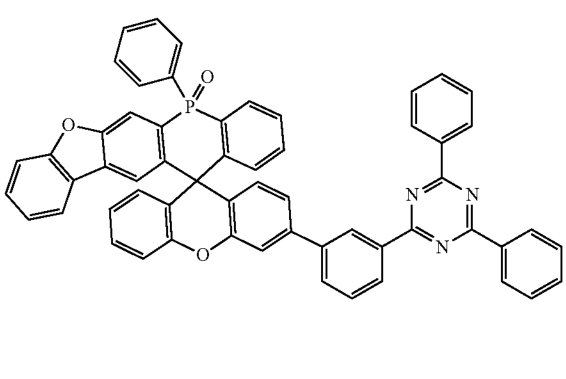
-continued
N9
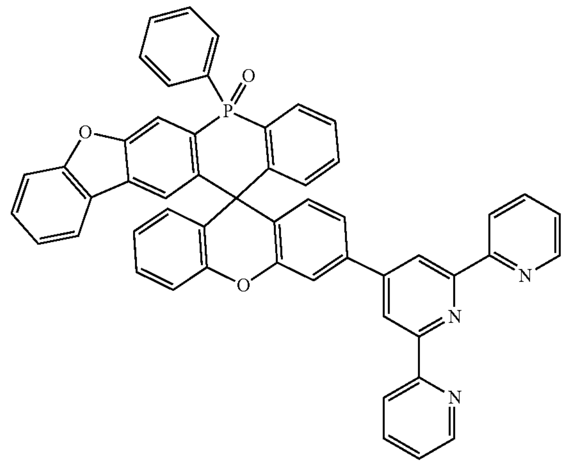
N10
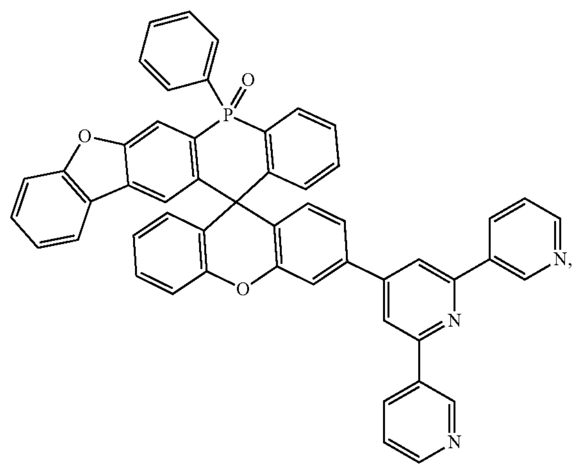
N11
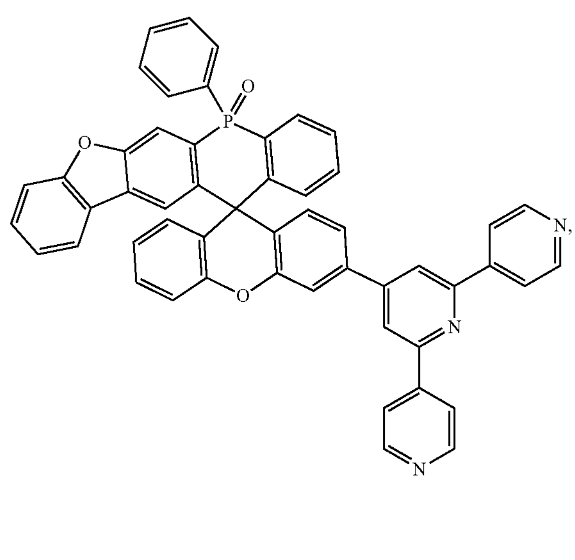

N12
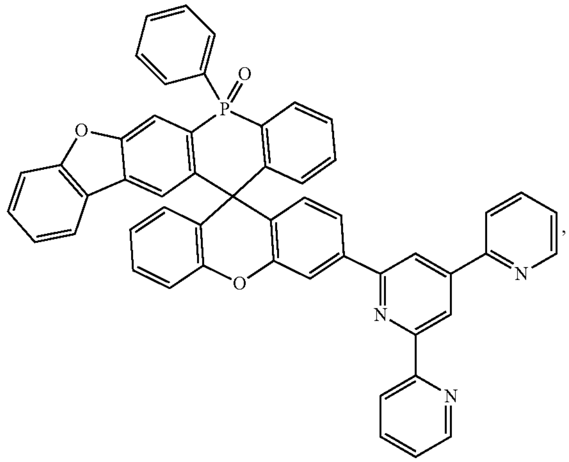
N13
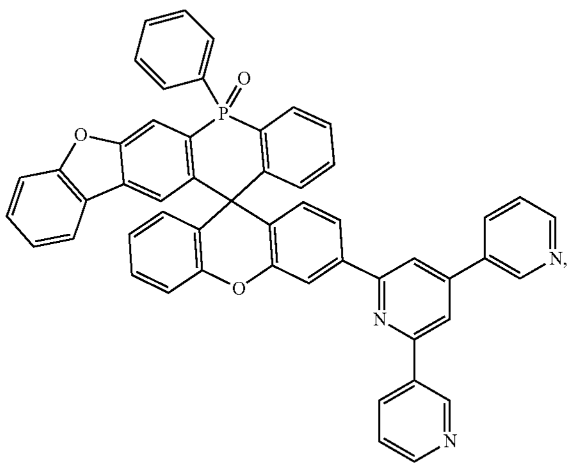
N14
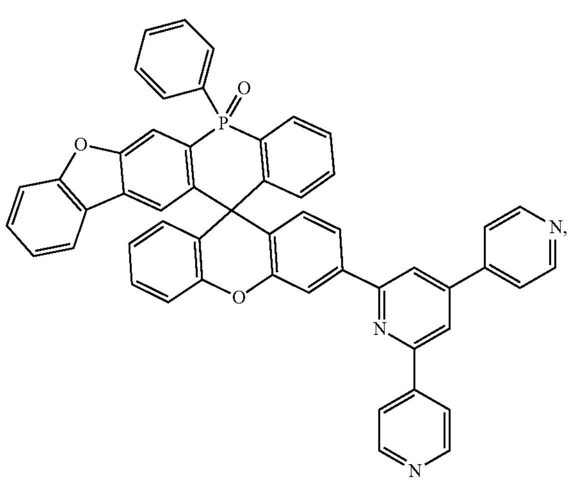
N15
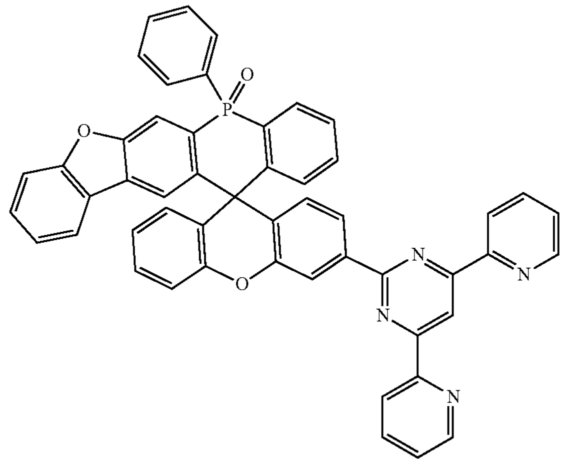
N16
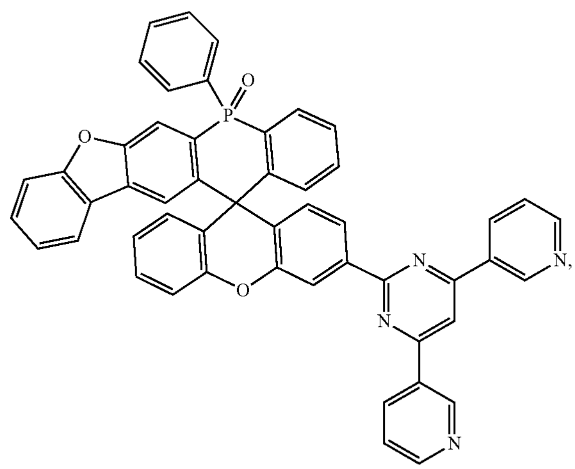
N17
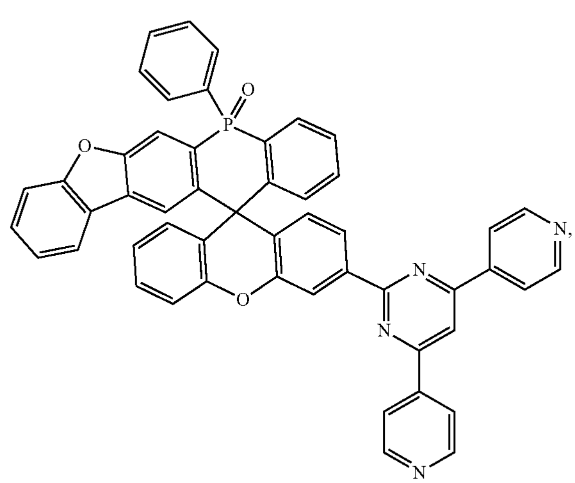

-continued
N18
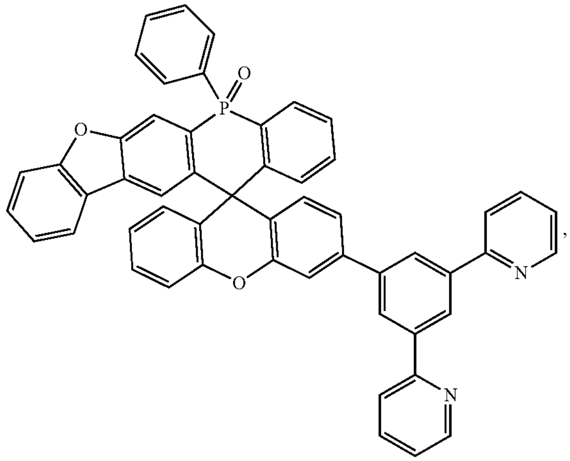
N19
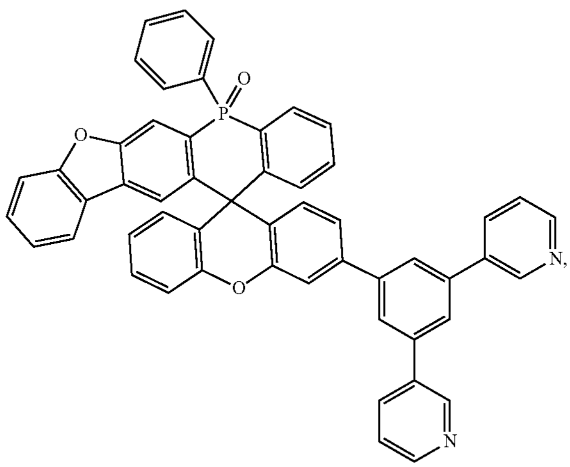
N20
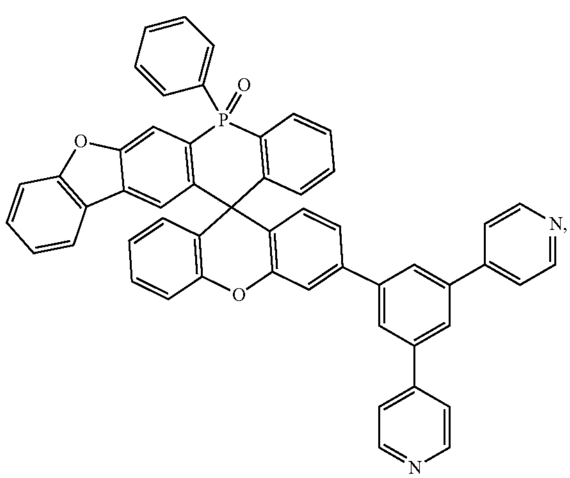
-continued
N21
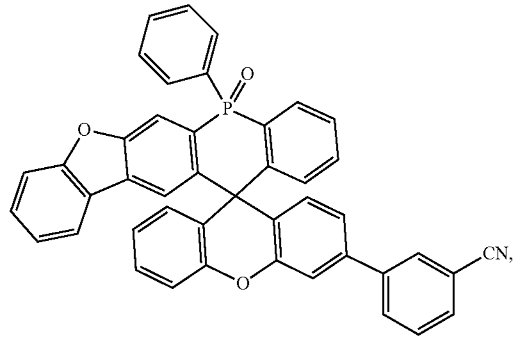
N22
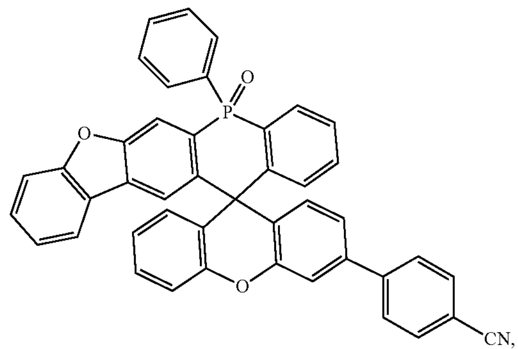
N23
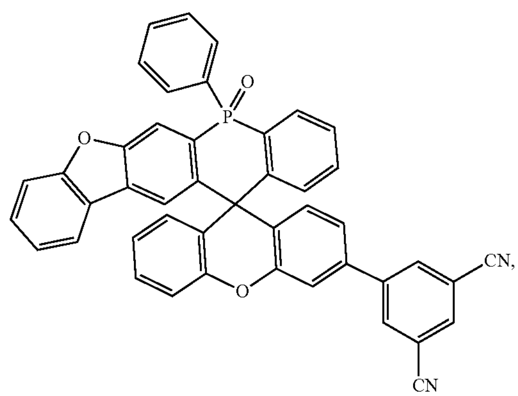
N24
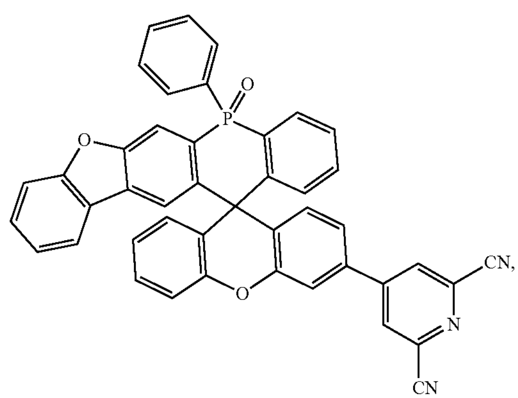

-continued
N25
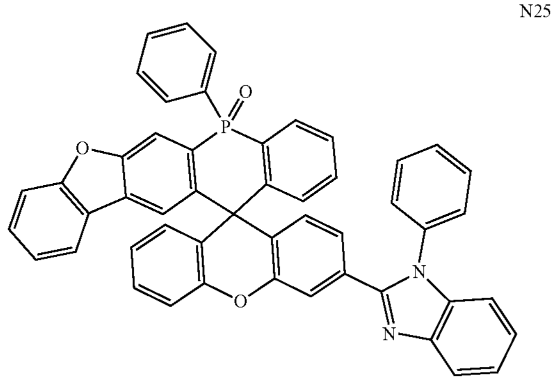
N26
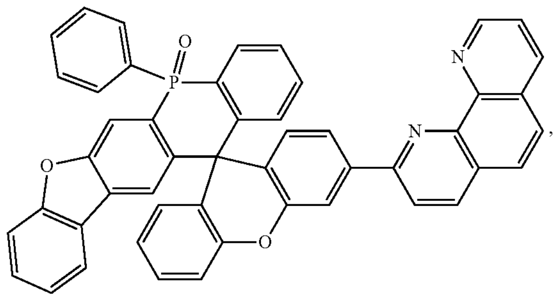
N27
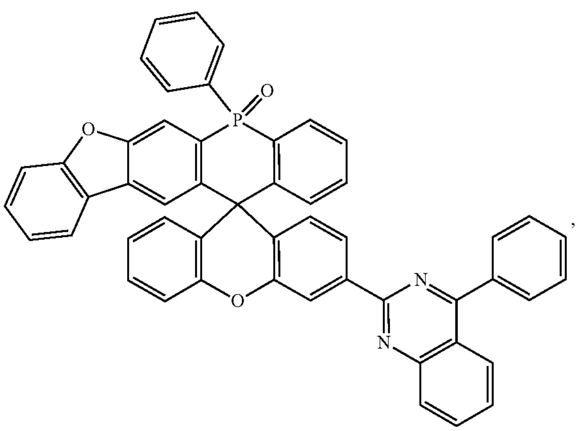
N28
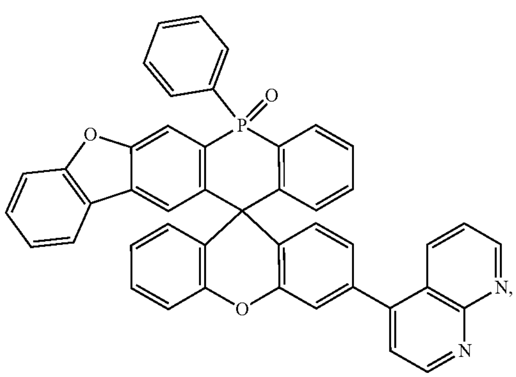
-continued
N29
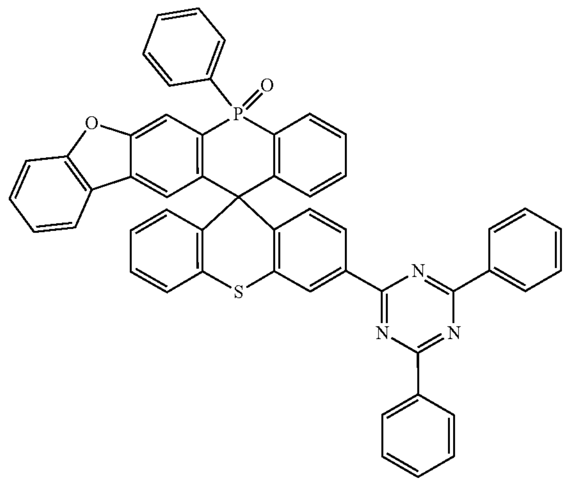
N30
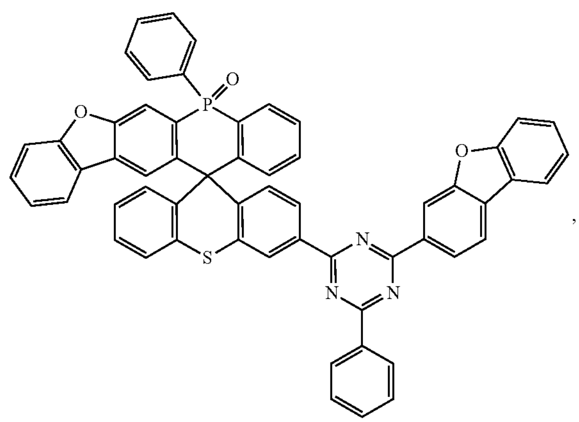
N31
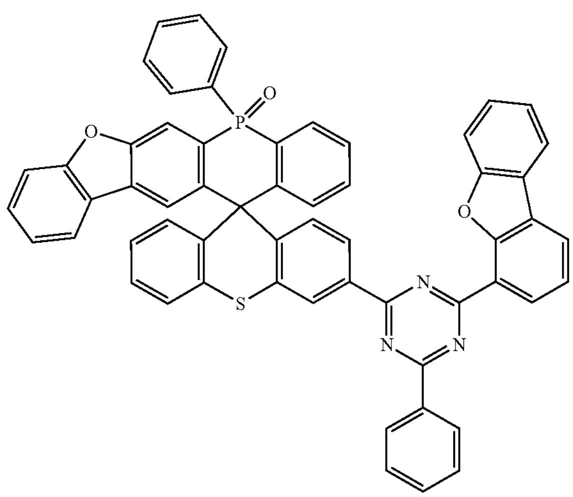

N32
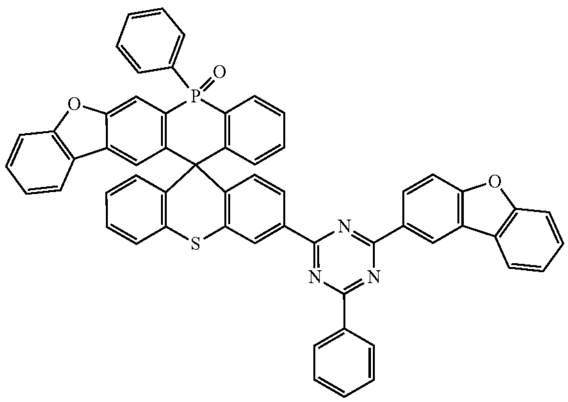
,
N33
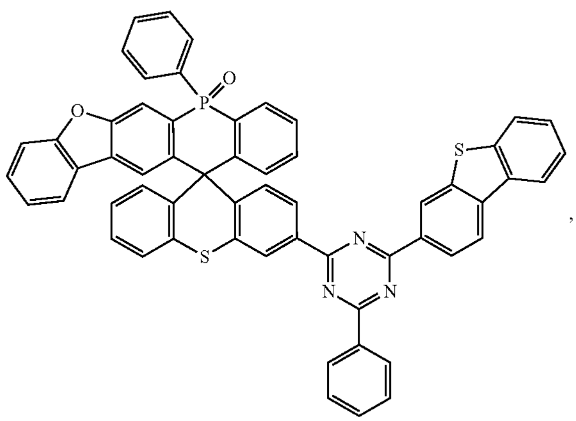
,
N34
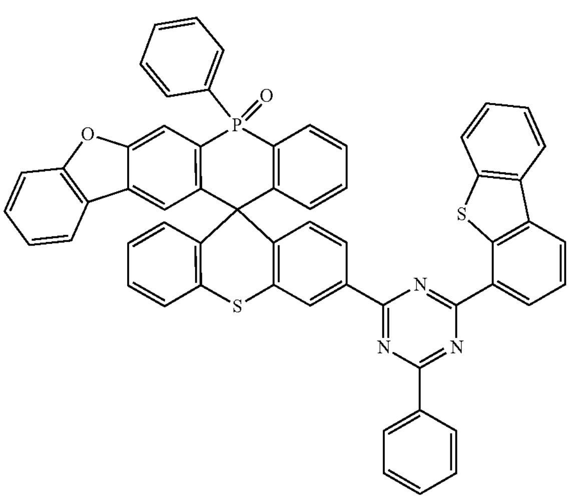
,
N35
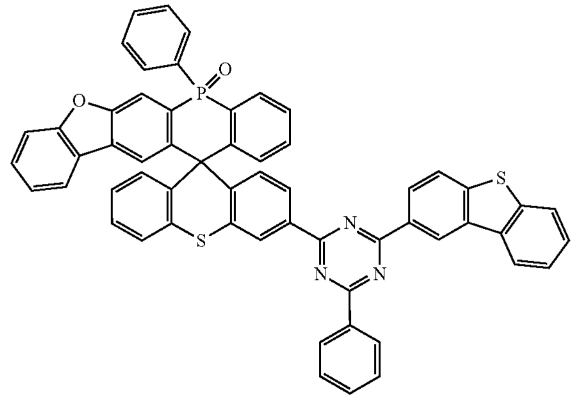
,
N36
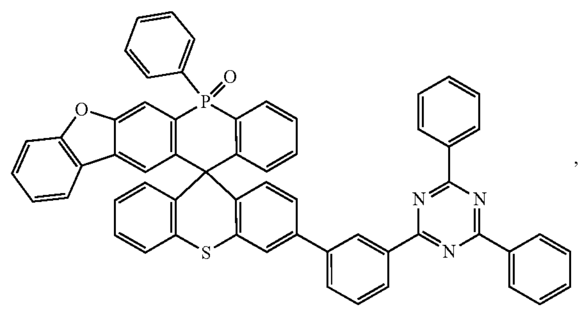
,
N37
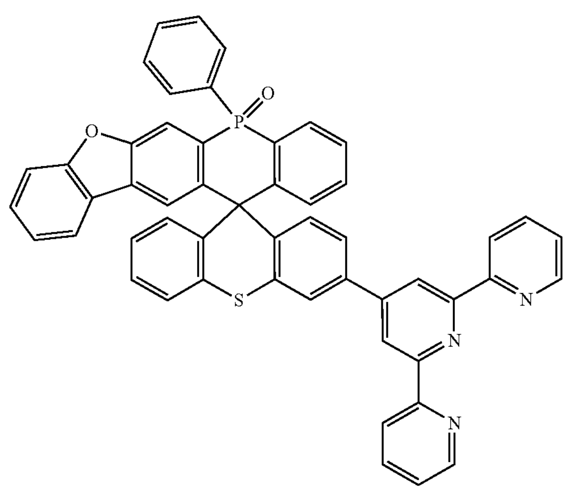
, -continued
N38
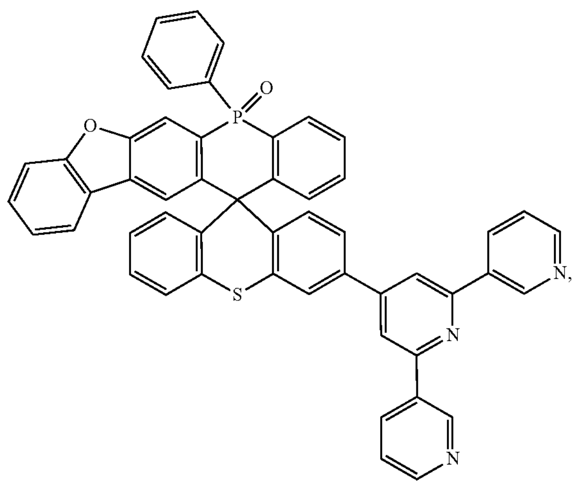
N39
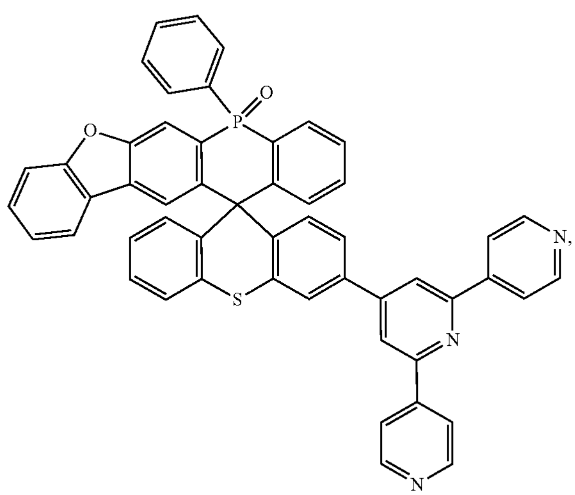
N40
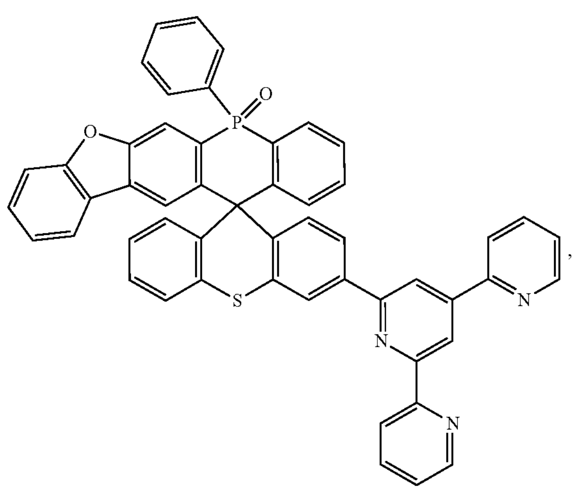
-continued
N41
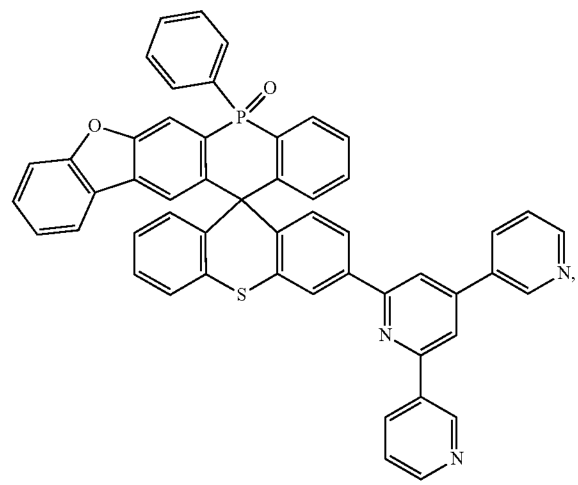
N42
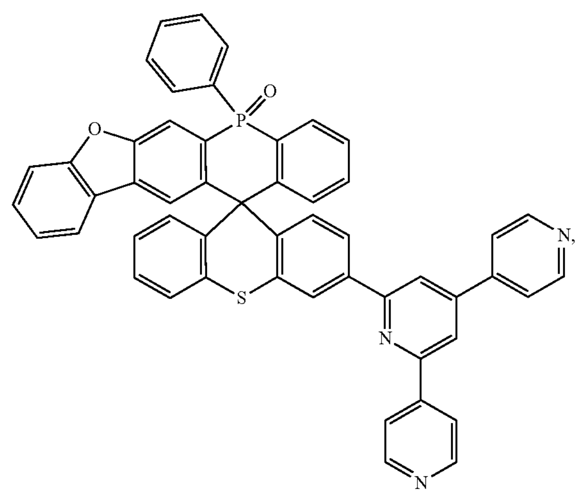
N43
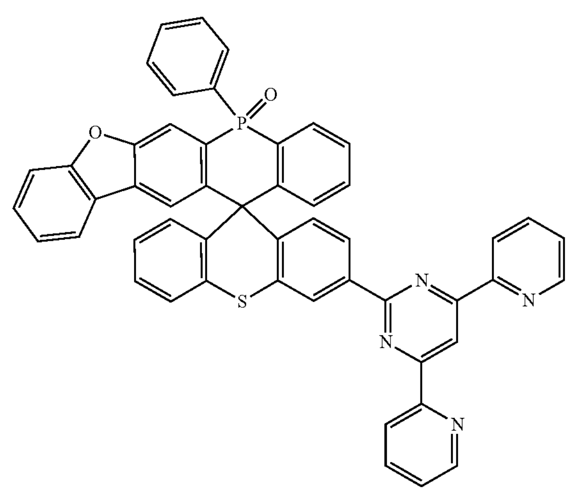

-continued
N44
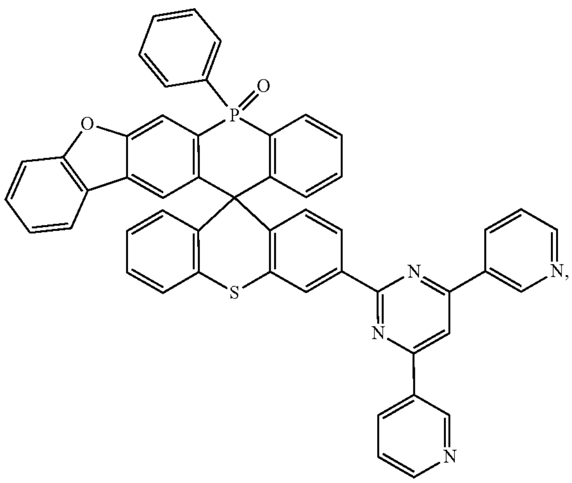
N45
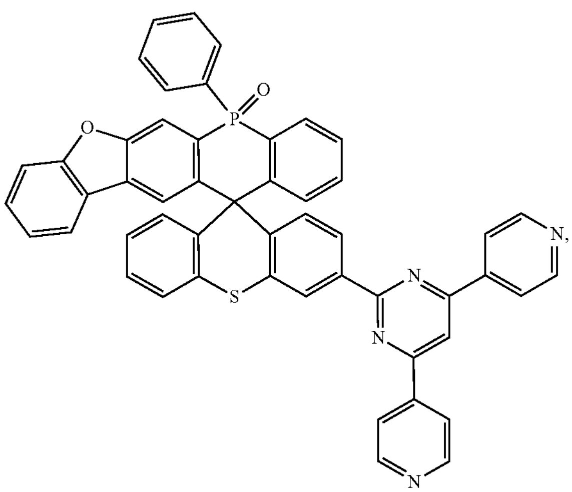
N46
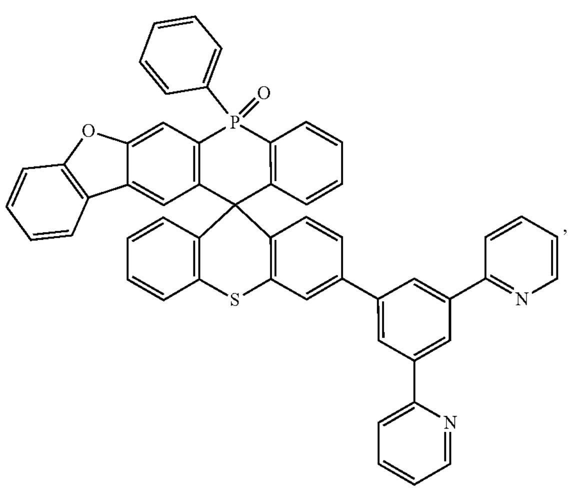
-continued
N47
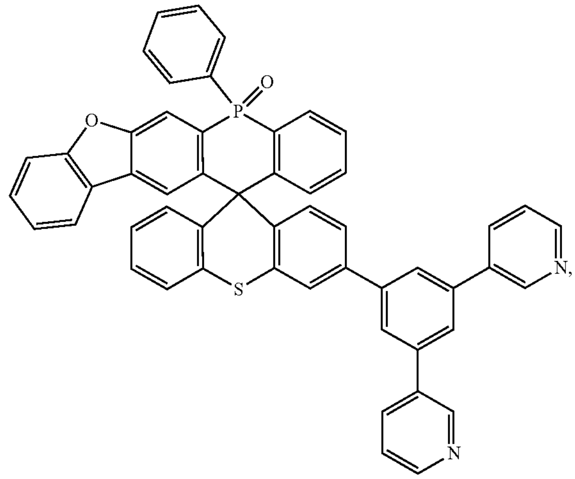
N48
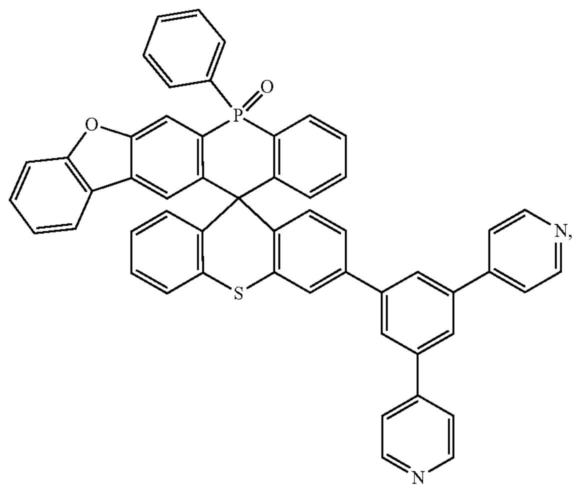
N49
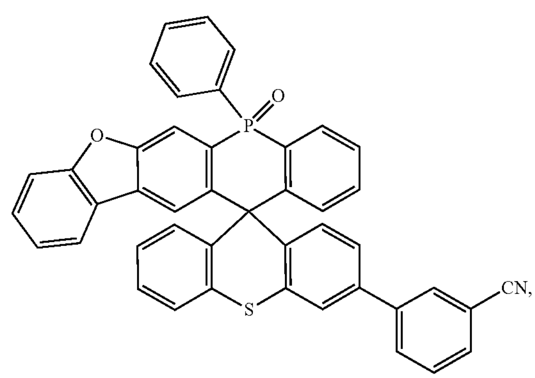

-continued
N50
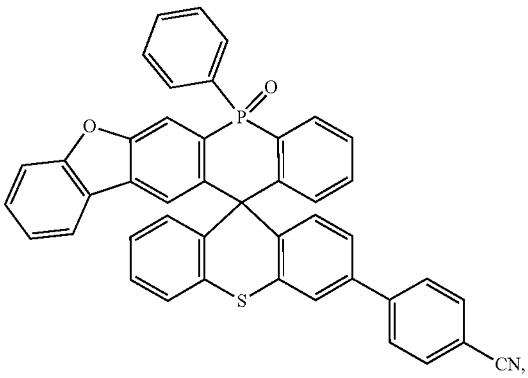
N51
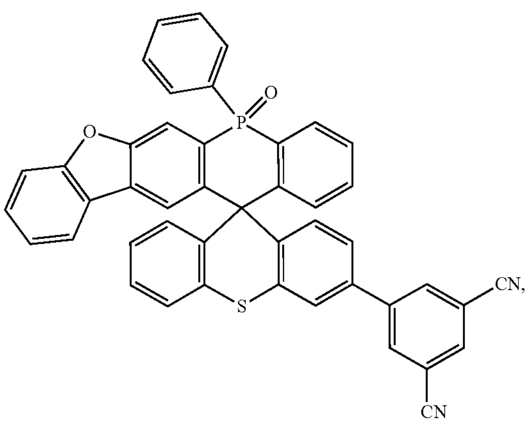
N52
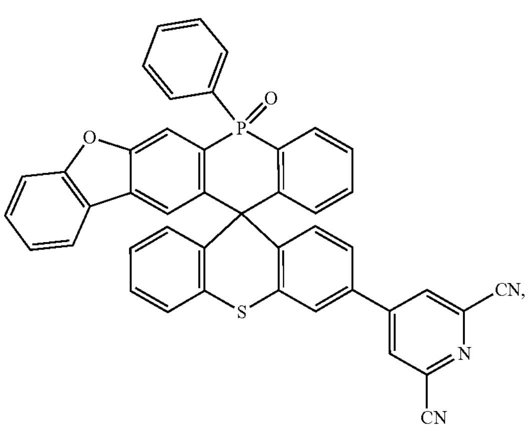
-continued
N53
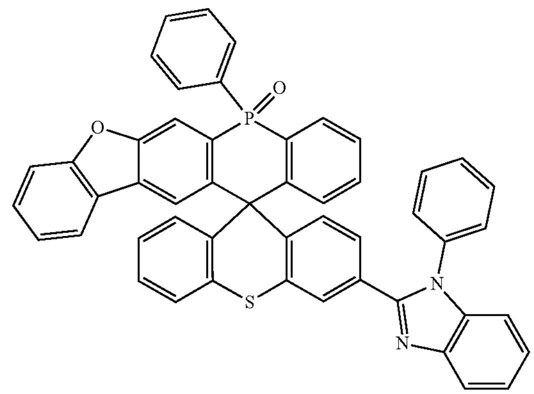
N54
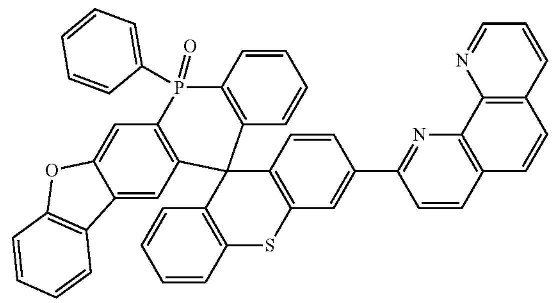
N55
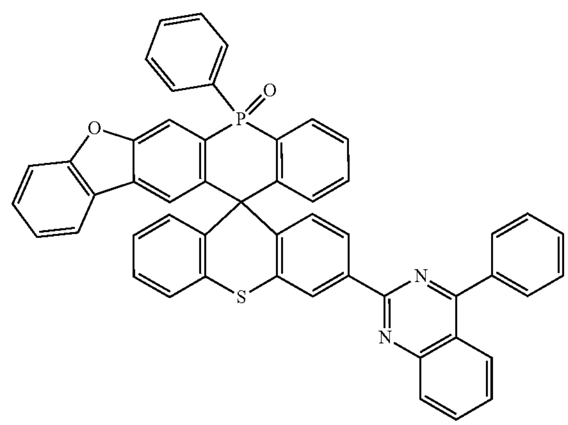
N56
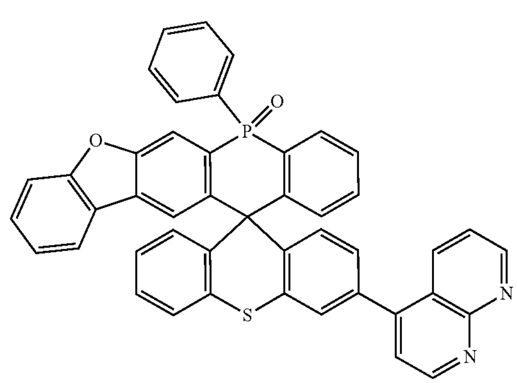

N57
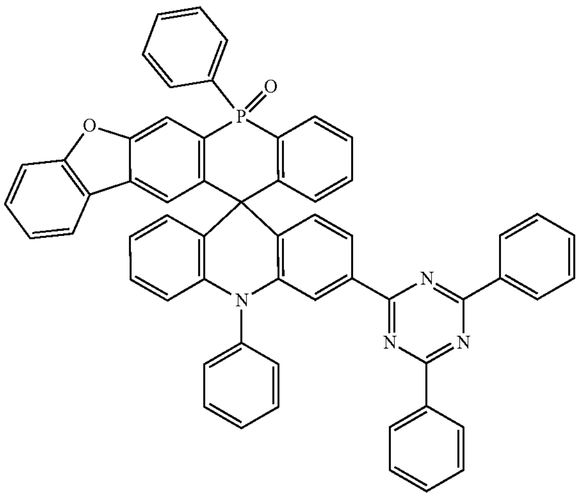
N57
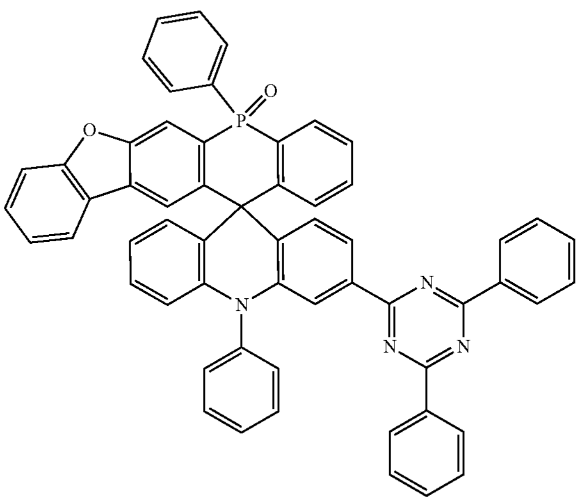
N58
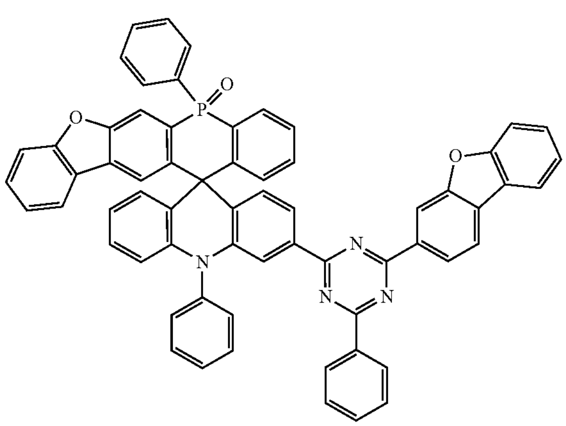
N59
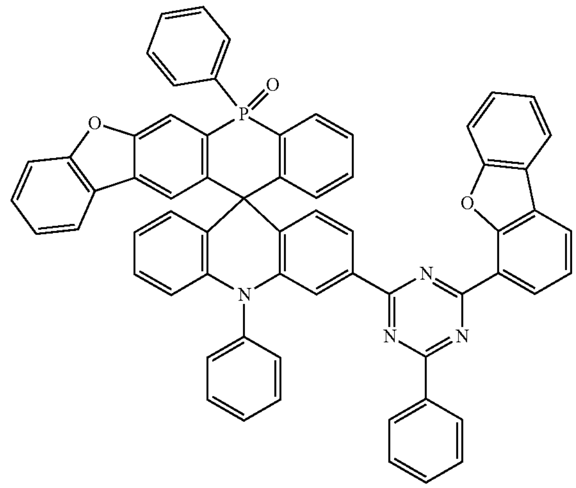
N60
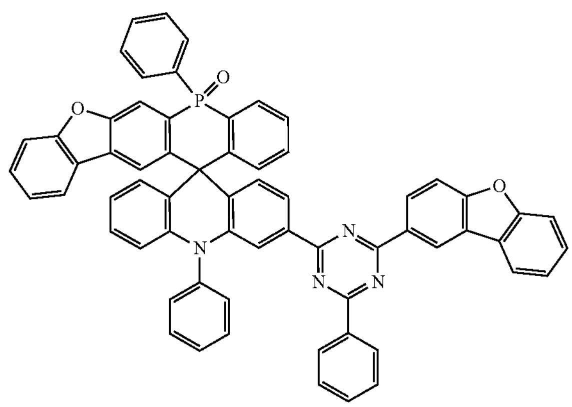
N61
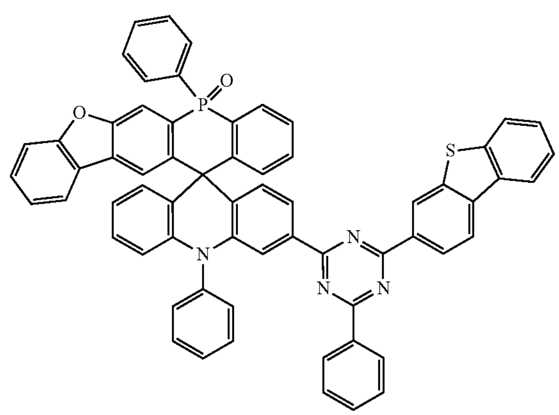

N62
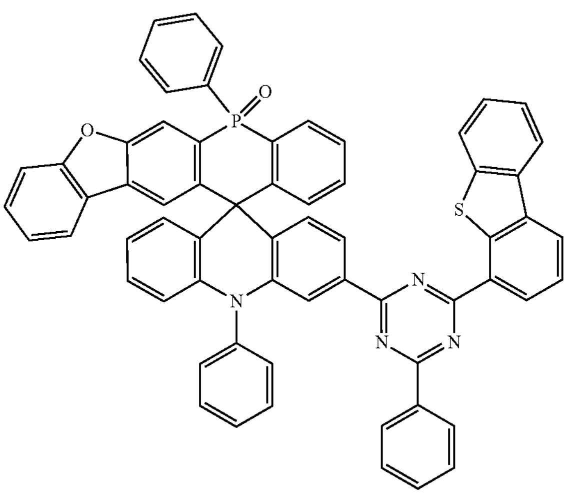
N63
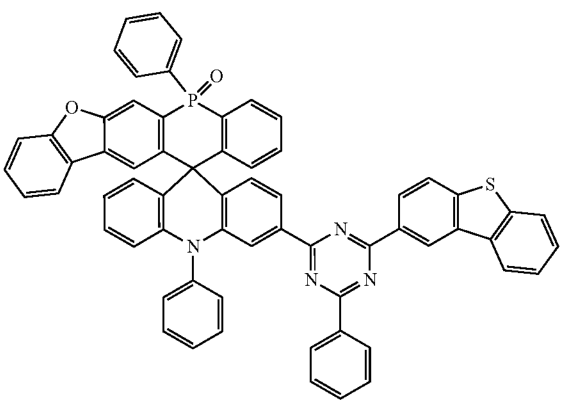
N64
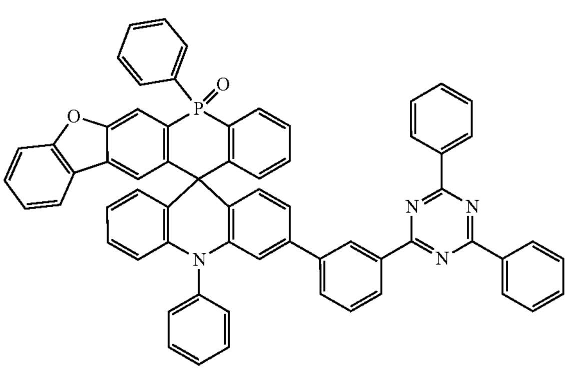
N65
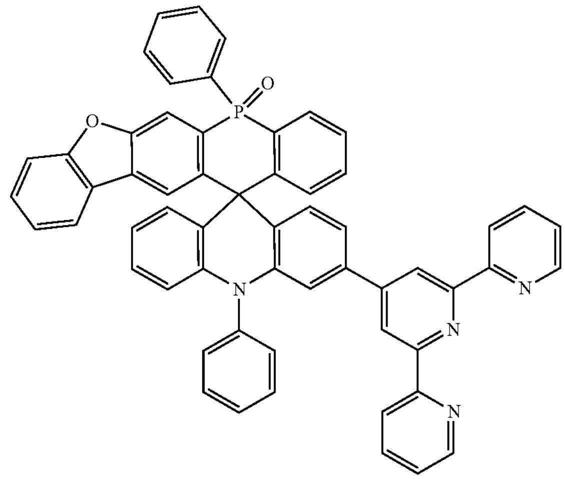
N66
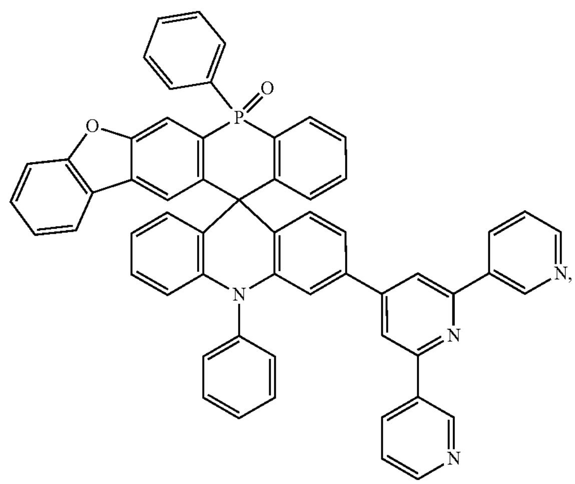
N67
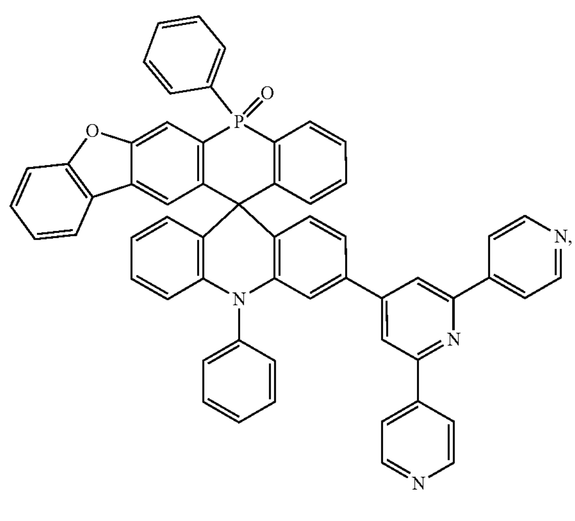

-continued
N68
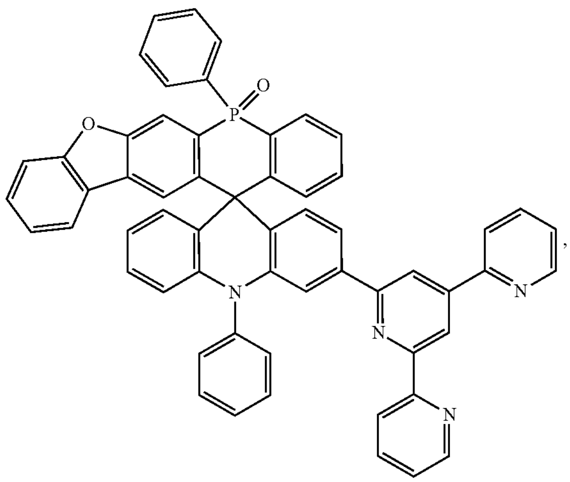
N69
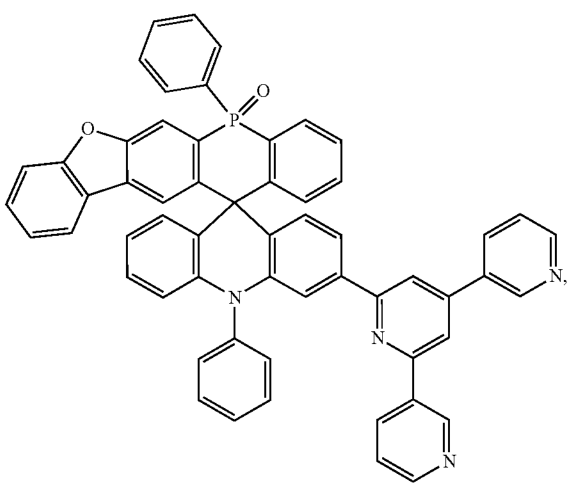
N70
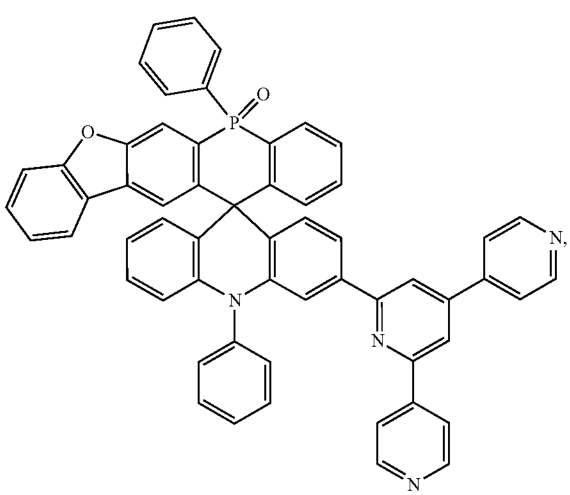
-continued
N71
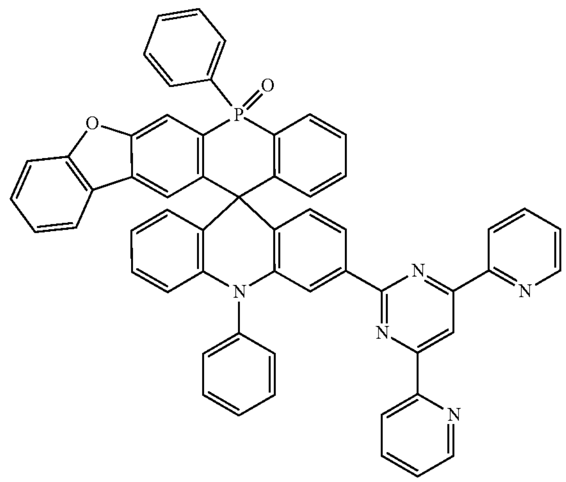
N72
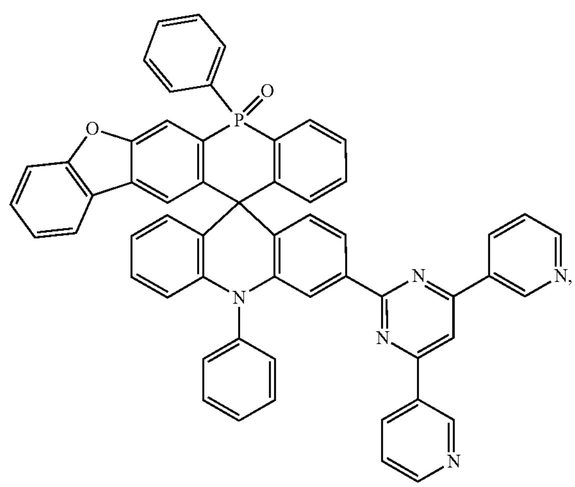
N73
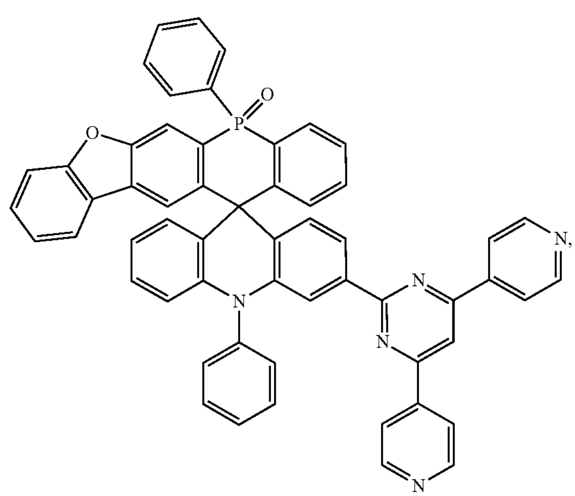

-continued
N74
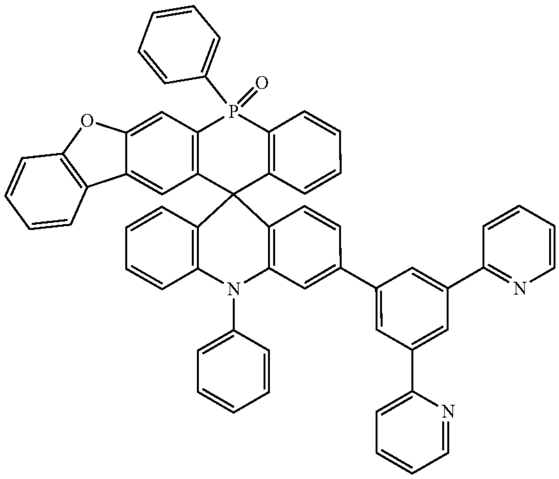
N75
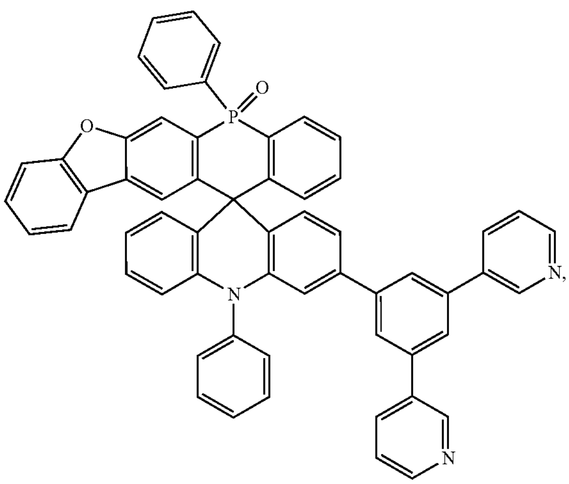
N76
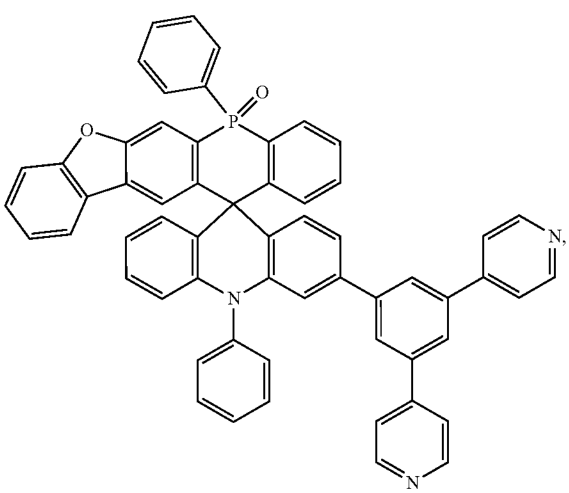
-continued
N77
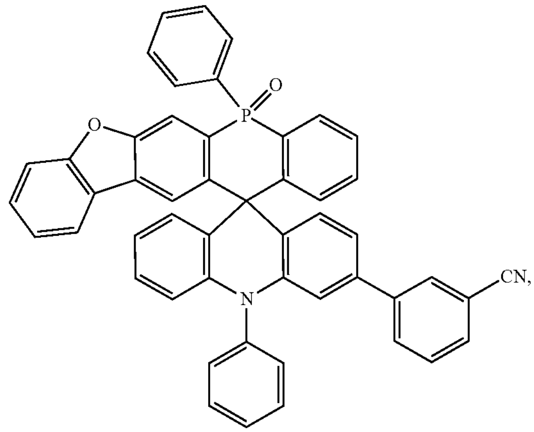
N78
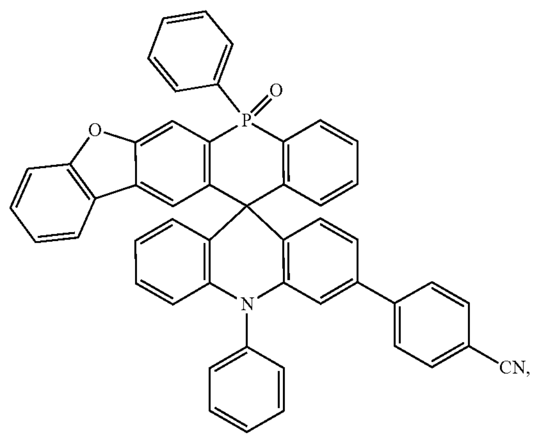
N79
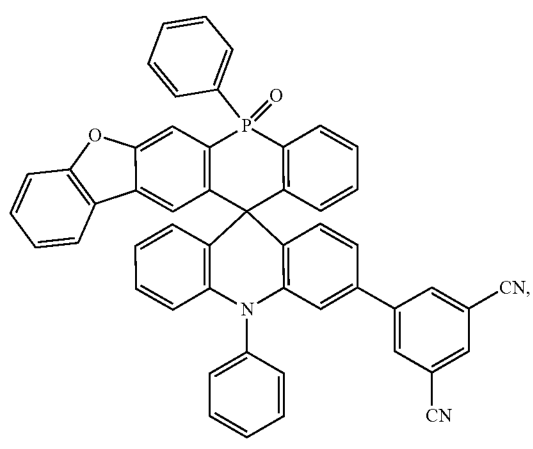

-continued
N80
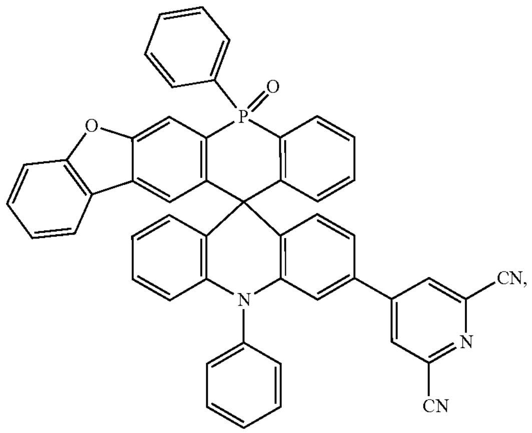
N81
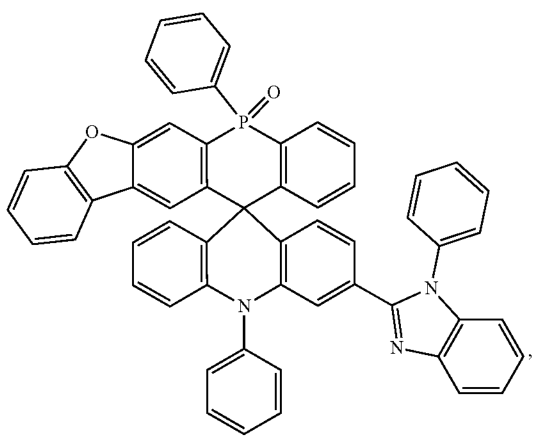
N82
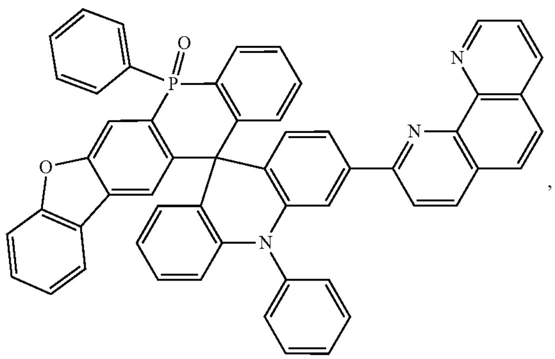
-continued
N83
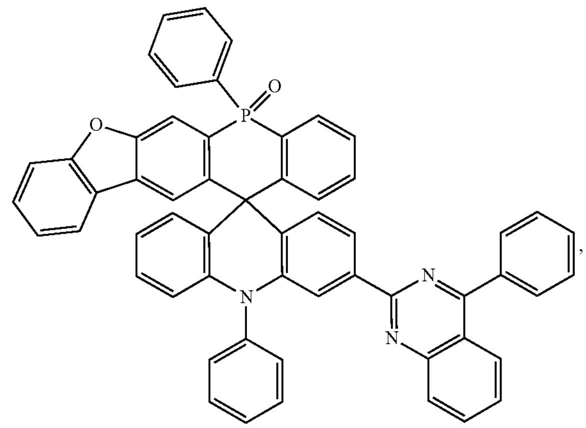
N84
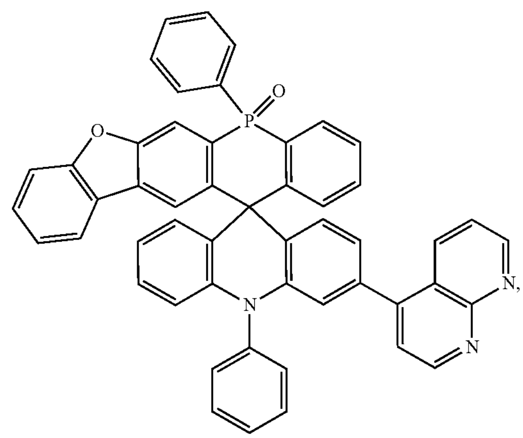
N85
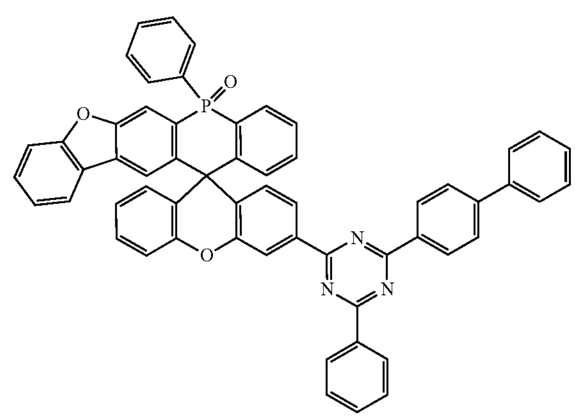

-continued
N86
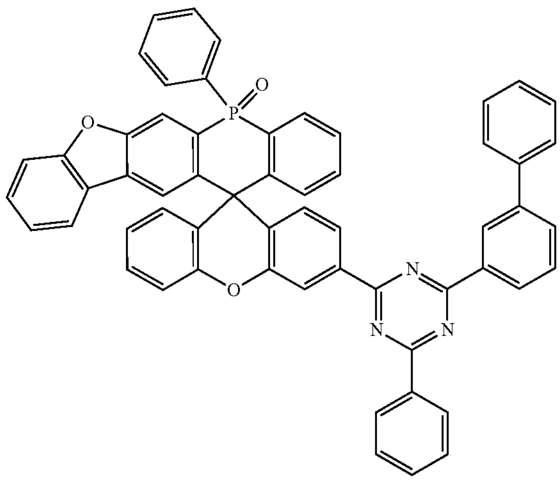
,
N87
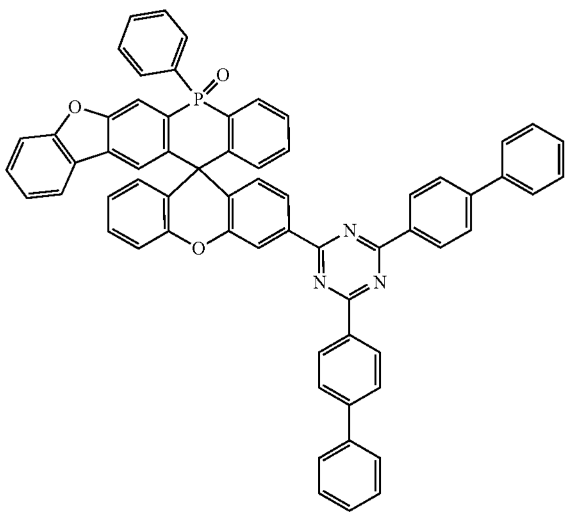
,
N88
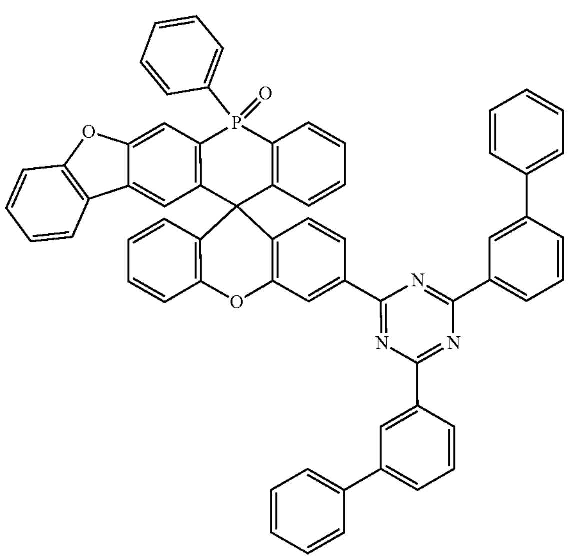
,
-continued
N88
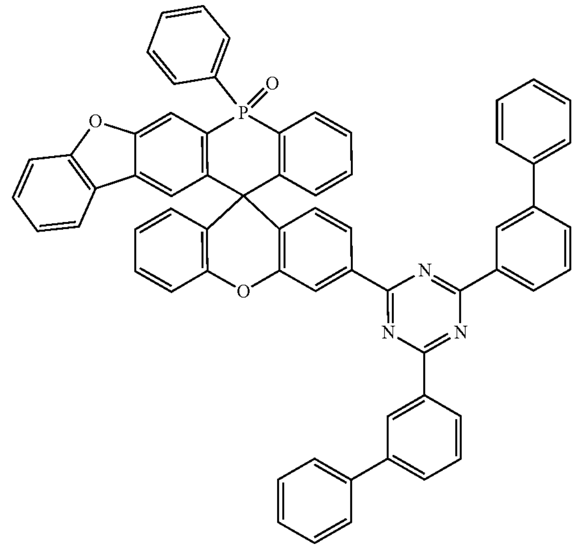
,
N89
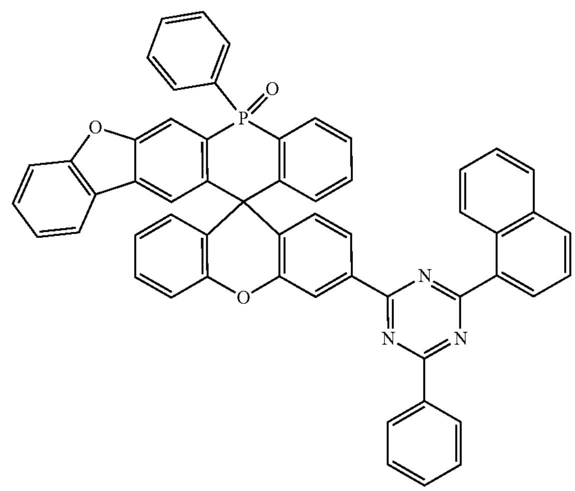
,
N90
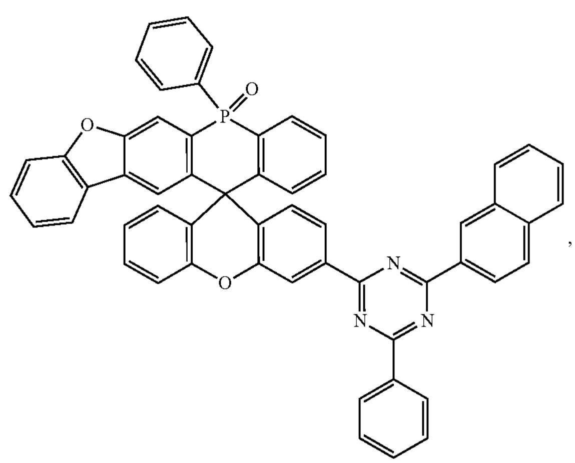
, -continued
N91
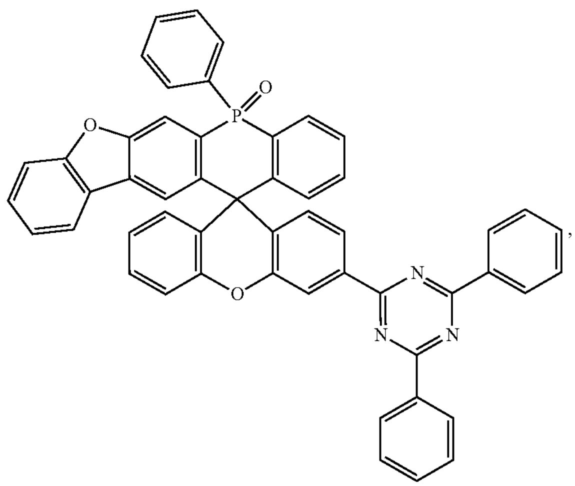
N92
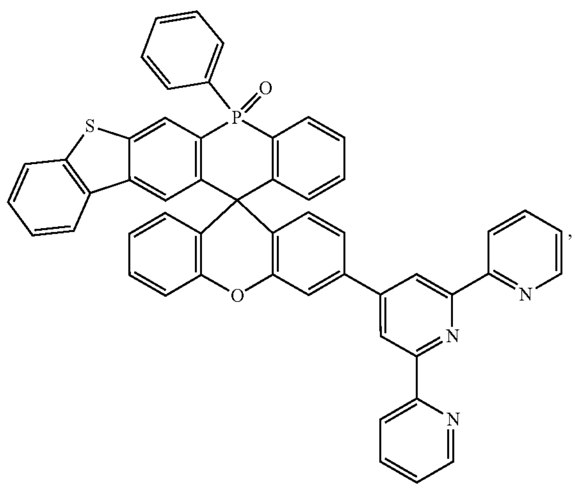
N93
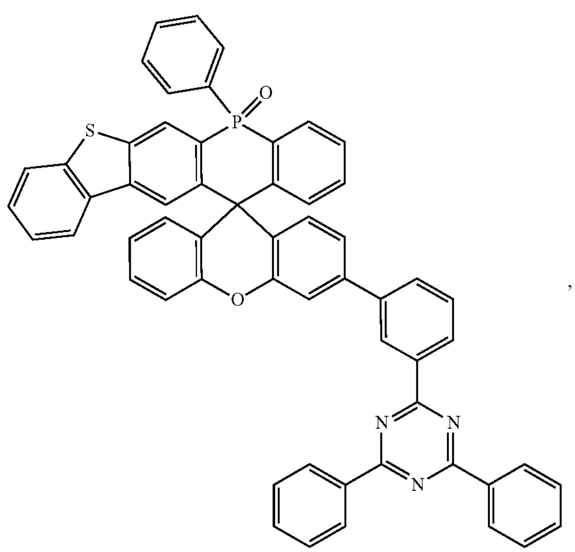
-continued
N94
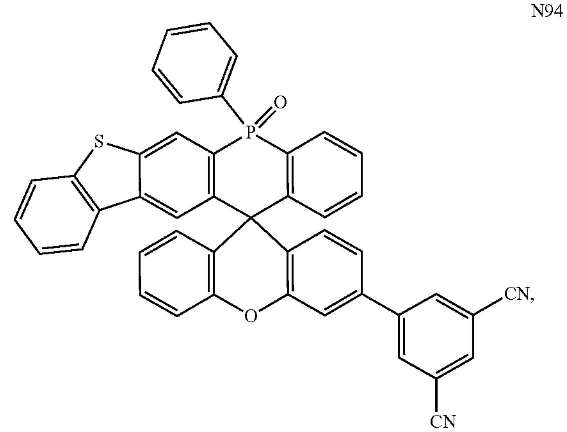
N95
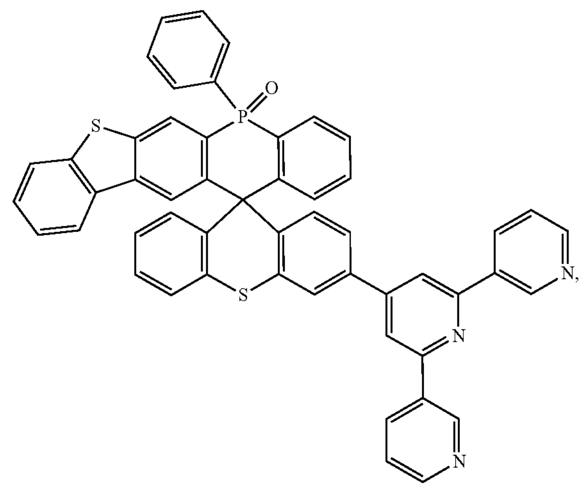
N96
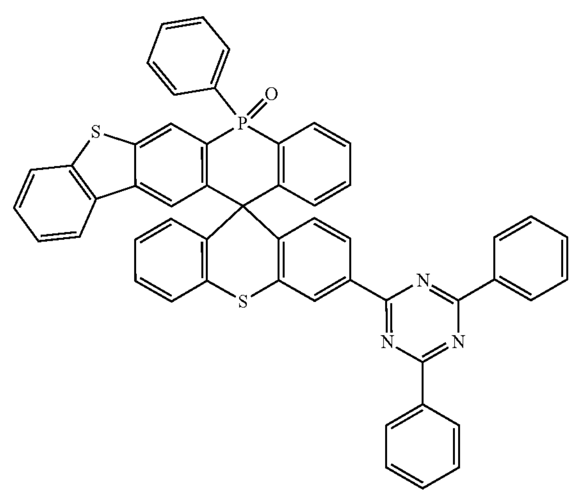

-continued

N97

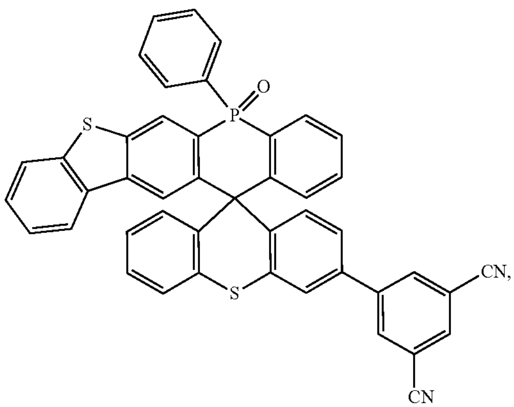

N98

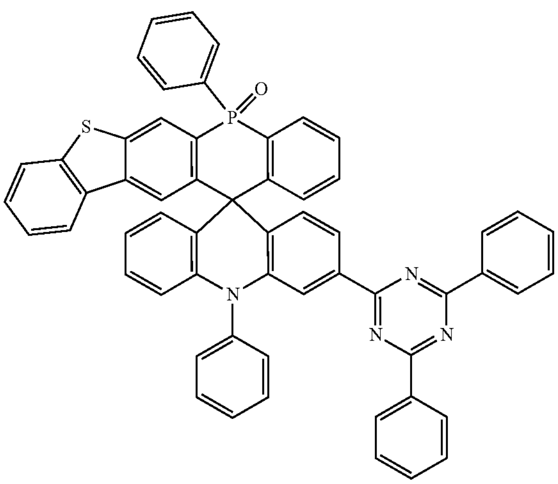

N99

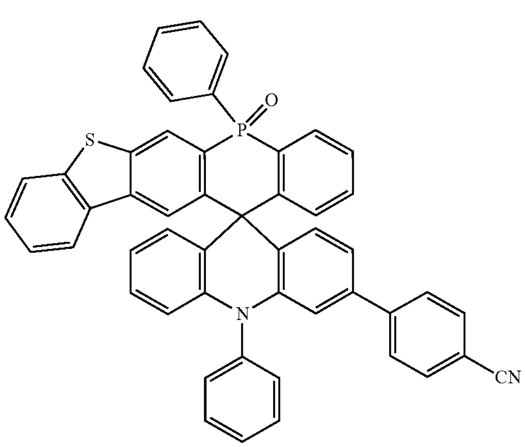

-continued

N100

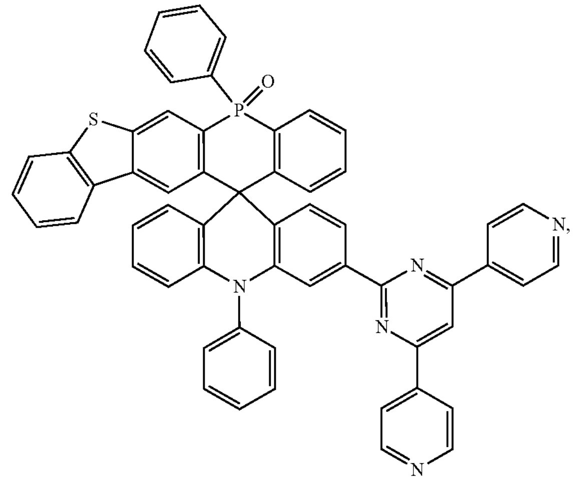

N101

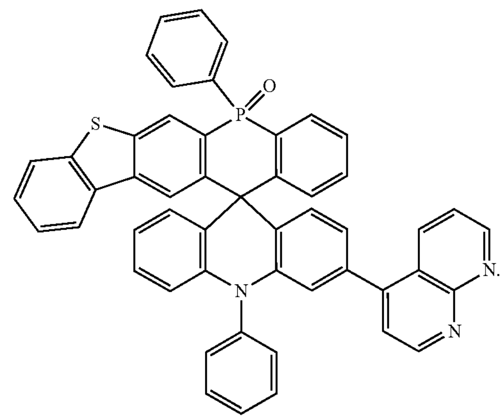

13. An electroluminescent material, comprising:

an organic compound, having a structure shown in formula I:

formula I

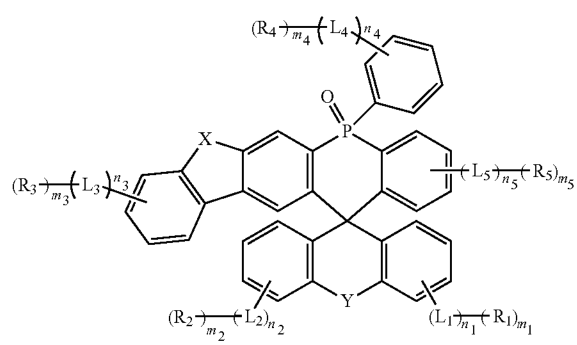

wherein:

X is selected from O, S, N—$R_{N1}$, and $CR_{C1}R_{C2}$;

Y is selected from O, S, N—$R_{N2}$, $CR_{C3}R_{C4}$, O═S═O, $SiR_{S1}R_{S2}$, O═P—$Ar_1$, and S═P—$Ar_2$;

$R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl;

$Ar_1$ and $Ar_2$ are each independently selected from any one of substituted or unsubstituted C6~C40 aryl, and substituted or unsubstituted C3~C40 heteroaryl;

$L_1$, $L_2$, $L_3$, $L_4$, and $L_5$ are each independently selected from any one of a single bond, substituted or unsubstituted C6~C40 arylene, and substituted or unsubstituted C3~C40 heteroarylene;

$R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

14. A display panel, comprising:

an organic light-emitting diode (OLED) device, wherein the OLED device includes an anode, a cathode, and an organic thin-film layer between the anode and the cathode; and a material of the organic thin-film layer includes:

an electroluminescent material, comprising:

an organic compound, having a structure shown in formula I:

formula I

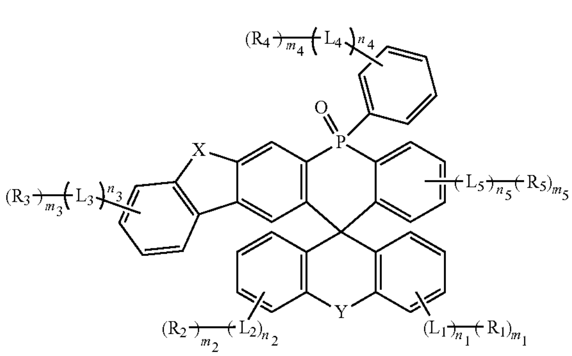

wherein:

X is selected from O, S, N—$R_{N1}$, and $CR_{C1}R_{C2}$;

Y is selected from O, S, N—$R_{N2}$, $CR_{C3}R_{C4}$, O═S═O, $SiR_{S1}R_{S2}$, O═P—$Ar_1$, and S═P—$Ar_2$;

$R_{N1}$, $R_{N2}$, $R_{C1}$, $R_{C2}$, $R_{C3}$, $R_{C4}$, $R_{S1}$, and $R_{S2}$ are each independently selected from any one of substituted or unsubstituted C1~C20 linear or branched alkyl, substituted or unsubstituted C6~C40 aryl, and substituted or unsubstituted C3~C40 heteroaryl;

$Ar_1$ and $Ar_2$ are each independently selected from any one of substituted or unsubstituted C6~C40 aryl, and substituted or unsubstituted C3~C40 heteroaryl;

$L_1$, $L_2$, $L_3$, $L_4$, and $L_5$ are each independently selected from any one of a single bond, substituted or unsubstituted C6~C40 arylene, and substituted or unsubstituted C3~C40 heteroarylene;

$R_1$, $R_2$, $R_3$, $R_4$, and $R_5$ are each independently selected from any one of deuterium, substituted or unsubstituted C1~C20 linear or branched alkyl, substituted or unsubstituted C1~C20 alkoxy, substituted or unsubstituted C1~C20 alkylthio, substituted or unsubstituted C3~C20 cycloalkyl, substituted or unsubstituted C6~C40 aryl, substituted or unsubstituted C3~C40 heteroaryl, and substituted or unsubstituted C6~C40 arylamino; and $n_1$, $n_2$, $n_3$, $n_4$, $n_5$, $m_1$, $m_2$, $m_3$, $m_4$, and $m_5$ are integers each independently selected from 0-2.

15. The display panel according to claim 14, wherein:

the organic thin-film layer includes an emission layer made of a material including the electroluminescent material.

16. The display panel according to claim 15, wherein:

the electroluminescent material is used as a phosphorescent host material of the emission layer.

17. The display panel according to claim 14, wherein:

the organic thin-film layer includes an electron transport layer made of a material including the electroluminescent material.

18. The display panel according to claim 14, wherein:

the organic thin-film layer includes a hole blocking layer made of a material including the electroluminescent material.

19. An electronic device, comprising:

the display panel according to claim 14.

* * * * *